United States Patent [19]
Jennings et al.

[11] Patent Number: 4,736,291
[45] Date of Patent: Apr. 5, 1988

[54] GENERAL-PURPOSE ARRAY PROCESSOR

[75] Inventors: Ronald B. Jennings, Richardson; Donald P. Shaver, Dallas; Maurice A. T. Ward, Plano; Eric A. Parsons, Dallas; Philip T. Mueller, Jr., Carrollton, all of Tex.

[73] Assignee: Texas Instruments Incorporated, Dallas, Tex.

[21] Appl. No.: 800,854

[22] Filed: Nov. 22, 1985

[51] Int. Cl.[4] ............ G06F 15/20
[52] U.S. Cl. ............ 364/200
[58] Field of Search ... 364/200 MS File, 900 MS File

[56] References Cited

U.S. PATENT DOCUMENTS 4,298,936 11/1981 Shapiro ............ 364/200

*Primary Examiner*—Raulfe B. Zache
*Attorney, Agent, or Firm*—Thomas G. Devine; James T. Comfort; Melvin Sharp

[57] ABSTRACT

A general purpose array processor is made up of a plurality of independent processing units. A digital host computer provides the overall control for the system. An interface unit is connected to receive instructions and data signals from the host computer and then to autonomously and selectively distribute the instructions and data to other units within the system and to transmit status, control and data signals to the digital host computer. A transfer controller unit is connected to a bulk memory and to the interface unit for receiving the instructions from the interface unit and for autonomously and selectively transferring data signals from the bulk memory means to an arithmetic unit which is also connected to the interface means and receives instructions therefrom for subsequently autonomously and selectively performing arithmetic functions on the data transferred by the transfer controller unit. An input controller unit may be provided for receiving data from a data source. The input controller unit is connected to the other units and to the bulk memory and receives the data from the source of data and reformats and transmits the reformatted data to the bulk memory. The arithmetic unit has a fixed point and a floating point adder for flexiblility of operation.

24 Claims, 137 Drawing Sheets

Microfiche Appendix Included
(4 Microfiche, 215 Pages)

FROM FIG. 8

BRANCH ADDRESS OR CONSTANT DATA SOURCE

DIRINBUS (0–15)

| | FE | | RE | | TRAP MAP ENABLE | | BRANCH ADDRESS ENABLE | | DEVICE DATA BUS TO 2911 | 31<br>STATUS ADDRESS |
|---|---|---|---|---|---|---|---|---|---|---|
| FAIL | PASS | FAIL | PASS | FAIL | PASS | FAIL | PASS | FAIL | | STADD(N) |
| PUPF | FEP | FEF | REP | REF | TRAPP | TRAPF | BRADDP | BRADDF | BUSTOSEQ | 0 |
| | | | | | | | | | | 47 |

| STATUS CLEAR | INSTRUCTION MAP ENABLE | OPERAND ENABLE | TRAP RESET ENABLE | TRAP RESET SELECT<br>TRRESSEL (N) | | | COUNTER LOAD | | COUNTER ENABLE | |
|---|---|---|---|---|---|---|---|---|---|---|
| STACLEAR | IMAPEN | OPEREN | TRRESEN | 0 | 1 | 2 | CNTO LDEN | CNT1 LDEN | COUNT 0EN | COUNT 1EN |
| | | | | | | | | | | 63 |

| PROGRAM MEMORY OPERATION<br>PMOP(N) | | | MAR. + LOWER LIMIT | MAR. + LOWER LIMIT +32 | ZERO DOUBLE WORD OPERATION | BRANCH CODE SELECT | 2901 INSTRUCTION<br>ADDGENOP(N) | | | |
|---|---|---|---|---|---|---|---|---|---|---|
| 0 | 1 | 2 | PADBIAS | PADPULTT | ZDBLEOP | BRCODESEL | 0 | 1 | 2 | 3 |
| | | | | | | | | | | 79 |

| 2901 A ADDRESS<br>ADDGENAADD(N) | | | | 2901 B ADDRESS<br>ADDGENBADD(N) | | | | 2904 INSTRUCTION<br>ADDGENLINK(N) | | |
|---|---|---|---|---|---|---|---|---|---|---|
| 0 | 1 | 2 | 3 | 0 | 1 | 2 | 3 | 0 | 1 | 2 |
| | | | | | | | | | | 95 |

| | | | | | 2904 MACH STATUS | 2904 μ STATUS | DEVICE DATA BUS SOURCE | | | |
|---|---|---|---|---|---|---|---|---|---|---|
| | | | | | ADDGEN( ) | | DEVDBUSSR(N) | | | 111 |
| 8 | 9 | 10 | 11 | 12 | UPSTAT- | MACST- | 0 | 1 | 2 | 3 |

| | | HALT/ EXAMINE RESET |
|---|---|---|
| | ← DEVICE DEPENDENT → | |
| 4 | | HERESET |

COMMON CONTROL MICROINSTRUCTION

Fig. 8'

TABLE 1–16. PIT PROM BIT ORGANIZATION

| POLARITY NAME | (1=INV) TYPE | 0000000059FEDFFC00 BIT POSITION | DESCRIPTION | NO. BITS |
|---|---|---|---|---|
| JA | VAR | FFC000000000000000 | JUMP ADDRESS | 10 |
| RN | VAR | 003800000000000000 | RUN SELECTOR ADDRESS | 3 |
| JP | VAR | 0007C0000000000000 | JUMP SELECTOR ADDRESS | 5 |
| OP | VAR | 000038000000000000 | PROGRAM OPERATION | 3 |
| DBSR | VAR | 000007C00000000000 | DEVICE DATA BUS SOURCE | 5 |
| DBDS | VAR | 0000003E0000000000 | DEVICE DATA BUS DESTINATION | 5 |
| SRARE1 | FIXED | 000000010000000000 | SPARE PROM BIT 1 | 1 |
| ACK | FIXED | 000000008000000000 | ACKNOWLEDGE DATA FROM 990 | 1 |
| ACTIVE | FIXED | 000000004000000000 | SET ACTIVE LED | 1 |
| ADDGENEN | FIXED | 000000002000000000 | ENABLE ADDRESS GENERATOR | 1 |
| BADCMD | FIXED | 000000001000000000 | ILLEGAL COMMAND | 1 |
| BITCLR | FIXED | 000000000800000000 | CLEAR ALL BIT FUNCTIONS | 1 |
| BITINT | FIXED | 000000000400000000 | HI ERROR TEST COMPLETED | 1 |
| BITPM | FIXED | 000000000200000000 | PM/CS MEMORY CONTROL | 1 |
| BPENS | FIXED | 000000000100000000 | SET BREAKPOINT ENABLE | 1 |
| BPENR | FIXED | 000000000080000000 | RESET BREAKPOINT ENABLE | 1 |
| BRUOC | FIXED | 000000000040000000 | LOAD CONTROL STORE ADDRESS | 1 |
| CLKCNTS | FIXED | 000000000020000000 | ENABLE CLOCK COUNTER | 1 |
| CLKCNTR | FIXED | 000000000010000000 | DISABLE CLOCK COUNTER | 1 |
| CLKENS | FIXED | 000000000008000000 | ENABLE GATED CLOCK | 1 |
| CLKENR | FIXED | 000000000004000000 | DISABLE GATED CLOCK | 1 |
| CMDR | FIXED | 000000000002000000 | RESET COMMAND RECEIVED FF | 1 |
| SPARE2 | FIXED | 000000000001000000 | SPARE PROM BIT 2 | 1 |
| DISABLE | FIXED | 000000000000800000 | DISABLE 990 COMMANDS | 1 |
| DUTRST | FIXED | 000000000000400000 | RESET ATP V | 1 |
| LDSR | FIXED | 000000000000200000 | LOAD SHIFT REGISTER | 1 |
| PITCLR | FIXED | 000000000000100000 | RESET THE PIT BOARD | 1 |
| REMENS | FIXED | 000000000000080000 | ENABLE REMOTE MEMORY | 1 |
| REMENR | FIXED | 000000000000040000 | DISABLE REMOTE MEMORY | 1 |
| STACLR | FIXED | 000000000000020000 | CLEAR 990 STATUS | 1 |
| TESTHII | FIXED | 000000000000010000 | SET TEST HI MICROCODE FF | 1 |
| WCSS | FIXED | 000000000000008000 | SET CONTROL STORE MODE FF | 1 |
| WCSR | FIXED | 000000000000004000 | RESET CONTROL STORE MODE FF | 1 |
| DISIDS | FIXED | 000000000000002000 | DISABLE BAD ID DETECT FF | 1 |
| BITPR | FIXED | 000000000000001000 | RESET ATP V RESET COMMAND FF | 1 |
| BERRS | FIXED | 000000000000000800 | SET DEVICE MICROCODE ERROR FF | 1 |
| EXAMI | FIXED | 000000000000000400 | SET EXAMINE FF | 1 |
| SPARE3 | FIXED | 000000000000000200 | SPARE PROM BIT 3 | 1 |
| SPARE4 | FIXED | 000000000000000100 | SPARE PROM BIT 4 | 1 |
| PADRD | VAR | 0000000000000000FF | ADDRESS OR DATA | 8 |
| RUN | MACRO | RN, JA, JP | RUN AND JUMP TO NEXT ADDRESS | — |
| JUMP | MACRO | JA, JP | JUMP TO NEXT ADDRESS | — |
| BUS | MACRO | DBSR, DBDS | DATA BUS SOURCE AND DESTINATION | |
| | | | TOTAL PROM BITS | 72 |
| | | | TOTAL ICS 72/8= | 9 |

*Fig. 13*

| | $A_7$ | $A_6$ | $A_5$ | $A_4$ | TWOC03 (sign) $A_3$ | SHFTMANT $A_2$ | ONEC17 $A_1$ | ONEC15 $A_0$ | CBØ $Q_4$ | DB1 $Q_3$ | DB2 $Q_2$ | DB3 $Q_1$ | |
|---|---|---|---|---|---|---|---|---|---|---|---|---|---|
| Negative Data | Ø | Ø | Ø | Ø | 1 | 1 | 1 | 1 | Ø | Ø | Ø | Ø | shift, no rounding |
| | Ø | Ø | Ø | Ø | 1 | 1 | 1 | Ø | Ø | Ø | Ø | Ø | |
| | Ø | Ø | Ø | Ø | 1 | 1 | Ø | 1 | 1 | 1 | 1 | 1 | shift, round-up |
| | Ø | Ø | Ø | Ø | 1 | 1 | Ø | Ø | 1 | 1 | 1 | 1 | |
| | Ø | Ø | Ø | Ø | 1 | Ø | 1 | 1 | Ø | Ø | Ø | Ø | no shift, no rounding |
| | Ø | Ø | Ø | Ø | 1 | Ø | 1 | Ø | 1 | 1 | Ø | Ø | no shift, round-up |
| | Ø | Ø | Ø | Ø | 1 | Ø | Ø | 1 | Ø | Ø | Ø | Ø | no shift, no rounding |
| | Ø | Ø | Ø | Ø | 1 | Ø | Ø | Ø | 1 | 1 | Ø | Ø | no shift, round-up |
| Positive Data | Ø | Ø | Ø | Ø | Ø | 1 | 1 | 1 | Ø | Ø | Ø | 1 | shift, round-up |
| | Ø | Ø | Ø | Ø | Ø | 1 | 1 | Ø | Ø | Ø | Ø | 1 | |
| | Ø | Ø | Ø | Ø | Ø | 1 | Ø | 1 | Ø | Ø | Ø | Ø | shift, no rounding |
| | Ø | Ø | Ø | Ø | Ø | 1 | Ø | Ø | Ø | Ø | Ø | Ø | |
| | Ø | Ø | Ø | Ø | Ø | Ø | 1 | 1 | Ø | 1 | Ø | Ø | no shift, round-up |
| | Ø | Ø | Ø | Ø | Ø | Ø | 1 | Ø | Ø | Ø | Ø | Ø | no shift, no rounding |
| | Ø | Ø | Ø | Ø | Ø | Ø | Ø | 1 | Ø | 1 | Ø | Ø | no shift, round-up |
| | Ø | Ø | Ø | Ø | Ø | Ø | Ø | Ø | Ø | Ø | Ø | Ø | no shift, no rounding |

ROUNDING CONTROL PROM MAP

*Fig. 29*

| $A_7$ | $A_6$ | $A_5$ | $A_4$ DIRTZERO | $A_3$ TWOCØØ | $A_2$ TWOCØ1 | $A_1$ TWOCØ2 | $A_0$ SHFTMANT | $Q_3$ SHFTEXP | $Q_2$ SELQUT1 | $Q_1$ SELQUTØ |
|---|---|---|---|---|---|---|---|---|---|---|
| Ø | Ø | Ø | 1 | X | X | X | X | Ø | 1 | Ø |
| Ø | Ø | Ø | Ø | 1 | 1 | 1 | 1 | Ø | Ø | Ø |
| Ø | Ø | Ø | Ø | 1 | 1 | 1 | Ø | Ø | Ø | Ø |
| Ø | Ø | Ø | Ø | 1 | 1 | Ø | 1 | 1 | Ø | 1 |
| Ø | Ø | Ø | Ø | 1 | 1 | Ø | Ø | Ø | Ø | Ø |
| Ø | Ø | Ø | Ø | 1 | Ø | 1 | 1 | 1 | Ø | 1 |
| Ø | Ø | Ø | Ø | 1 | Ø | 1 | Ø | Ø | Ø | Ø |
| Ø | Ø | Ø | Ø | 1 | Ø | Ø | 1 | 1 | Ø | 1 |
| Ø | Ø | Ø | Ø | 1 | Ø | Ø | Ø | Ø | Ø | Ø |
| Ø | Ø | Ø | Ø | Ø | 1 | 1 | 1 | 1 | Ø | 1 |
| Ø | Ø | Ø | Ø | Ø | 1 | 1 | Ø | Ø | Ø | Ø |
| Ø | Ø | Ø | Ø | Ø | 1 | Ø | 1 | 1 | Ø | 1 |
| Ø | Ø | Ø | Ø | Ø | 1 | Ø | Ø | Ø | Ø | Ø |
| Ø | Ø | Ø | Ø | Ø | Ø | 1 | 1 | 1 | Ø | 1 |
| Ø | Ø | Ø | Ø | Ø | Ø | 1 | Ø | Ø | Ø | Ø |
| Ø | Ø | Ø | Ø | Ø | Ø | Ø | 1 | 1 | Ø | 1 |
| Ø | Ø | Ø | Ø | Ø | Ø | Ø | Ø | Ø | Ø | Ø |

MANTISSA SELECTOR PROM MAP

*Fig. 30*

| $A_7$ | $A_6$ | TWOCØ3 | DIRTZERO | SHFTEXP | TWOCØØ | TWOCØ1 | TWOCØ2 | QUARTØ1 | QUARTØ2 | QUARTØ3 | QUATSION | |
|---|---|---|---|---|---|---|---|---|---|---|---|---|
| Ø | Ø | Ø | Ø | Ø | Ø | Ø | Ø | 1 | 1 | 1 | Ø | E |
| Ø | Ø | Ø | Ø | Ø | Ø | Ø | 1 | 1 | 1 | Ø | Ø | C |
| Ø | Ø | Ø | Ø | Ø | Ø | 1 | Ø | 1 | Ø | 1 | Ø | A |
| Ø | Ø | Ø | Ø | Ø | Ø | 1 | 1 | 1 | Ø | Ø | Ø | 8 |
| Ø | Ø | Ø | Ø | Ø | 1 | Ø | Ø | Ø | 1 | 1 | Ø | 6 |
| Ø | Ø | Ø | Ø | Ø | 1 | Ø | 1 | Ø | 1 | Ø | Ø | 4 |
| Ø | Ø | Ø | Ø | Ø | 1 | 1 | Ø | Ø | Ø | 1 | Ø | 2 |
| Ø | Ø | Ø | Ø | Ø | 1 | 1 | 1 | Ø | Ø | Ø | Ø | Ø |
| Ø | Ø | Ø | Ø | 1 | Ø | Ø | Ø | 1 | 1 | Ø | Ø | C |
| Ø | Ø | Ø | Ø | 1 | Ø | Ø | 1 | 1 | Ø | 1 | Ø | A |
| Ø | Ø | Ø | Ø | 1 | Ø | 1 | Ø | 1 | Ø | Ø | Ø | 8 |
| Ø | Ø | Ø | Ø | 1 | Ø | 1 | 1 | Ø | 1 | 1 | Ø | 6 |
| Ø | Ø | Ø | Ø | 1 | 1 | Ø | Ø | Ø | 1 | Ø | Ø | 4 |
| Ø | Ø | Ø | Ø | 1 | 1 | Ø | 1 | Ø | Ø | 1 | Ø | 2 |
| Ø | Ø | Ø | Ø | 1 | 1 | 1 | Ø | Ø | Ø | Ø | Ø | Ø |
| Ø | Ø | Ø | Ø | 1 | 1 | 1 | 1 | Ø | Ø | Ø | Ø | Ø |
| Ø | Ø | Ø | 1 | X | X | X | X | Ø | Ø | Ø | Ø | Ø |
| Ø | Ø | 1 | Ø | Ø | Ø | Ø | Ø | 1 | 1 | 1 | 1 | F |
| Ø | Ø | 1 | Ø | Ø | Ø | Ø | 1 | 1 | 1 | Ø | 1 | D |
| Ø | Ø | 1 | Ø | Ø | Ø | 1 | Ø | 1 | Ø | 1 | 1 | B |
| Ø | Ø | 1 | Ø | Ø | Ø | 1 | 1 | 1 | Ø | Ø | 1 | 9 |
| Ø | Ø | 1 | Ø | Ø | 1 | Ø | Ø | Ø | 1 | 1 | 1 | 7 |
| Ø | Ø | 1 | Ø | Ø | 1 | Ø | 1 | Ø | 1 | Ø | 1 | 5 |
| Ø | Ø | 1 | Ø | Ø | 1 | 1 | Ø | Ø | Ø | 1 | 1 | 3 |
| Ø | Ø | 1 | Ø | Ø | 1 | 1 | 1 | Ø | Ø | Ø | 1 | 1 |
| Ø | Ø | 1 | Ø | 1 | Ø | Ø | Ø | 1 | 1 | Ø | 1 | D |
| Ø | Ø | 1 | Ø | 1 | Ø | Ø | 1 | 1 | Ø | 1 | 1 | B |
| Ø | Ø | 1 | Ø | 1 | Ø | 1 | Ø | 1 | Ø | Ø | 1 | 9 |
| Ø | Ø | 1 | Ø | 1 | Ø | 1 | 1 | Ø | 1 | 1 | 1 | 7 |
| Ø | Ø | 1 | Ø | 1 | 1 | Ø | Ø | Ø | 1 | Ø | 1 | 5 |
| Ø | Ø | 1 | Ø | 1 | 1 | Ø | 1 | Ø | Ø | 1 | 1 | 3 |
| Ø | Ø | 1 | Ø | 1 | 1 | 1 | Ø | Ø | Ø | Ø | 1 | 1 |
| Ø | Ø | 1 | Ø | 1 | 1 | 1 | 1 | Ø | Ø | Ø | 1 | 1 |
| Ø | Ø | 1 | 1 | X | X | X | X | Ø | Ø | Ø | Ø | Ø |

EXPONENT AND SIGN PROM MAP

*Fig. 31*

| ZEROB4 | ZEROB3 | ZEROB2 | ZEROB1 | ZEROBØ | ONECØ1 | ONECØ2 | ONECØ2 | UNUSED | Exponent | | | | | | | UNUSED | Mux Select | | | | |
|---|---|---|---|---|---|---|---|---|---|---|---|---|---|---|---|---|---|---|---|---|---|
| | | | | | | | | | BE166 | | | BC166 | | | | BG166 | | | | | |
| $A_8$ | $A_7$ | $A_6$ | $A_5$ | $A_4$ | $A_3$ | $A_2$ | $A_1$ | $O_4$ | $O_3$ | $O_2$ | $O_1$ | $O_4$ | $O_3$ | $O_2$ | $O_1$ | $O_4$ | $O_3$ | $O_2$ | $O_1$ | | |
| 0 | 0 | 0 | 0 | 0 | 0 | 0 | 0 | 1 | 1 | 0 | 0 | 0 | 0 | 0 | 0 | 1 | 0 | 1 | 1 | C0 | B |
| | | | | 0 | 0 | 0 | 1 | | 1 | 0 | 0 | 0 | 0 | 0 | 1 | | 1 | 0 | 0 | C1 | C |
| | | | | 0 | 0 | 1 | 0 | | 1 | 0 | 0 | 0 | 0 | 0 | 1 | | 0 | 1 | 1 | C1 | B |
| | | | | 0 | 0 | 1 | 1 | | 1 | 0 | 0 | 0 | 0 | 1 | 0 | | 1 | 0 | 0 | C2 | C |
| | | | | 0 | 1 | 0 | 0 | | 1 | 0 | 0 | 0 | 0 | 1 | 0 | | 0 | 1 | 1 | C2 | B |
| | | | | 0 | 1 | 0 | 1 | | 1 | 0 | 0 | 0 | 0 | 1 | 1 | | 1 | 0 | 0 | C3 | C |
| | | | | 0 | 1 | 1 | 0 | | 1 | 0 | 0 | 0 | 0 | 1 | 1 | | 0 | 1 | 1 | C3 | B |
| | | | | 0 | 1 | 1 | 1 | | 1 | 0 | 0 | 0 | 1 | 0 | 0 | | 1 | 0 | 0 | C4 | C |
| 0 | 0 | 0 | 0 | 1 | 0 | 0 | 0 | | 0 | 1 | 1 | 1 | 1 | 1 | 1 | | 0 | 1 | 0 | BF | A |
| | | | | 1 | 0 | 0 | 1 | | 1 | 0 | 0 | 0 | 0 | 0 | 1 | | 1 | 0 | 0 | C1 | C |
| | | | | 1 | 0 | 1 | 0 | | 1 | 0 | 0 | 0 | 0 | 0 | 1 | | 0 | 1 | 1 | C1 | B |
| | | | | 1 | 0 | 1 | 1 | | 1 | 0 | 0 | 0 | 0 | 1 | 0 | | 1 | 0 | 0 | C2 | C |
| | | | | 1 | 1 | 0 | 0 | | 1 | 0 | 0 | 0 | 0 | 1 | 0 | | 0 | 1 | 1 | C2 | B |
| | | | | 1 | 1 | 0 | 1 | | 1 | 0 | 0 | 0 | 0 | 1 | 1 | | 1 | 0 | 0 | C3 | C |
| | | | | 1 | 1 | 1 | 0 | | 1 | 0 | 0 | 0 | 0 | 1 | 1 | | 0 | 1 | 1 | C3 | B |
| | | | | 1 | 1 | 1 | 1 | | 1 | 0 | 0 | 0 | 1 | 0 | 0 | | 1 | 0 | 0 | C4 | C |
| 0 | 0 | 0 | 1 | 0 | 0 | 0 | 0 | | 1 | 0 | 0 | 0 | 0 | 0 | 0 | | 0 | 1 | 1 | C0 | B |
| | | | | 0 | 0 | 0 | 1 | | 1 | 0 | 0 | 0 | 0 | 0 | 1 | | 1 | 0 | 0 | C1 | C |
| | | | | 0 | 0 | 1 | 0 | | 1 | 0 | 0 | 0 | 0 | 0 | 1 | | 0 | 1 | 1 | C1 | B |
| | | | | 0 | 0 | 1 | 1 | | 1 | 0 | 0 | 0 | 0 | 1 | 0 | | 1 | 0 | 0 | C2 | C |
| | | | | 0 | 1 | 0 | 0 | | 1 | 0 | 0 | 0 | 0 | 1 | 0 | | 0 | 1 | 1 | C2 | B |
| | | | | 0 | 1 | 0 | 1 | | 1 | 0 | 0 | 0 | 0 | 1 | 1 | | 1 | 0 | 0 | C3 | C |
| | | | | 0 | 1 | 1 | 0 | | 1 | 0 | 0 | 0 | 0 | 1 | 1 | | 0 | 1 | 1 | C3 | B |
| | | | | 0 | 1 | 1 | 1 | | 1 | 0 | 0 | 0 | 1 | 0 | 0 | | 1 | 0 | 0 | C4 | C |
| 0 | 0 | 0 | 1 | 1 | 0 | 0 | 0 | | 0 | 1 | 1 | 1 | 1 | 1 | 0 | | 0 | 0 | 1 | BE | 9 |
| | | | | 1 | 0 | 0 | 1 | | 1 | 0 | 0 | 0 | 0 | 0 | 1 | | 1 | 0 | 0 | C1 | C |
| | | | | 1 | 0 | 1 | 0 | | 1 | 0 | 0 | 0 | 0 | 0 | 1 | | 0 | 1 | 1 | C1 | B |
| | | | | 1 | 0 | 1 | 1 | | 1 | 0 | 0 | 0 | 0 | 1 | 0 | | 1 | 0 | 0 | C2 | C |
| | | | | 1 | 1 | 0 | 0 | | 1 | 0 | 0 | 0 | 0 | 1 | 0 | | 0 | 1 | 1 | C2 | B |
| | | | | 1 | 1 | 0 | 1 | | 1 | 0 | 0 | 0 | 0 | 1 | 1 | | 1 | 0 | 0 | C3 | C |
| | | | | 1 | 1 | 1 | 0 | | 1 | 0 | 0 | 0 | 0 | 1 | 1 | | 0 | 1 | 1 | C3 | B |
| | | | | 1 | 1 | 1 | 1 | | 1 | 0 | 0 | 0 | 1 | 0 | 0 | | 1 | 0 | 0 | C4 | C |

32-BIT HEXADECIMAL FORMAT CONVERSION PROM MAPS

*Fig. 32a*

| ZEROB4 | ZEROB3 | ZEROB2 | ZEROB1 | ZEROBØ | ONECØ1 | ONECØ2 | ONECØ2 | UNUSED | Exponent | | | | | | | UNUSED | Mux Select | | | | |
|---|---|---|---|---|---|---|---|---|---|---|---|---|---|---|---|---|---|---|---|---|---|
| $A_8$ | $A_7$ | $A_6$ | $A_5$ | $A_4$ | $A_3$ | $A_2$ | $A_1$ | $O_4$ | $O_3$ | $O_2$ | $O_1$ | $O_4$ | $O_3$ | $O_2$ | $O_1$ | $O_4$ | $O_3$ | $O_2$ | $O_1$ | | |
| 0 | 0 | 1 | 0 | 0 | 0 | 0 | 0 | 1 | 1 | 0 | 0 | 0 | 0 | 0 | 0 | 1 | 0 | 1 | 1 | C0 | B |
| | | | | 0 | 0 | 0 | 1 | | 1 | 0 | 0 | 0 | 0 | 0 | 1 | | 1 | 0 | 0 | C1 | C |
| | | | | 0 | 0 | 1 | 0 | | 1 | 0 | 0 | 0 | 0 | 0 | 1 | | 0 | 1 | 1 | C1 | B |
| | | | | 0 | 0 | 1 | 1 | | 1 | 0 | 0 | 0 | 0 | 1 | 0 | | 1 | 0 | 0 | C2 | C |
| | | | | 0 | 1 | 0 | 0 | | 1 | 0 | 0 | 0 | 0 | 1 | 0 | | 0 | 1 | 1 | C2 | B |
| | | | | 0 | 1 | 0 | 1 | | 1 | 0 | 0 | 0 | 0 | 1 | 1 | | 1 | 0 | 0 | C3 | C |
| | | | | 0 | 1 | 1 | 0 | | 1 | 0 | 0 | 0 | 0 | 1 | 1 | | 0 | 1 | 1 | C3 | B |
| | | | | 0 | 1 | 1 | 1 | | 1 | 0 | 0 | 0 | 1 | 0 | 0 | | 1 | 0 | 0 | C4 | C |
| 0 | 0 | 1 | 0 | 1 | 0 | 0 | 0 | | 0 | 1 | 1 | 1 | 1 | 1 | 1 | | 0 | 1 | 0 | BF | A |
| | | | | 1 | 0 | 0 | 1 | | 1 | 0 | 0 | 0 | 0 | 0 | 1 | | 1 | 0 | 0 | C1 | C |
| | | | | 1 | 0 | 1 | 0 | | 1 | 0 | 0 | 0 | 0 | 0 | 1 | | 0 | 1 | 1 | C1 | B |
| | | | | 1 | 0 | 1 | 1 | | 1 | 0 | 0 | 0 | 0 | 1 | 0 | | 1 | 0 | 0 | C2 | C |
| | | | | 1 | 1 | 0 | 0 | | 1 | 0 | 0 | 0 | 0 | 1 | 0 | | 0 | 1 | 1 | C2 | B |
| | | | | 1 | 1 | 0 | 1 | | 1 | 0 | 0 | 0 | 0 | 1 | 1 | | 1 | 0 | 0 | C3 | C |
| | | | | 1 | 1 | 1 | 0 | | 1 | 0 | 0 | 0 | 0 | 1 | 1 | | 0 | 1 | 1 | C3 | B |
| | | | | 1 | 1 | 1 | 1 | | 1 | 0 | 0 | 0 | 1 | 0 | 0 | | 1 | 0 | 0 | C4 | C |
| 0 | 0 | 1 | 1 | 0 | 0 | 0 | 0 | | 1 | 0 | 0 | 0 | 0 | 0 | 0 | | 0 | 1 | 1 | C0 | B |
| | | | | 0 | 0 | 0 | 1 | | 1 | 0 | 0 | 0 | 0 | 0 | 1 | | 1 | 0 | 0 | C1 | C |
| | | | | 0 | 0 | 1 | 0 | | 1 | 0 | 0 | 0 | 0 | 0 | 1 | | 0 | 1 | 1 | C1 | B |
| | | | | 0 | 0 | 1 | 1 | | 1 | 0 | 0 | 0 | 0 | 1 | 0 | | 1 | 0 | 0 | C2 | C |
| | | | | 0 | 1 | 0 | 0 | | 1 | 0 | 0 | 0 | 0 | 1 | 0 | | 0 | 1 | 1 | C2 | B |
| | | | | 0 | 1 | 0 | 1 | | 1 | 0 | 0 | 0 | 0 | 1 | 1 | | 1 | 0 | 0 | C3 | C |
| | | | | 0 | 1 | 1 | 0 | | 1 | 0 | 0 | 0 | 0 | 1 | 1 | | 0 | 1 | 1 | C3 | B |
| | | | | 0 | 1 | 1 | 1 | | 1 | 0 | 0 | 0 | 1 | 0 | 0 | | 1 | 0 | 0 | C4 | C |
| 0 | 0 | 1 | 1 | 1 | 0 | 0 | 0 | | 0 | 1 | 1 | 1 | 1 | 0 | 1 | | 0 | 0 | 0 | BD | 8 |
| | | | | 1 | 0 | 0 | 1 | | 1 | 0 | 0 | 0 | 0 | 0 | 1 | | 1 | 0 | 0 | C1 | C |
| | | | | 1 | 0 | 1 | 0 | | 1 | 0 | 0 | 0 | 0 | 0 | 1 | | 0 | 1 | 1 | C1 | B |
| | | | | 1 | 0 | 1 | 1 | | 1 | 0 | 0 | 0 | 0 | 1 | 0 | | 1 | 0 | 0 | C2 | C |
| | | | | 1 | 1 | 0 | 0 | | 1 | 0 | 0 | 0 | 0 | 1 | 0 | | 0 | 1 | 1 | C2 | B |
| | | | | 1 | 1 | 0 | 1 | | 1 | 0 | 0 | 0 | 0 | 1 | 1 | | 1 | 0 | 0 | C3 | C |
| | | | | 1 | 1 | 1 | 0 | | 1 | 0 | 0 | 0 | 0 | 1 | 1 | | 0 | 1 | 1 | C3 | B |
| | | | | 1 | 1 | 1 | 1 | | 1 | 0 | 0 | 0 | 1 | 0 | 0 | | 1 | 0 | 0 | C4 | C |

*Fig. 32b*

| ZEROB4 | ZEROB3 | ZEROB2 | ZEROB1 | ZEROB0 | ONECØ1 | ONECØ2 | ONECØ2 | UNUSED | Exponent | | | | | | | UNUSED | Mux Select | | | | |
|---|---|---|---|---|---|---|---|---|---|---|---|---|---|---|---|---|---|---|---|---|---|
| $A_8$ | $A_7$ | $A_6$ | $A_5$ | $A_4$ | $A_3$ | $A_2$ | $A_1$ | $O_4$ | $O_3$ | $O_2$ | $O_1$ | $O_4$ | $O_3$ | $O_2$ | $O_1$ | $O_4$ | $O_3$ | $O_2$ | $O_1$ | | |
| 0 | 1 | 0 | 0 | 0 | 0 | 0 | 0 | 1 | 1 | 0 | 0 | 0 | 0 | 0 | 0 | 1 | 0 | 1 | 1 | C0 | B |
| | | | | 0 | 0 | 0 | 1 | | 1 | 0 | 0 | 0 | 0 | 0 | 1 | | 1 | 0 | 0 | C1 | C |
| | | | | 0 | 0 | 1 | 0 | | 1 | 0 | 0 | 0 | 0 | 0 | 1 | | 0 | 1 | 1 | C1 | B |
| | | | | 0 | 0 | 1 | 1 | | 1 | 0 | 0 | 0 | 0 | 1 | 0 | | 1 | 0 | 0 | C2 | C |
| | | | | 0 | 1 | 0 | 0 | | 1 | 0 | 0 | 0 | 0 | 1 | 0 | | 0 | 1 | 1 | C2 | B |
| | | | | 0 | 1 | 0 | 1 | | 1 | 0 | 0 | 0 | 0 | 1 | 1 | | 1 | 0 | 0 | C3 | C |
| | | | | 0 | 1 | 1 | 0 | | 1 | 0 | 0 | 0 | 1 | 1 | 1 | | 0 | 1 | 1 | C3 | B |
| | | | | 0 | 1 | 1 | 1 | | 1 | 0 | 0 | 0 | 1 | 0 | 0 | | 1 | 0 | 0 | C4 | C |
| 0 | 1 | 0 | 0 | 1 | 0 | 0 | 0 | | 0 | 1 | 1 | 1 | 1 | 1 | 1 | | 0 | 1 | 0 | BF | A |
| | | | | 1 | 0 | 0 | 1 | | 1 | 0 | 0 | 0 | 0 | 0 | 1 | | 1 | 0 | 0 | C1 | C |
| | | | | 1 | 0 | 1 | 0 | | 1 | 0 | 0 | 0 | 0 | 0 | 1 | | 0 | 1 | 1 | C1 | B |
| | | | | 1 | 0 | 1 | 1 | | 1 | 0 | 0 | 0 | 0 | 1 | 0 | | 1 | 0 | 0 | C2 | C |
| | | | | 1 | 1 | 0 | 0 | | 1 | 0 | 0 | 0 | 0 | 1 | 0 | | 0 | 1 | 1 | C2 | B |
| | | | | 1 | 1 | 0 | 1 | | 1 | 0 | 0 | 0 | 0 | 1 | 1 | | 1 | 0 | 0 | C3 | C |
| | | | | 1 | 1 | 1 | 0 | | 1 | 0 | 0 | 0 | 0 | 1 | 1 | | 0 | 1 | 1 | C3 | B |
| | | | | 1 | 1 | 1 | 1 | | 1 | 0 | 0 | 0 | 1 | 0 | 0 | | 1 | 0 | 0 | C4 | C |
| 0 | 1 | 0 | 1 | 0 | 0 | 0 | 0 | | 1 | 0 | 0 | 0 | 0 | 0 | 0 | | 0 | 1 | 1 | C0 | B |
| | | | | 0 | 0 | 0 | 1 | | 1 | 0 | 0 | 0 | 0 | 0 | 1 | | 1 | 0 | 0 | C1 | C |
| | | | | 0 | 0 | 1 | 0 | | 1 | 0 | 0 | 0 | 0 | 0 | 1 | | 0 | 1 | 1 | C1 | B |
| | | | | 0 | 0 | 1 | 1 | | 1 | 0 | 0 | 0 | 0 | 1 | 0 | | 1 | 0 | 0 | C2 | C |
| | | | | 0 | 1 | 0 | 0 | | 1 | 0 | 0 | 0 | 0 | 1 | 0 | | 0 | 1 | 1 | C2 | B |
| | | | | 0 | 1 | 0 | 1 | | 1 | 0 | 0 | 0 | 0 | 1 | 1 | | 1 | 0 | 0 | C3 | C |
| | | | | 0 | 1 | 1 | 0 | | 1 | 0 | 0 | 0 | 0 | 1 | 1 | | 0 | 1 | 1 | C3 | B |
| | | | | 0 | 1 | 1 | 1 | | 1 | 0 | 0 | 0 | 1 | 0 | 0 | | 1 | 0 | 0 | C4 | C |
| 0 | 1 | 0 | 1 | 1 | 0 | 0 | 0 | | 0 | 1 | 1 | 1 | 1 | 1 | 0 | | 0 | 0 | 1 | BE | 9 |
| | | | | 1 | 0 | 0 | 1 | | 1 | 0 | 0 | 0 | 0 | 0 | 1 | | 1 | 0 | 0 | C1 | C |
| | | | | 1 | 0 | 1 | 0 | | 1 | 0 | 0 | 0 | 0 | 0 | 1 | | 0 | 1 | 1 | C1 | B |
| | | | | 1 | 0 | 1 | 1 | | 1 | 0 | 0 | 0 | 0 | 1 | 0 | | 1 | 0 | 0 | C2 | C |
| | | | | 1 | 1 | 0 | 0 | | 1 | 0 | 0 | 0 | 0 | 1 | 0 | | 0 | 1 | 1 | C2 | B |
| | | | | 1 | 1 | 0 | 1 | | 1 | 0 | 0 | 0 | 0 | 1 | 1 | | 1 | 0 | 0 | C3 | C |
| | | | | 1 | 1 | 1 | 0 | | 1 | 0 | 0 | 0 | 0 | 1 | 1 | | 0 | 1 | 1 | C3 | B |
| | | | | 1 | 1 | 1 | 1 | | 1 | 0 | 0 | 0 | 1 | 0 | 0 | | 1 | 0 | 0 | C4 | C |

*Fig. 32c*

| ZEROB4 | ZEROB3 | ZEROB2 | ZEROB1 | ZEROBØ | ONECØ1 | ONECØ2 | ONECØ2 | UNUSED | Exponent | | | | | | | UNUSED | Mux Select | | | | |
|---|---|---|---|---|---|---|---|---|---|---|---|---|---|---|---|---|---|---|---|---|---|
| $A_8$ | $A_7$ | $A_6$ | $A_5$ | $A_4$ | $A_3$ | $A_2$ | $A_1$ | $O_4$ | $O_3$ | $O_2$ | $O_1$ | $O_4$ | $O_3$ | $O_2$ | $O_1$ | $O_4$ | $O_3$ | $O_2$ | $O_1$ | | |
| 0 | 1 | 1 | 0 | 0 | 0 | 0 | 0 | 1 | 1 | 0 | 0 | 0 | 0 | 0 | 0 | 1 | 0 | 1 | 1 | C0 | B |
| | | | | 0 | 0 | 0 | 1 | | 1 | 0 | 0 | 0 | 0 | 0 | 1 | | 1 | 0 | 0 | C1 | C |
| | | | | 0 | 0 | 1 | 0 | | 1 | 0 | 0 | 0 | 0 | 0 | 1 | | 0 | 1 | 1 | C1 | B |
| | | | | 0 | 0 | 1 | 1 | | 1 | 0 | 0 | 0 | 0 | 1 | 0 | | 1 | 0 | 0 | C2 | C |
| | | | | 0 | 1 | 0 | 0 | | 1 | 0 | 0 | 0 | 0 | 1 | 0 | | 0 | 1 | 1 | C2 | B |
| | | | | 0 | 1 | 0 | 1 | | 1 | 0 | 0 | 0 | 0 | 1 | 1 | | 1 | 0 | 0 | C3 | C |
| | | | | 0 | 1 | 1 | 0 | | 1 | 0 | 0 | 0 | 0 | 1 | 1 | | 0 | 1 | 1 | C3 | B |
| | | | | 0 | 1 | 1 | 1 | | 1 | 0 | 0 | 0 | 1 | 0 | 0 | | 1 | 0 | 0 | C4 | C |
| 0 | 1 | 1 | 0 | 1 | 0 | 0 | 0 | | 0 | 1 | 1 | 1 | 1 | 1 | 1 | | 0 | 1 | 0 | BF | A |
| | | | | 1 | 0 | 0 | 1 | | 1 | 0 | 0 | 0 | 0 | 0 | 1 | | 1 | 0 | 0 | C1 | C |
| | | | | 1 | 0 | 1 | 0 | | 1 | 0 | 0 | 0 | 0 | 0 | 1 | | 0 | 1 | 1 | C1 | B |
| | | | | 1 | 0 | 1 | 1 | | 1 | 0 | 0 | 0 | 0 | 1 | 0 | | 1 | 0 | 0 | C2 | C |
| | | | | 1 | 1 | 0 | 0 | | 1 | 0 | 0 | 0 | 0 | 1 | 0 | | 0 | 1 | 1 | C2 | B |
| | | | | 1 | 1 | 0 | 1 | | 1 | 0 | 0 | 0 | 0 | 1 | 1 | | 1 | 0 | 0 | C3 | C |
| | | | | 1 | 1 | 1 | 0 | | 1 | 0 | 0 | 0 | 0 | 1 | 1 | | 0 | 1 | 1 | C3 | B |
| | | | | 1 | 1 | 1 | 1 | | 1 | 0 | 0 | 0 | 1 | 0 | 0 | | 1 | 0 | 0 | C4 | C |
| 0 | 1 | 1 | 1 | 0 | 0 | 0 | 0 | | 1 | 0 | 0 | 0 | 0 | 0 | 0 | | 0 | 1 | 1 | C0 | B |
| | | | | 0 | 0 | 0 | 1 | | 1 | 0 | 0 | 0 | 0 | 0 | 1 | | 1 | 0 | 0 | C1 | C |
| | | | | 0 | 0 | 1 | 0 | | 1 | 0 | 0 | 0 | 0 | 0 | 1 | | 0 | 1 | 1 | C1 | B |
| | | | | 0 | 0 | 1 | 1 | | 1 | 0 | 0 | 0 | 0 | 1 | 0 | | 1 | 0 | 0 | C2 | C |
| | | | | 0 | 1 | 0 | 0 | | 1 | 0 | 0 | 0 | 0 | 1 | 0 | | 0 | 1 | 1 | C2 | B |
| | | | | 0 | 1 | 0 | 1 | | 1 | 0 | 0 | 0 | 0 | 1 | 1 | | 1 | 0 | 0 | C3 | C |
| | | | | 0 | 1 | 1 | 0 | | 1 | 0 | 0 | 0 | 0 | 1 | 1 | | 0 | 1 | 1 | C3 | B |
| | | | | 0 | 1 | 1 | 1 | | 1 | 0 | 0 | 0 | 1 | 0 | 0 | | 1 | 0 | 0 | C4 | C |
| 0 | 1 | 1 | 1 | 1 | 0 | 0 | 0 | | 0 | 0 | 0 | 0 | 0 | 0 | 0 | | 0 | 0 | 0 | 80 | 8 |
| | | | | 1 | 0 | 0 | 1 | | 1 | 0 | 0 | 0 | 0 | 0 | 1 | | 1 | 0 | 0 | C1 | C |
| | | | | 1 | 0 | 1 | 0 | | 1 | 0 | 0 | 0 | 0 | 0 | 1 | | 0 | 1 | 1 | C1 | B |
| | | | | 1 | 0 | 1 | 1 | | 1 | 0 | 0 | 0 | 0 | 1 | 0 | | 1 | 0 | 0 | C2 | C |
| | | | | 1 | 1 | 0 | 0 | | 1 | 0 | 0 | 0 | 0 | 1 | 0 | | 0 | 1 | 1 | C2 | B |
| | | | | 1 | 1 | 0 | 1 | | 1 | 0 | 0 | 0 | 0 | 1 | 1 | | 1 | 0 | 0 | C3 | C |
| | | | | 1 | 1 | 1 | 0 | | 1 | 0 | 0 | 0 | 0 | 1 | 1 | | 0 | 1 | 1 | C3 | B |
| | | | | 1 | 1 | 1 | 1 | | 1 | 0 | 0 | 0 | 1 | 0 | 0 | | 1 | 0 | 0 | C4 | C |

*Fig. 32d*

| ZEROB4 | ZEROB3 | ZEROB2 | ZEROB1 | ZEROBØ | ONECØ1 | ONECØ2 | ONECØ2 | UNUSED | Exponent | | | | | | | UNUSED | Mux Select | | | | |
|---|---|---|---|---|---|---|---|---|---|---|---|---|---|---|---|---|---|---|---|---|---|
| $A_8$ | $A_7$ | $A_6$ | $A_5$ | $A_4$ | $A_3$ | $A_2$ | $A_1$ | $O_4$ | $O_3$ | $O_2$ | $O_1$ | $O_4$ | $O_3$ | $O_2$ | $O_1$ | $O_4$ | $O_3$ | $O_2$ | $O_1$ | | |
| 1 | 0 | 0 | 0 | 0 | 0 | 0 | 0 | 1 | 1 | 0 | 0 | 0 | 0 | 0 | 0 | 1 | 0 | 1 | 1 | C0 | B |
| | | | | 0 | 0 | 0 | 1 | | 1 | 0 | 0 | 0 | 0 | 0 | 0 | | 1 | 0 | 1 | C0 | D |
| | | | | 0 | 0 | 1 | 0 | | 1 | 0 | 0 | 0 | 0 | 0 | 1 | | 0 | 1 | 1 | C1 | B |
| | | | | 0 | 0 | 1 | 1 | | 1 | 0 | 0 | 0 | 0 | 0 | 1 | | 1 | 0 | 1 | C1 | |
| | | | | 0 | 1 | 0 | 0 | | 1 | 0 | 0 | 0 | 0 | 1 | 0 | | 0 | 1 | 1 | C2 | B |
| | | | | 0 | 1 | 0 | 1 | | 1 | 0 | 0 | 0 | 0 | 1 | 0 | | 1 | 0 | 1 | C2 | D |
| | | | | 0 | 1 | 1 | 0 | | 1 | 0 | 0 | 0 | 0 | 1 | 1 | | 0 | 1 | 1 | C3 | B |
| | | | | 0 | 1 | 1 | 1 | | 1 | 0 | 0 | 0 | 0 | 1 | 1 | | 1 | 0 | 1 | C3 | D |
| 1 | 0 | 0 | 0 | 1 | 0 | 0 | 0 | | 0 | 1 | 1 | 1 | 1 | 1 | 1 | | 0 | 1 | 0 | BF | A |
| | | | | 1 | 0 | 0 | 1 | | 1 | 0 | 0 | 0 | 0 | 0 | 0 | | 1 | 0 | 1 | C0 | D |
| | | | | 1 | 0 | 1 | 0 | | 1 | 0 | 0 | 0 | 0 | 0 | 1 | | 0 | 1 | 1 | C1 | B |
| | | | | 1 | 0 | 1 | 1 | | 1 | 0 | 0 | 0 | 0 | 0 | 1 | | 1 | 0 | 1 | C1 | D |
| | | | | 1 | 1 | 0 | 0 | | 1 | 0 | 0 | 0 | 0 | 1 | 0 | | 0 | 1 | 1 | C2 | B |
| | | | | 1 | 1 | 0 | 1 | | 1 | 0 | 0 | 0 | 0 | 1 | 0 | | 1 | 0 | 1 | C2 | D |
| | | | | 1 | 1 | 1 | 0 | | 1 | 0 | 0 | 0 | 0 | 1 | 1 | | 0 | 1 | 1 | C3 | B |
| | | | | 1 | 1 | 1 | 1 | | 1 | 0 | 0 | 0 | 0 | 1 | 1 | | 1 | 0 | 1 | C3 | D |
| 1 | 0 | 0 | 1 | 0 | 0 | 0 | 0 | | 1 | 0 | 0 | 0 | 0 | 0 | 0 | | 0 | 1 | 1 | C0 | B |
| | | | | 0 | 0 | 0 | 1 | | 1 | 0 | 0 | 0 | 0 | 0 | 0 | | 1 | 0 | 1 | C0 | D |
| | | | | 0 | 0 | 1 | 0 | | 1 | 0 | 0 | 0 | 0 | 0 | 1 | | 0 | 1 | 1 | C1 | B |
| | | | | 0 | 0 | 1 | 1 | | 1 | 0 | 0 | 0 | 0 | 0 | 1 | | 1 | 0 | 1 | C1 | D |
| | | | | 0 | 1 | 0 | 0 | | 1 | 0 | 0 | 0 | 0 | 1 | 0 | | 0 | 1 | 1 | C2 | B |
| | | | | 0 | 1 | 0 | 1 | | 1 | 0 | 0 | 0 | 0 | 1 | 0 | | 1 | 0 | 1 | C2 | D |
| | | | | 0 | 1 | 1 | 0 | | 1 | 0 | 0 | 0 | 0 | 1 | 1 | | 0 | 1 | 1 | C3 | B |
| | | | | 0 | 1 | 1 | 1 | | 1 | 0 | 0 | 0 | 0 | 1 | 1 | | 1 | 0 | 1 | C3 | D |
| 1 | 0 | 0 | 1 | 1 | 0 | 0 | 0 | | 0 | 1 | 1 | 1 | 1 | 1 | 0 | | 0 | 0 | 1 | BE | 9 |
| | | | | 1 | 0 | 0 | 1 | | 1 | 0 | 0 | 0 | 0 | 0 | 0 | | 1 | 0 | 1 | C0 | D |
| | | | | 1 | 0 | 1 | 0 | | 1 | 0 | 0 | 0 | 0 | 0 | 1 | | 0 | 1 | 1 | C1 | B |
| | | | | 1 | 0 | 1 | 1 | | 1 | 0 | 0 | 0 | 0 | 0 | 1 | | 1 | 0 | 1 | C1 | D |
| | | | | 1 | 1 | 0 | 0 | | 1 | 0 | 0 | 0 | 0 | 1 | 0 | | 0 | 1 | 1 | C2 | B |
| | | | | 1 | 1 | 0 | 1 | | 1 | 0 | 0 | 0 | 0 | 1 | 0 | | 1 | 0 | 1 | C2 | D |
| | | | | 1 | 1 | 1 | 0 | | 1 | 0 | 0 | 0 | 0 | 1 | 1 | | 0 | 1 | 1 | C3 | B |
| | | | | 1 | 1 | 1 | 1 | | 1 | 0 | 0 | 0 | 0 | 1 | 1 | | 1 | 0 | 1 | C3 | D |

*Fig. 32e*

| ZEROB4 | ZEROB3 | ZEROB2 | ZEROB1 | ZEROBØ | ONECØ1 | ONECØ2 | ONECØ2 | UNUSED | Exponent | | | | | | | UNUSED | Mux Select | | | | |
|---|---|---|---|---|---|---|---|---|---|---|---|---|---|---|---|---|---|---|---|---|---|
| $A_8$ | $A_7$ | $A_6$ | $A_5$ | $A_4$ | $A_3$ | $A_2$ | $A_1$ | $O_4$ | $O_3$ | $O_2$ | $O_1$ | $O_4$ | $O_3$ | $O_2$ | $O_1$ | $O_4$ | $O_3$ | $O_2$ | $O_1$ | | |
| 1 | 0 | 1 | 0 | 0 | 0 | 0 | 0 | 1 | 1 | 0 | 0 | 0 | 0 | 0 | 0 | 1 | 0 | 1 | 1 | C0 | B |
| | | | | 0 | 0 | 0 | 1 | | 1 | 0 | 0 | 0 | 0 | 0 | 0 | | 1 | 0 | 1 | C0 | D |
| | | | | 0 | 0 | 1 | 0 | | 1 | 0 | 0 | 0 | 0 | 0 | 1 | | 0 | 1 | 1 | C1 | B |
| | | | | 0 | 0 | 1 | 1 | | 1 | 0 | 0 | 0 | 0 | 0 | 1 | | 1 | 0 | 1 | C1 | D |
| | | | | 0 | 1 | 0 | 0 | | 1 | 0 | 0 | 0 | 0 | 1 | 0 | | 0 | 1 | 1 | C2 | B |
| | | | | 0 | 1 | 0 | 1 | | 1 | 0 | 0 | 0 | 0 | 1 | 0 | | 1 | 0 | 1 | C2 | D |
| | | | | 0 | 1 | 1 | 0 | | 1 | 0 | 0 | 0 | 0 | 1 | 1 | | 0 | 1 | 1 | C3 | B |
| | | | | 0 | 1 | 1 | 1 | | 1 | 0 | 0 | 0 | 0 | 1 | 1 | | 1 | 0 | 1 | C3 | D |
| 1 | 0 | 1 | 0 | 1 | 0 | 0 | 0 | | 0 | 1 | 1 | 1 | 1 | 1 | 1 | | 0 | 1 | 0 | BF | A |
| | | | | 1 | 0 | 0 | 1 | | 1 | 0 | 0 | 0 | 0 | 0 | 0 | | 1 | 0 | 1 | C0 | D |
| | | | | 1 | 0 | 1 | 0 | | 1 | 0 | 0 | 0 | 0 | 0 | 1 | | 0 | 1 | 1 | C1 | B |
| | | | | 1 | 0 | 1 | 1 | | 1 | 0 | 0 | 0 | 0 | 0 | 1 | | 1 | 0 | 1 | C1 | D |
| | | | | 1 | 1 | 0 | 0 | | 1 | 0 | 0 | 0 | 0 | 1 | 0 | | 0 | 1 | 1 | C2 | B |
| | | | | 1 | 1 | 0 | 1 | | 1 | 0 | 0 | 0 | 0 | 1 | 0 | | 1 | 0 | 1 | C2 | D |
| | | | | 1 | 1 | 1 | 0 | | 1 | 0 | 0 | 0 | 0 | 1 | 1 | | 0 | 1 | 1 | C3 | B |
| | | | | 1 | 1 | 1 | 1 | | 1 | 0 | 0 | 0 | 0 | 1 | 1 | | 1 | 0 | 1 | C3 | D |
| 1 | 0 | 1 | 1 | 0 | 0 | 0 | 0 | | 1 | 0 | 0 | 0 | 0 | 0 | 0 | | 0 | 1 | 1 | C0 | B |
| | | | | 0 | 0 | 0 | 1 | | 1 | 0 | 0 | 0 | 0 | 0 | 0 | | 1 | 0 | 1 | C0 | D |
| | | | | 0 | 0 | 1 | 0 | | 1 | 0 | 0 | 0 | 0 | 0 | 1 | | 0 | 1 | 1 | C1 | B |
| | | | | 0 | 0 | 1 | 1 | | 1 | 0 | 0 | 0 | 0 | 0 | 1 | | 1 | 0 | 1 | C1 | D |
| | | | | 0 | 1 | 0 | 0 | | 1 | 0 | 0 | 0 | 0 | 1 | 0 | | 0 | 1 | 1 | C2 | B |
| | | | | 0 | 1 | 0 | 1 | | 1 | 0 | 0 | 0 | 0 | 1 | 0 | | 1 | 0 | 1 | C2 | D |
| | | | | 0 | 1 | 1 | 0 | | 1 | 0 | 0 | 0 | 0 | 1 | 1 | | 0 | 1 | 1 | C3 | B |
| | | | | 0 | 1 | 1 | 1 | | 1 | 0 | 0 | 0 | 0 | 1 | 1 | | 1 | 0 | 1 | C3 | D |
| 1 | 0 | 1 | 1 | 1 | 0 | 0 | 0 | | 0 | 1 | 1 | 1 | 1 | 0 | 1 | | 0 | 0 | 0 | BD | 8 |
| | | | | 1 | 0 | 0 | 1 | | 1 | 0 | 0 | 0 | 0 | 0 | 0 | | 1 | 0 | 1 | C0 | D |
| | | | | 1 | 0 | 1 | 0 | | 1 | 0 | 0 | 0 | 0 | 0 | 1 | | 0 | 1 | 1 | C1 | B |
| | | | | 1 | 0 | 1 | 1 | | 1 | 0 | 0 | 0 | 0 | 0 | 1 | | 1 | 0 | 1 | C1 | D |
| | | | | 1 | 1 | 0 | 0 | | 1 | 0 | 0 | 0 | 0 | 1 | 0 | | 0 | 1 | 1 | C2 | B |
| | | | | 1 | 1 | 0 | 1 | | 1 | 0 | 0 | 0 | 0 | 1 | 0 | | 1 | 0 | 1 | C2 | D |
| | | | | 1 | 1 | 1 | 0 | | 1 | 0 | 0 | 0 | 0 | 1 | 1 | | 0 | 1 | 1 | C3 | B |
| | | | | 1 | 1 | 1 | 1 | | 1 | 0 | 0 | 0 | 0 | 1 | 1 | | 1 | 0 | 1 | C3 | D |

*Fig. 32f*

| ZEROB4 | ZEROB3 | ZEROB2 | ZEROB1 | ZEROBØ | ONECØ1 | ONECØ2 | ONECØ2 | UNUSED | Exponent | | | | | | | UNUSED | Mux Select | | | | |
|---|---|---|---|---|---|---|---|---|---|---|---|---|---|---|---|---|---|---|---|---|---|
| $A_8$ | $A_7$ | $A_6$ | $A_5$ | $A_4$ | $A_3$ | $A_2$ | $A_1$ | $O_4$ | $O_3$ | $O_2$ | $O_1$ | $O_4$ | $O_3$ | $O_2$ | $O_1$ | $O_4$ | $O_3$ | $O_2$ | $O_1$ | | |
| 1 | 1 | 0 | 0 | 0 | 0 | 0 | 0 | 1 | 1 | 0 | 0 | 0 | 0 | 0 | 0 | 1 | 0 | 1 | 1 | C0 | B |
| | | | | 0 | 0 | 0 | 1 | | 1 | 0 | 0 | 0 | 0 | 0 | 0 | | 1 | 0 | 1 | C0 | D |
| | | | | 0 | 0 | 1 | 0 | | 1 | 0 | 0 | 0 | 0 | 0 | 1 | | 0 | 1 | 1 | C1 | B |
| | | | | 0 | 0 | 1 | 1 | | 1 | 0 | 0 | 0 | 0 | 0 | 1 | | 1 | 0 | 1 | C1 | D |
| | | | | 0 | 1 | 0 | 0 | | 1 | 0 | 0 | 0 | 0 | 1 | 0 | | 0 | 1 | 1 | C2 | B |
| | | | | 0 | 1 | 0 | 1 | | 1 | 0 | 0 | 0 | 0 | 1 | 0 | | 1 | 0 | 1 | C2 | D |
| | | | | 0 | 1 | 1 | 0 | | 1 | 0 | 0 | 0 | 0 | 1 | 1 | | 0 | 1 | 1 | C3 | B |
| | | | | 0 | 1 | 1 | 1 | | 1 | 0 | 0 | 0 | 0 | 1 | 1 | | 1 | 0 | 1 | C3 | D |
| 1 | 1 | 0 | 0 | 1 | 0 | 0 | 0 | | 0 | 1 | 1 | 1 | 1 | 1 | 1 | | 0 | 1 | 0 | BF | A |
| | | | | 1 | 0 | 0 | 1 | | 1 | 0 | 0 | 0 | 0 | 0 | 0 | | 1 | 0 | 1 | C0 | D |
| | | | | 1 | 0 | 1 | 0 | | 1 | 0 | 0 | 0 | 0 | 0 | 1 | | 0 | 1 | 1 | C1 | B |
| | | | | 1 | 0 | 1 | 1 | | 1 | 0 | 0 | 0 | 0 | 0 | 1 | | 1 | 0 | 1 | C1 | D |
| | | | | 1 | 1 | 0 | 0 | | 1 | 0 | 0 | 0 | 0 | 1 | 0 | | 0 | 1 | 1 | C2 | B |
| | | | | 1 | 1 | 0 | 1 | | 1 | 0 | 0 | 0 | 0 | 1 | 0 | | 1 | 0 | 1 | C2 | D |
| | | | | 1 | 1 | 1 | 0 | | 1 | 0 | 0 | 0 | 0 | 1 | 1 | | 0 | 1 | 1 | C3 | B |
| | | | | 1 | 1 | 1 | 1 | | 1 | 0 | 0 | 0 | 0 | 1 | 1 | | 1 | 0 | 1 | C3 | D |
| 1 | 1 | 0 | 1 | 0 | 0 | 0 | 0 | | 1 | 0 | 0 | 0 | 0 | 0 | 0 | | 0 | 1 | 1 | C0 | B |
| | | | | 0 | 0 | 0 | 1 | | 1 | 0 | 0 | 0 | 0 | 0 | 0 | | 1 | 0 | 1 | C0 | D |
| | | | | 0 | 0 | 1 | 0 | | 1 | 0 | 0 | 0 | 0 | 0 | 1 | | 0 | 1 | 1 | C1 | B |
| | | | | 0 | 0 | 1 | 1 | | 1 | 0 | 0 | 0 | 0 | 0 | 1 | | 1 | 0 | 1 | C1 | D |
| | | | | 0 | 1 | 0 | 0 | | 1 | 0 | 0 | 0 | 0 | 1 | 0 | | 0 | 1 | 1 | C2 | B |
| | | | | 0 | 1 | 0 | 1 | | 1 | 0 | 0 | 0 | 0 | 1 | 0 | | 1 | 0 | 1 | C2 | D |
| | | | | 0 | 1 | 1 | 0 | | 1 | 0 | 0 | 0 | 0 | 1 | 1 | | 0 | 1 | 1 | C3 | B |
| | | | | 0 | 1 | 1 | 1 | | 1 | 0 | 0 | 0 | 0 | 1 | 1 | | 1 | 0 | 1 | C3 | D |
| 1 | 1 | 0 | 1 | 1 | 0 | 0 | 0 | | 0 | 1 | 1 | 1 | 1 | 1 | 0 | | 0 | 0 | 1 | BE | 9 |
| | | | | 1 | 0 | 0 | 1 | | 1 | 0 | 0 | 0 | 0 | 0 | 0 | | 1 | 0 | 1 | C0 | D |
| | | | | 1 | 0 | 1 | 0 | | 1 | 0 | 0 | 0 | 0 | 0 | 1 | | 0 | 1 | 1 | C1 | B |
| | | | | 1 | 0 | 1 | 1 | | 1 | 0 | 0 | 0 | 0 | 0 | 1 | | 1 | 0 | 1 | C1 | D |
| | | | | 1 | 1 | 0 | 0 | | 1 | 0 | 0 | 0 | 0 | 1 | 0 | | 0 | 1 | 1 | C2 | B |
| | | | | 1 | 1 | 0 | 1 | | 1 | 0 | 0 | 0 | 0 | 1 | 0 | | 1 | 0 | 1 | C2 | D |
| | | | | 1 | 1 | 1 | 0 | | 1 | 0 | 0 | 0 | 0 | 1 | 1 | | 0 | 1 | 1 | C3 | B |
| | | | | 1 | 1 | 1 | 1 | | 1 | 0 | 0 | 0 | 0 | 1 | 1 | | 1 | 0 | 1 | C3 | D |

*Fig. 32g*

| ZEROB4 | ZEROB3 | ZEROB2 | ZEROB1 | ZEROBØ | ONECØ1 | ONECØ2 | ONECØ2 | UNUSED | Exponent | | | | | | | UNUSED | Mux Select | | | | |
|---|---|---|---|---|---|---|---|---|---|---|---|---|---|---|---|---|---|---|---|---|---|
| $A_8$ | $A_7$ | $A_6$ | $A_5$ | $A_4$ | $A_3$ | $A_2$ | $A_1$ | $O_4$ | $O_3$ | $O_2$ | $O_1$ | $O_4$ | $O_3$ | $O_2$ | $O_1$ | $O_4$ | $O_3$ | $O_2$ | $O_1$ | | |
| 1 | 1 | 1 | 0 | 0 | 0 | 0 | 0 | 1 | 1 | 0 | 0 | 0 | 0 | 0 | 0 | 1 | 0 | 1 | 1 | C0 | B |
| | | | | 0 | 0 | 0 | 1 | | 1 | 0 | 0 | 0 | 0 | 0 | 0 | | 1 | 0 | 1 | C0 | D |
| | | | | 0 | 0 | 1 | 0 | | 1 | 0 | 0 | 0 | 0 | 0 | 1 | | 0 | 1 | 1 | C1 | B |
| | | | | 0 | 0 | 1 | 1 | | 1 | 0 | 0 | 0 | 0 | 0 | 1 | | 1 | 0 | 1 | C1 | D |
| | | | | 0 | 1 | 0 | 0 | | 1 | 0 | 0 | 0 | 0 | 1 | 0 | | 0 | 1 | 1 | C2 | B |
| | | | | 0 | 1 | 0 | 1 | | 1 | 0 | 0 | 0 | 0 | 1 | 0 | | 1 | 0 | 1 | C2 | D |
| | | | | 0 | 1 | 1 | 0 | | 1 | 0 | 0 | 0 | 0 | 1 | 1 | | 0 | 1 | 1 | C3 | B |
| | | | | 0 | 1 | 1 | 1 | | 1 | 0 | 0 | 0 | 0 | 1 | 1 | | 1 | 0 | 1 | C3 | D |
| 1 | 1 | 1 | 0 | 1 | 0 | 0 | 0 | | 0 | 1 | 1 | 1 | 1 | 1 | 1 | | 0 | 1 | 0 | BF | A |
| | | | | 1 | 0 | 0 | 1 | | 1 | 0 | 0 | 0 | 0 | 0 | 0 | | 1 | 0 | 1 | C0 | D |
| | | | | 1 | 0 | 1 | 0 | | 1 | 0 | 0 | 0 | 0 | 0 | 1 | | 0 | 1 | 1 | C1 | B |
| | | | | 1 | 0 | 1 | 1 | | 1 | 0 | 0 | 0 | 0 | 0 | 1 | | 1 | 0 | 1 | C1 | D |
| | | | | 1 | 1 | 0 | 0 | | 1 | 0 | 0 | 0 | 0 | 1 | 0 | | 0 | 1 | 1 | C2 | B |
| | | | | 1 | 1 | 0 | 1 | | 1 | 0 | 0 | 0 | 0 | 1 | 0 | | 1 | 0 | 1 | C2 | D |
| | | | | 1 | 1 | 1 | 0 | | 1 | 0 | 0 | 0 | 0 | 1 | 1 | | 0 | 1 | 1 | C3 | B |
| | | | | 1 | 1 | 1 | 1 | | 1 | 0 | 0 | 0 | 0 | 1 | 1 | | 1 | 0 | 1 | C3 | D |
| 1 | 1 | 1 | 1 | 0 | 0 | 0 | 0 | | 1 | 0 | 0 | 0 | 0 | 0 | 0 | | 0 | 1 | 1 | C0 | B |
| | | | | 0 | 0 | 0 | 1 | | 1 | 0 | 0 | 0 | 0 | 0 | 0 | | 1 | 0 | 1 | C0 | D |
| | | | | 0 | 0 | 1 | 0 | | 1 | 0 | 0 | 0 | 0 | 0 | 1 | | 0 | 1 | 1 | C1 | B |
| | | | | 0 | 0 | 1 | 1 | | 1 | 0 | 0 | 0 | 0 | 0 | 1 | | 1 | 0 | 1 | C1 | D |
| | | | | 0 | 1 | 0 | 0 | | 1 | 0 | 0 | 0 | 0 | 1 | 0 | | 0 | 1 | 1 | C2 | B |
| | | | | 0 | 1 | 0 | 1 | | 1 | 0 | 0 | 0 | 0 | 1 | 0 | | 1 | 0 | 1 | C2 | D |
| | | | | 0 | 1 | 1 | 0 | | 1 | 0 | 0 | 0 | 0 | 1 | 1 | | 0 | 1 | 1 | C3 | B |
| | | | | 0 | 1 | 1 | 1 | | 1 | 0 | 0 | 0 | 0 | 1 | 1 | | 1 | 0 | 1 | C3 | D |
| 1 | 1 | 1 | 1 | 1 | 0 | 0 | 0 | | 0 | 0 | 0 | 0 | 0 | 0 | 0 | | 0 | 0 | 0 | 00 | 8 |
| | | | | 1 | 0 | 0 | 1 | | 1 | 0 | 0 | 1 | 0 | 0 | 0 | | 1 | 0 | 1 | C0 | D |
| | | | | 1 | 0 | 1 | 0 | | 1 | 0 | 0 | 0 | 0 | 0 | 1 | | 0 | 1 | 1 | C1 | B |
| | | | | 1 | 0 | 1 | 1 | | 1 | 0 | 0 | 0 | 0 | 0 | 1 | | 1 | 0 | 1 | C1 | D |
| | | | | 1 | 1 | 0 | 0 | | 1 | 0 | 0 | 0 | 0 | 1 | 0 | | 0 | 1 | 1 | C2 | B |
| | | | | 1 | 1 | 0 | 1 | | 1 | 0 | 0 | 0 | 0 | 1 | 0 | | 1 | 0 | 1 | C2 | D |
| | | | | 1 | 1 | 1 | 0 | | 1 | 0 | 0 | 0 | 0 | 1 | 1 | | 0 | 1 | 1 | C3 | B |
| | | | | 1 | 1 | 1 | 1 | | 1 | 0 | 0 | 0 | 0 | 1 | 1 | | 1 | 0 | 1 | C3 | D |

*Fig. 32h*

| | IBM/QUART- | SCANADØ | SCANAD1 | SCANAD2 | SCABØWID3 | SCAB0WID2 | SCAB0WID1 | SCAB0WIDØ | SCAB1WID3 | SCABIWID2 | SCAB1WID1 | SCAB1WIDØ |
|---|---|---|---|---|---|---|---|---|---|---|---|---|
| Ø | × | × | × | × | Ø | Ø | Ø | Ø | Ø | Ø | Ø | Ø |
| 1 | Ø | Ø | Ø | Ø | Ø | Ø | Ø | Ø | Ø | Ø | Ø | 1 |
| 1 | Ø | Ø | Ø | 1 | Ø | Ø | Ø | Ø | Ø | Ø | 1 | Ø |
| 1 | Ø | Ø | 1 | Ø | Ø | Ø | Ø | Ø | Ø | 1 | Ø | Ø |
| 1 | Ø | Ø | 1 | 1 | Ø | Ø | Ø | Ø | 1 | Ø | Ø | Ø |
| 1 | Ø | 1 | Ø | Ø | Ø | Ø | Ø | 1 | Ø | Ø | Ø | Ø |
| 1 | Ø | 1 | Ø | 1 | Ø | Ø | 1 | Ø | Ø | Ø | Ø | Ø |
| 1 | Ø | 1 | 1 | Ø | Ø | 1 | Ø | Ø | Ø | Ø | Ø | Ø |
| 1 | Ø | 1 | 1 | 1 | 1 | Ø | Ø | Ø | Ø | Ø | Ø | Ø |
| 1 | 1 | Ø | Ø | Ø | Ø | Ø | Ø | Ø | Ø | Ø | 1 | 1 |
| 1 | 1 | Ø | Ø | 1 | Ø | Ø | Ø | Ø | 1 | 1 | Ø | Ø |
| 1 | 1 | Ø | 1 | Ø | Ø | Ø | 1 | 1 | Ø | Ø | Ø | Ø |
| 1 | 1 | Ø | 1 | 1 | 1 | 1 | Ø | Ø | Ø | Ø | Ø | Ø |
| 1 | 1 | 1 | Ø | Ø | Ø | Ø | Ø | Ø | Ø | Ø | 1 | 1 |
| 1 | 1 | 1 | Ø | 1 | Ø | Ø | Ø | Ø | 1 | 1 | Ø | Ø |
| 1 | 1 | 1 | 1 | Ø | Ø | Ø | 1 | 1 | Ø | Ø | Ø | Ø |
| 1 | 1 | 1 | 1 | 1 | 1 | 1 | Ø | Ø | Ø | Ø | Ø | Ø |

SCAN BUFFER WRITE ENABLE PROM MAP

*Fig. 35*

| | IBM/QUART | SCANADØ | SCANAD1 | SCANAD2 | SCAB1THIRT3 | SCABITHIRT1 | SCABØTHIRT3 | SCABØTHIRT1 | SCAB1QUD3 | SCAB1QUD1 | SCABØQUD3 | SCABØQUD1 |
|---|---|---|---|---|---|---|---|---|---|---|---|---|
| Ø | X | X | X | X | Ø | Ø | Ø | Ø | Ø | Ø | Ø | Ø |
| 1 | Ø | Ø | Ø | Ø | Ø | Ø | Ø | Ø | Ø | Ø | Ø | Ø |
| 1 | Ø | Ø | Ø | 1 | Ø | Ø | Ø | Ø | Ø | Ø | Ø | 1 |
| 1 | Ø | Ø | 1 | Ø | Ø | Ø | Ø | Ø | Ø | Ø | Ø | Ø |
| 1 | Ø | Ø | 1 | 1 | Ø | Ø | Ø | Ø | Ø | Ø | 1 | Ø |
| 1 | Ø | 1 | Ø | Ø | Ø | Ø | Ø | Ø | Ø | Ø | Ø | Ø |
| 1 | Ø | 1 | Ø | 1 | Ø | Ø | Ø | Ø | Ø | 1 | Ø | Ø |
| 1 | Ø | 1 | 1 | Ø | Ø | Ø | Ø | Ø | Ø | Ø | Ø | Ø |
| 1 | Ø | 1 | 1 | 1 | Ø | Ø | Ø | Ø | 1 | Ø | Ø | Ø |
| 1 | 1 | Ø | Ø | Ø | Ø | Ø | Ø | 1 | Ø | Ø | Ø | Ø |
| 1 | 1 | Ø | Ø | 1 | Ø | Ø | 1 | Ø | Ø | Ø | Ø | Ø |
| 1 | 1 | Ø | 1 | Ø | Ø | 1 | Ø | Ø | Ø | Ø | Ø | Ø |
| 1 | 1 | Ø | 1 | 1 | 1 | Ø | Ø | Ø | Ø | Ø | Ø | Ø |
| 1 | 1 | 1 | Ø | Ø | Ø | Ø | Ø | 1 | Ø | Ø | Ø | Ø |
| 1 | 1 | 1 | Ø | 1 | Ø | Ø | 1 | Ø | Ø | Ø | Ø | Ø |
| 1 | 1 | 1 | 1 | Ø | Ø | 1 | Ø | Ø | Ø | Ø | Ø | Ø |
| 1 | 1 | 1 | 1 | 1 | 1 | Ø | Ø | Ø | Ø | Ø | Ø | Ø |

SCAN BUFFER INPUT DATA ENABLE PROM MAP

*Fig. 36*

| LIENRCD- | IBM/QUART- | SCANADØ | SCANAD1 | SCANAD2 | SCANSP3 | SCANSP2 | SCANSP1 | SCANSPØ | SCAØ | SBUF1 | SBUFØ | SBUSWI- |
|---|---|---|---|---|---|---|---|---|---|---|---|---|
| Ø | Ø | Ø | Ø | Ø | Ø | Ø | Ø | Ø | 1 | 1 | Ø | Ø |
| Ø | Ø | Ø | Ø | 1 | Ø | Ø | Ø | Ø | Ø | 1 | Ø | Ø |
| Ø | Ø | Ø | 1 | Ø | Ø | Ø | Ø | Ø | Ø | 1 | Ø | Ø |
| Ø | Ø | Ø | 1 | 1 | Ø | Ø | Ø | Ø | Ø | 1 | Ø | Ø |
| Ø | Ø | 1 | Ø | Ø | Ø | Ø | Ø | Ø | 1 | Ø | 1 | Ø |
| Ø | Ø | 1 | Ø | 1 | Ø | Ø | Ø | Ø | Ø | Ø | 1 | Ø |
| Ø | Ø | 1 | 1 | Ø | Ø | Ø | Ø | Ø | Ø | Ø | 1 | Ø |
| Ø | Ø | 1 | 1 | 1 | Ø | Ø | Ø | Ø | Ø | Ø | 1 | Ø |
| Ø | 1 | Ø | Ø | Ø | Ø | Ø | Ø | Ø | 1 | 1 | Ø | Ø |
| Ø | 1 | Ø | Ø | 1 | Ø | Ø | Ø | Ø | Ø | 1 | Ø | Ø |
| Ø | 1 | Ø | 1 | Ø | Ø | Ø | Ø | Ø | 1 | Ø | 1 | Ø |
| Ø | 1 | Ø | 1 | 1 | Ø | Ø | Ø | Ø | Ø | Ø | 1 | Ø |
| Ø | 1 | 1 | Ø | Ø | Ø | Ø | Ø | Ø | 1 | 1 | Ø | Ø |
| Ø | 1 | 1 | Ø | 1 | Ø | Ø | Ø | Ø | Ø | 1 | Ø | Ø |
| Ø | 1 | 1 | 1 | Ø | Ø | Ø | Ø | Ø | 1 | Ø | 1 | Ø |
| Ø | 1 | 1 | 1 | 1 | Ø | Ø | Ø | Ø | Ø | Ø | 1 | Ø |
| 1 | Ø | Ø | Ø | Ø | Ø | Ø | Ø | Ø | 1 | Ø | 1 | Ø |
| 1 | Ø | Ø | Ø | 1 | Ø | Ø | Ø | Ø | Ø | Ø | 1 | 1 |
| 1 | Ø | Ø | 1 | Ø | Ø | Ø | Ø | Ø | Ø | Ø | 1 | 1 |
| 1 | Ø | Ø | 1 | 1 | Ø | Ø | Ø | Ø | Ø | Ø | 1 | 1 |
| 1 | Ø | 1 | Ø | Ø | Ø | Ø | Ø | Ø | 1 | 1 | Ø | Ø |
| 1 | Ø | 1 | Ø | 1 | Ø | Ø | Ø | Ø | Ø | 1 | Ø | 1 |
| 1 | Ø | 1 | 1 | Ø | Ø | Ø | Ø | Ø | Ø | 1 | Ø | 1 |
| 1 | Ø | 1 | 1 | 1 | Ø | Ø | Ø | Ø | Ø | 1 | Ø | 1 |
| 1 | 1 | Ø | Ø | Ø | Ø | Ø | Ø | Ø | 1 | Ø | 1 | Ø |
| 1 | 1 | Ø | Ø | 1 | Ø | Ø | Ø | Ø | Ø | Ø | 1 | 1 |
| 1 | 1 | Ø | 1 | Ø | Ø | Ø | Ø | Ø | 1 | 1 | Ø | Ø |
| 1 | 1 | Ø | 1 | 1 | Ø | Ø | Ø | Ø | Ø | 1 | Ø | 1 |
| 1 | 1 | 1 | Ø | Ø | Ø | Ø | Ø | Ø | 1 | Ø | 1 | Ø |
| 1 | 1 | 1 | Ø | 1 | Ø | Ø | Ø | Ø | Ø | Ø | 1 | 1 |
| 1 | 1 | 1 | 1 | Ø | Ø | Ø | Ø | Ø | 1 | 1 | Ø | Ø |
| 1 | 1 | 1 | 1 | 1 | Ø | Ø | Ø | Ø | Ø | 1 | Ø | 1 |

SCAN BUFFER ADDRESS SELECTOR AND SWITCH PROM

*Fig. 37*

TIMING FOR NUMBER OF CHANNELS TO SKIP, NUMBER OF ACTIVE CHANNELS AND SCAN BUFFER WRITE ENABLE.
[NUCS = 0, NACH = 15 (ONE LESS THAN THE NUMBER OF STROBES)]

FROM FIG.38a

TIMING FOR NUMBER OF CHANNELS TO SKIP, NUMBER OF ACTIVE CHANNELS AND SCAN BUFFER WRITE ENABLE. (NUCS = 8, NACH = 7)

TO FIG. 47b

32-BIT, FIXED-POINT TO 32-BIT, HEXADECIMAL EXPONENT, FLOATING-POINT FORMAT CONVERSION FLOW CHART

32-BIT, HEXADECIMAL EXPONENT, FLOATING-POINT TO 32-BIT, FIXED-POINT FORMAT CONVERSION FLOW CHART

16-BIT, FIXED-POINT TO 32-BIT, HEXADECIMAL EXPONENT, FLOATING-POINT FORMAT CONVERSION FLOW CHART

| FCIR- $A_8$ | IRADOUT (1) $A_7$ | (2) $A_6$ | (3) $A_5$ | (4) $A_4$ | (5) $A_3$ | (6) $A_2$ | (7) $A_1$ | (8) $A_0$ | $O_4$ | FIXOVRFL- $O_3$ | FIXUNDRFL- $O_2$ | CLRDRMUX- $O_1$ | | |
|---|---|---|---|---|---|---|---|---|---|---|---|---|---|---|
| 0 | 0 | 0 | 0 | 0 | 0 | 0 | 0 | 0 | | 1 | 1 | 0 | E | Zero |
| 0 | 0 | 0 | 0 | 0 | 0 | 0 | 0 | 1 | | 1 | 0 | 0 | C | |
| . | . | . | . | . | . | . | . | . | | . | . | . | . | |
| . | . | . | . | . | . | . | . | . | | . | . | . | . | Underflow |
| . | . | . | . | . | . | . | . | . | | . | . | . | . | |
| 0 | 0 | 1 | 1 | 1 | 1 | 1 | 1 | 1 | | 1 | 0 | 0 | C | |
| 0 | 1 | 0 | 0 | 0 | 0 | 0 | 0 | X | | 1 | 0 | 0 | C | |
| 0 | 1 | 0 | 0 | 0 | 0 | 0 | 1 | X | | 1 | 1 | 1 | F | |
| 0 | 1 | 0 | 0 | 0 | 0 | 1 | 0 | X | | 1 | 1 | 1 | F | |
| 0 | 1 | 0 | 0 | 0 | 0 | 1 | 1 | X | | 1 | 1 | 1 | F | |
| 0 | 1 | 0 | 0 | 0 | 1 | 0 | 0 | 0 | | 1 | 1 | 1 | F | |
| 0 | 1 | 0 | 0 | 0 | 1 | 0 | 0 | 1 | | 1 | 1 | 1 | F | |
| 0 | 1 | 0 | 0 | 0 | 1 | 0 | 1 | 0 | | 1 | 1 | 1 | F | |
| 0 | 1 | 0 | 0 | 0 | 1 | 0 | 1 | 1 | | 1 | 1 | 1 | F | |
| 0 | 1 | 0 | 0 | 0 | 1 | 1 | 0 | 0 | | 1 | 1 | 1 | F | |
| 0 | 1 | 0 | 0 | 0 | 1 | 1 | 0 | 1 | | 1 | 1 | 1 | F | |
| 0 | 1 | 0 | 0 | 0 | 1 | 1 | 1 | 0 | | 1 | 1 | 1 | F | |
| 0 | 1 | 0 | 0 | 0 | 1 | 1 | 1 | 1 | | 1 | 1 | 1 | F | |
| 0 | 1 | 0 | 0 | 1 | 0 | 0 | 0 | 0 | | 1 | 1 | 1 | F | |
| 0 | 1 | 0 | 0 | 1 | 0 | 0 | 0 | 1 | | 0 | 1 | 1 | B | |
| . | . | . | . | . | . | . | . | . | | . | . | . | . | |
| . | . | . | . | . | . | . | . | . | | . | . | . | . | Overflow |
| . | . | . | . | . | . | . | . | . | | . | . | . | . | |
| 0 | 1 | 1 | 1 | 1 | 1 | 1 | 1 | 1 | | 0 | 1 | 1 | B | |
| 1 | 0 | 0 | 0 | 0 | 0 | 0 | 0 | 0 | | 1 | 1 | 0 | E | Zero |
| 1 | 0 | 0 | 0 | 0 | 0 | 0 | 0 | 1 | | 1 | 0 | 0 | C | |
| . | . | . | . | . | . | . | . | . | | . | . | . | . | |
| . | . | . | . | . | . | . | . | . | | . | . | . | . | Underflow |
| . | . | . | . | . | . | . | . | . | | . | . | . | . | |
| 1 | 0 | 1 | 1 | 1 | 1 | 1 | 1 | 1 | | 1 | 0 | 0 | C | |
| 1 | 1 | 0 | 0 | 0 | 0 | 0 | 0 | X | | 1 | 0 | 0 | C | |
| 1 | 1 | 0 | 0 | 0 | 0 | 0 | 1 | X | | 1 | 1 | 1 | F | |
| 1 | 1 | 0 | 0 | 0 | 0 | 1 | 0 | X | | 1 | 1 | 1 | F | |
| 1 | 1 | 0 | 0 | 0 | 0 | 1 | 1 | X | | 1 | 1 | 1 | F | |
| 1 | 1 | 0 | 0 | 0 | 1 | 0 | 0 | 0 | | 1 | 1 | 1 | F | |
| 1 | 1 | 0 | 0 | 0 | 1 | 0 | 0 | 1 | | 0 | 1 | 1 | B | |
| . | . | . | . | . | . | . | . | . | | . | . | . | . | |
| . | . | . | . | . | . | . | . | . | | . | . | . | . | Overflow |
| . | . | . | . | . | . | . | . | . | | . | . | . | . | |
| 1 | 1 | 1 | 1 | 1 | 1 | 1 | 1 | 1 | | 0 | 1 | 1 | B | |

FLOATING-POINT TO FIXED-POINT PROM MAP

*Fig. 55*

GENERAL-PURPOSE ARRAY PROCESSOR

A microfiche appendix of 215 pages and 4 microfiche is part of the specification but not printed therewith.

BACKGROUND OF THE INVENTION

1. Field of the Invention

This invention relates to a general purpose array processor and more particularly to an array processor made up of autonomously operating units, including a fixed point and floating point arithmetic unit that is particularly optimized for performing the Fast Fourier Transform algorithm.

2. Prior Art

The problems which are solved by the use of array processors were originally solved by general purpose digital computers. However, because of the complex programming required to perform vector computations, the computing time was far too slow to adequately service real time computer requirements that are required in fields such as seismic data collection.

Special array processors were then designed for use with digital computers. U.S. Pat. No. 4,107,773 describes such a system. In this system, the array processor operates as a direct memory access peripheral device to a general purpose computer to address, fetch, process and store the data arrays in a central memory with a minimum of intervention by the general purpose computer. This type of system was a marked improvement over the general purpose computer for the particular type of computing tasks. However, as the amount of data to be processed has increased, further advances had to be made.

A state-of-the-art type of array processor has a host digital computer that communicates with a centralized controller and a plurality of functional units such as arithmetic units, forming an array processor. The host computer supplies the controller with user instructions. The controller then supplies the functional units with machine language instructions. The controller controls the ordering of operations in the functional units so that the system is limited by the necessary flow of information between the controller and the functional units.

The array processor of this invention eliminates the central controller and provides each functional unit with its own user instructions.

BRIEF SUMMARY OF THE INVENTION

The present processor is an array transform processor that performs high speed processing of arrays of data generally in floating point format, but also has fixed point capability.

The processor is made up of a plurality of functional units: host interface unit (HI); processor initialization and test unit (PIT); arithmatic unit (AU); transfer controller unit (TC). These units are all connected together through a system control bus (SCB). A bulk memory is connected to the HI and the TC. An input controller (IC) may be added by connecting to the SCB and to the bulk memory.

The host interface unit provides the interface between a digital host computer (Perkin-Elmer Model 3230, in this preferred embodiment) and the other units making up the array processor. The host computer transmits initialization commands and addresses to the host interface and the host interface transmits status information and interrupts to the host computer. The units making up the array processor are interconnected by the 16-bit system control bus (SCB). In this preferred embodiment, as many 15 devices may be connected at unique priorities to the SCB.

The bulk memory is connected to the devices that require access to it through a bulk memory data bus (AP), a 64-bit bus that operates at a data rate of six million, 64-bit words per second. Up to eight devices can be interfaced to the AP bus at unique priority levels.

Initially, system programs are down loaded via the SCB where they are sent to the appropriate device program memories.

Each of the devices making up the array processor have a writeable control store for storing microcode, a program memory for storing user instructions, a control unit for providing much of the control of the particular device (the control units of each device being substantially identical except for the processor initialization and test (PIT) device) and a device dependent unit which gives the particular device its unique functionality. Both the control unit and the device dependent unit are controlled by microcode and the control unit is also controlled by the user instructions. The program memory and the control store of each of these units is connected to the SCB.

Initially, microcode instructions are sent to the writeable control store of the individual devices and user programs are sent to the program memory of the individual devices. Also, any data required by specific programs is down loaded to the bulk memory via the AP Bus. Once initialized, an execution command generated by the host computer is accessed by the host interface. The host interface then activates the remainder of the devices to execute the previously down-loaded program.

A processor initialization and test (PIT) device is connected through the SCB to all of the other devices making up the array processor. The processor initialization device provides SCB priority arbitration, microcode control store verification through diagnostic signature analysis, and contains the master clock. The processor initialization device also has various testing capabilities. Further, it provides the host interface with initial microcode from a ROM for that purpose.

The transfer controller device grants access to the highest priority device attached to the AP bus in case of a simultaneous request. Each device is given a unique, fixed priority. The transfer controller device also performs block transfer of data between the bulk memory and arithmetic unit working store. In addition to generating the required bulk memory and working store addresses, the transfer controller formats data during the data transfer operation. This formatting includes fixed-to-floating point conversion as well as conversions between various floating point formats.

The arithmetic unit performs high speed fixed point and floating point arithmetic on data arrays that are located in the arithmetic unit working store. All computational elements are optimized to perform the Fast Fourier Transform (FFT) algorithm because a significant percentage of the array processor load involves the FFT. Although tailored to perform the FFT, the arithmetic unit has the flexibility through microprogramming to perform basic arithmetic algorithms efficiently, including add, subtract, multiply, divide, square root, log, anti-log and arc-tangent.

The devices so far identified perform computations on data supplied from the host computer. When the system is used for seismic data processing, as in this preferred embodiment, an input controller device is also provided. It is the interface between channel data (seismic data) and the array processor. The input controller reformats, internally buffers and outputs the channel data to a buffer located in the bulk memory. When one part of the bulk memory buffer becomes filled, the input controller so notifies the transfer controller over the SCB and then begins loading the channel data into the next buffer memory buffer. This process of transferring data to bulk memory and alternating buffers continues until a specified number of samples has been sent to bulk memory. The input controller is then reactivated to handle the next input record data. Through the buffering technique, the input data may be organized in the bulk memory so that the bulk memory may be sequentially accessed for data flow through the transfer controller to the arithmetic unit.

In summary, an array processor is made up of individual, independently operating units. When properly, independently programmed, the units perform their particular function of a given problem, signal when they are through with their particular function to permit transfer of the results of that function to be used in another unit. In this manner, arrays of data can be processed at extremely high rates of speed.

The principal object of this invention, therefore, is to provide an array processor that can process very large amounts of data in real time.

Another object of this invention is to provide an array processor that is made up of a number of independently operating, interrelated functional devices, each of which is separately programmed.

Still another object of this invention is to provide an array processor that is capable of processing data from a host computer and also from a data array source.

Still another object of this invention is to provide an array processor made up of interrelated, independent functional devices that differ in structure only by circuitry required to individualize the device.

These and other objects will be made evident in the detailed disclosure that follows.

BRIEF DESCRIPTION OF THE DRAWINGS

FIG. 13 illustrates the bit organization of the PROM in the PIT PROM controller.

FIGS. 14-1 through 14-25 form flowcharts illustrating the operation of the PIT PROM controller.

FIG. 15 illustrates the system clock timing.

FIG. 16 is a block diagram of the data bus selector of FIG. 11.

FIG. 17 is a block diagram of the system control bus access grant/arbitration of FIG. 11.

FIG. 18 illustrates the system control bus access timing.

FIG. 19 is a block diagram of the host interface.

FIG. 20 is a block diagram of the Mux bus interface and control.

FIG. 21 is a block diagram of the host interface control unit.

FIG. 22 is a block diagram of the addressable latches and status MUX of FIG. 21.

FIG. 23 is a diagram illustrating the instruction execution sequence of this invention.

FIG. 24 is a block diagram of the DMA transfer controller of FIG. 21.

FIGS. 25*a*–25*c* form a block diagram of the input controller address generation for bulk memory.

FIG. 29 is a map of the rounding control PROM for the input controller format transfer.

FIG. 30 is a map of the mantissa selector PROM for the input controller format conversion.

FIG. 31 is a map of the exponent and sign PROM for the input controller format conversion.

FIGS. 32*a*–32*h* form a map of the 32-bit hexadecimal format conversion for the input controller PROM.

FIG. 35 is a map of the scan buffer write enable PROM of the IC.

FIG. 36 is a map of the scan buffer input data enable PROM of the IC.

FIG. 37 is the scan buffer address selector and switch PROM map of the IC.

FIG. 55 is a map of the floating-point to fixed-point PROM of the transfer controller.

DETAILED DESCRIPTION OF THE INVENTION

Because of increasing resolution requirements in seismic exploration and the need to improve productivity and cycle time and delivery of final processed data, an advanced field system for seismic data collection was developed.

A major portion of that system is the array processor described and claimed herein. The array processor achieves very high operational speed through the system architecture which employs a number of individual devices. In this preferred embodiment, these devices are the host interface (HI), the transfer controller (TC), the arithmetic unit (AU), and the input controller (IC). The processor initialization and test (PIT) is still another device, but differing somewhat in structure. These devices are interrelated but are separately programmed via assembly language so that they operate independently of one another, supplying results when required. A bulk memory is connected to the devices for the storage of data originally from a host computer or from a source of seismic data.

Figure 1:
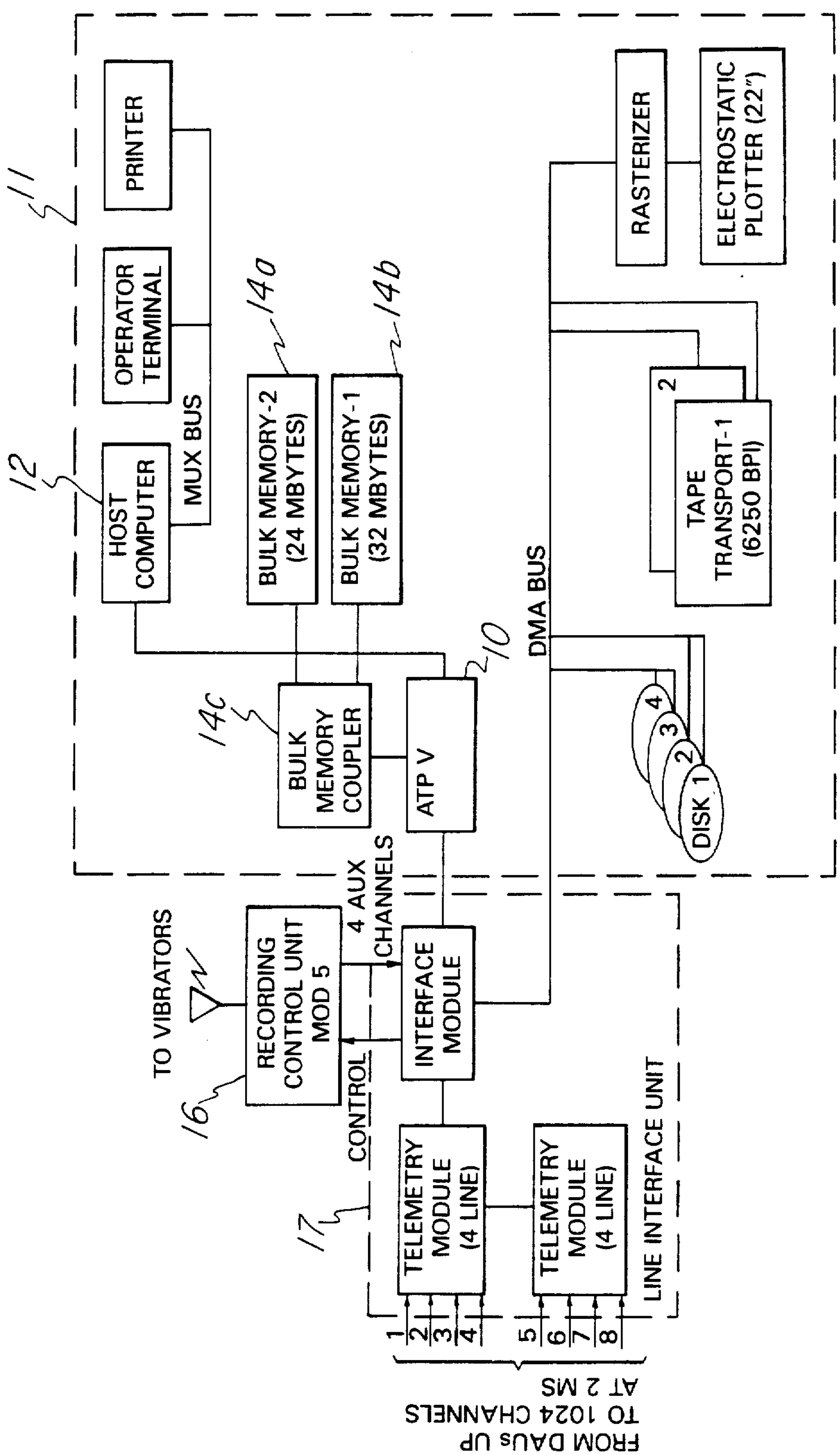
FIG. 1 illustrates the array processor of this invention in place within a data collection and recording system.

FIG. 1 illustrates a data collection and recording system. The array processor (ATPV) 10 is shown as part of the overall array processing system 11. Host computer 12 is shown connected to array processor 10 as is bulk memory coupler 14c to which bulk memories 14a and 14b are connected. Recording control unit 16 is shown connected to line interface unit 17 which in turn is connected to the array processing system for supplying seismic data thereto.

Figure 2:
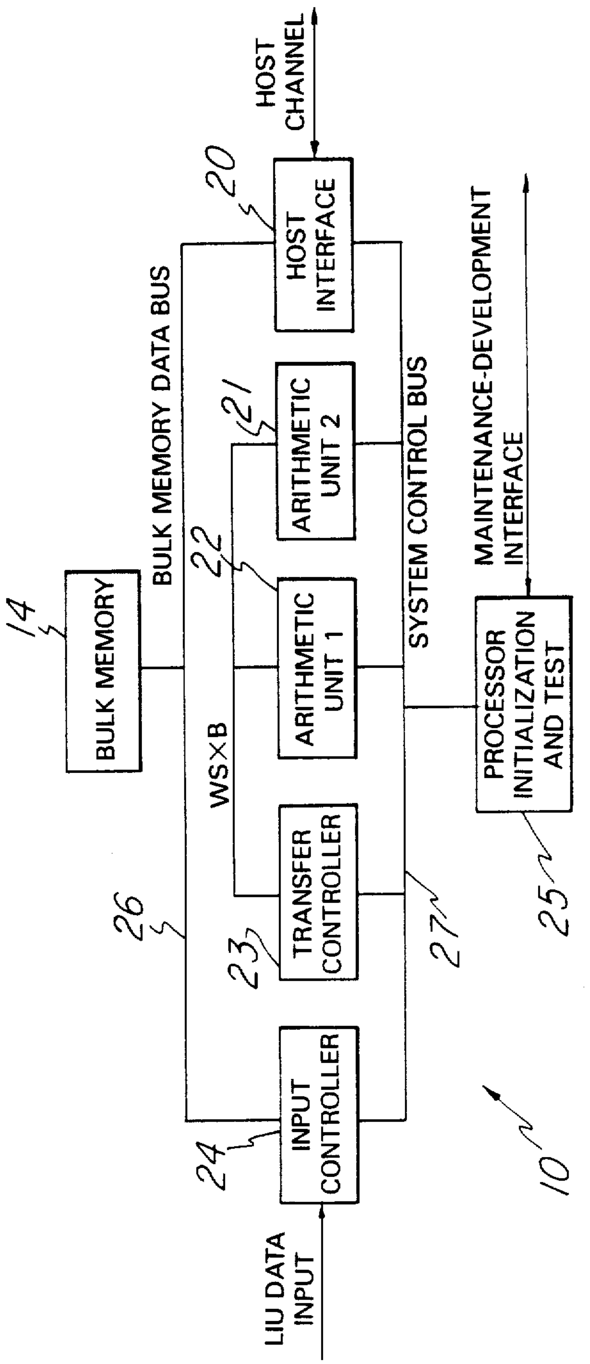
FIG. 2 is a block diagram of the array processor invention.

FIG. 2 is a block diagram of the array processor showing host interface (HI) 20, transfer controller (TC) 23 and input controller (IC) 24 all connected to bulk memory 14 through the array processory memory (APM) bus 26. Arithmetic units (AU) 21 and 22 are shown connected TC 23. PIT 25 is shown connected to HI 20, AU 21, AU 22, TC 23 and IC 24. The PIT provides the system 6 MHz clock and also provides priority arbitration for access to the system control bus 27. PIT 25 is used for diagnostic purposes and software development, functions which are not germaine to the invention described herein.

Data may come over the host channel to HI 20 and then through the array processory memory bus 26 to bulk memory 14. Another source of data is seismic data from the line interface unit 17 which comes into the IC 24, is reformatted and sent over array processor memory bus 26 to bulk memory 14. The HI 20 is provided with an executive program for the array processor. The executive program is made up of a microcode program and assembly language. HI 20 communicates with the host computer 12, providing data paths from the host computer 12 to the memories of the individual devices 20–24. The writeable control store 33 of each device is loaded with microcode and the program memory 31 (FIG. 3) of each device is loaded with assembly language instructions, all through system control bus 27. The HI 20, through its programming, checks the available size of the bulk memory 14 and the devices that are connected to form the array processor 10. That is, an IC 24 may not be connected, only one AU may be connected, etc. The HI 20 then notifies host computer 12 to load the devices with the appropriate microcode and assembly language. When the loading has been completed, host interface 20 indicates completion through a system clear line, allowing the devices to start operation.

HI 20 also acquires and interprets commands received from the host computer 12. Through the assembly language instructions, HI 20 provides the resource scheduling (all array processor devices) and collects and reports status.

IC 24 provides the data path for seismic data to be received from the line interface unit 17 and transferred to bulk memory 14. As the data passes through IC 24, it is modified under program control. The received data is in a two's-compliment, inverse gain, multiplexed format. IC 24 removes the gain and converts the data to either a 32 bit floating point or 16 bit quaternary format. The data is stored internally in IC 24 in scan buffers in multiplexed order. The scan buffers are accessed and the data is transmitted to bulk memory 14 in a demultiplexed format. The format demultiplexing control is provided by bulk memory address control within IC 24.

TC 23 provides priority arbitration between the various devices which request bulk memory 14 on AP bus 26. TC 27 also provides the data path from bulk memory 14 to AU's 21 and 22. In this preferred embodiment, AU's 21 and 22 are 32-bit floating point processors and the data path provided by TC 23 provides a number of format conversions in both directions. The selected conversion for use is under program control, however, common hardware is used for all conversions. The details of this conversion will be described later.

AU's 21 and 22 provide the array processor with its high speed fixed and floating point computational capability on arrays. The hardware is optimized towards the computation of the Fast Fourier Transform.

Figure 3:
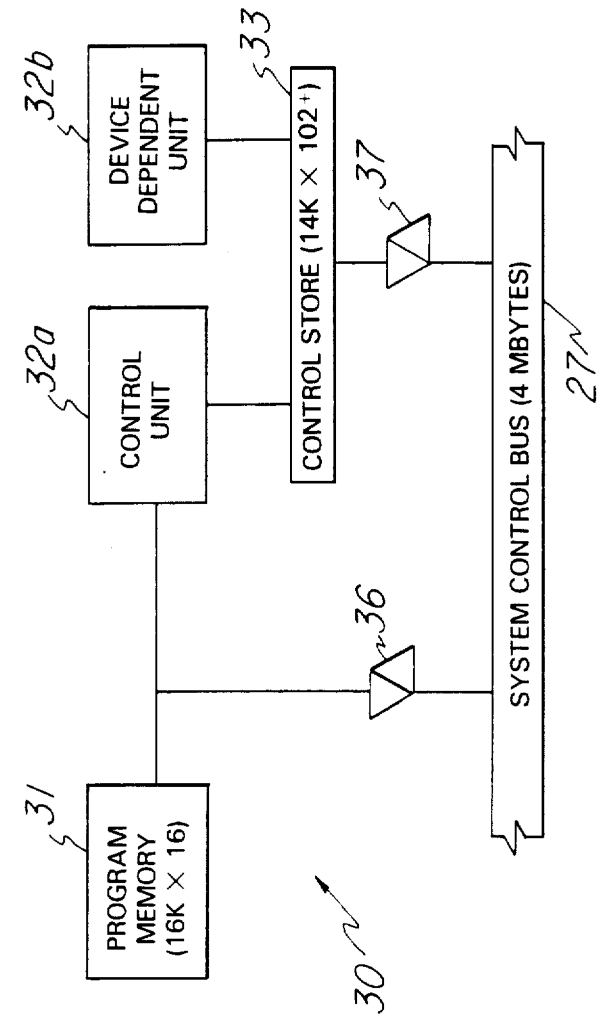
FIG. 3 is a block diagram of any individual device making up the array processor (except PIT).
Figure 4A:
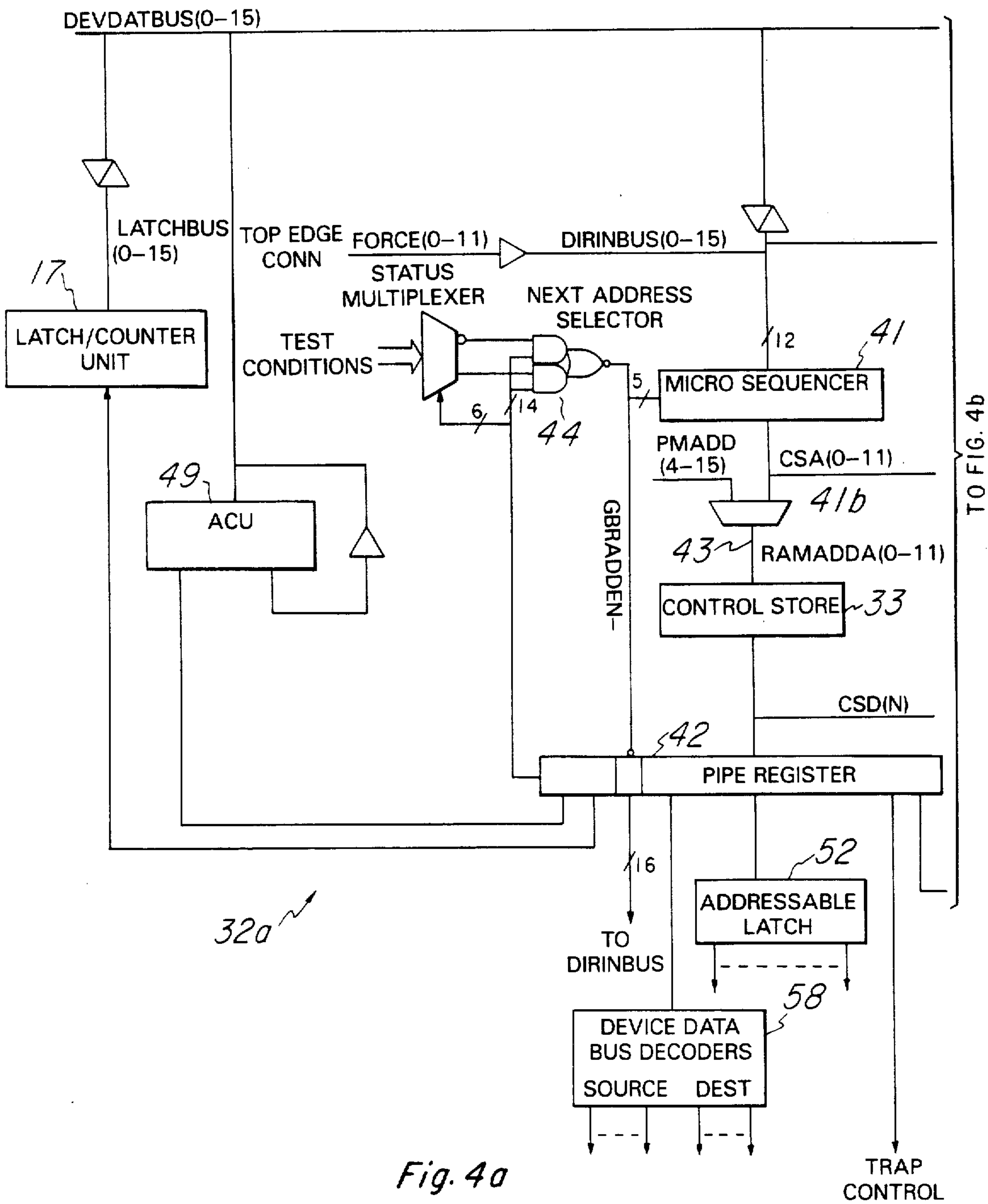
FIG. 4 is a block diagram of the control circuitry that is common to all of the devices making up the array processor (except PIT).
Figure 4B:
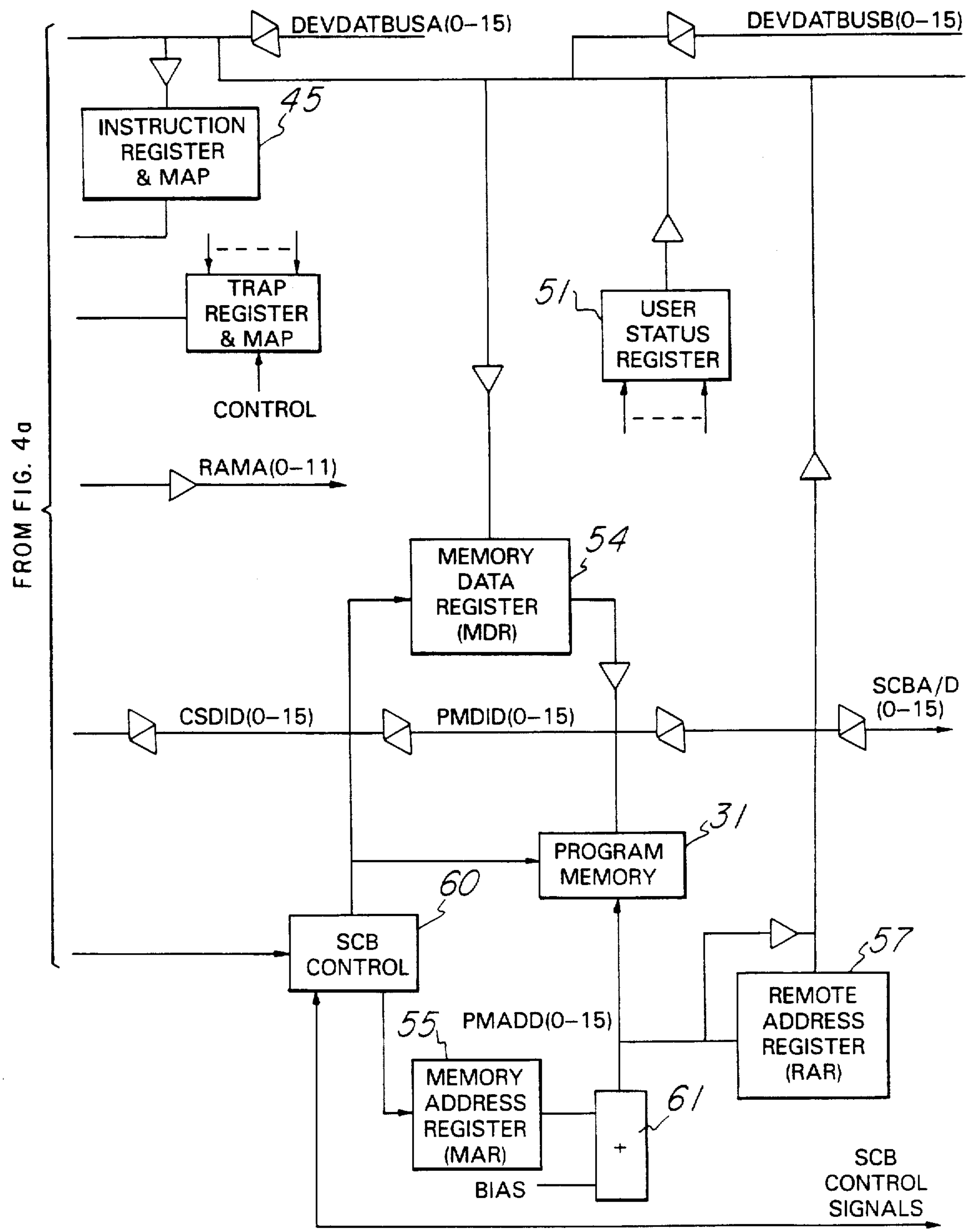

FIG. 3 shows array processor device 30 having program memory 31 for storing assembly language, writeable control store 33 for storing microcode, control unit 32a having circuitry common to all devices in the array processor and device dependent unit 32b illustrating generally circuitry that is peculiar to the particular device. Control units 32a and 32b are connected to control store 33. System control bus 27 is connected through line driver/receiver 36 to program memory 31 and control unit 32a. It is also connected, through line driver/receiver 37 to control store 33.

Figures 1, 14:
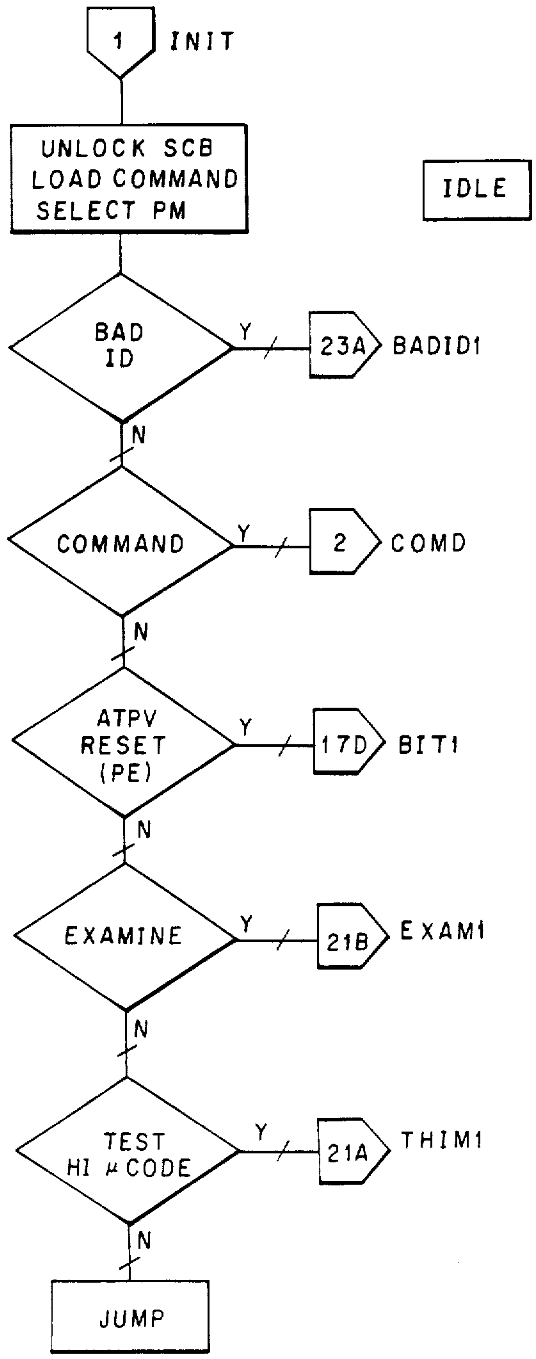
Figures 2, 14:
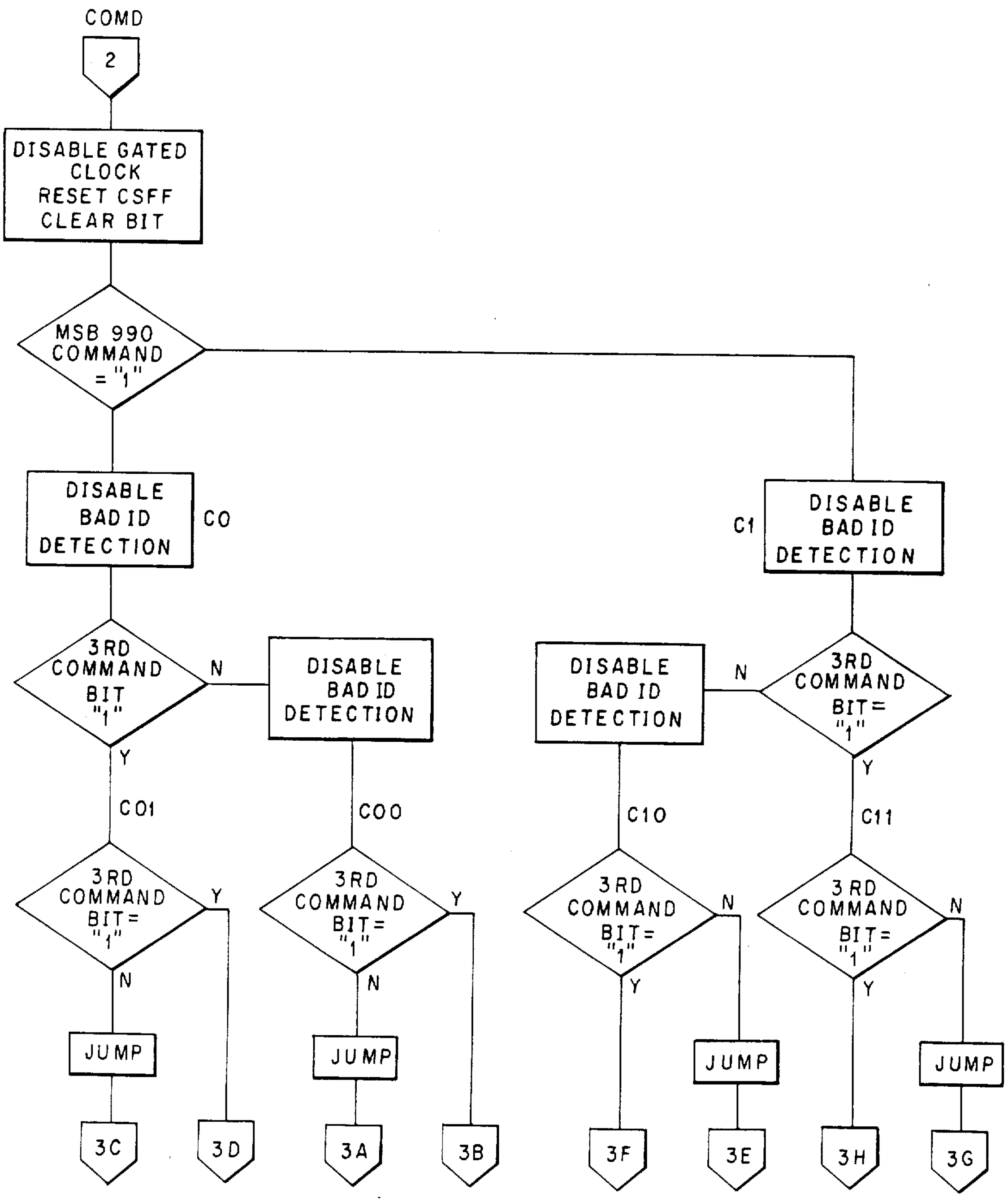
Figures 3, 14:
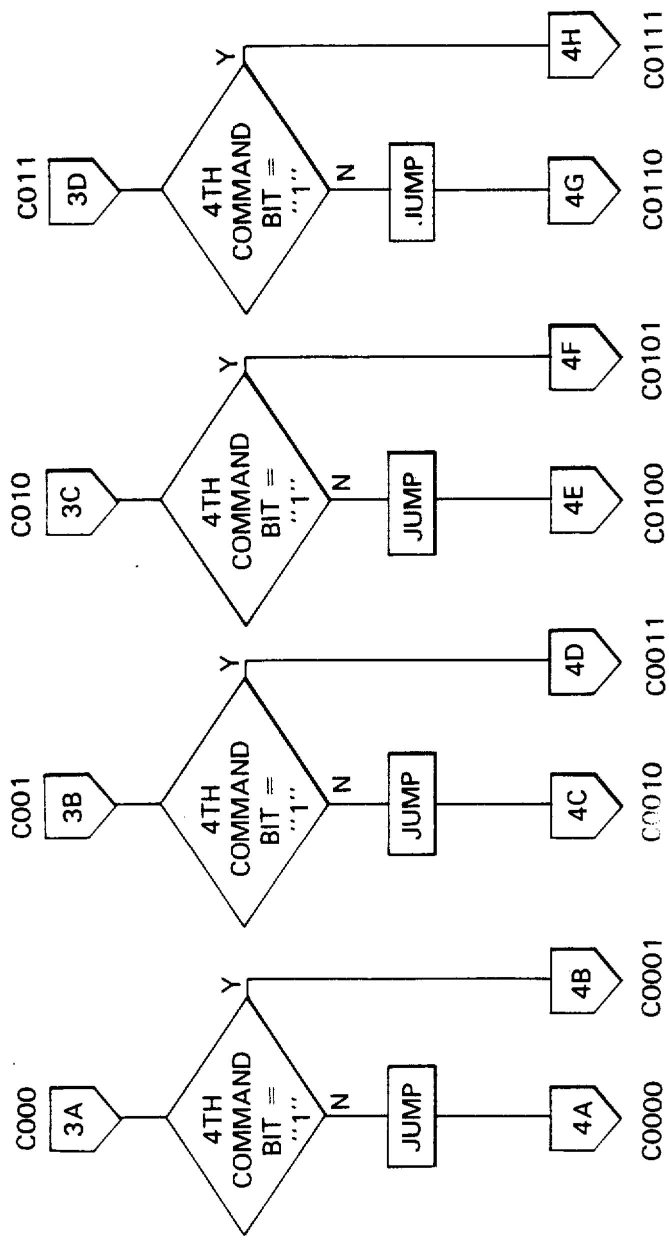
Figures 3, 14:
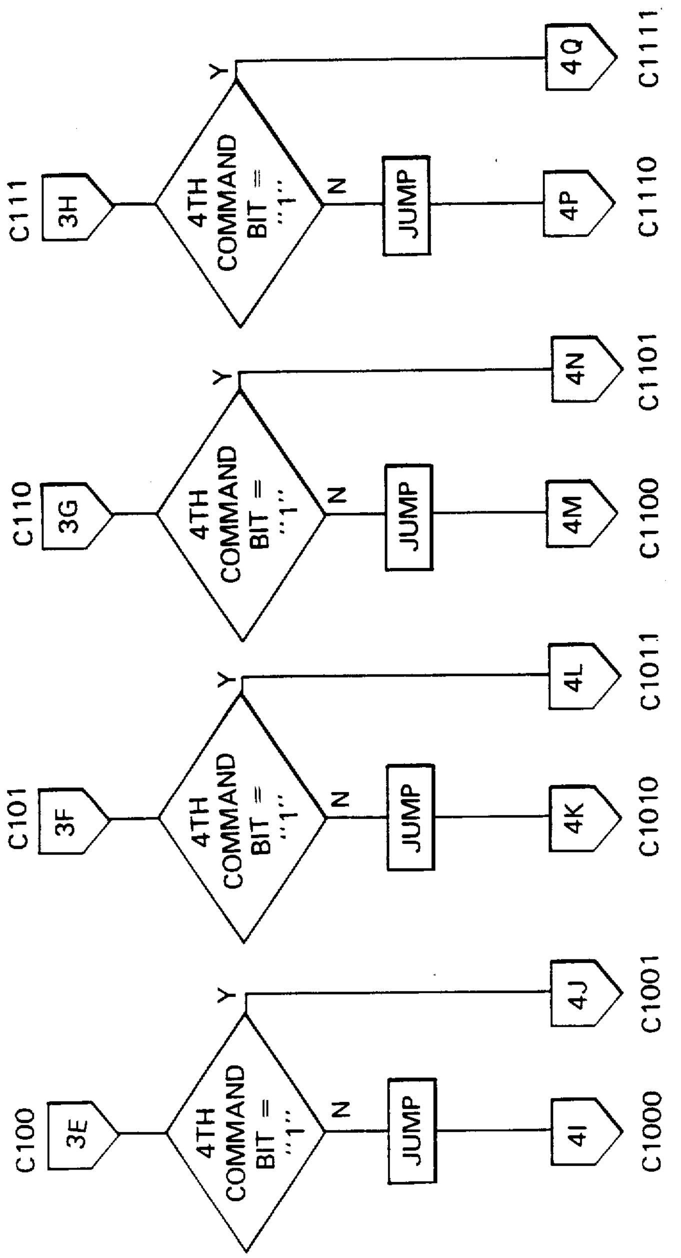
Figures 4, 14:
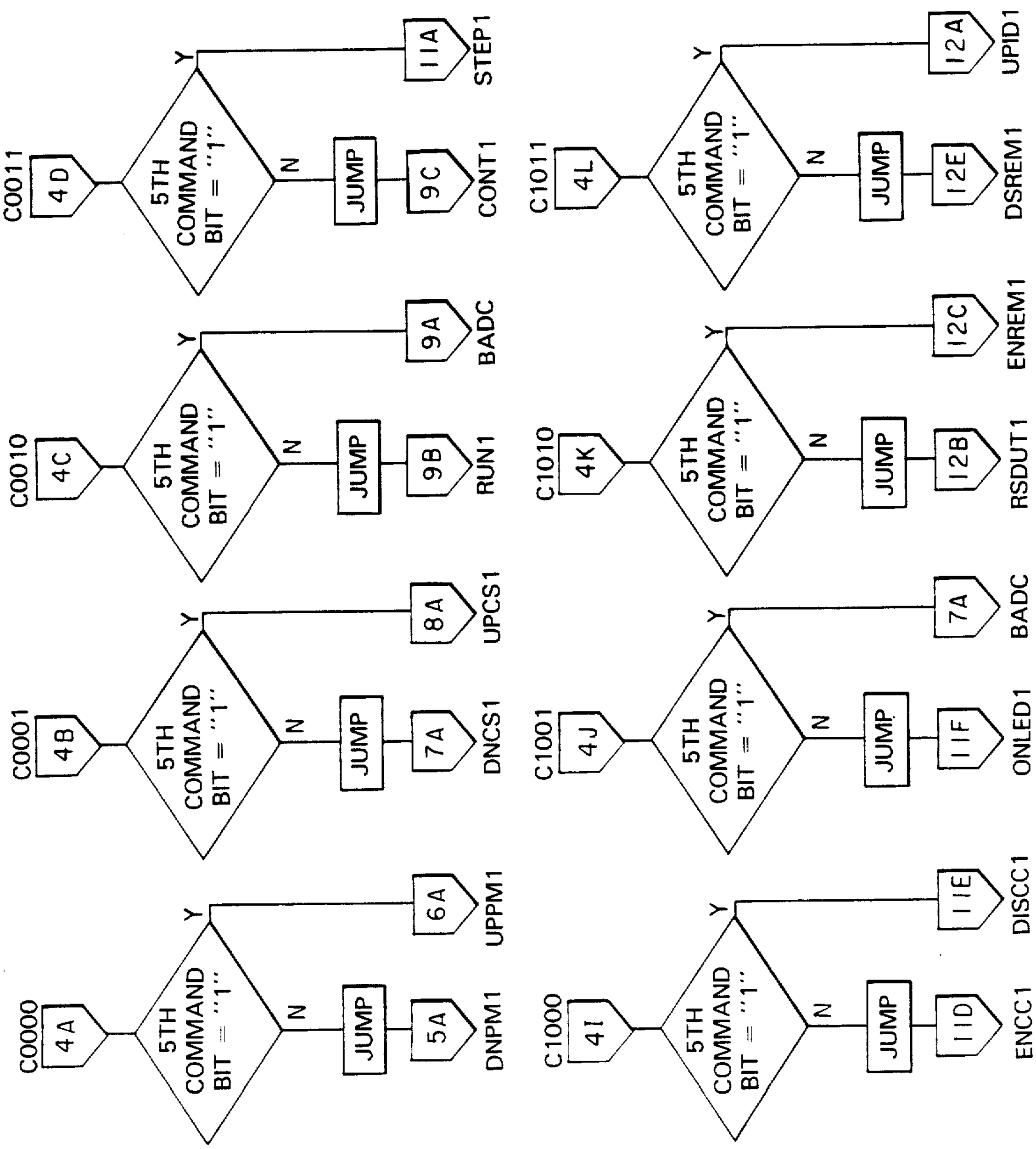
Figures 4, 14:
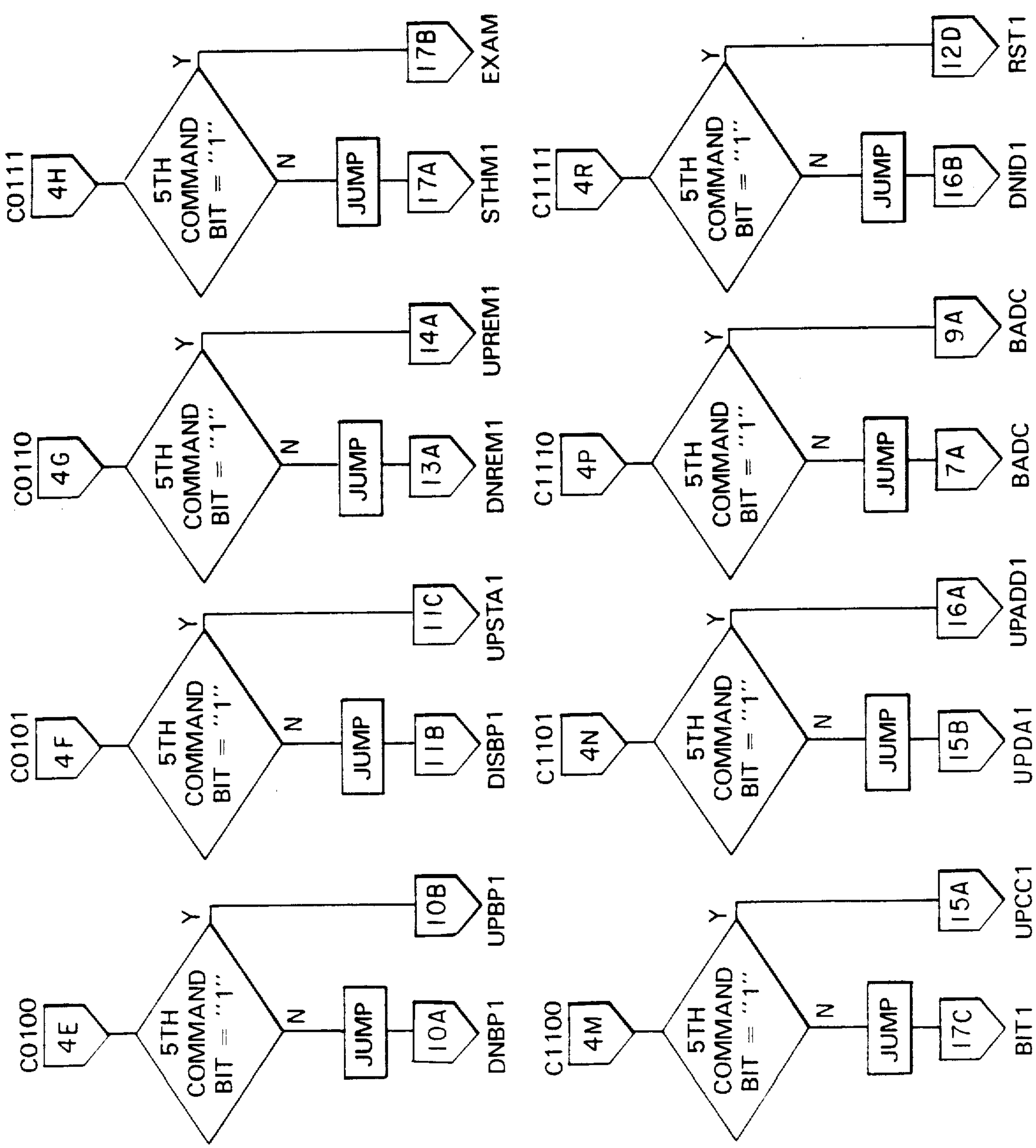
Figures 5, 14:
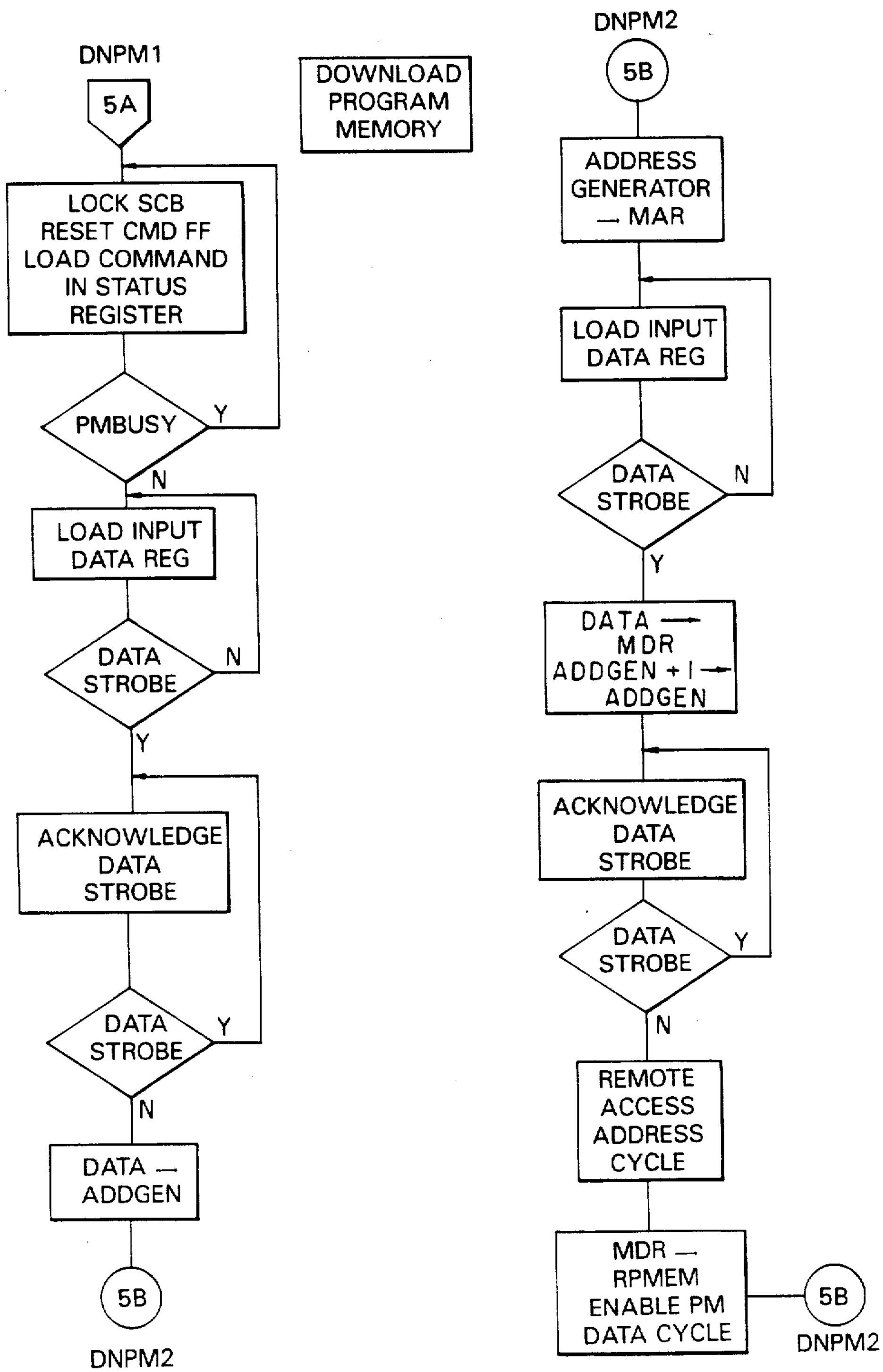
Figures 6, 14:
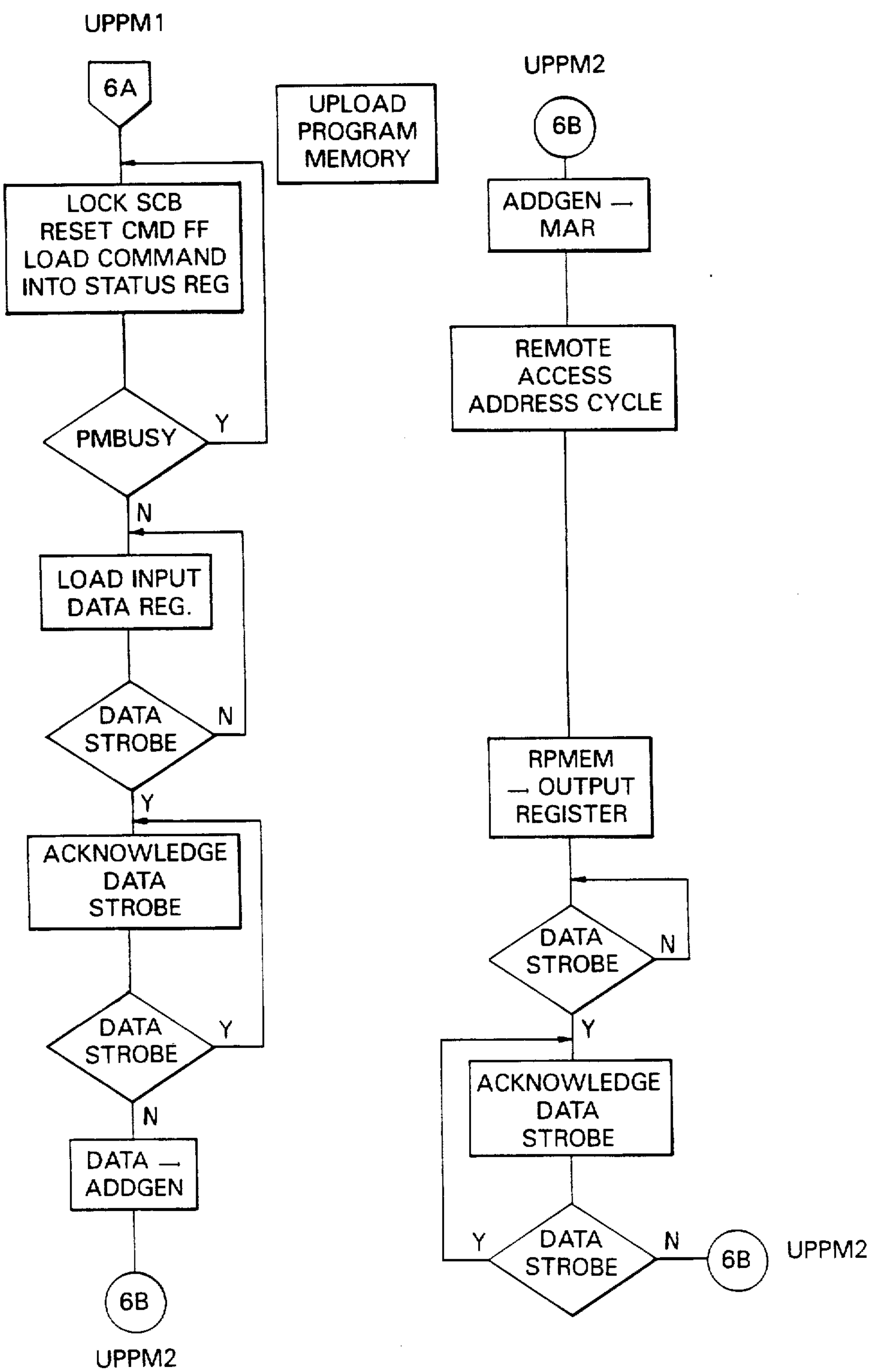
Figures 7, 14:
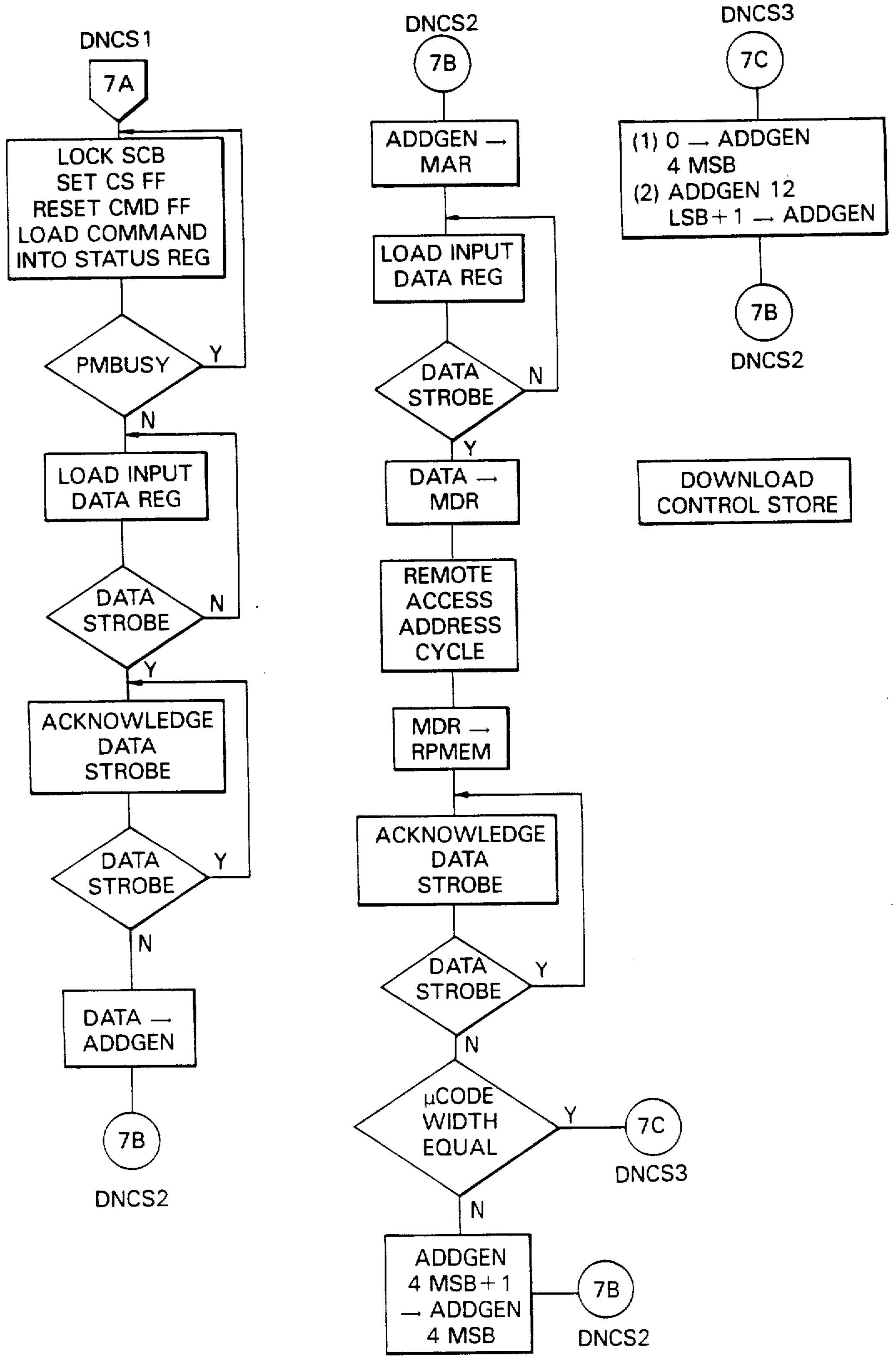
Figures 8, 14:
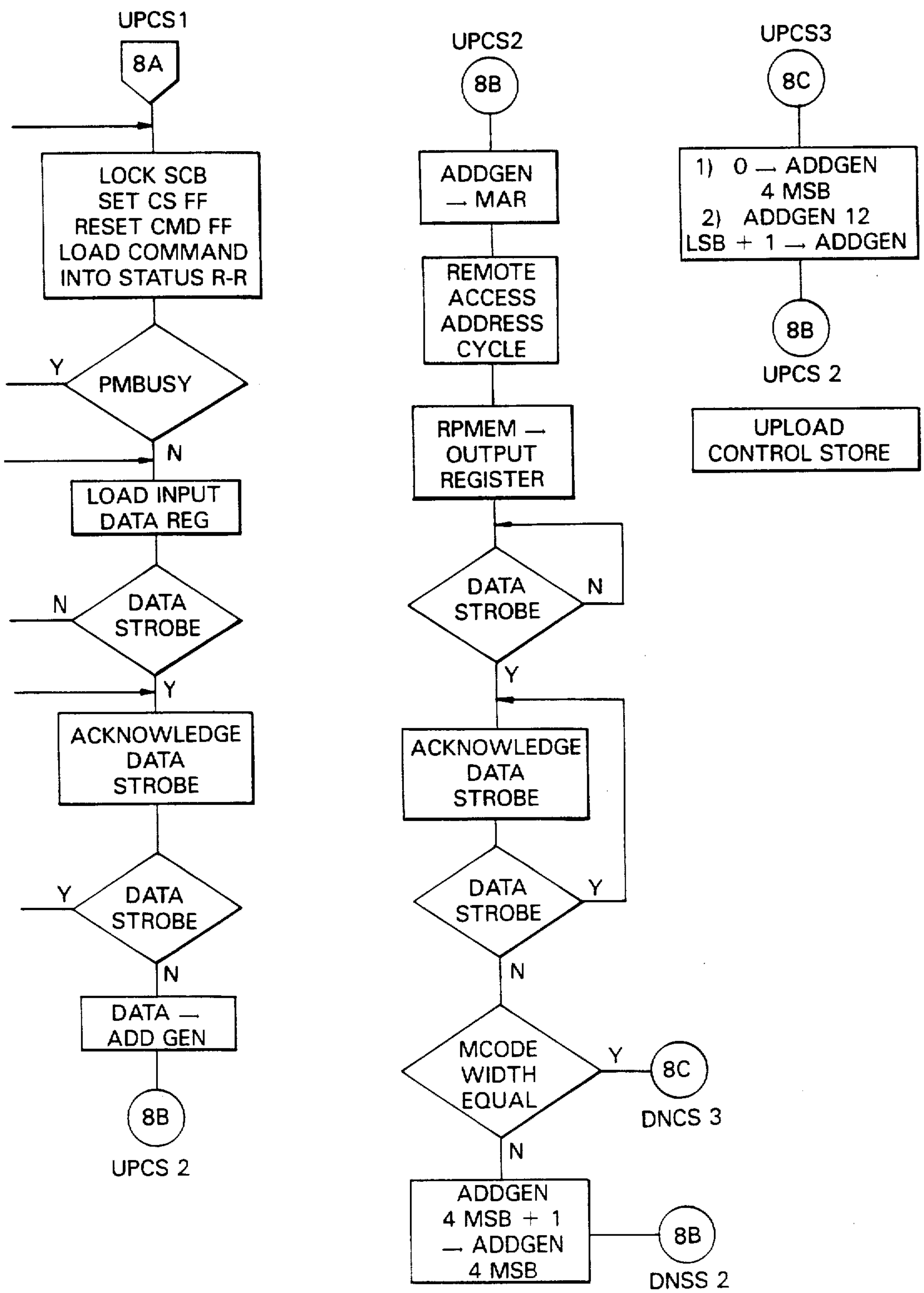
Figures 9, 14:
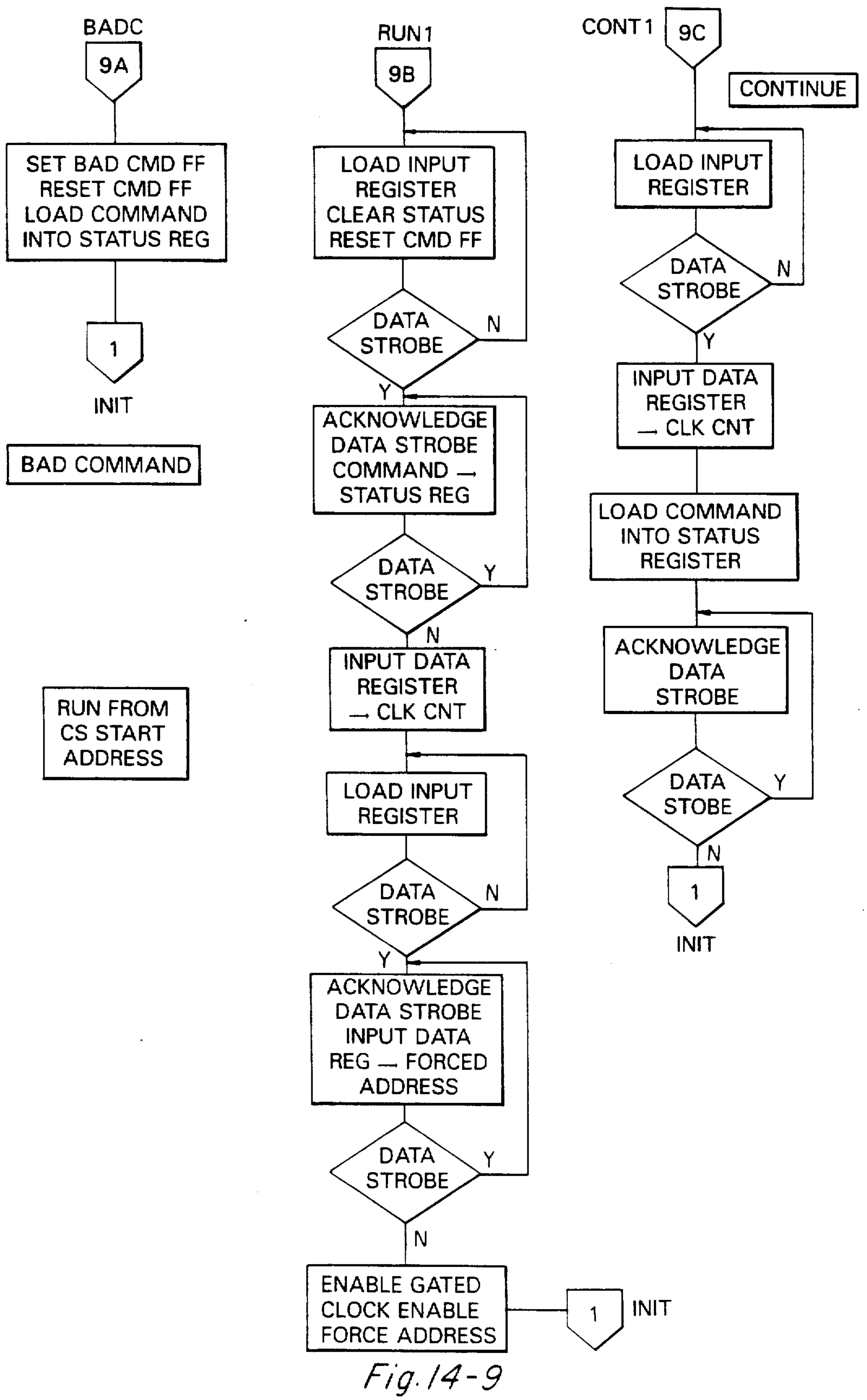
Figures 10, 14:
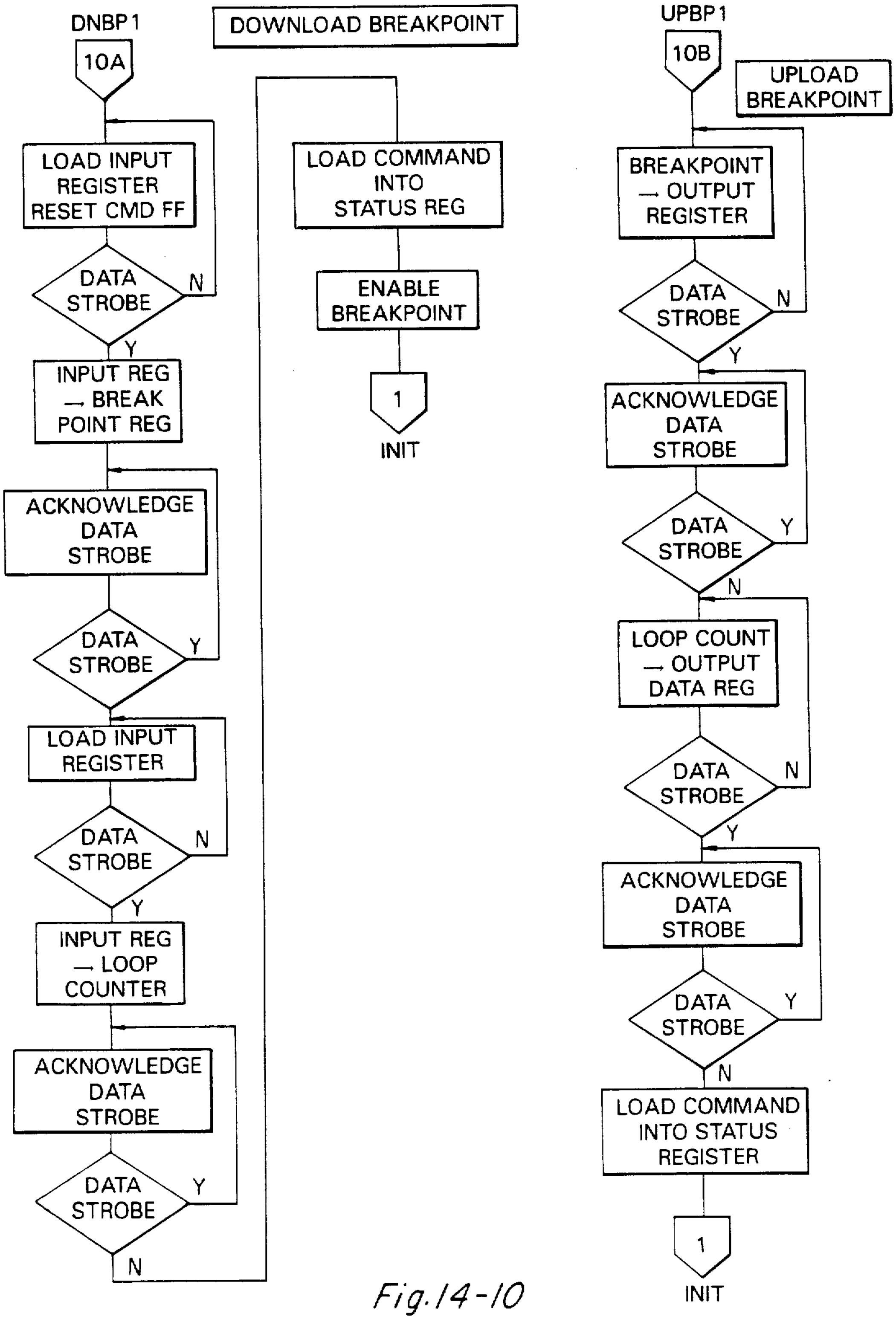
Figures 11, 14:
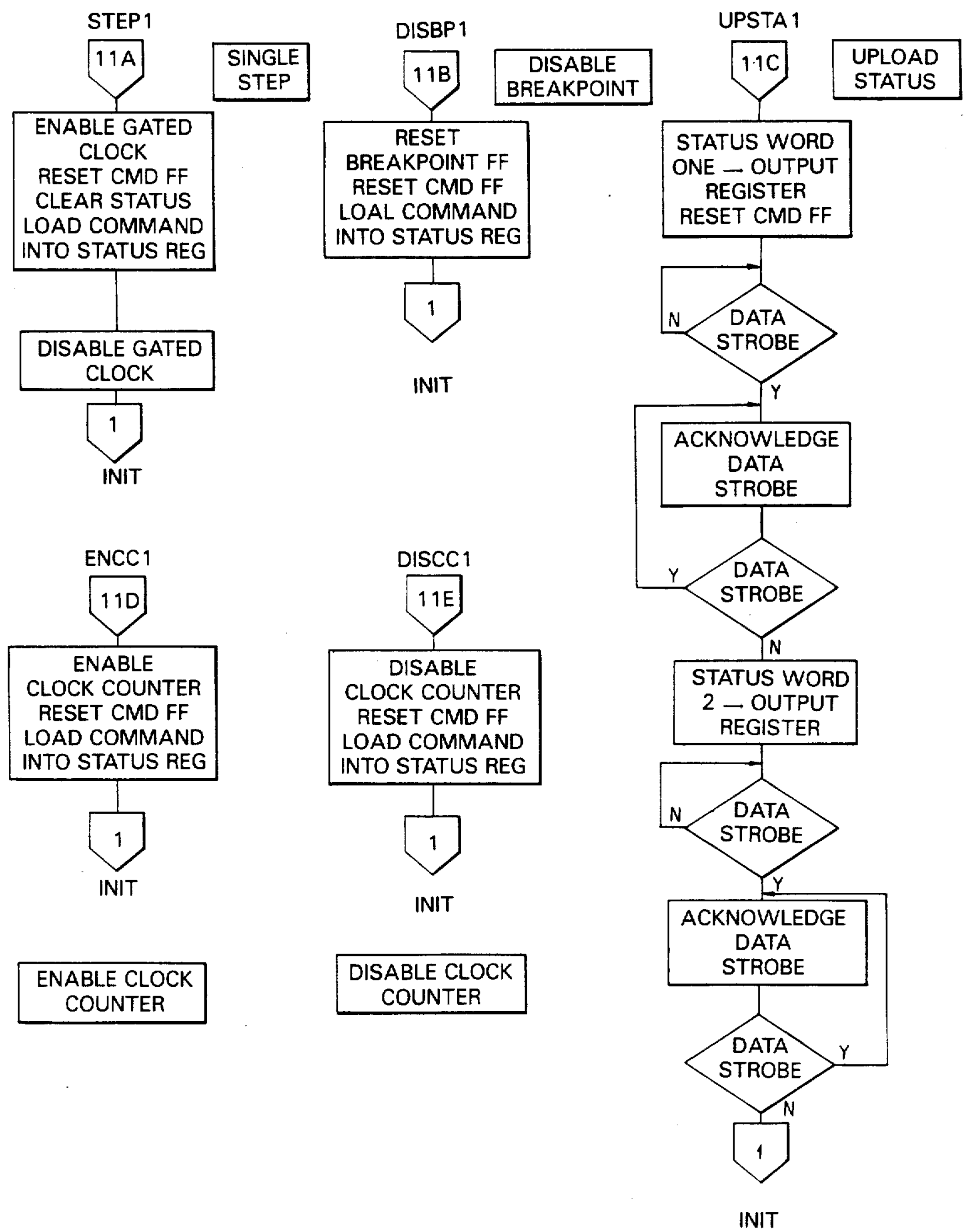
Figures 12, 14:
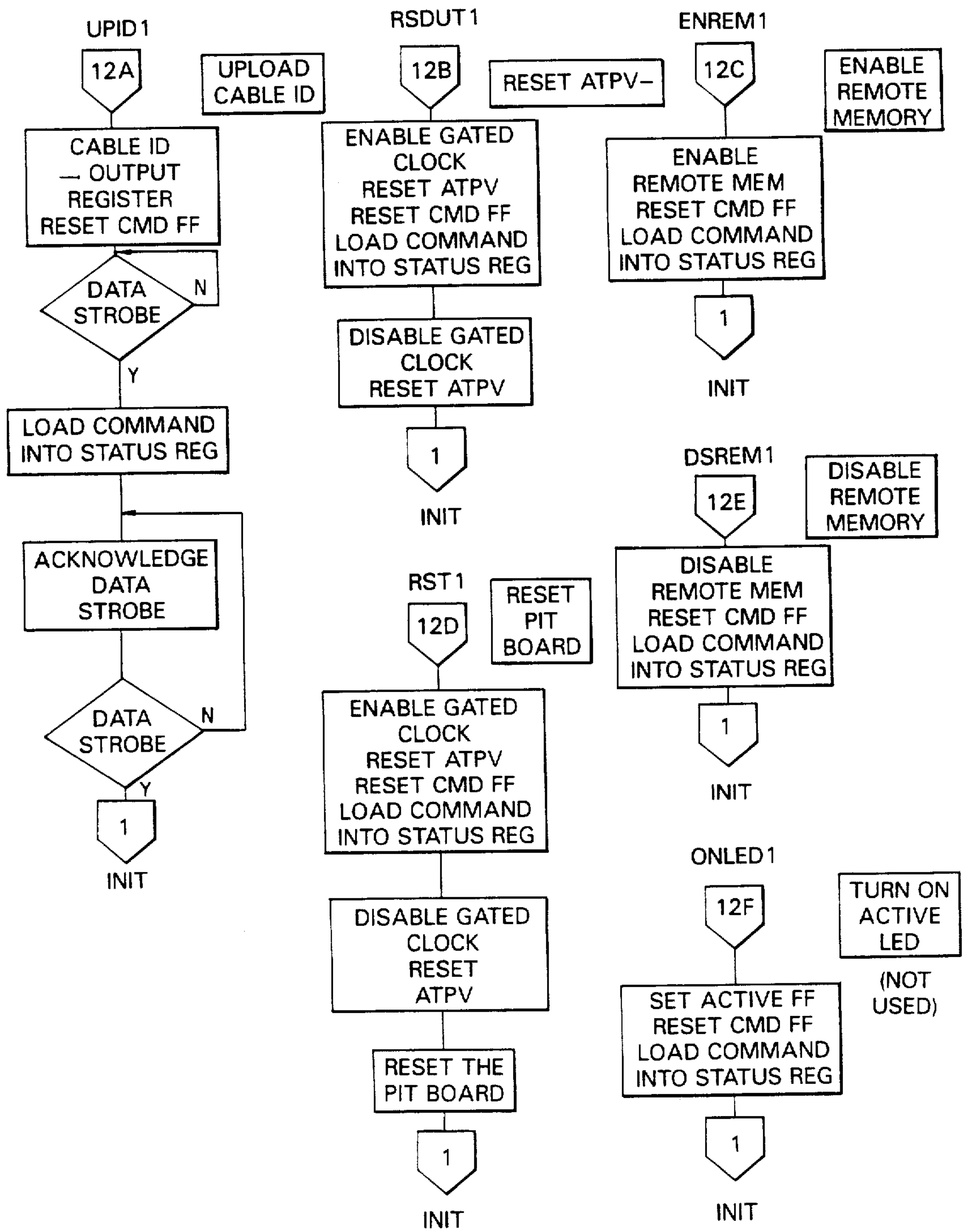

Referring now to FIG. 4, the control circuitry 32a common to all of the devices except the PIT is shown. Control store 33 is a random access memory. Of course, a preprogrammed ROM could also be used, but the use of the RAM permits more flexibility because of the ease of programming. A micro sequencer 41 (Advanced Micro Devices 2911, in this preferred embodiment), provides addresses through control store address selector 41a, the address, in this preferred embodiment, being 12 bits in length. Address selector 41a also receives 12 bits from the program memory address register 55 as biased by summer 61. This address, PMADD (4-15) is used for the initial downloading of control store 33 and is also used for reading and writing the contents of control store 33 for verification, as will be described later.

Pipe register 42 receives the output from control store 33. The pipe register holds the microinstruction for one clock period, while the next microinstruction is being acquired by the microsequencer.

The pipe register provides an output (30 bits in this preferred embodiment) to the arithmetic control unit 49. In this preferred embodiment, the arithmetic control is made up of Advanced Micro Devices parts 2901, 2902 and 2904. Arithmetic control unit 49 performs arithmetic, logical and shifting operations on the 16 bit data.

The pipe register also supplies a 16 bit output to the microsequencer as signal DIRIN bus (0-15). This input is used to force an address such as in the case of a jump instruction.

The pipe register also has bits connected to the DEVDAT bus 48 through decoders 58. This permits communication with other devices on the bus 48.

The pipe register also inputs an addressable latch by addressing any single bit for an indication of status, error and the like.

Still another output from the pipe register is applied to status multiplexer and next address selector 44. This circuit is used for testing and will not be further described herein.

Still another output from pipe register 42 is applied to SCB controller 60. The SCB (system control bus) controller 60 provides an input to the program memory 31, to the memory data register (MDR) 54 and to the memory address register (MAR) 55. The SCB control 60 requests access to the SCB 27 using the SCB control signals. If access is granted, then the SCB control 60 is able to send an address from MDR, followed by data from MDR to the SCB to RAR 57 and program memory 31 of M remote device. Data is input on the data cycle from the SCD27 to the device data bus 48.

Figure 5:
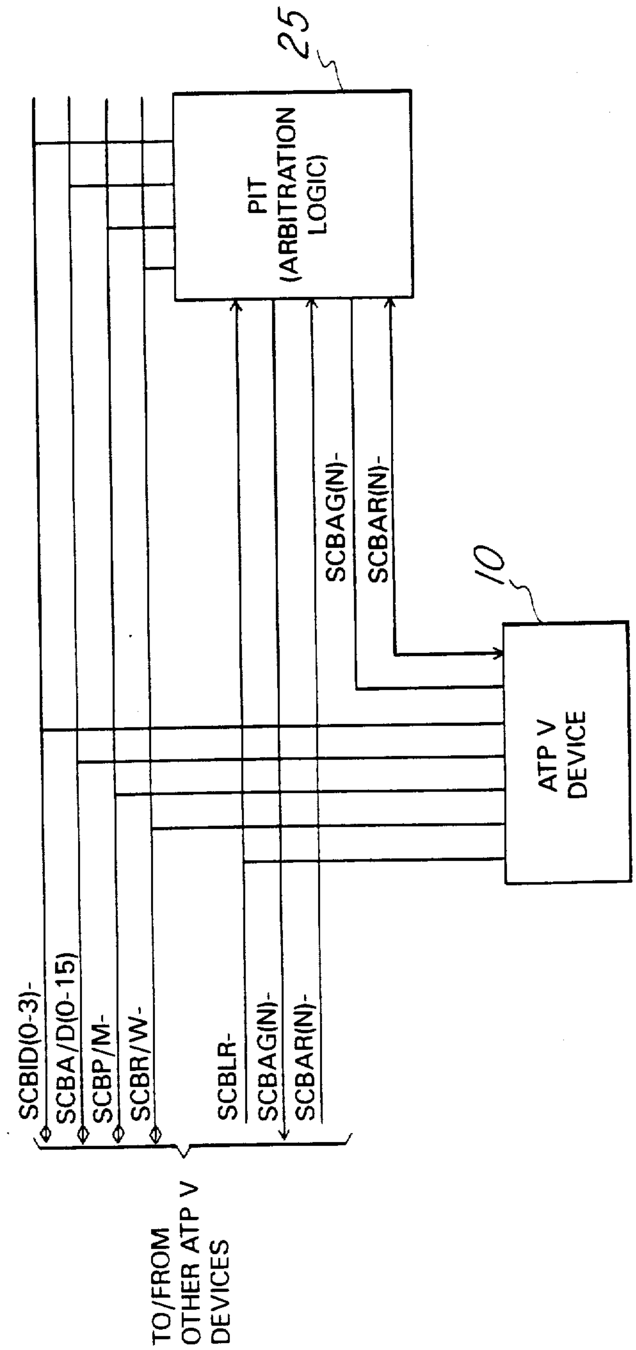
FIG. 5 is a block diagram of the system control bus interface.

Turning now to FIG. 5, the SCB interface is shown. FIG. 5 shows the general SCB interface. Device 10 is shown communicating with the SCB arbitration logic of PIT 25 through the SCB control signals SCBAG (n)-access grant to device and SCBAR (n)-device access request. Output from the device 10 are signals SCBA/D (0-15)-the 16 bit address/data bus; SCBID (0-3)-ID of the remote device that is being accessed; SCBP/M-program memory/control store selection. High level selects program memory and is also the default state of the line. This line is controlled only by the HI 20 and PIT 25; SCBR/W-read/write control for the present access. A high level indicates a read operation. This signal is generated by the device performing the access; SCBLR- lock request—may be issued by any device to lock the bus, retaining access until releasing.

Access to SCB 27 is made available to one device at a time. The access requests from each device is sent to the PIT where arbitration between devices requesting access at the same time is resolved. This priority selection will be discussed later. The signals described above are also available to the PIT as shown.

Figure 6A:
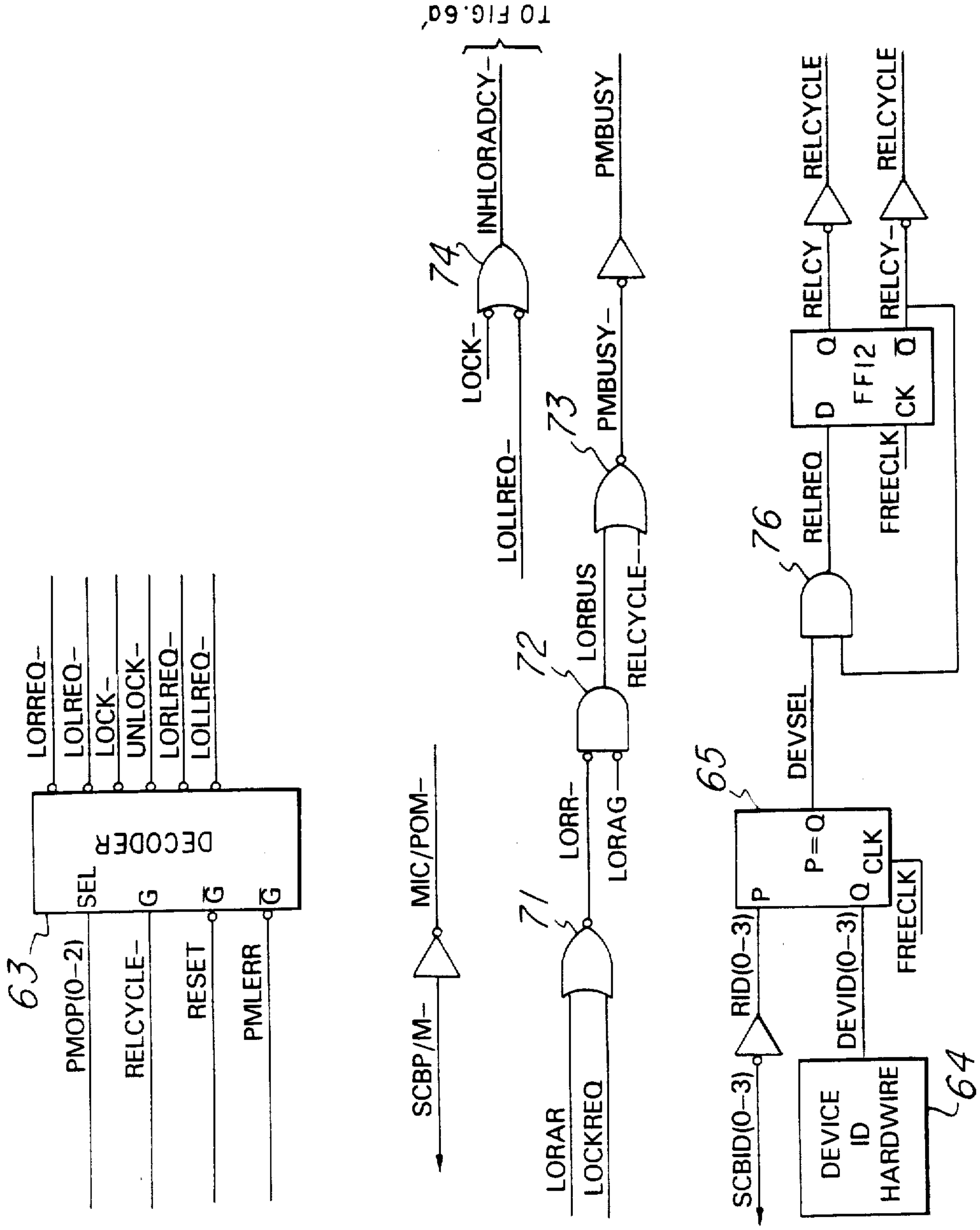
FIGS. 6*a* and 6*b* illustrate the system control bus control logic.
Figure 6A:
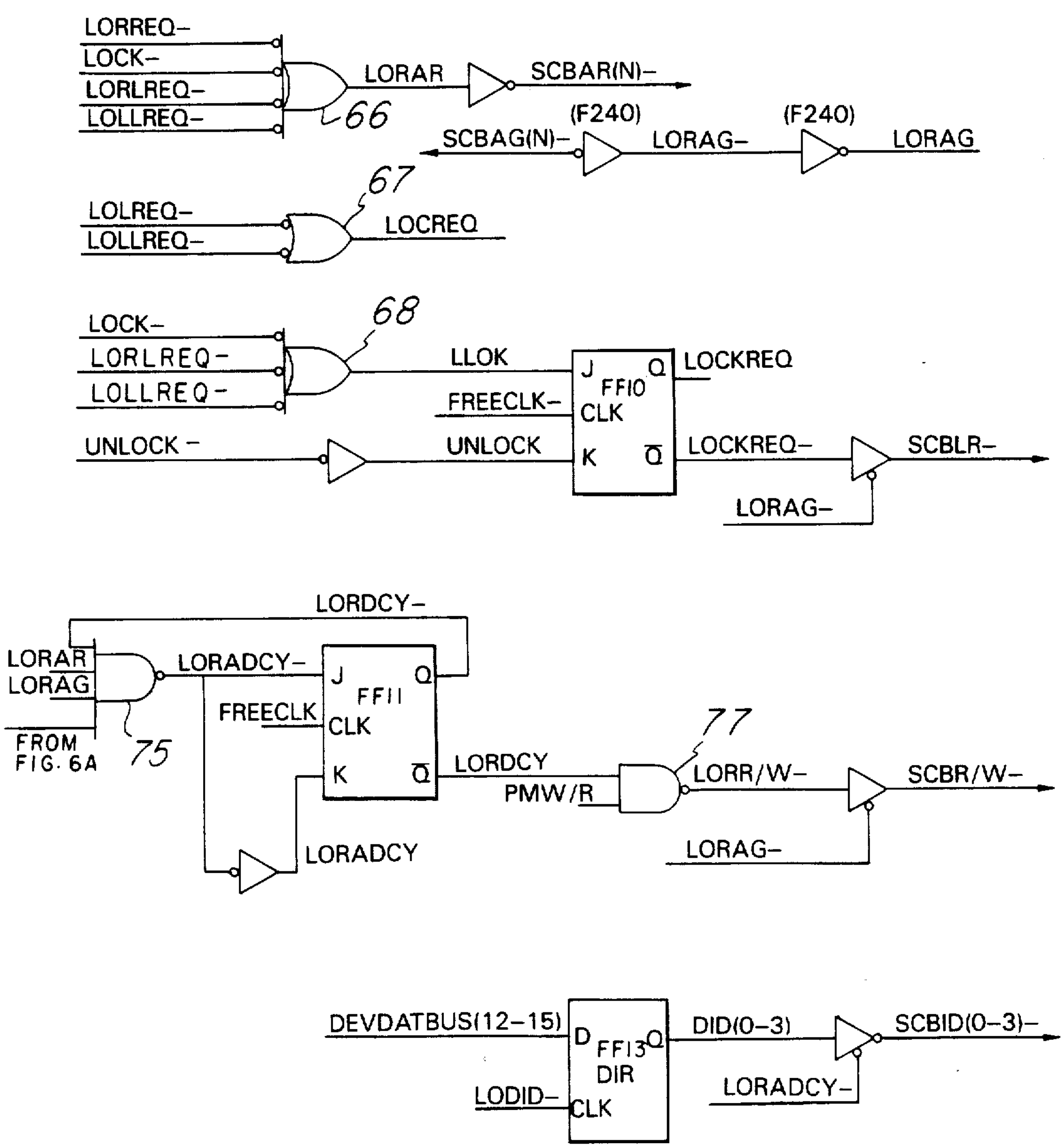
Figure 6B:
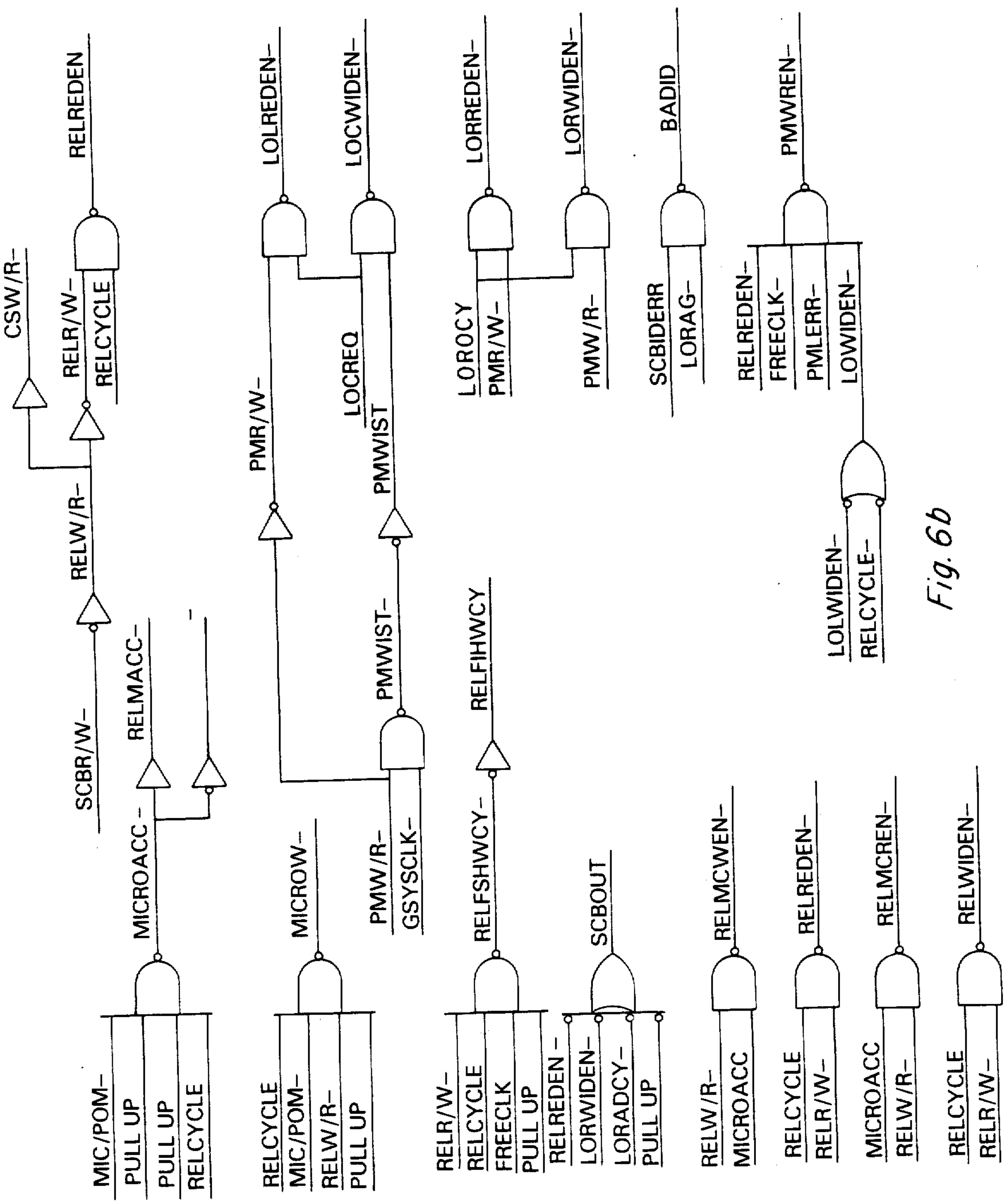

Referring now to FIGS. 6a and 6b, the common SCB control 60 is illustrated. The SCB operations performed by each device are under microprogram control. The program memory operation bits (PMOP(0-2)) are input to decoder 63. The output of decoder 63 provides signals:

| | | |
|---|---|---|
| 2. | LORREQ | LOCAL TO REMOTE PROGRAM MEMORY |
| 3. | LOLREQ | LOCAL TO LOCAL PROGRAM MEMORY |
| 4. | LOCK | LOCK SCB |
| 5. | UNLOCK | UNLOCK SCB |
| 6. | LORLREQ | LOCAL TO REMOTE PROGRAM MEMORY AND LOCK SCB |
| 7. | LOLLREQ | LOCAL TO LOCAL PROGRAM MEMORY ANO LOCK SCB |

The signals LORREQ-, LOCK-, LORLREQ- AND LOLLREQ- are inputs to NAND gate 66 yielding signal LORAR which is inverted to provide the SCB access request signal SCBAR(n)-.

Signals LOLREQ- and LOLLREQ- are inputs to NAND gate 67 providing output signal LOCREQ. Signals LOCK-, LORLREQ- and LOLLREQ- are inputs to NAND gate 68 providing signal LLOK which is connected to the J input of flip flop FF10. The K input to flip flop FF10 is provided by signal UNLOCK. The Q output of flip flop 10 is signal LOCKREQ and the Q- output signal, after inversion, is signal SCBLR- enabled when the request for access has been granted. The SCB access cannot be executed until the device receives a grant indicated by the signal SCBAG(n)-. The condition in which access request is issued and access has not been granted is indicated by the signal PMBUSY which is tested by the microprogram. Signal PMBUSY is generated as indicated by signals LORAR and LOCKREQ providing inputs to NOR gate 71 whose output provides one input to NOR gate 72, the other input being provided by signal LORAG. The output from NOR gate 72 provides an input to NOR gate 73 whose other input is provided by signal RELCYCLE. NOR gate 73 provides output signal PMBUSY-, which is inverted to provide signal PMBUSY. In the event that a remote access is in progress, signal RELCYCLE- is input to selector 63, inhibiting the request and causing signal PMBUSY to be true. Referring again to FIG. 4, the system control bus 27 is the bus that communicates with all other devices. MDR 54 is the source of data that is written into program memory 31. MAR 55 is the source of memory addresses. Remote address register (RAR) 57 may be loaded externally from the SCB 27. This is the source of addresses for remote accesses to program memory 31 and control store 33. MAR 55 is output to summer 61 whose output is connected to program memory 31 and RAR 57. Summer 61 provides biasing of addresses for various reasons such as relative addressing, well known in the art.

Instruction Register and Mapping Unit 45 is loaded with instructions acquired from program memory 31. The instruction map 45 outputs to the DIRIN bus to cause a branch in control store 33 to the microprogram routine corresponding to that particular instruction. Instruction Register and Mapping Unit 45 therefore supplies instructions during the normal operation of the system.

The FORCE input to the DIRIN bus is used for test purposes.

A remote SCB access is indicated as having been initiated when the signal LORADCY- becomes false. Signal LORADCY- is the output from NAND gate 75, as seen in FIG. *6a*, whose inputs are signals LORAR, LORAG, the output of AND gate 74 and the Q output of flip flop FF11. This occurs when the access has been requested (LORAR) and access has been granted (LORAG). The signal LORADCY- provides the input to the J terminal of flip flop FF11, and is inverted and applied to the K terminal of that flip flop. Also, signal LORADCY- enables the inversion of the Q output of flip flop 13, providing signal SCBID for the device to be placed on the SCB 27. Signal LORADCY- is inhibited for a LOCK request or for a LOLLREQ signal from both inputs to AND gate 74. Flip flops FF10 and FF11 are both gated by clock signal FREECLK-, a repeat of the six MHz clock in this system. Flip flop 11 is reset on the following clock period which is the data period of the access cycle. The Q- output of flip flop FF11 is combined with signal PMW/R in a NAND gate 77 and buffer to provide signal SCBR/W-, the SCB read/write control line. Signal PMW/R is the output of the device data bus source decode 58. The device ID is loaded into DIR register FF13 from the four least significant bits of the device data bus (DEVDATBUS) (12-15) by signal LODID- prior to the initiation of a remote access cycle.

A remote access from another device is initiated by the signal SCBID being placed on the line during the address period of the access cycle. Detection is accomplished by comparing SCBID with the output from hardwired device ID 64. Signal DEVSEL output from comparator 65 is used to initiate a remote access for the device. Signal RELREQ enables loading the remote address register (not shown) with data. Flip flop FF12 provides signals RELCYCLE and RELCYCLE- which are used for steering data and addresses. Signal MIC/POM-, the inversion of signal SCBP/M- selects program memory 31 or control store 33 during the access cycle.

FIG. *6b*, together with FIG. *6a*, illustrate gates for generating various signals. Following is a description of those signals.

| | |
|---|---|
| BADID | An invalid ID placed on line by device initiating SCB access |
| CSW/R- | Control store bidirectional drivers direction control |
| LOLREDEN- | Read local program memory to device data bus |
| LOLWIDEN- | Write local data to program memory from memory data register |
| LORREDEN- | Read remote program memory to local device data bus |
| LORWIDEN- | Write data from memory data register to remote program memory |
| MICROACC- | Control store access enable |
| MICROW- | Control store write enable |
| PMWREN- | Program memory write strobe |
| RELFIHWCY | Controls enable of bus drivers and memory elements to eliminate active drivers on same buses |
| RELMACC- | Control for control store address selector |
| RELMCWEN | Remote write to local control store |
| RELMCREN- | Remote read from local control store |
| RELREDEN- | Remote read from local program memory |
| RELWIDEN- | Remote write to local program memory |
| SCBOUT | Directional control of SCB interface bidirectional drivers |

A device can access a program memory other than its own by loading the four-bit DIR comparator 65 with its identity. The accessing device may then make an SCB request. Upon receiving the grant, the requesting device outputs the device ID and address and assumes control of the lock request. The accessed device, upon seeing its own ID, stores the address into its remote address register 57. Data is transferred during the first clock after grant. If the access is a read, the device being accessed outputs its program memory 31 to the SCB 27. Thus, any access over the SCB 27 requires a minimum of two SCB clock cycles (one clock cycle equals 167 nsec, in this preferred embodiment). If the request is not granted immediately, a program memory busy is generated. The device must wait during this time before advancing to the data transfer cycle. This timing is shown in FIG. *7a*. In the timing diagrams in the figures, an "X" indicates that this is transition time from one state to the other.

The timing in FIG. *7b* illustrates a remote to local access initiated by a remote device.

Any device can read or write its local program memory 31 without interfering with transfers in progress on the SCB 27. A read-write operation involving local program memory 31 occurs in two cycles for a read and three cycles for a write—in the absence of remote device activity in the program memory 31.

On the first two clock cycles of a local program memory write operation, the memory address register 55 and the memory data register 54 will be loaded. On the third clock cycle, the program memory read/write line will be set to the write state and the PMOP code will be set to 3 or 7. If a remote device is accessing the local memory, signal PMBUSY will be high and the device will have to wait. Otherwise, the transfer from the memory data register 54 to the program memory occurs on the third clock period as shown in FIG. *7c*.

Figure 7A:
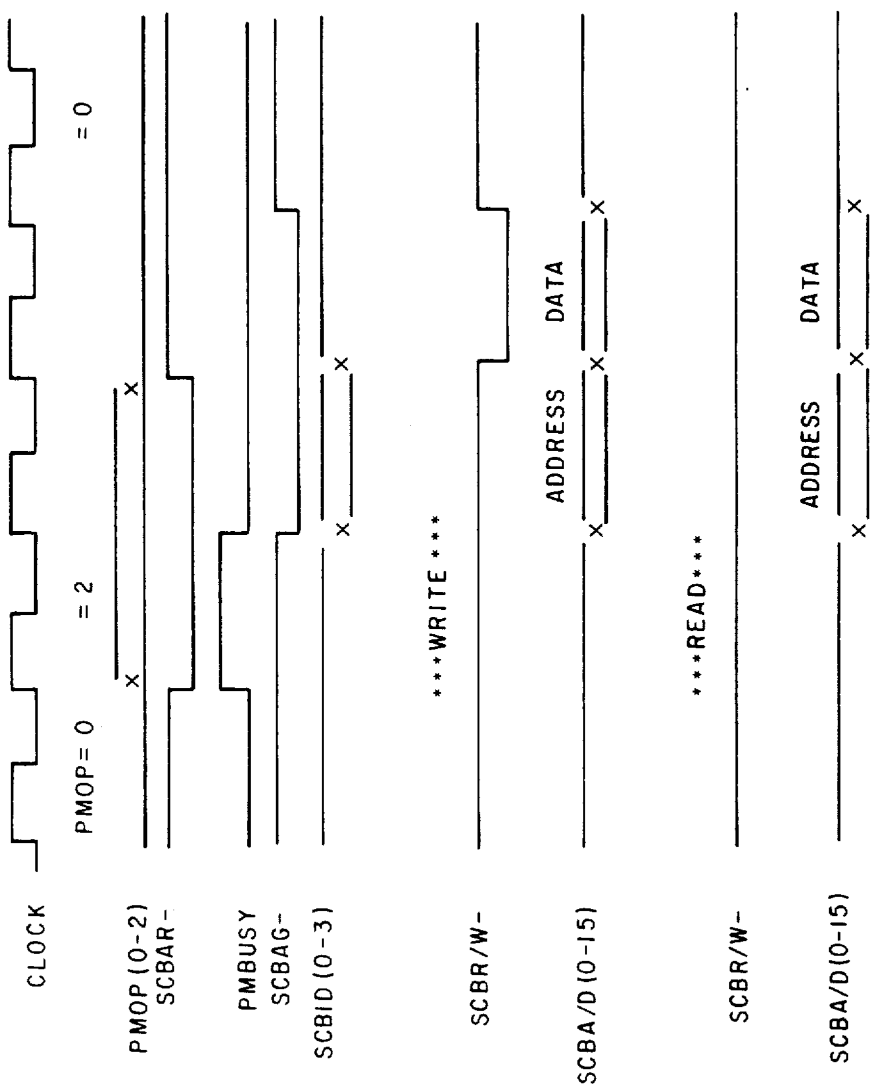
FIGS. 7*a*–7*e* illustrate system control bus timing, local and remote, read and write, with and without locking.
Figure 7B:
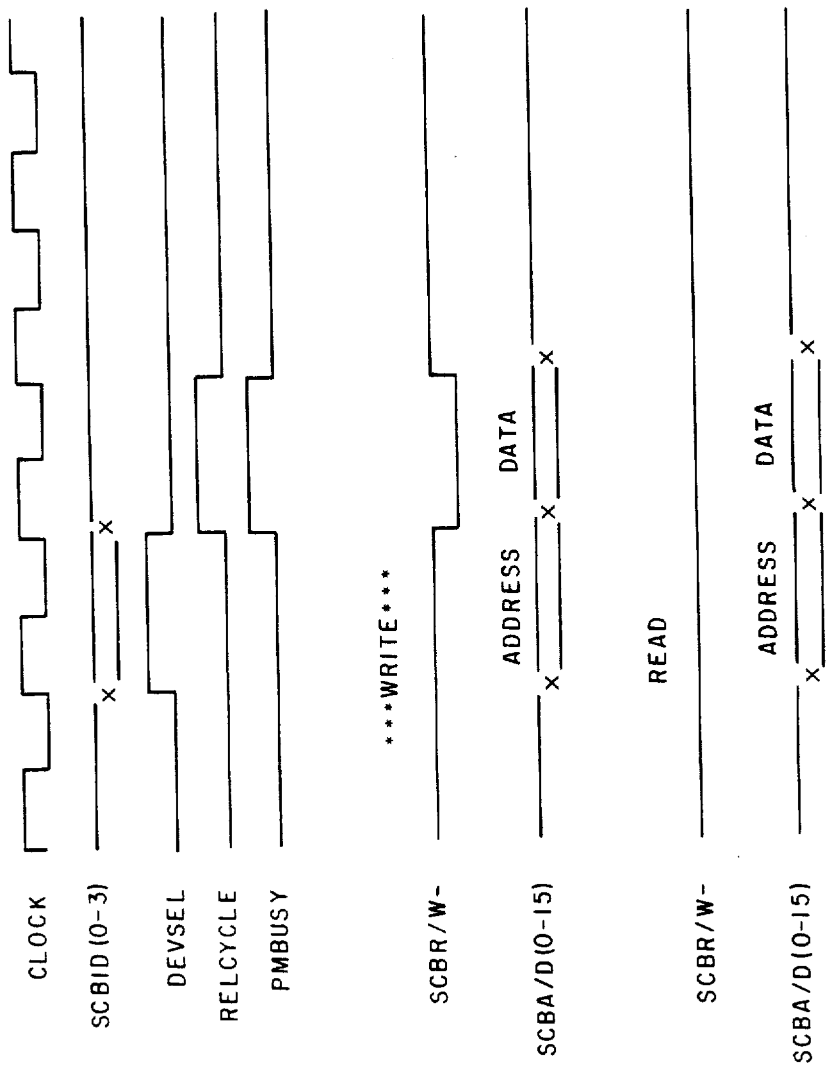
Figure 7C:
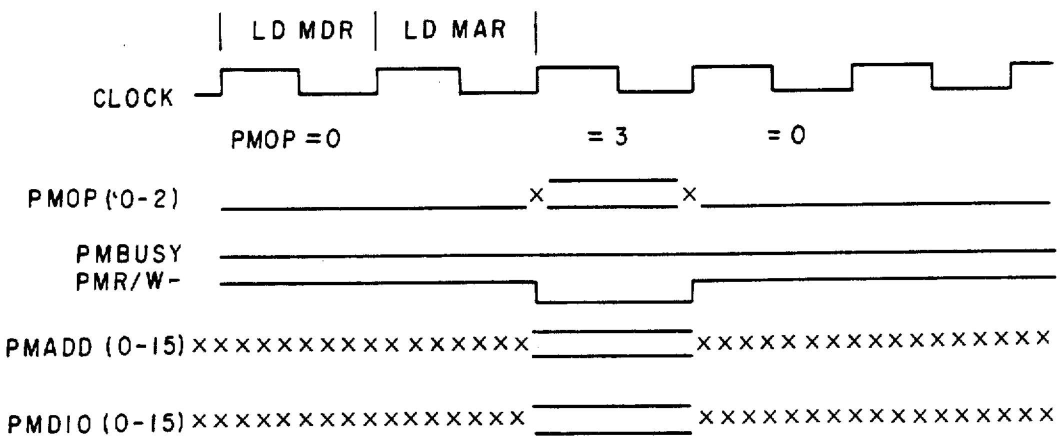
Figure 7D:
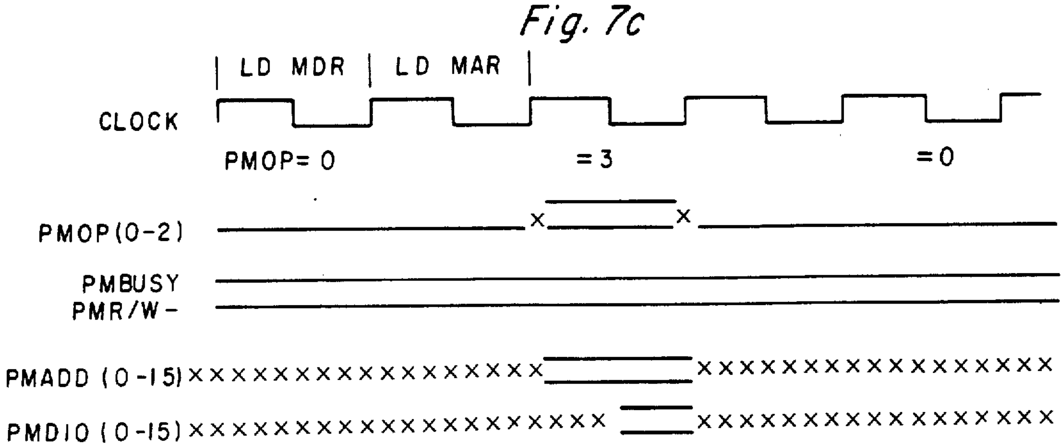

In a local program read operation, on the first clock cycle, the memory address register 55 is loaded. On the second clock cycle, the program memory read/write line is set to the read state and the PMOP code is set to 3 or 7. If there is not a PMBUSY, the transfer from the program memory occurs as shown in FIG. 7*d*.

Locking the SCB 27 is accomplished by specifying PMOP=4, 6 or 7. In the case PMOP=4, the lock request signal (SCBLR-) is activated from the device to the PIT25 grant arbitration. The device that initiatlly locked the SCB27 can unlock the bus by resetting the SCBLR-signal.

Specifying the program memory operation PMOP=6 or 7 will allow a device to perform remote or local accesses without interference from other devices.

Figure 7E:
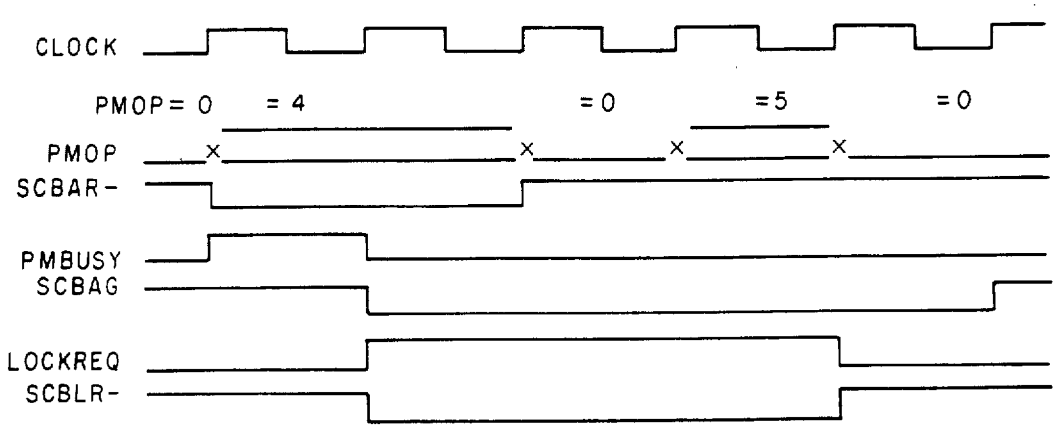

Unlocking the SCB is accomplished by specifying PMOP=5 which causes the lock request signal to be reset. FIG. 7*e* shows the timing for locking and unlocking the SCB.

Figure 8:
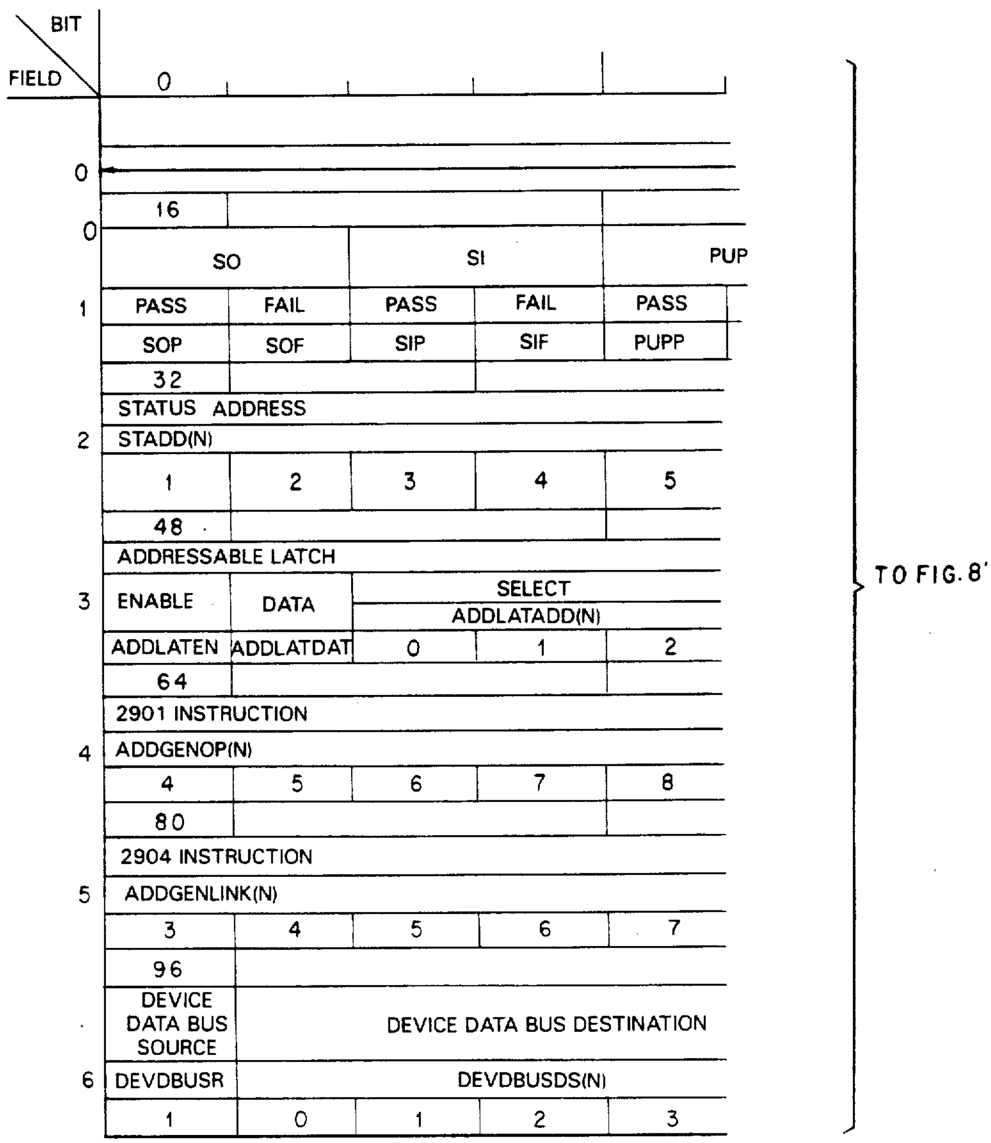
FIG. 8 illustrates the microinstructions found in the common control of the devices.

The common control 32 microcode fields are shown in FIG. 8. The addressable latch for the host interface 20 does not have an enable bit and has four address bits. The host interface 20 does not have a halt/exam reset bit in that the host interface 20 is the source for the halt/examine. The halt/examine line to all devices is the signal that causes a device to test its program memory location 0 to determine if any action is required. The halt/examine reset bit as shown in FIG. 8 is for the transfer controller 23. This bit is located in field 6, bit 107 for the input controller 24 and in field 14, bit 232 for the arithmetic unit 21, 22. Following is a description of the individual bits of FIG. 8.

| | |
|---|---|
| 1. Microsequencer Opcode | |
| Branch address or constant data | DIRINBUS (0-15) |
| 2911 S0 pass | S0P |
| 2911 S0 fail | S0F |
| 2911 S1 pass | S1P |
| 2911 S1 fail | S1F |
| 2911 PUP pass | PUPP |
| 2911 PUP fail | PUPF |
| 2911 stack enable pass | FEP |
| 2911 stack enable fail | FEF |
| 2911 internal register enable pass | REP |
| 2911 internal register enable fail | REF |
| Trap Map enable pass | TPMAPENP |
| Trap Map enable fail | TPMAPENF |
| Branch address enable pass | BRADDENP |
| Branch address enable fail | BRADDENF |
| Bus to sequencer enable | BUSTOSEQ |
| 2. Status Block | |
| Status condition address | STADD (0-5) |
| User status register clear | STATLCEAR |
| 3. Instruction Block | |
| Intruction map enable | IMAPEN |
| Perform instruction enable | OPEREN |
| 4. Trap Block | |
| Trap register reset enable | TRREESEN |
| Trap register reset bit select | TRRESSEL (0-2) |
| 5. LATCH/COUNTER BLOCK | |
| Counter 0 load enable | CNT0LDEN |
| Counter 1 load enable | CNT1LDEN |
| Counter 0 enable | COUNT0EN |
| Counter 1 enable | COUNT1EN |
| 6. Addressable Latch Block | |
| Addressable latch enable | ADDLATEN |
| Addressable latch data | ADDLATDAT |
| Addressable latch address | ADDLATADD (0-2) |
| 7. SCB/PM Block | |
| Program memory operation | PMOP (0-2) |
| (PM + bias) enable | PADBIAS |
| (PM + BIAS) + 32 | PADPLUTT |
| 8. Arithmetic control unit | |
| Zero bit double word operation | ZDBLEOP |
| Branch condition code select | BRCODESEL |
| 2901 instruction control | ADDGENOP (0-8) |
| 2901 RAM A address | ADDGENAADD (0-3) |
| 2901 RAM b address | ADDGENBADD (0-3) |

-continued

| | |
|---|---|
| 2904 instruction control | ADDGENLINK (0-12) |
| 2904 micro status register enable | ADDGENUPST- |
| 2904 machine status register enable | ADDGENMACST- |
| 9. Device Data Bus Source Select | DEVDBUSSR (0-4) |
| 10. Devie Data Bus Destination Select | DEVDBUSDS (0-4) |
| 11. Halt/Examine Reset | HERESET |

PROCESSOR INITIALIZATION AND TEST

The PIT device 25 performs several important functions. The system clock is located on the PIT 25 and is distributed therefrom to the other devices.

The host interface device 20 has its control store downloaded by the PIT 25.

A signature anaylis technique is used to test the control stores 33 of each of the devices. The control stores of each device is read in 16 bit parallel words through the system control bus 27. The data is shifted into a 16 bit shift register generator with exclusive OR feedback to generate a pseudo-random bit stream not including the last word of microcode from the control store. The resultant signature, after all bits of the control store have been shifted, will be the contents of the 16 bit shift register generator. This is compared with the precalculaed signature. If there is a comparison, then the microcode was correct. The microcode for all of the array devices is set out in the microfiche appendix associated herewith.

Figure 9:
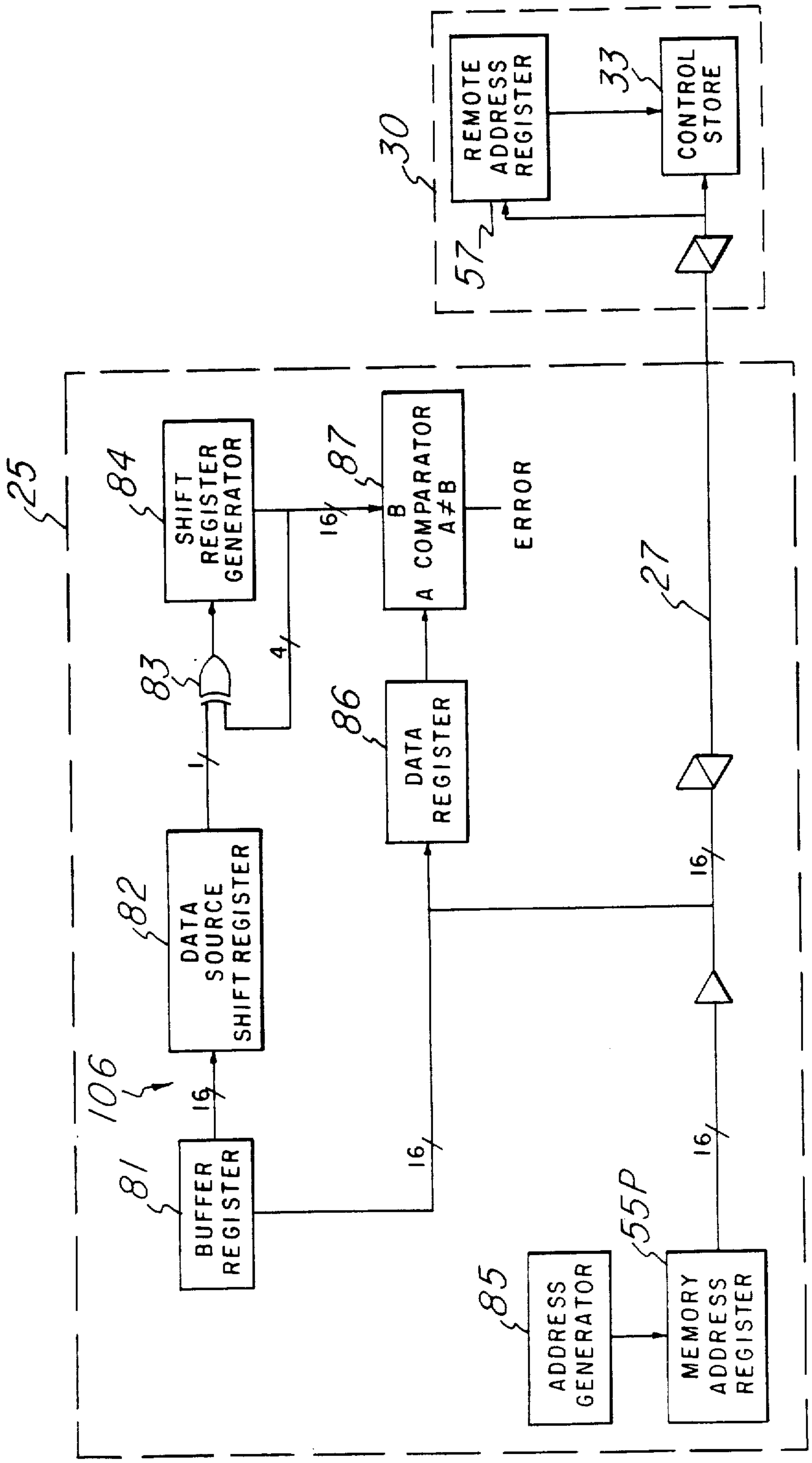
FIG. 9 is a block diagram of the storage verification circuit.

The data is shifted into the shift register generator at 12 MHz (in this preferred embodiment) to minimize the time required to complete the test. For control store 33 of 4K by 256, error testing takes approximately 100 milliseconds. FIG. 9 illustrates the circuitry for verifying the control store contents of control store 33 in device 30. PIT 25 has address generator 85 which, in this preferred embodiment, is a Texas Instruments Type 74LS163 16 bit counter in which the most significant 4 bits are used to count the number of 16 bit words in an entire microcode word and the remaining 12 bits are used to count the number of total words.

Address generator 85 provides an input to memory address register 55 P, the Memory Address Register for the PIT device. MAR55P is connected, through SCB27 to remote address register 57 of device 30. Remote address register 57, connected to control store 33 of device 30 fetches words from control store 33 in accordance with the addressed generated by address generator 85 in the manner described above. The 16 bit words from RAR57 are transmitted over SCB27 to PIT device 25 and to buffer register 81. Buffer register 81 transmits the 16 bit word into data source shift register 82 in a parallel fashion. Register 82, in this preferred embodiment, is made up of two a Texas Instruments Type 74LS299 bidirectional shift registers. It serially shifts the 16 bit word into exclusive OR circuit 83 and then into shift register generator 84, the same type of register as register 82. Shift register generator 84, together with its associated exclusive OR circuits, shown in FIG. 10, form a pseudo-random shift register. The output from register 84 is input to comparator 87 made up of a pair of Texas Instruments Type SN74AS885 magnitude comparator, in this preferred embodiment. Data register 86 also provides an input to comparator 87 so that the contents of data register 86 are compared with that of register 84. The first 16 bit word in the last sequence of words from the control store 33 has been predetermined to agree with the output from register 84 so that if those words do not agree, there has been an error.

Figure 10:
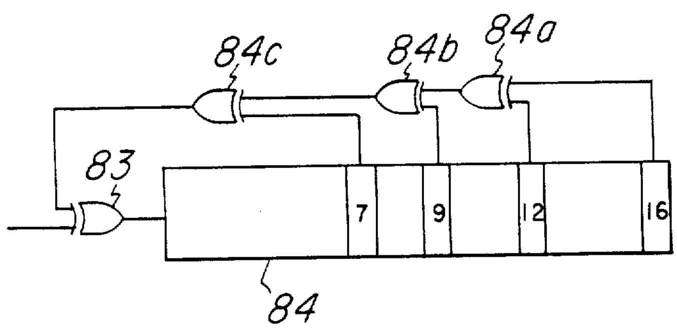
FIG. 10 is a block diagram of a pseudo random register used in the storage verification circuit.

FIG. 10 illustrates register 84 with bits 11 and 15 providing inputs to exclusive OR gate 84*a*. Gate 84*a* provides an input to exclusive OR gate 84*b* whose other input is provided by bit 8 from register 84. The output from gate 84*b* and bit 6 provide the inputs to exclusive OR gate 84*c* whose output provides one input to exclusive OR gate 83 whose other input is provided by register 82. It is evident that each 16 bit word that is shifted into register 84 changes the output so that the selected 16 bit word from the memory 33 provides a check word for comparison in comparator with the last 16 bit word output from register 84. If the results are equal, no error is present.

Figure 11:
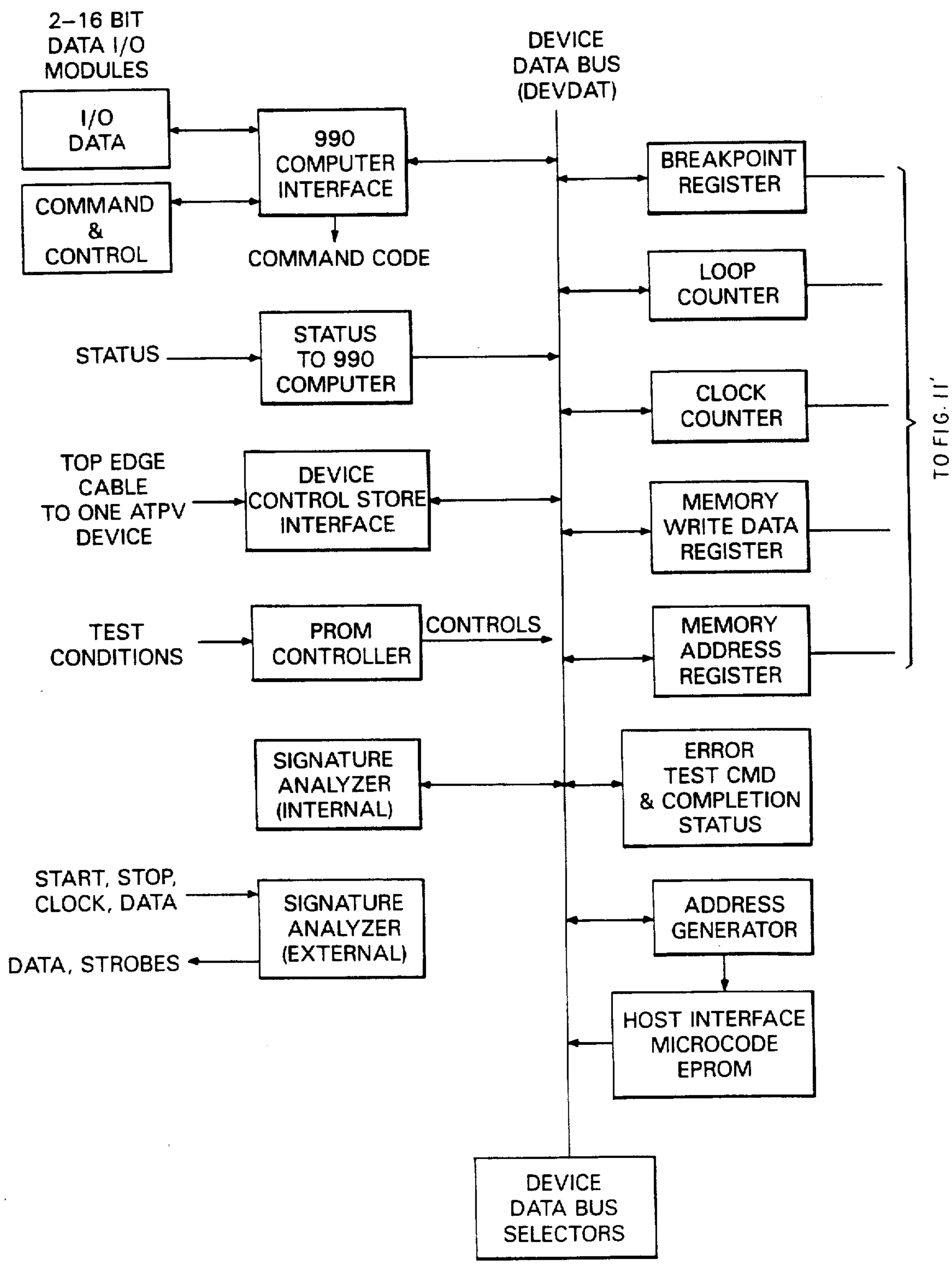
FIG. 11 is a block diagram of the processor initialization and test device.
Figure 11:
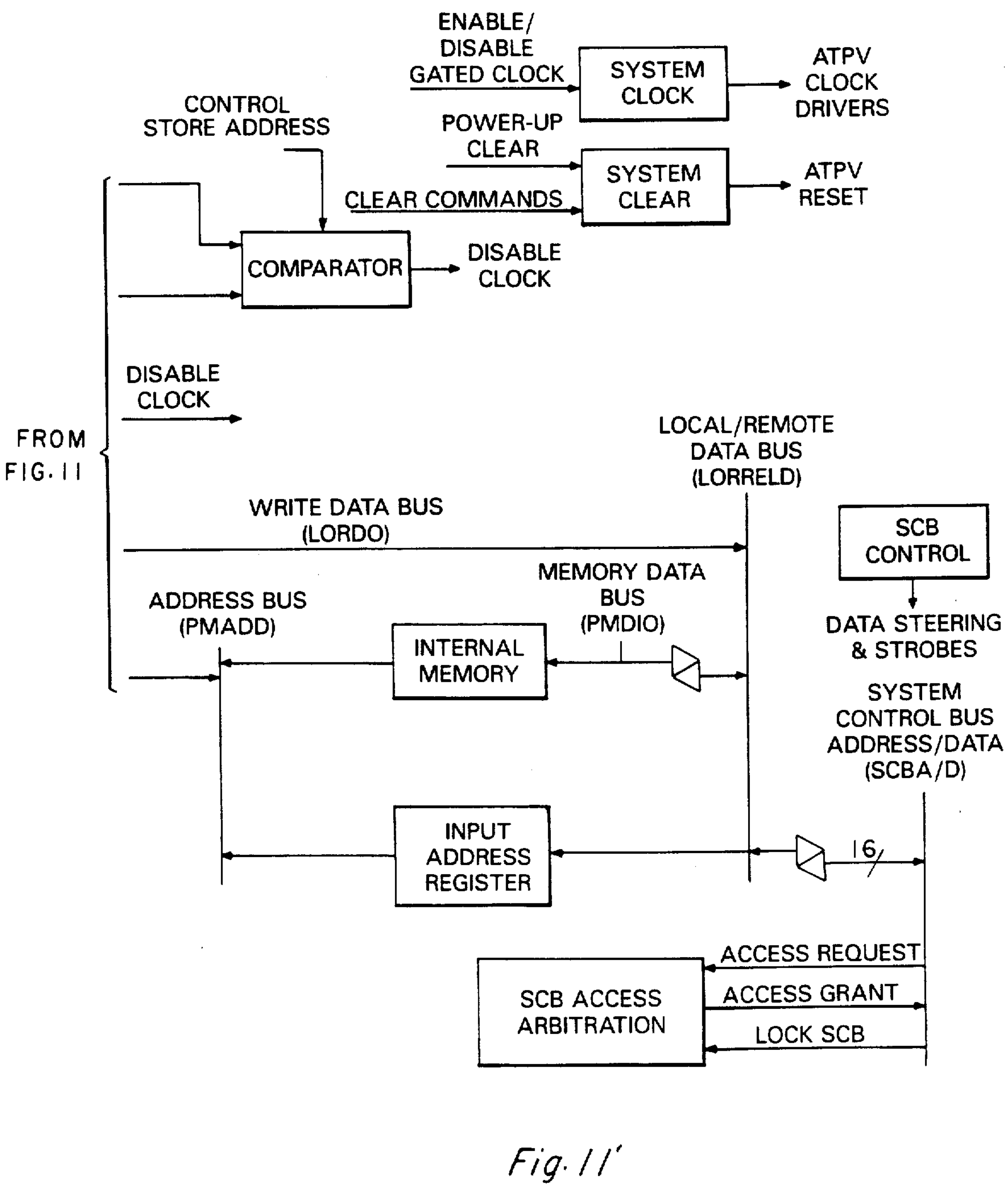

The processor initialization and test (PIT) device 25, shown in block form in FIG. 11, is capable of exercising and monitoring the other devices in the system under the control of an external computer 101, which in this preferred embodiment is a Texas Instruments Type 990. Of course this could be any computer with a parallel input/output. In any event, under normal operating conditions, computer 101 is disabled and PIT 25 is responsive to the host computer 12.

As shown in FIGS. 9 and 10, PIT 25 has the capability of checking the control store of the other devices in the system, as well as the contents of its own host interface microcode EPROM 120, through device data bus 48 P to signature analyzer 106.

The primary interface to other array processor devices is by way of SCB 27 to which device data bus 48P is connected. For certain other testing and control functions, a connection is made through interface 105, allowing forced starting addresses and break points for the microcode of the particular selected device.

The break point is provided on the microcode address to stop the system clock after the break point has been reached a specified number of times. The system clock 121 can be restarted from the point at which the clock was stopped.

System clock 121 is shown having an enable/disable input, the disable input coming from comparator 113. Comparator 113 has inputs from break point register 111 and loop counter 112, and a selected control store address. Break point register 111 of loop counter 112 are connected to bus 48P. Clock counter 114 is also connected to bus 48P and also provides a disable clock signal. Clock counter 114 is provided to terminate the execution of a sequence when a specified count is reached. System clear 122 is used for resetting and clearing the system.

PROM controller 110 controls the function of the PIT 25 and will be described in detail below.

Address generator 85, data register 86 and memory address register 55P are all shown connected to bus 48P, these components having been discussed with respect to FIG. 9.

Finally, device data bus selectors 119 is shown connected to the bus 48P.

PIT 25 arbitrates access to SCB 27 through SCB access arbitration 125. SCB control 123 is also shown.

Internal memory 124 is shown. This memory is equivalent to the program memories 31 33 of the other devices in the system. Remote address register 126 is shown connected to address bus 127.

Figure 12:
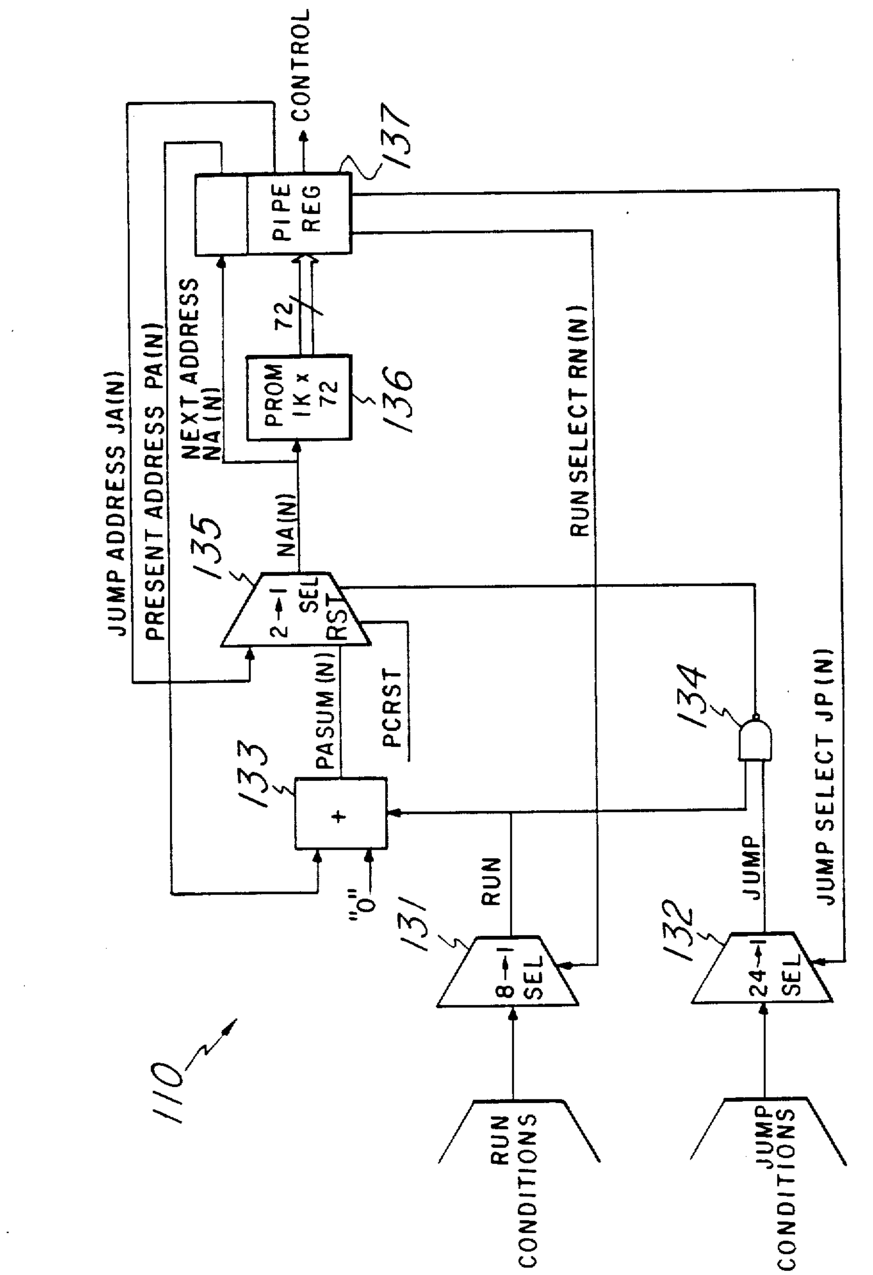
FIG. 12 is a block diagram of the processor initialization and test PROM controller.

Key to the operation of PIT 25 is PROM controller 110. FIG. 12 illustrates that controller in block form. Shown is run selector 131 and jump selector 132, the outputs of which combine to perform the control functions. In this preferred embodiment, these selectors are Texas Instruments Type SN74S251, but of course could be any readily available selector having the proper parameters. The output of one selector 131 enables a carry into adder 133, a Texas Instruments Type SN74S283, in this preferred embodiment. The carry into adder 133 adds 1 to the present address. The outputs from the run and jump selectors 131 and 132 are NANDED in gate 134, the output of which is the select input to 2-1 selector 135, a Texas Instruments Type SN74157, in this preferred embodiment. If only the output of run selector 131 is high, then the present address is incremented by 1 in address 133 to form the next address. If the outputs of both selectors 131 and 132 are high, the selector 135 outputs the jump address as the next address. If neither the outputs of selectors 131 or 132 is high, the output of selector 135 is the present address and the PROM controller 110 continues to address the same address.

The output of selector 135 presents the next address to PROM 136, a 1k×72 bit memory. The outputs from PROM 136 and the next address PROM selector 135 are input to pipe register 137, a Texas Instruments Type 54S374, in this preferred embodiment. The present address is output from pipe register 137 to adder 133. The jump address is output from pipe register 137 to selector 135. The jump select output from pipe register 137 is input to jump selector 132 and the run select output from pipe register 137 is the select input to selector 131. Control bits from PROM 136 are also output from pipe register 137.

The run conditions input to selector 131 are conditions such as an indication that SCB 27 is not busy, etc. The jump conditions input to selector 132 are conditions such as an error in the control store check, etc.

Signal PCRST into selector 135 is simply a reset control signal.

Figures 13, 14:
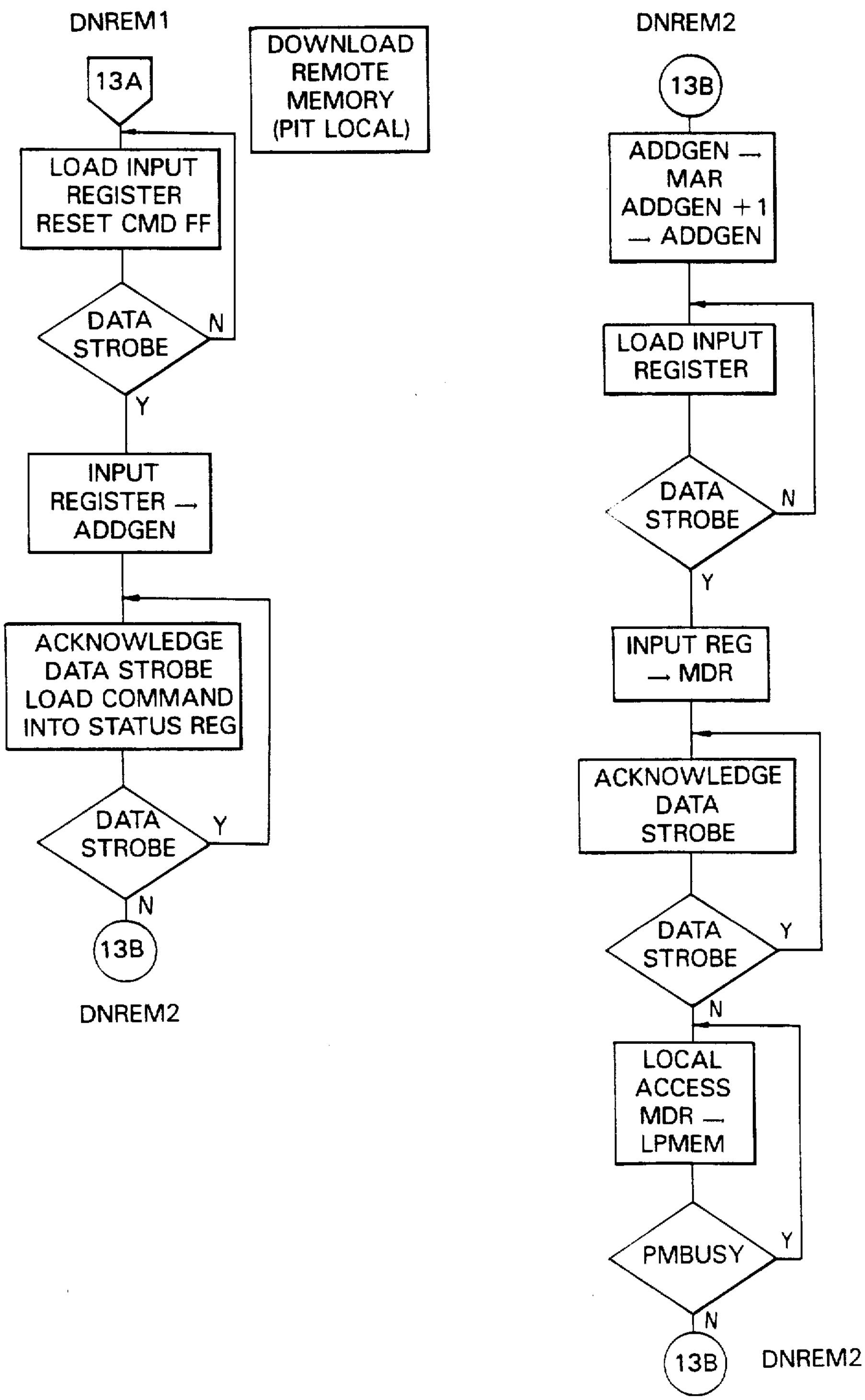
Figure 14:
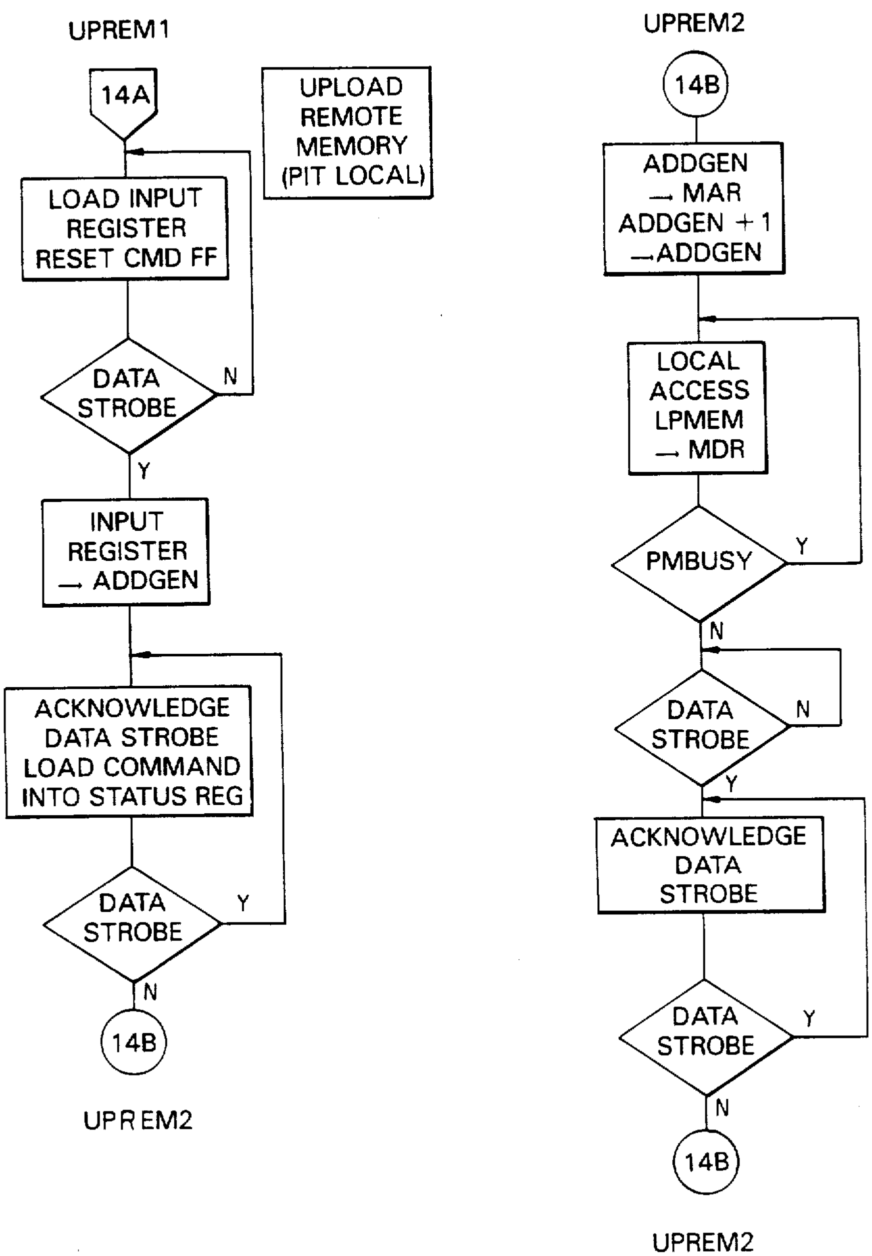

FIG. 13 illustrates the organization of the bits of PROM 136. This figure illustrates the relative bit position and the polarity of the bits which have to be inverted to be active. The pattern shown is the default or inactive state of all bits.

FIGS. 14-1 through 14-25 form a flowchart of the functions of PROM controller 110.

FIG. 14-1 illustrates the idle condition, that is, when entries to the various functions can be made. In the first block, certain bits must be true such as shown: unlock SCB, load command and select PM (program memory). Note that if the command is present, then the functions as set out in FIGS. 14-2 through 14-16 are performed. These functions relate to the testing procedures available through the use of the Texas Instruments 990 computer. If a system reset is selected, (ATPV reset) then referring to FIG. 14-17, it is seen that a function for reset is started and continued through FIG. 14-20.

The "EXAM" and "TEST HI" (host interface) microcode begin as shown in FIG. 14-21 and continue through FIG. 14-25.

Figures 14, 15:
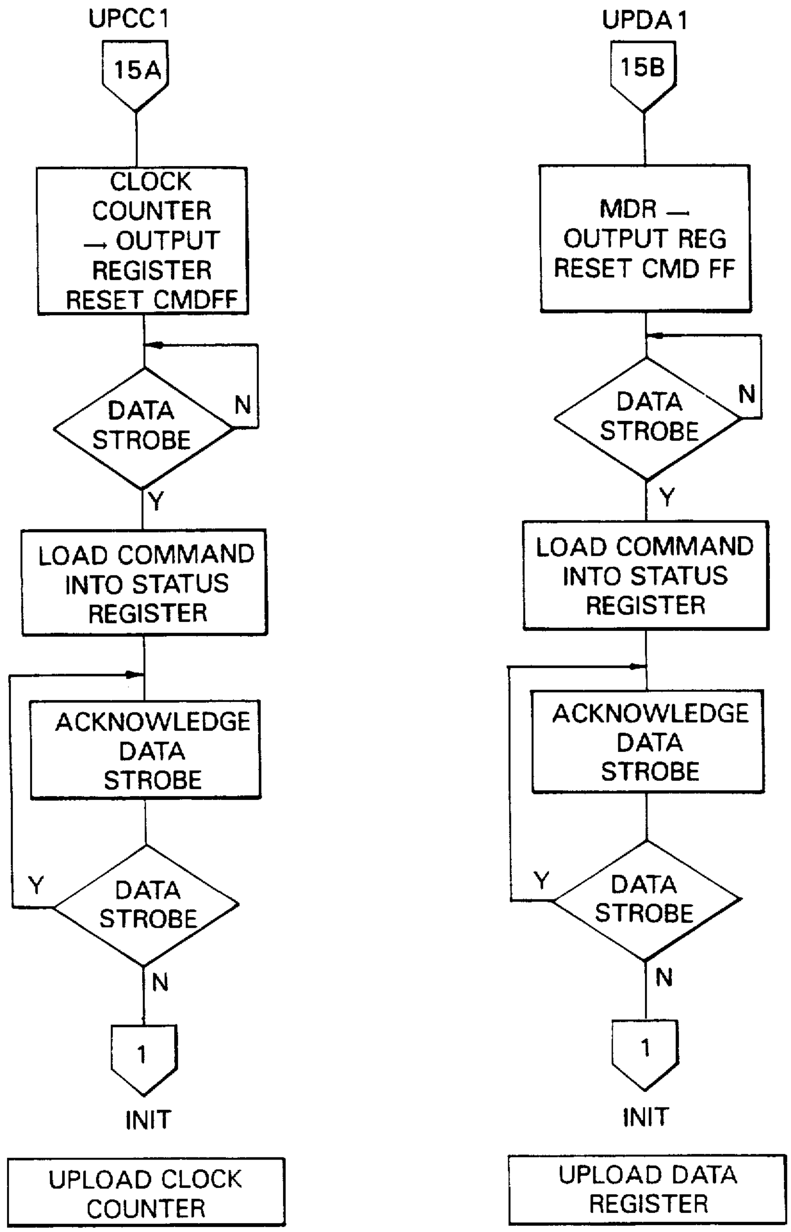

These flowcharts set out all of the critical functions of PIT 25 as defined in PROM 136. The output of system clock 121 is shown in FIG. 15. The clock is driven by a 24 MHz oscillator (not shown) with a divide by 4 circuit to provide taps for lower frequencies of 6 MHz and 12 MHz, as well as 24 MHz. These lower frequencies are selectable to drive the divide by 4 circuit to generate the clock frequencies 1.5 MHz, 3 MHz and 6 MHz. As indicated earlier, 6 MHz is the basic system clock frequency. Lower frequencies are provided to enhance prototype development. The gates on the output of the last divide by 4 enable four types of clock which are:

1. System Clock
2. Gated System Clock
3. System Clock +90°
4. Gate System Clock +90°

Relative timing of these signals is shown, relative to the 24 MHz oscillator, in the first five waveforms of FIG. 15.

The outputs of the four gates mentioned above are clocked into a buffer register which in turn is clocked by the selected 6 MHz, 12 MHz, and 24 MHz. The outputs then are further buffered and sent to other devices in the system. The clock that are used by PIT 25 are buffered through four levels to ensure that all system clocks are buffered to the same level from the original source.

The gated clock is controlled by signal CLKENQ, shown in FIG. 15 as is the gated clock shown as "GSYSCLK". Signal CKLENQ is generated by a flip flop (not shown) whose inputs are signals CLKENS- and CLKENR-, bits from PROM 136 for setting and resetting, respectively, the flip flop. Controlling the flip flop, therefore, controls whether the gated clock is turned on or turned off.

Figures 14, 15, 16:
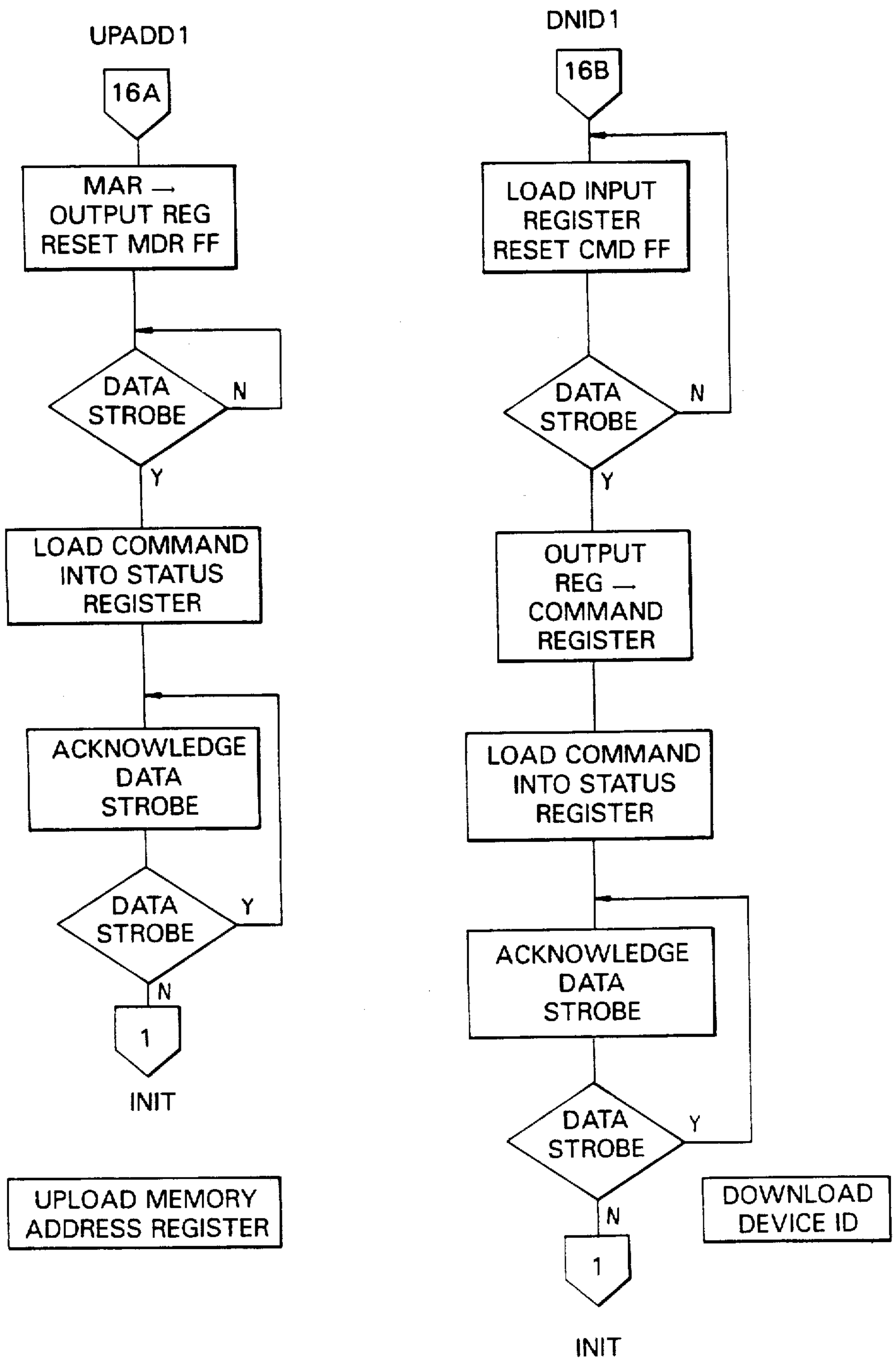

FIG. 16 illustrates device data bus selectors 119. Selectors 140–143 receive bits from PROM 136 for the selection of sources. The outputs from selectors 140, 141 and 142 are input to registers for further input to the device data bus.

Selectors 144–147 also receive bits from PROM 136 for selecting destination registers for information to be transferred from the device data bus.

Following are the various sources and destinations, and their signatures, for the system.

| Hex Code | Device Data Bus Source | Signature |
|---|---|---|
| | Source Selector Code | |
| 1 | Memory Read/Write Control | POMW/R- |
| 2 | ID Register | IDEN- |
| 3 | Data/Address 8 lsb | PADREN- |
| 4 | Shift Register Generator | SRGEN- |
| 5 | Clock Counter | CLKCNTEN- |
| 6 | 990 Output Data | COUTEN- |
| 8 | Address Generator | ADDGEN- |
| 9 | Breakpoint Loop Counter | LPCNTEN- |
| A | 990 STATUS WORD ONE | STATEN1- |
| B | 990 Status Word Two | STATEN12 |
| C | Completion Status Word | CSWEN- |
| D | Breakpoint Address Register | BPEN- |
| E | Memory Address Register | PMAREN- |
| F | Cable ID | CABLEID |
| 10 | HI Micro Code Data | CSDEN- |
| 11 | Write Data Register | LOWDEN- |
| | Destination Selector Code | |
| 1 | Memory Address Register | PMARLD- |
| 2 | Write Data Register | LOWDLD- |
| 3 | Shift Register Generator Buffer | BUFLD- |
| 4 | Control Store Force Address | FORCELD- |
| 5 | Last 990 Computer Command | CMDSTALD- |
| 6 | Breakpoint Address Register | BKPTLD- |
| 7 | Output Data to 990 Computer | COUTLD- |
| 8 | Input Data to 990 Computer | INLD- |
| 9 | Host Interface Command Register | CMDPLD- |
| A | 990 Computer Command to PIT | CMDCLD- |
| 10 | Loop Counter | LPCNTLD- |
| 11 | Clock Counter | CLKCNTLD- |
| 12 | Address Generator 16 Bits | ADDGENLD- |
| 13 | Address Generator 4 MSB | ADDGENMLD- |

Only one source to the device data bus can be enabled at one time. Also, only one destination can be enabled at one time.

Figures 14, 15, 16, 17:
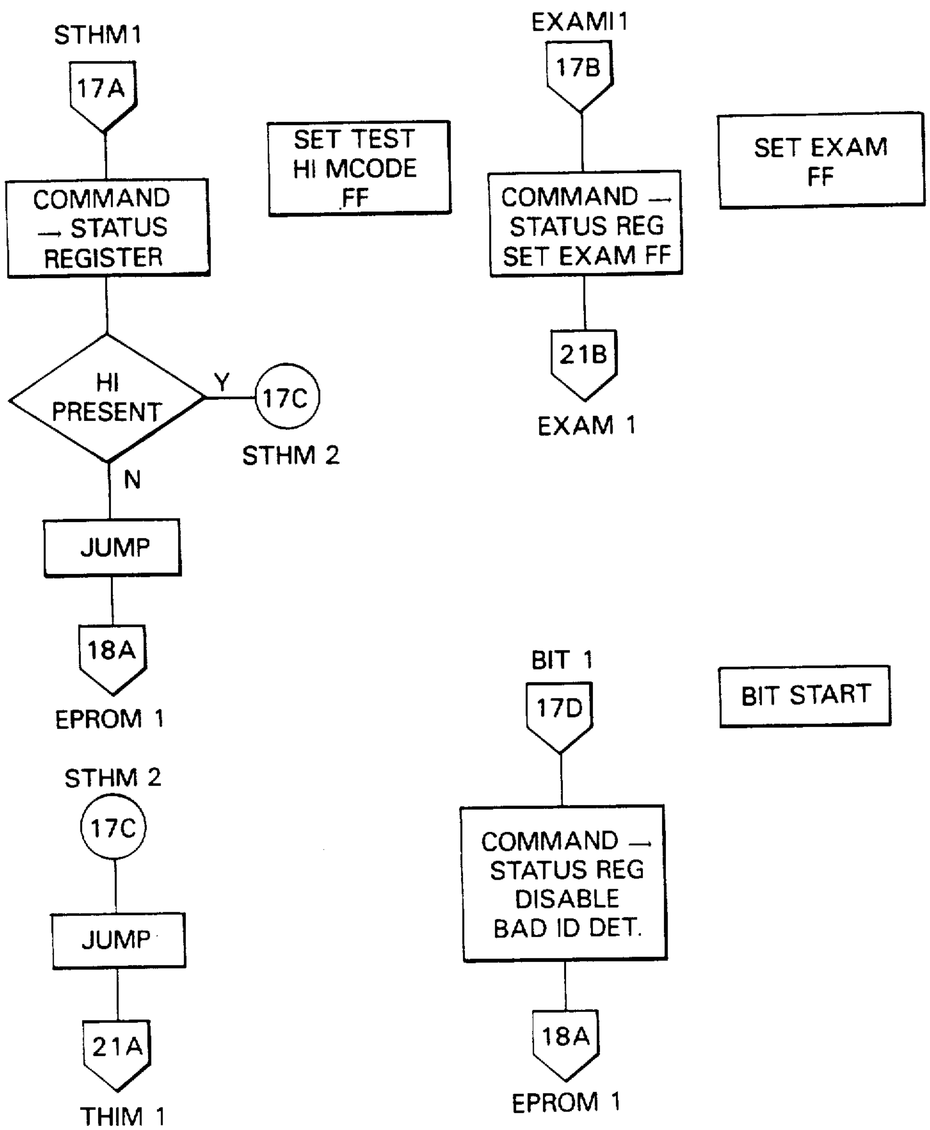

PIT 25 contains the circuitry for accessing SCB 27. FIG. 17 illustrates SCB access arbitration 125 in block form. The other devices making up the array processor each have their own ID number which may range from 0 through 15. Following is a list of the ID numbers assigned to the devices:

| DEVICE | ID |
|---|---|
| Host Interface | 0 |
| Transfer Controller | 5 |
| Arithmetic Unit 0 | 8 |
| Arithmetic Unit 1 | 9 |
| Input Controller | 13 |
| Host Interface | 14 |
| Processor Initialization and Test | 15 |

The priority of the grants are in the order of 0 assigned the lowest and 15 the highest.

Figures 14, 15, 16, 17, 18:
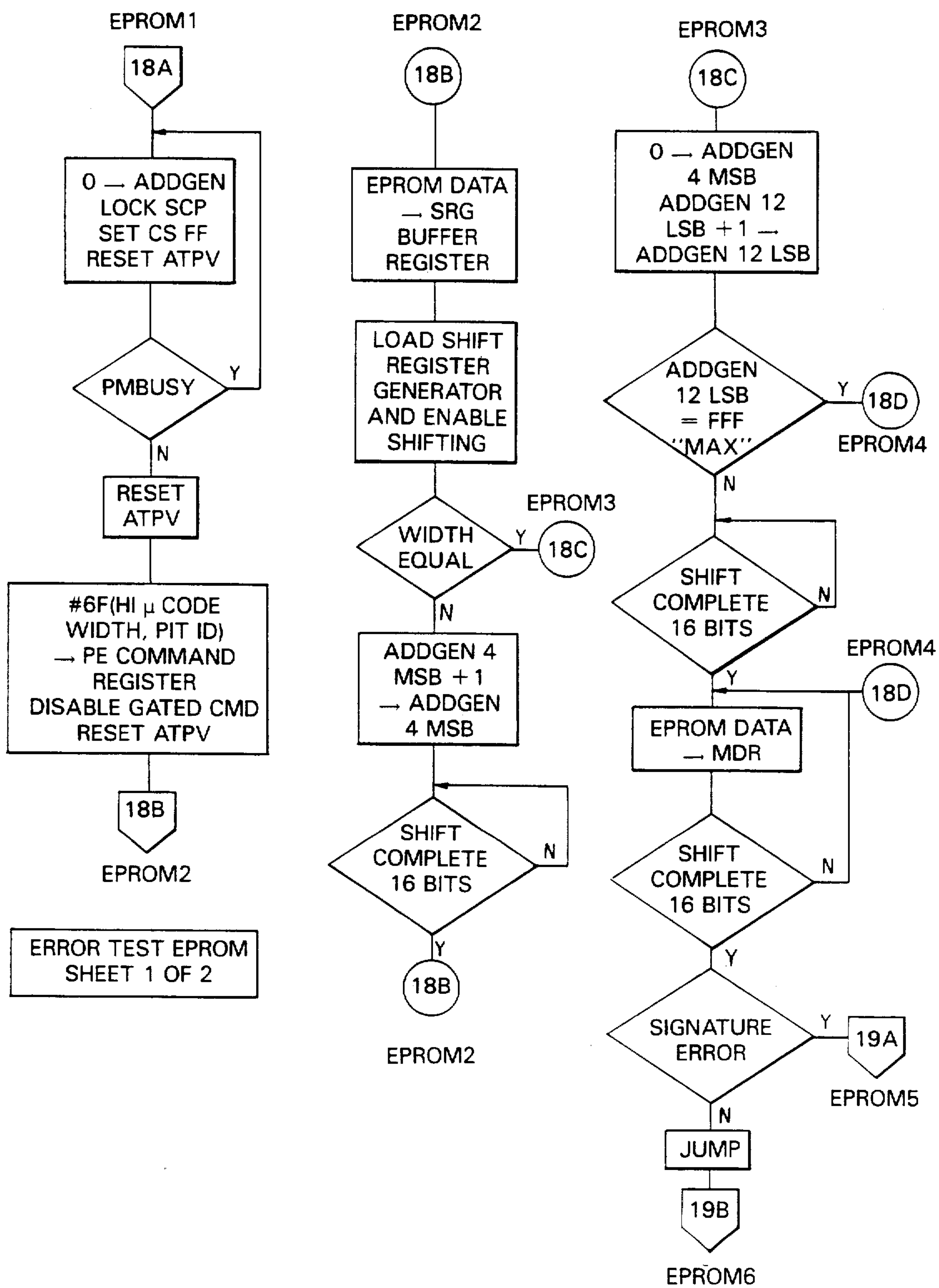
Figures 14, 15, 16, 17, 18, 19:
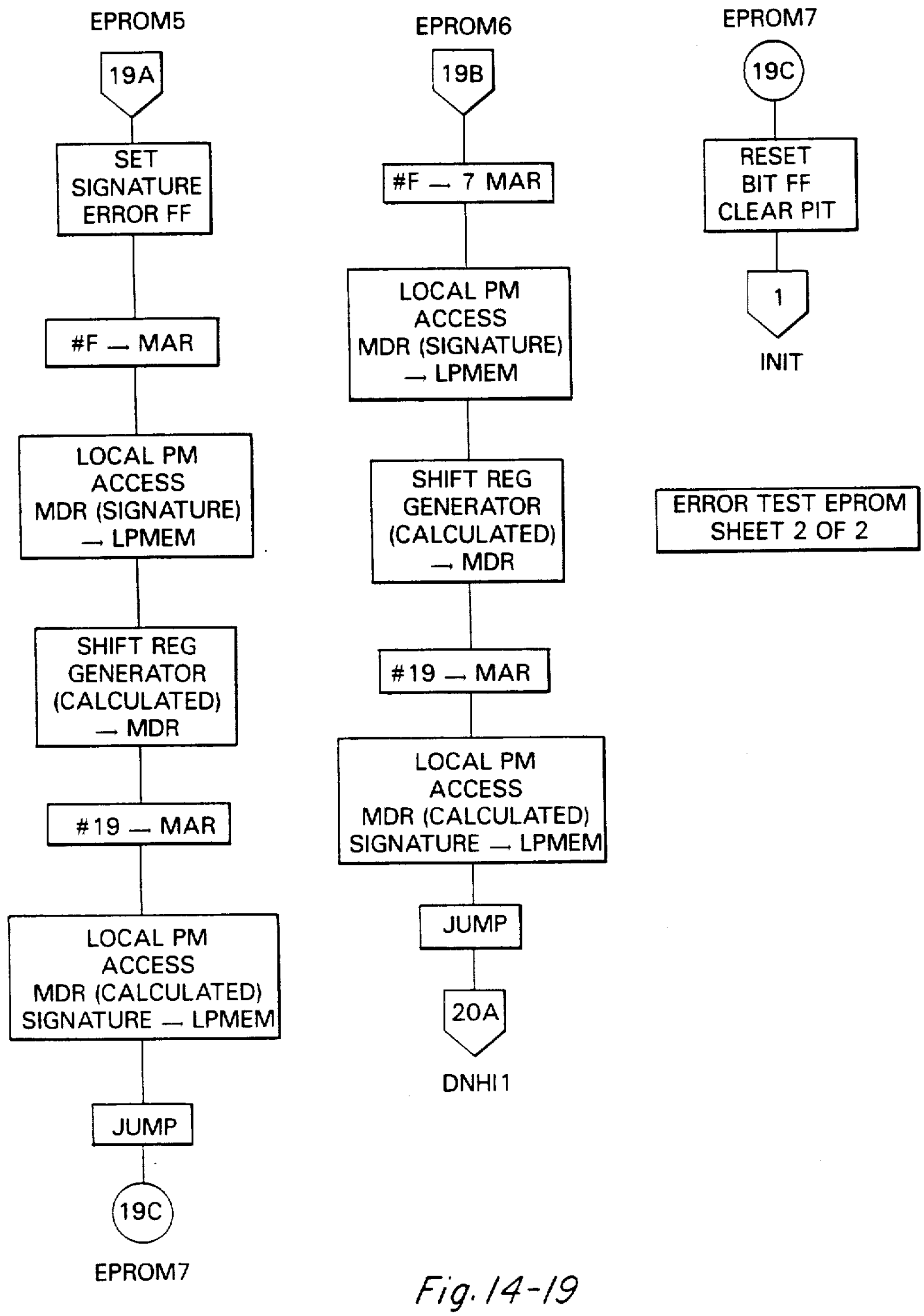

Referring to FIG. 17, priority encoders 150 and 151 receive the eight lowest and the eight highest ID's, respectively. Note that encoder 151 disables encoder 150 when it receives a higher priority ID. In this preferred embodiment, encoders 150 and 151 are Texas Instruments Type SN74148. The output of each encoder is the octal equivalent of the input number. Encoders 150 and 151 drive decoders 154 and 155, respectively. In this preferred embodiment, these decoders are Type 54F138. Only one of decoders 154 and 155 will be activated. An output from each of encoders 150 and 151 provide inputs to NAND gate 153 which provides an input to the J terminal of flip flop FF15, which is clocked by the signal SYSCLK-. A Q- output of flip flop FF15 is signal SKIPCLK- and is connected as one input to NAND gate 157. Signal LOCK-, for locking an access request by any access granted device, provides another input. Clock SYSCLKB-, an inverted clock, provides the third input. The output of NAND gate 157, signal SKIPCLKG- clocks register 156 and is disabled on the following clock to allow each device to have access for a minimum of two clock periods. The SCB cycle consists of two clock periods. The address is placed on the bus during the first clock period and data is placed on the bus during the second clock period. FIG. 18 shows the timing involved in the SCB arbitration. SYSCLK- is shown followed by access request (AR)- low priority, followed by access granted (AG)- low priority. AR- high priority is then shown followed by access granted high priority. Finally, lock- is shown.

FIG. 6*a*, as mentioned earlier, is a schematic diagram of SCB control 123 of FIG. 11. The signals are generated by the various gates and registers as shown. Following is a brief description of those signals:

| Signature | Description |
|---|---|
| | SCB CONTROL SIGNALS |
| BADID- | Invalid ID placed on SCB by PIT Board |
| BITP/M- | Program/Control Store Memory (from bit) |
| LOCK | Lock the SCB Request |
| LOCKLED- | Lock Display Driver |
| LOCREQ | Local to Local Request |
| LOCKRED | Lock Request F/F |
| LOLREDEN- | Read Local Memory Enable |
| LOLWIDEN- | Write Local Memory Enable |
| LORADCY- | Address Period of SCB Access Cycle |
| LORAG | Access Grant |
| LORDCY | Data Period of SCB Access Cycle |

-continued

| SCB CONTROL SIGNALS | |
|---|---|
| Signature | Description |
| LORREDEN- | Read Remote Memory Enable |
| LORREQ | Local to Remote Request |
| FORWIDEN- | Local to Remote Memory Write Enable |
| PMBUSY | SCB is Busy |
| PMOP (0-2) | SCD Operation (from bits) |
| POMR/W- | Read/Write Control |
| RELCYCLE | Remote Access Cycle Initiated by Another Device |
| RELREDEN- | Read Local Memory to Remote Device Enable |
| SCBAG15- | Access grant to the PIT Board |
| SCBAR15- | ACCESS REQUEST FROM THE PIT BOARD |
| SCBLR- | Lock Request to Arbitration Logic |
| SCBOUT | Directional Control for Bidirectional SCB Transceivers |
| SCBP/M- | Program or Control Store Memory Control |
| SCBR/W- | Read/Write Control Line During Data Cycle |
| UNLOCK | Unlock the SCB |

In summary, PIT 25 plays a key role in the operation of this system. It provides the clocking, it downloads the contents of its PROM to the control store of the host interface to initialize the system, it checks the accuracy of the contents of the control stores of each of the devices, as well as its own PROM, it provides arbitration for use of the system control bus and performs various tests.

Host Interface

Figures 14, 15, 16, 17, 18, 19, 20:
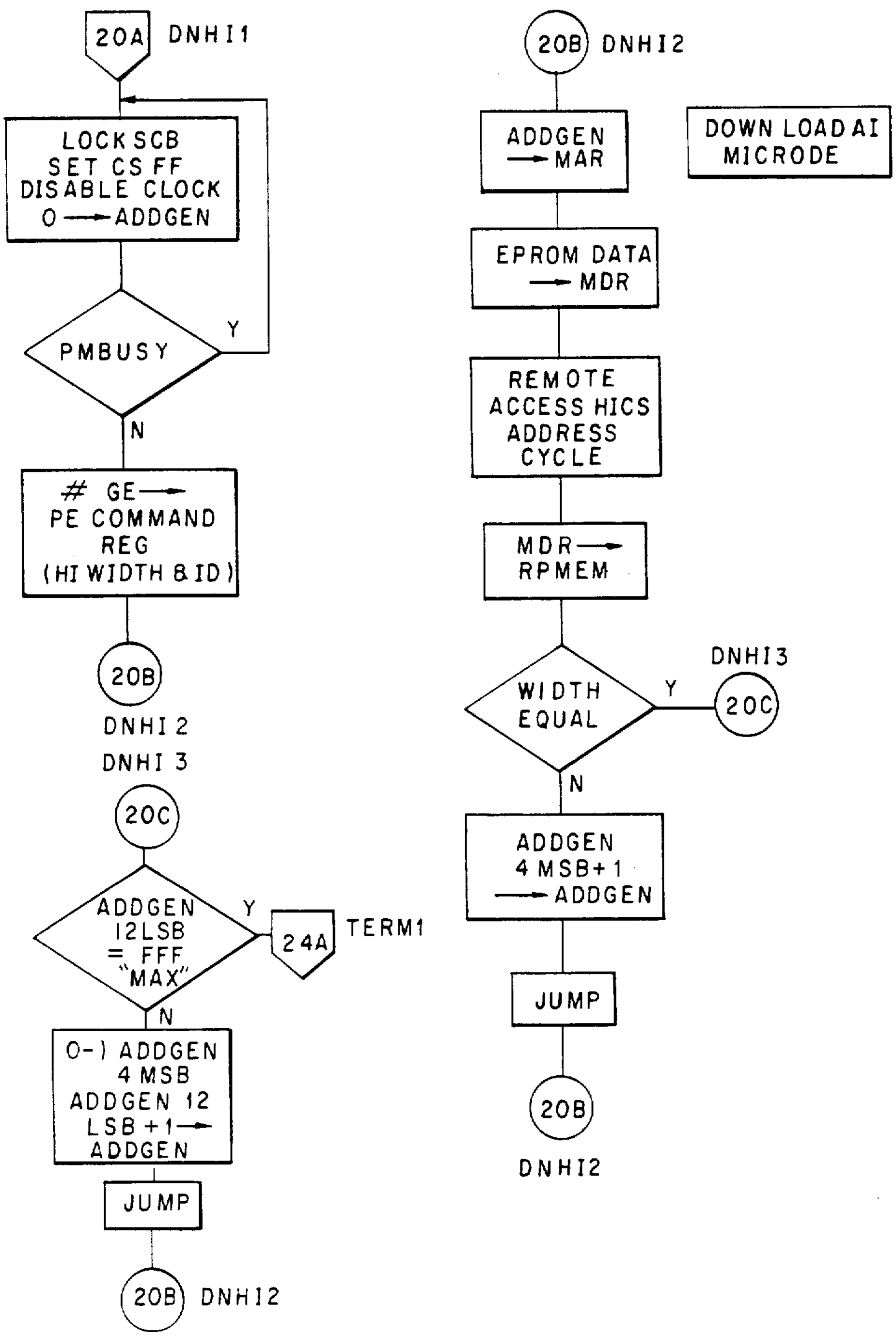

Referring now to FIG. 20, host interface (HI) 20 is shown in block form. Host interface control unit 32H is shown having outputs to HI/SCB control unit 160 and to other processor devices. Host interface control unit (HICU) 32H also has outputs to DMA transfer controller (DMATC) 163 and to multiplexer bus interface and control (MCICU) 165. HICU32H receives inputs from HI/SCB control unit 160, from other array processor devices, and from MCICDU 165, all as shown. The main elements of HI 20 are the HICU32H, DMATC 163, program memory 31H and HI/SCB control unit 160. HI/SCB control unit 160 is shown with outputs and inputs to and from program memory 31H and SCB access arbitration 125, and bilaterally connected to the SCB 27.

DMA/SCB control unit 161 is shown bilaterally connected to SCB 27 to program memory 31H and to DMA transfer controller 163. Bulk memory interface logic 162 is shown bilaterally connected to the DMA transfer controller 163 and to the transfer controller bulk memory data bus. DMA bus interface logic 164 is shown bilaterally connected to DMA transfer controller 163.

Figures 14, 15, 16, 17, 18, 19, 20, 21:
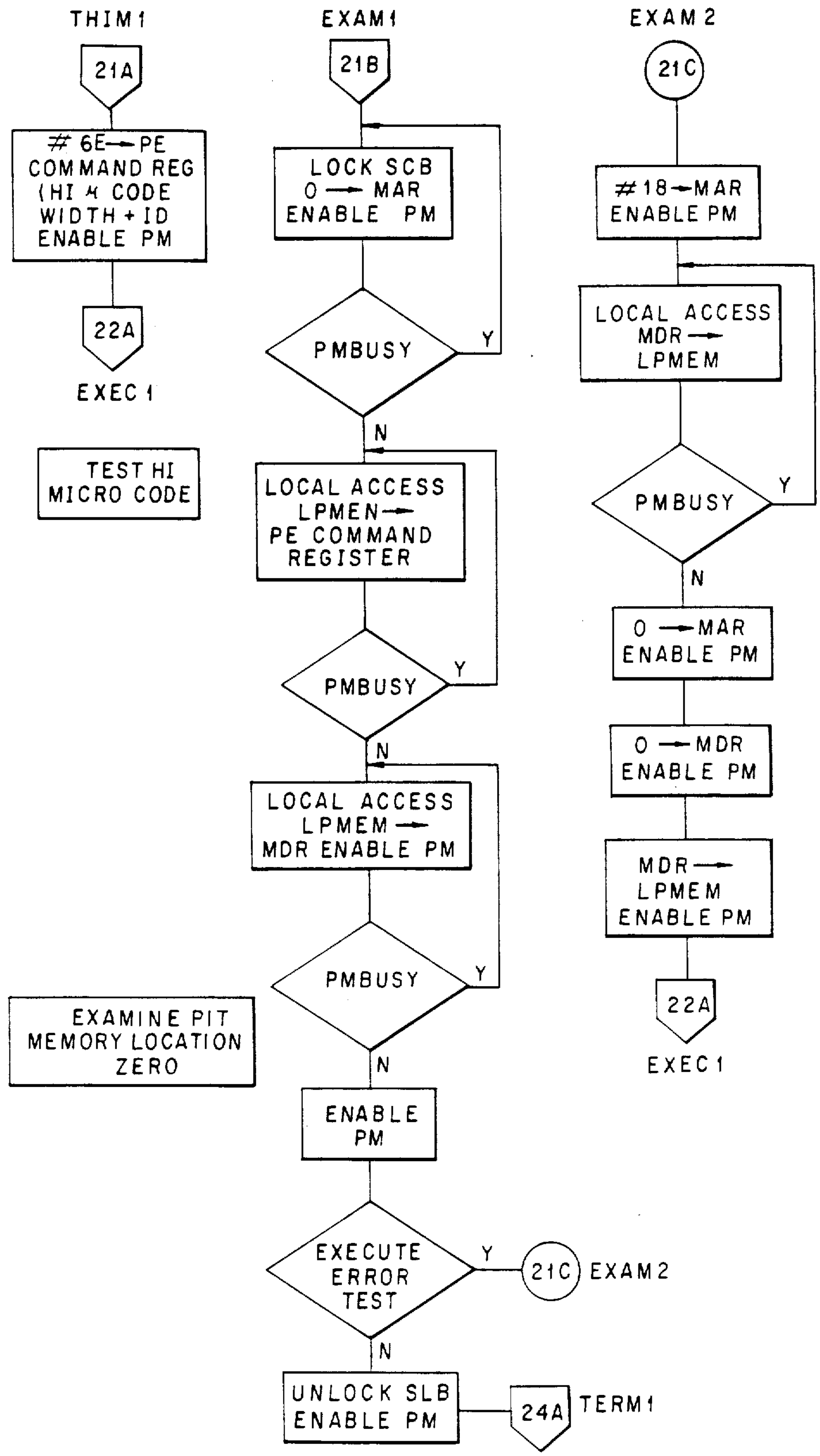

FIG. 21 illustrates HICU32H as connected to control units 160 and 161. This control unit, as can be seen, is the same as the control unit shown in FIG. 4. HICU32H performs the following functions:

1. Accepts and executes commands transmitted to the system from the host computer via the multiplexer bus.
2. Sends status information to the host computer via the multiplexer bus.
3. Activates the DMA transfer controller 163 to perform a transfer operation between the host computer memory and the system.
4. Accepts and schedules operations from the host computer initially transmitted to the system via the DMA transfer controller 163.

5. Initiates and monitors the execution within the individual system devices, and accesses status information as devices complete their assignments.
6. Handles abnormal program termination from any of the devices.

The three major elements within HICU32H are the microsequence 41H, ALU 49H and control store 33H. These elements and the other elements shown had been discussed with respect to FIG. 4. The device complete register 166 was not previously discussed and is used in connection with testing.

Microsequencer 41H is downloaded with microcode from the host computer 12. A listing of this microcode is set out in the Appendix.

Figures 14, 15, 16, 17, 18, 19, 20, 21, 22:
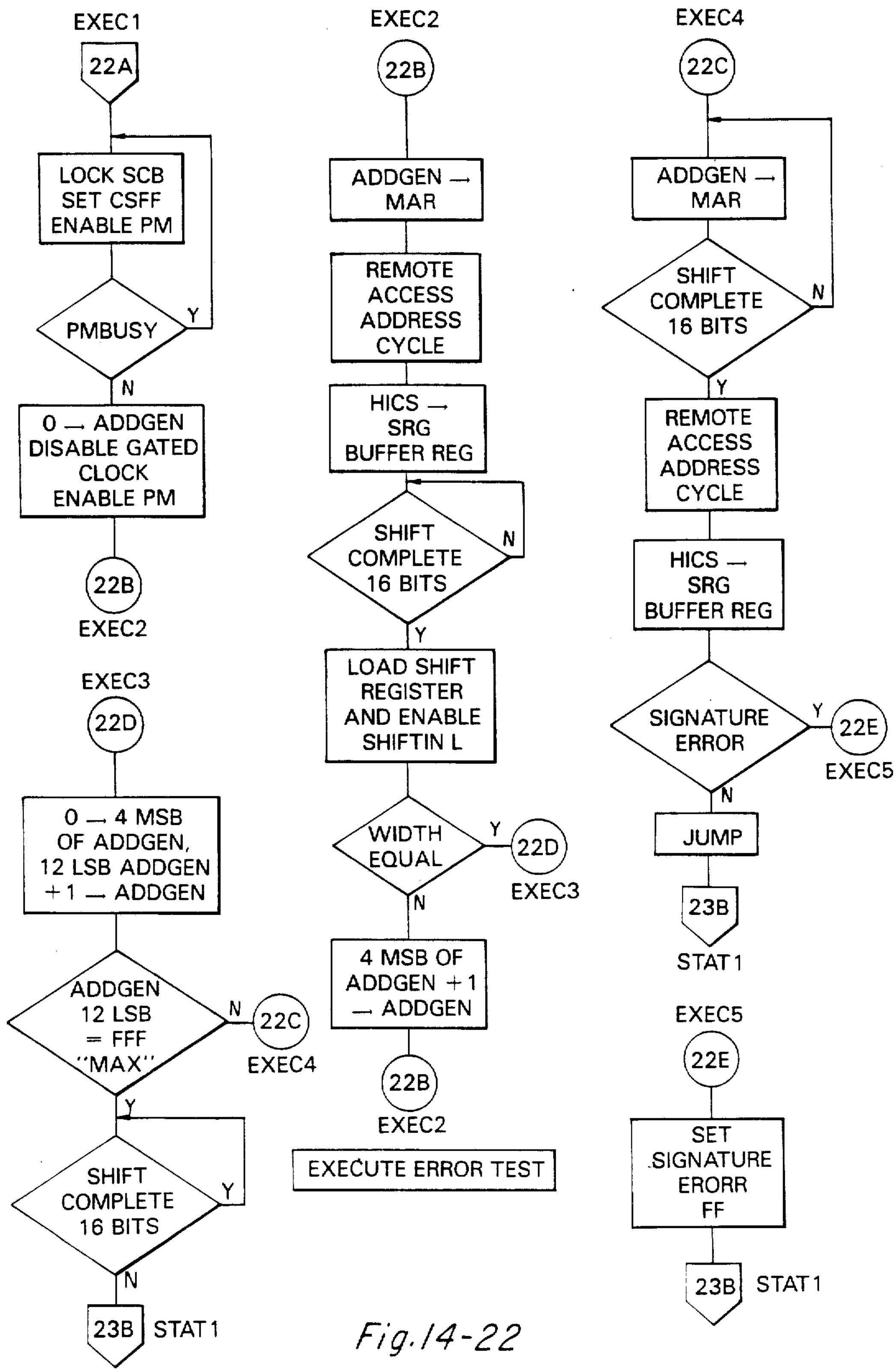

FIG. 22 illustrates the various signal lines that are required to monitor status and generate control signals within HICU 32H. The control signals are generated by a 5-bit microcode field, one bit for data and four bits for address. The address bits are used to address which bit of the addressable latch is to be set to 0 or 1, depending on the data bit. Five control signals are required: SR-, HALT-, EXAM-, BRATEN and SSEN.

Figures 14, 15, 16, 17, 18, 19, 20, 21, 22, 23:
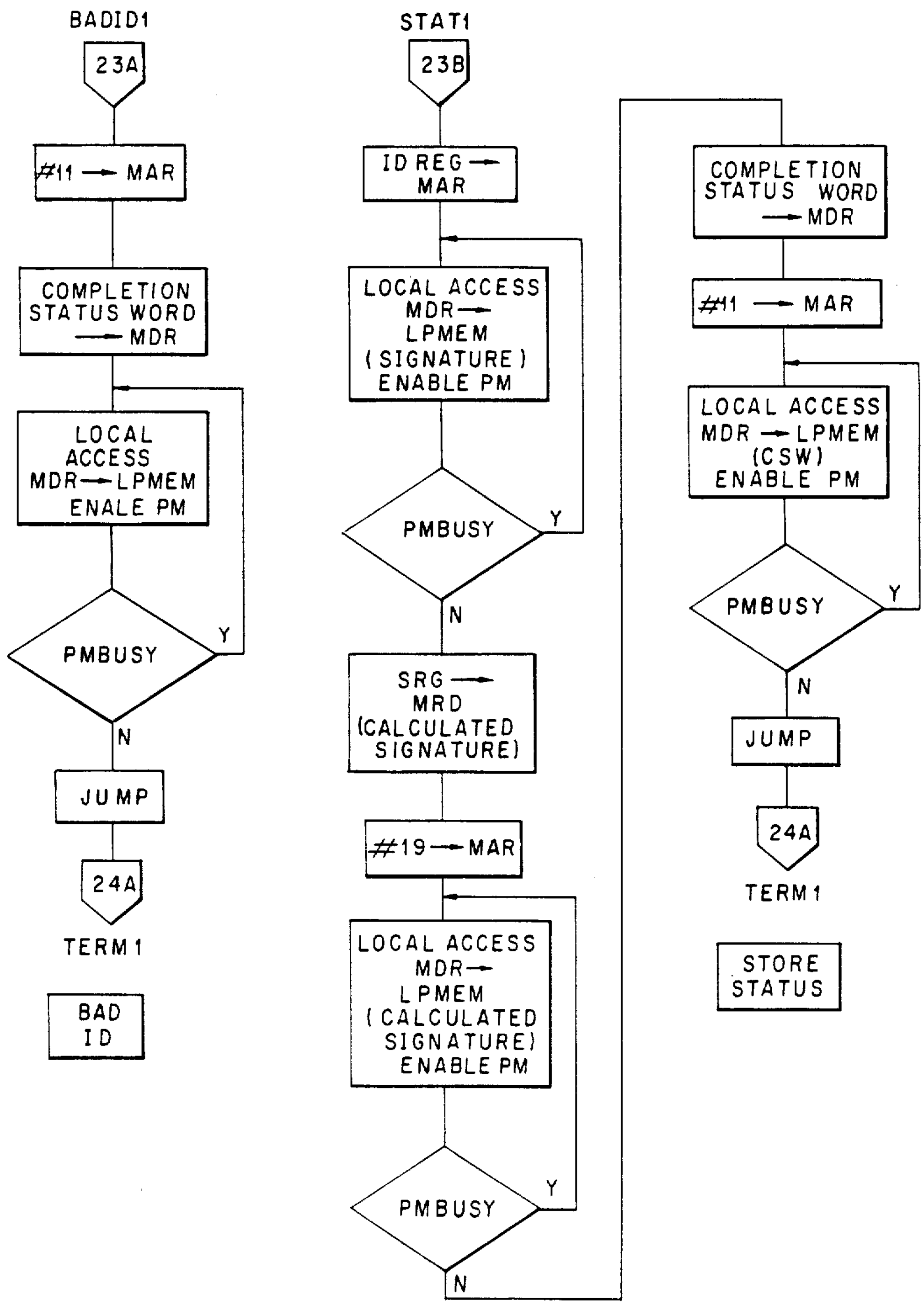

Reference should be made to FIG. 23 for an understanding of the role played by the above described signals. FIG. 23 depicts two levels of programming, as performed in all of the devices. One level of programming is at the microcode level with the microcode being stored in control store 33. The second level of programming is the user level with the instructions being stored in program memory 31. The initial user program entry point is stored in absolute location 0 of program memory 31. At program activation, the PROGRAM SEQUENCING MICROCODE (PSM) accesses location 0 (step 1) to determine the address of the first user instruction to be executed. PSM is responsible for maintaining a pointer to the next user instruction to be executed (PC-Program Counter) and for exception handling at the end of execution of a microprogram. As shown in FIG. 23, user instruction i (step 2) is accessed at some point in the user program. The operation code for instruction i is then used by PSM as an address into an instruction map (IMAP) PROM in step 4. The contents of location j of the IMAP specifies a microcode PC (PC) value (step 5) which, in turn, corresponds to the entry point of microprogram J (step 6). Micro program j executes the functions associated with instruction i. At micro program j completion, control is returned to PSM (step 7), the next user instruction accessed, the PC updated, (step 8), and corresponding micro program executed. User program execution continues until a "HALT" instruction is executed by the device.

Figures 14, 15, 16, 17, 18, 19, 20, 21, 22, 23, 24:
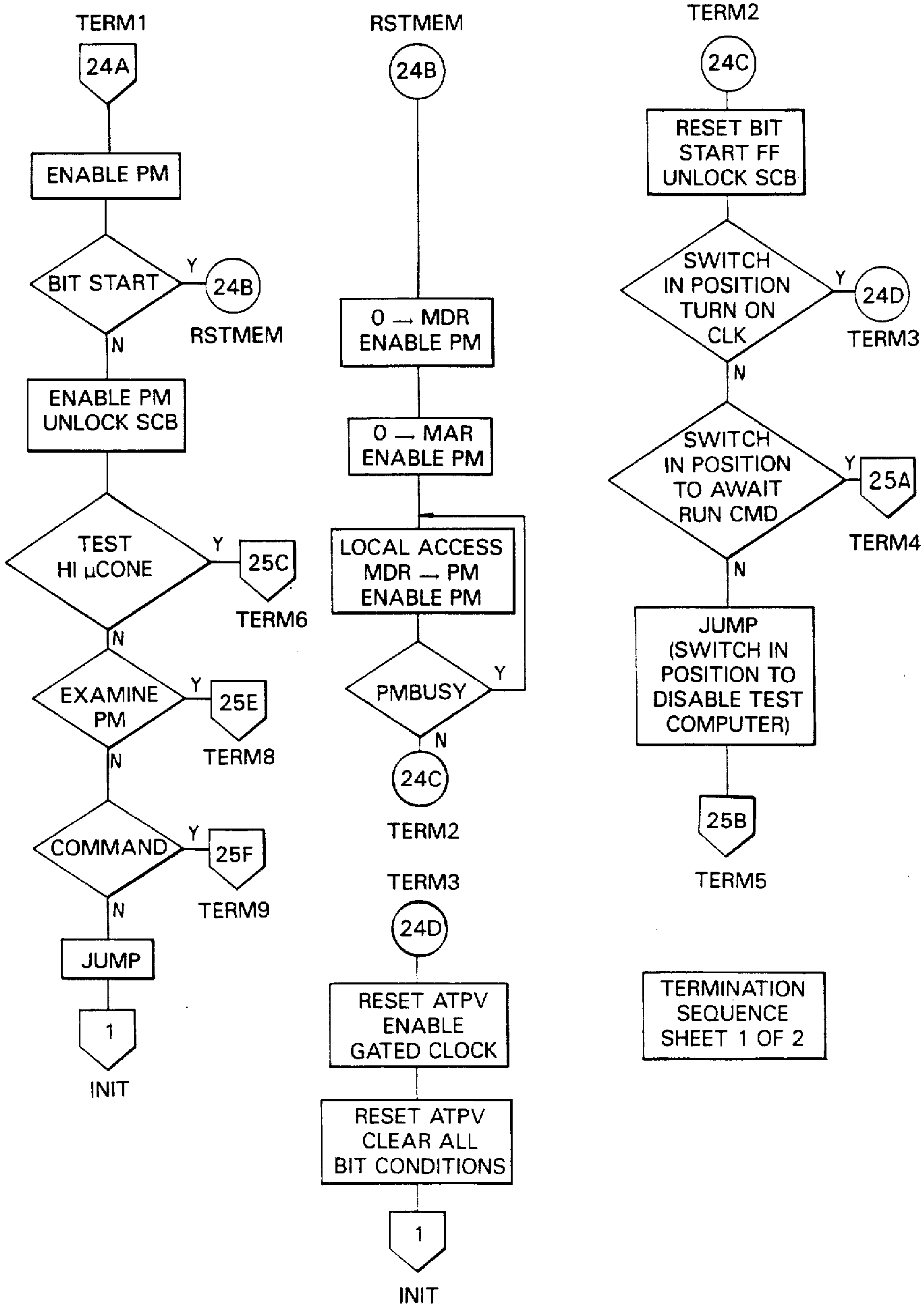
Figures 14, 15, 16, 17, 18, 19, 20, 21, 22, 23, 24, 25:
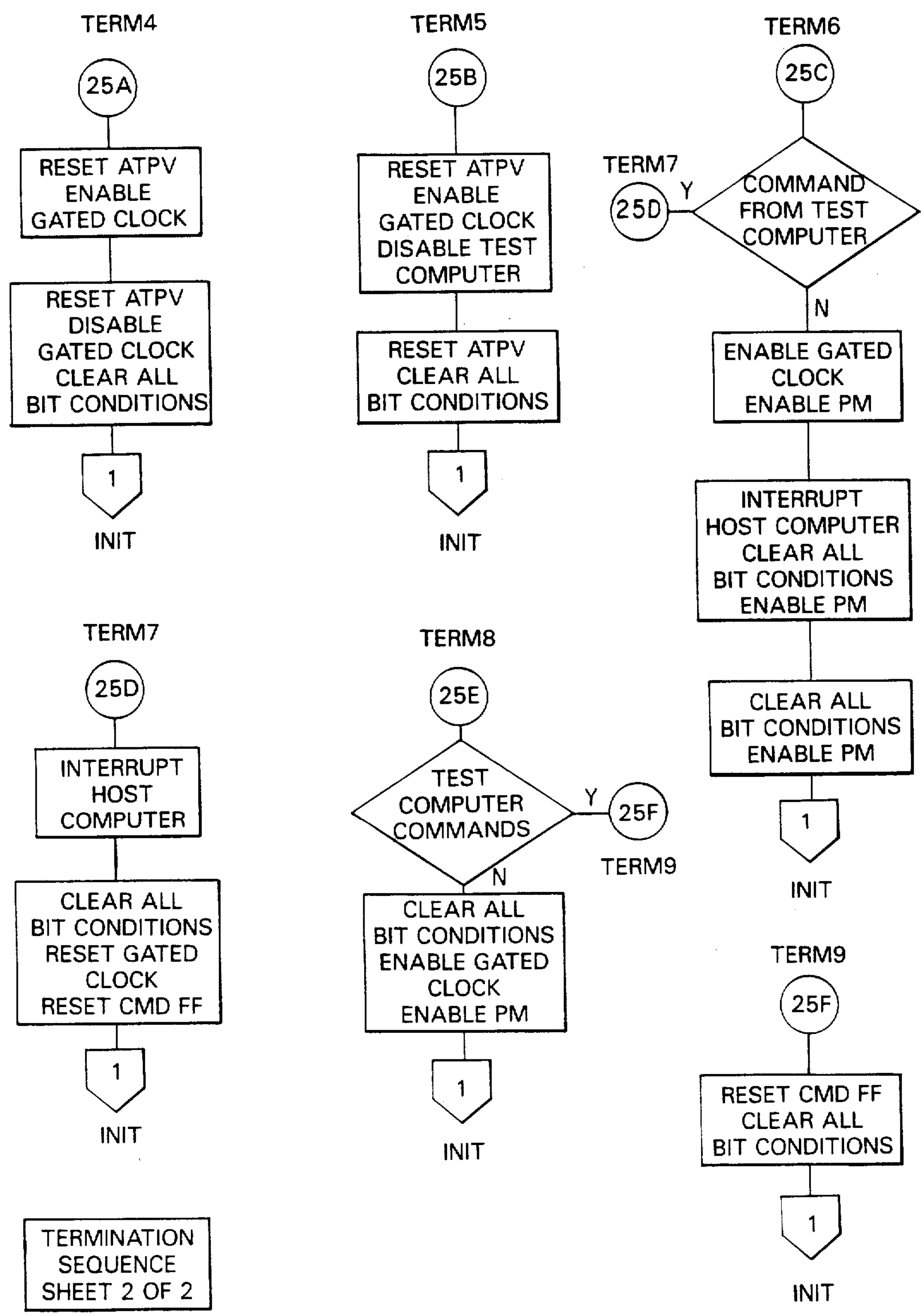
Figure 15:
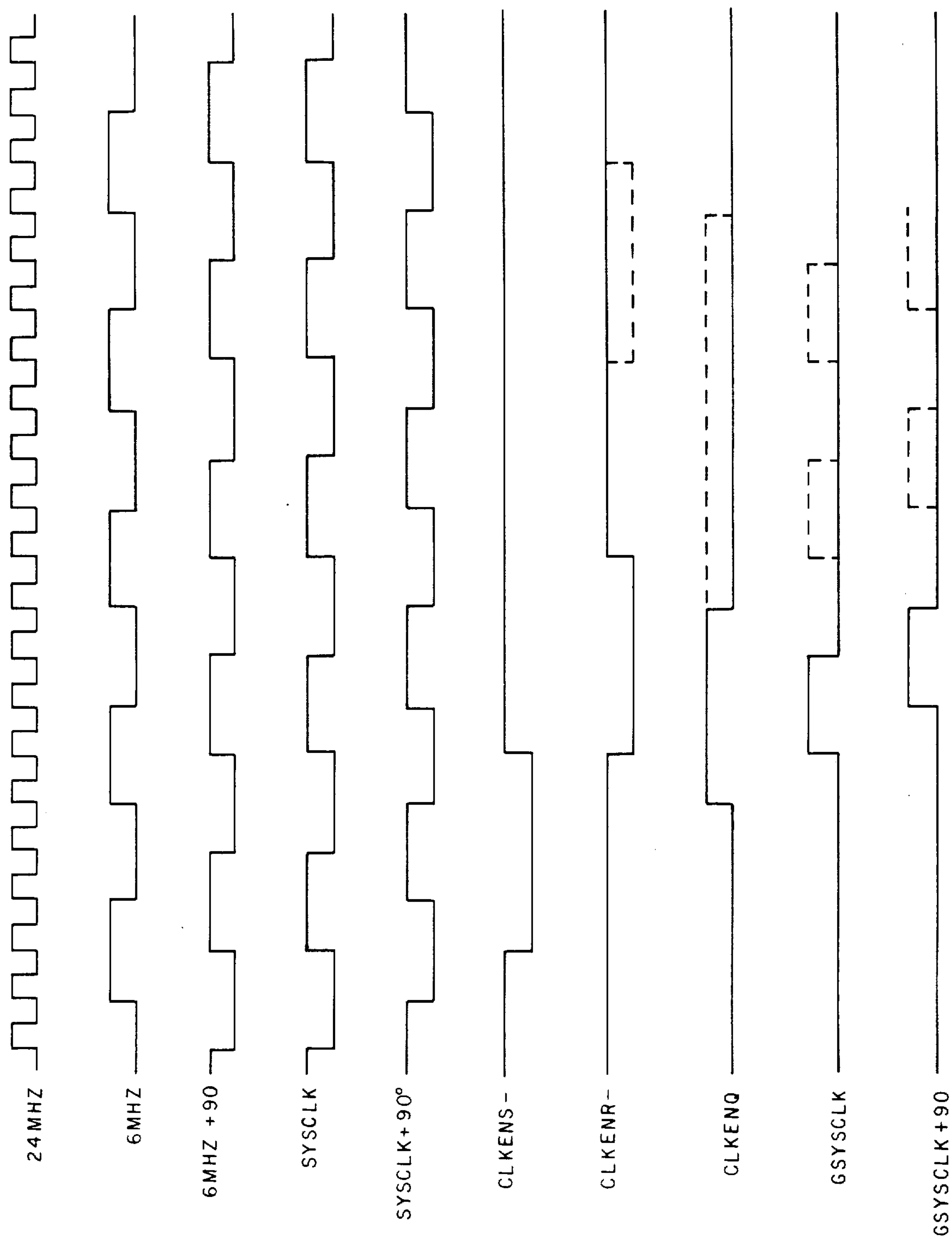
Figure 16:
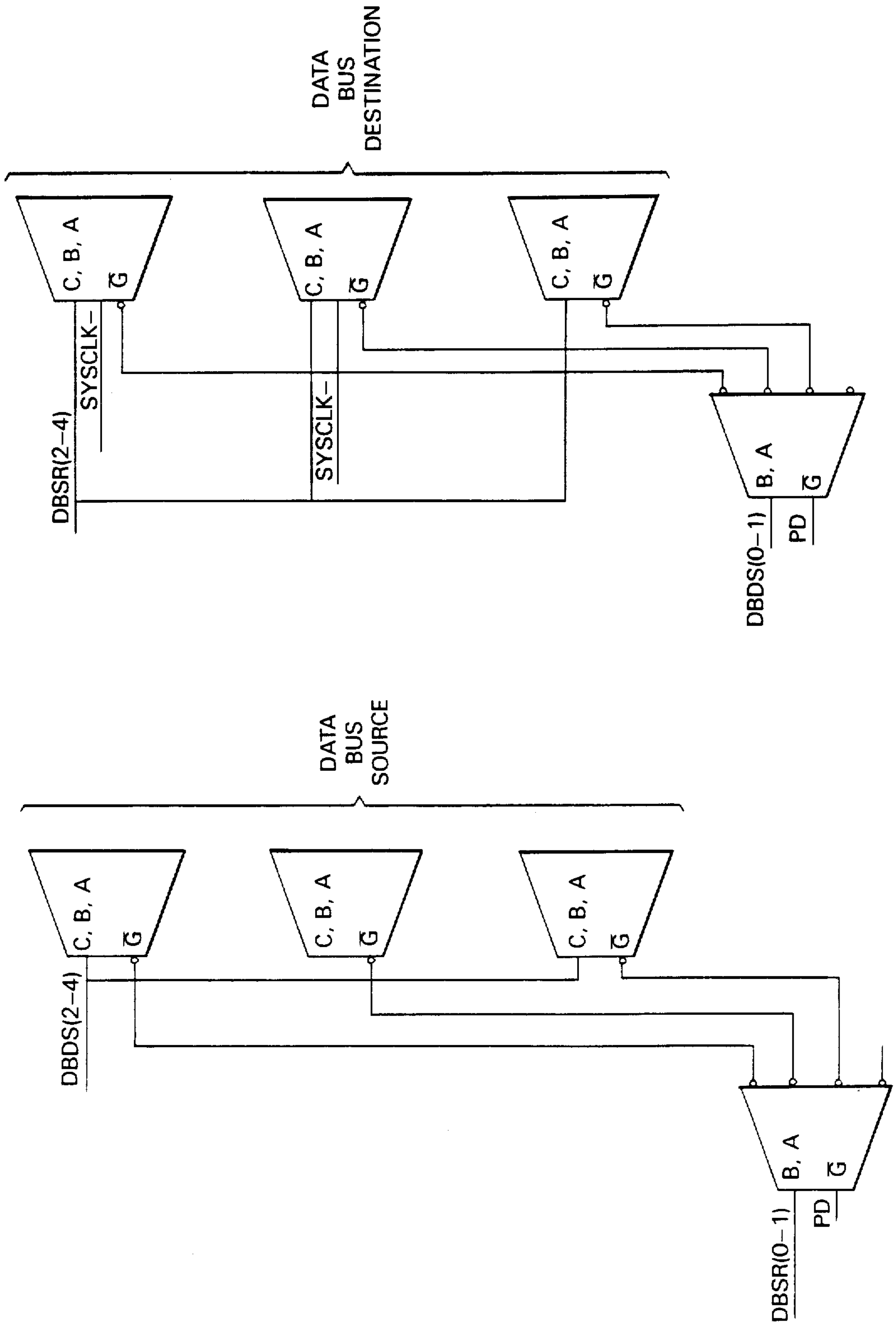
Figure 17:
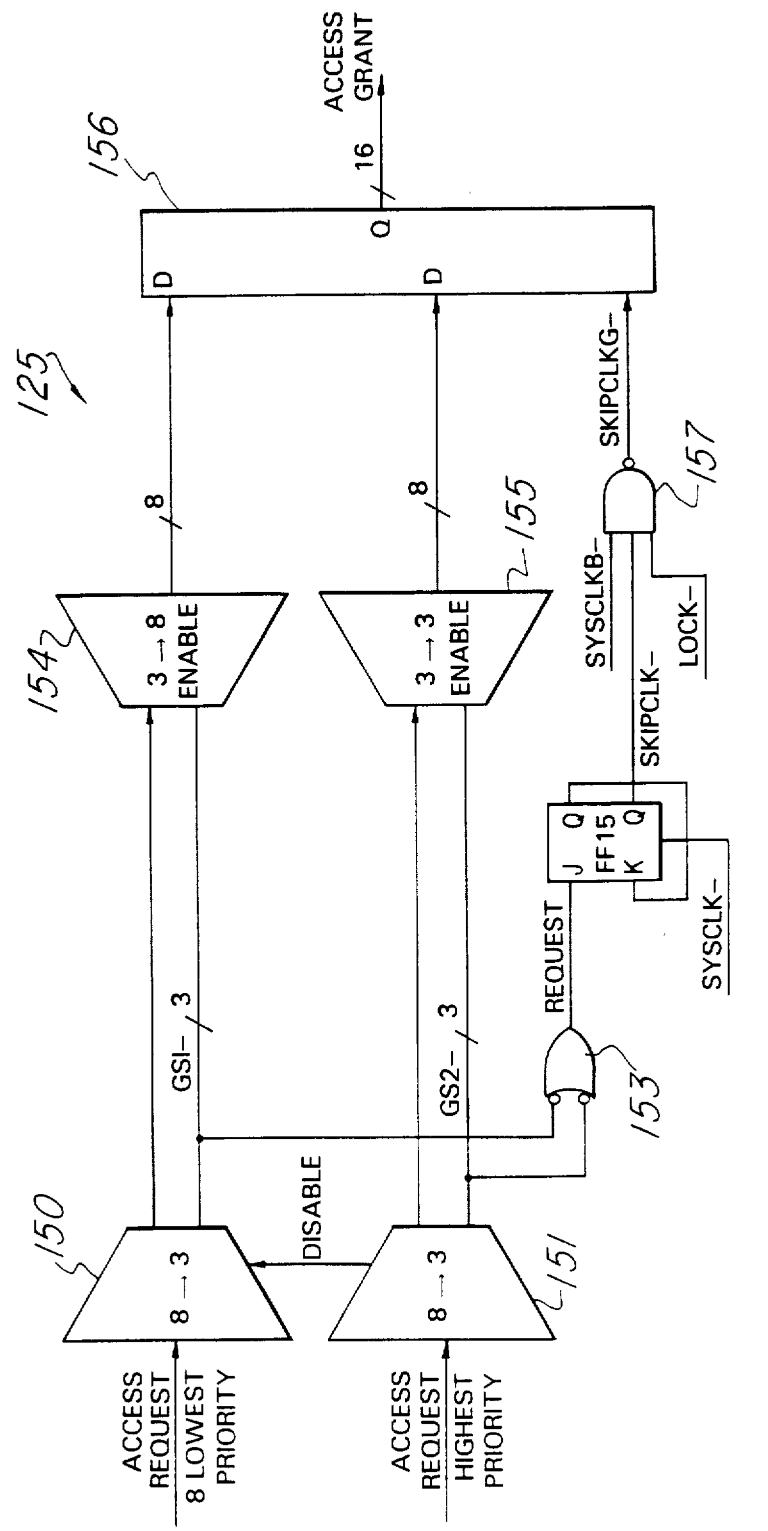
Figure 18:
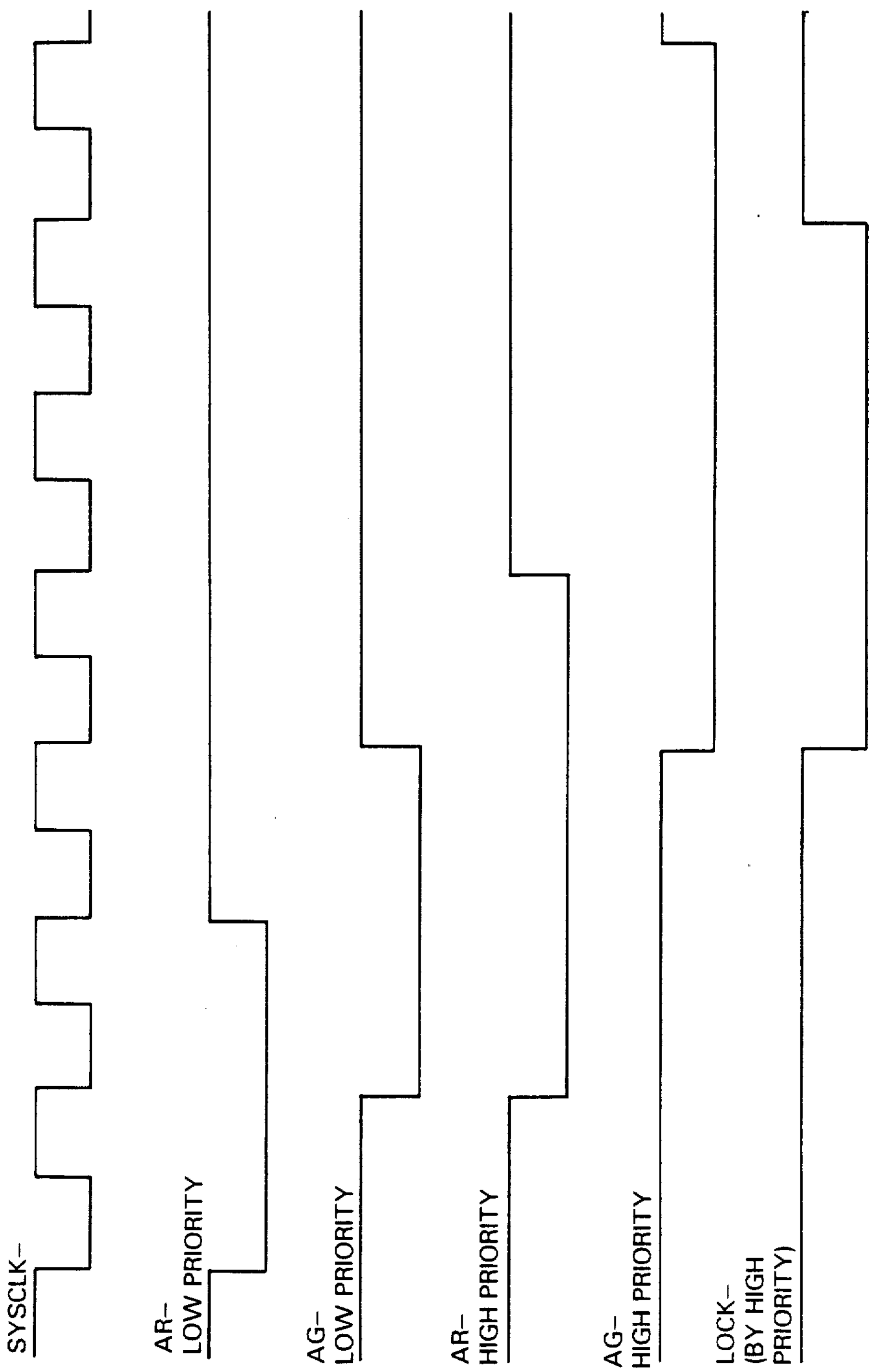
Figure 19:
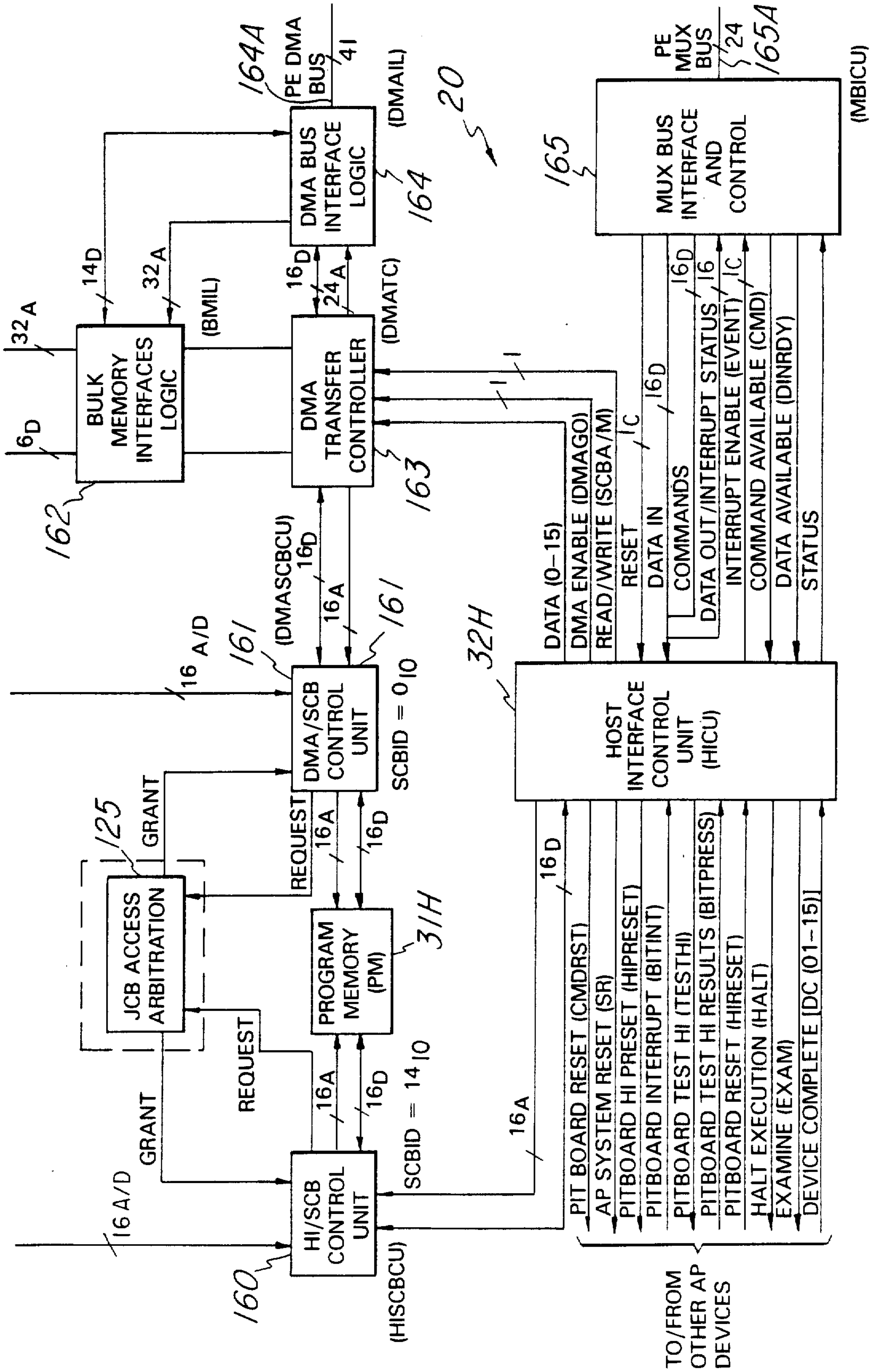
Figure 20:
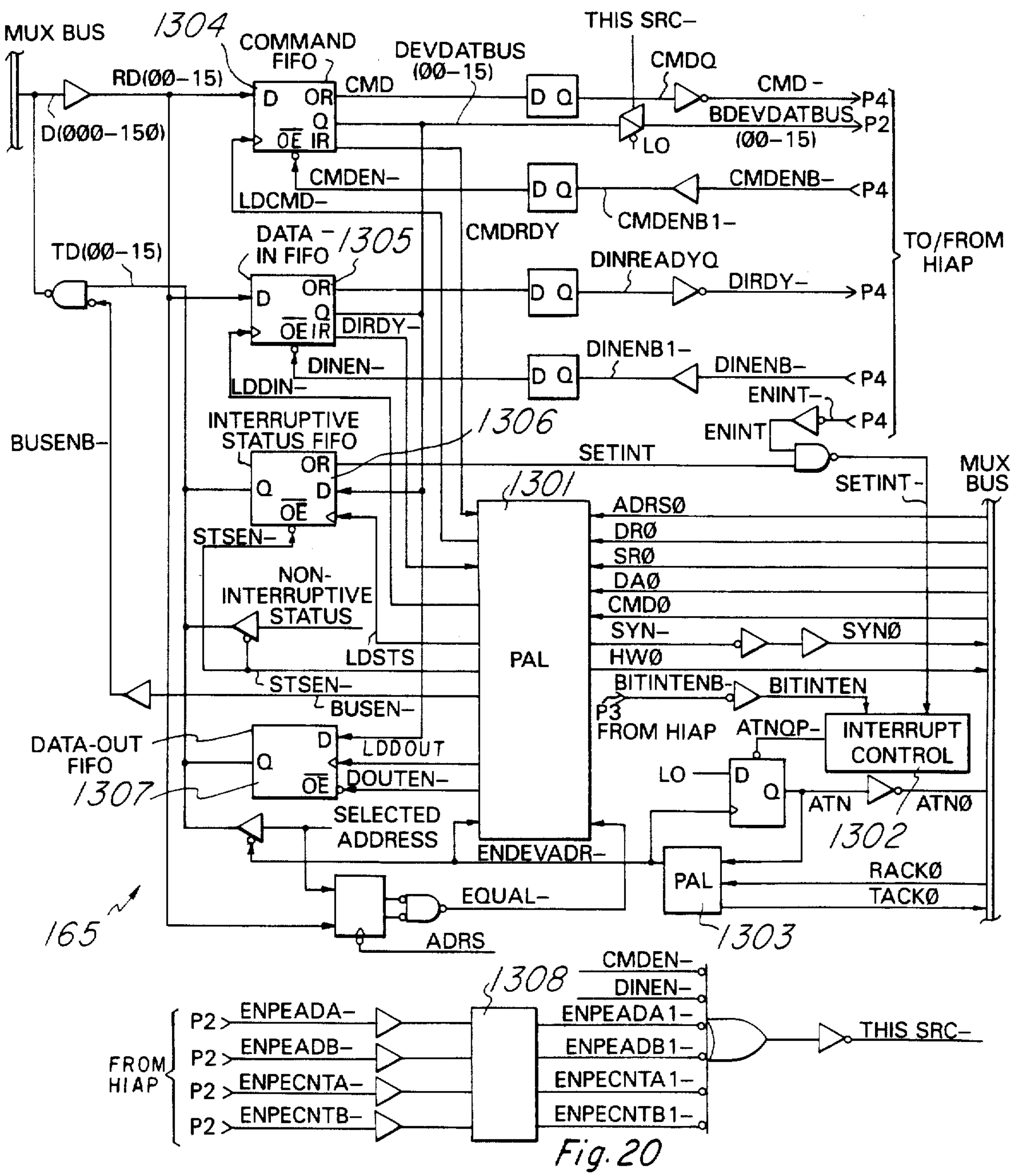
Figure 21:
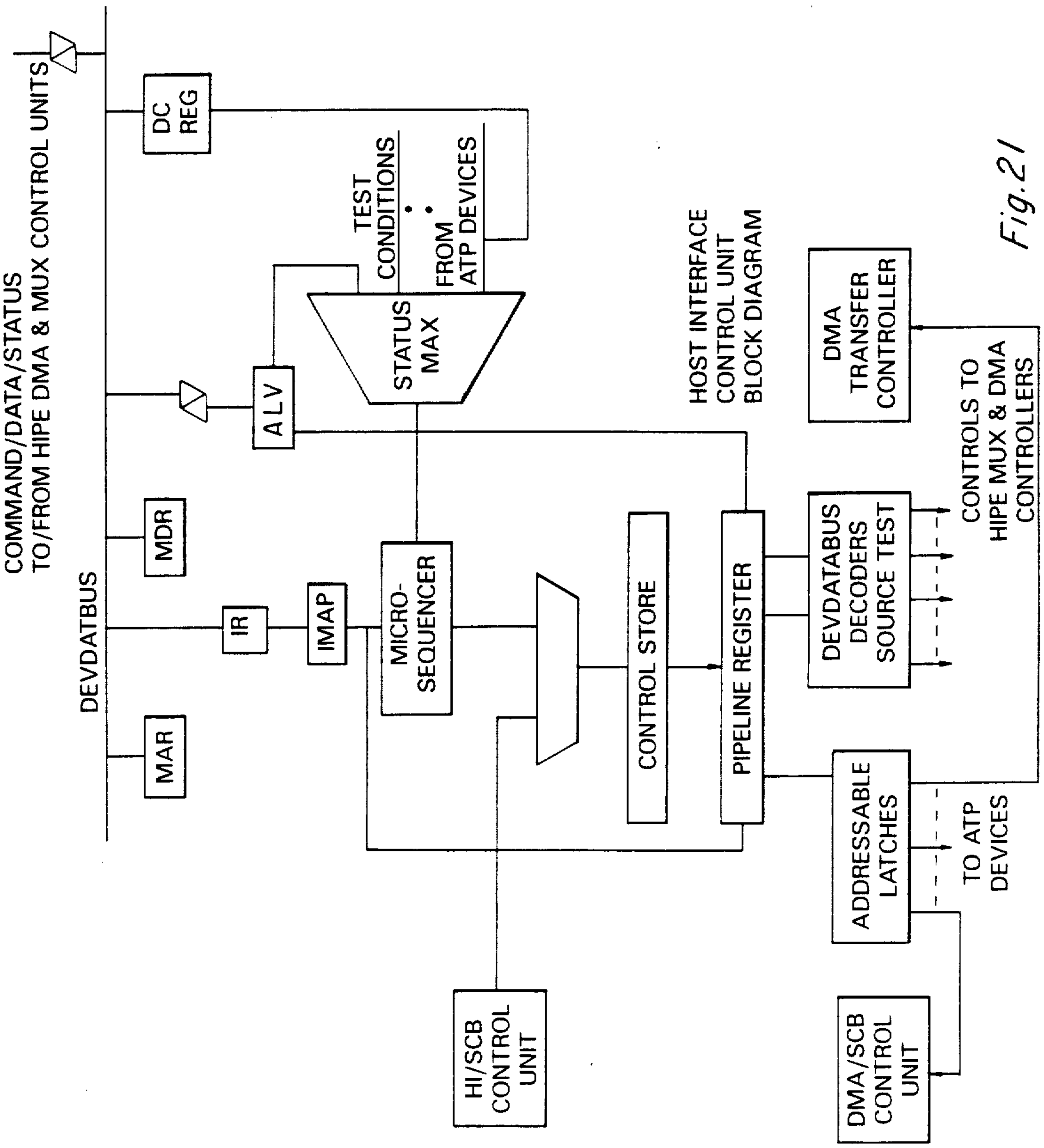
Figure 22:
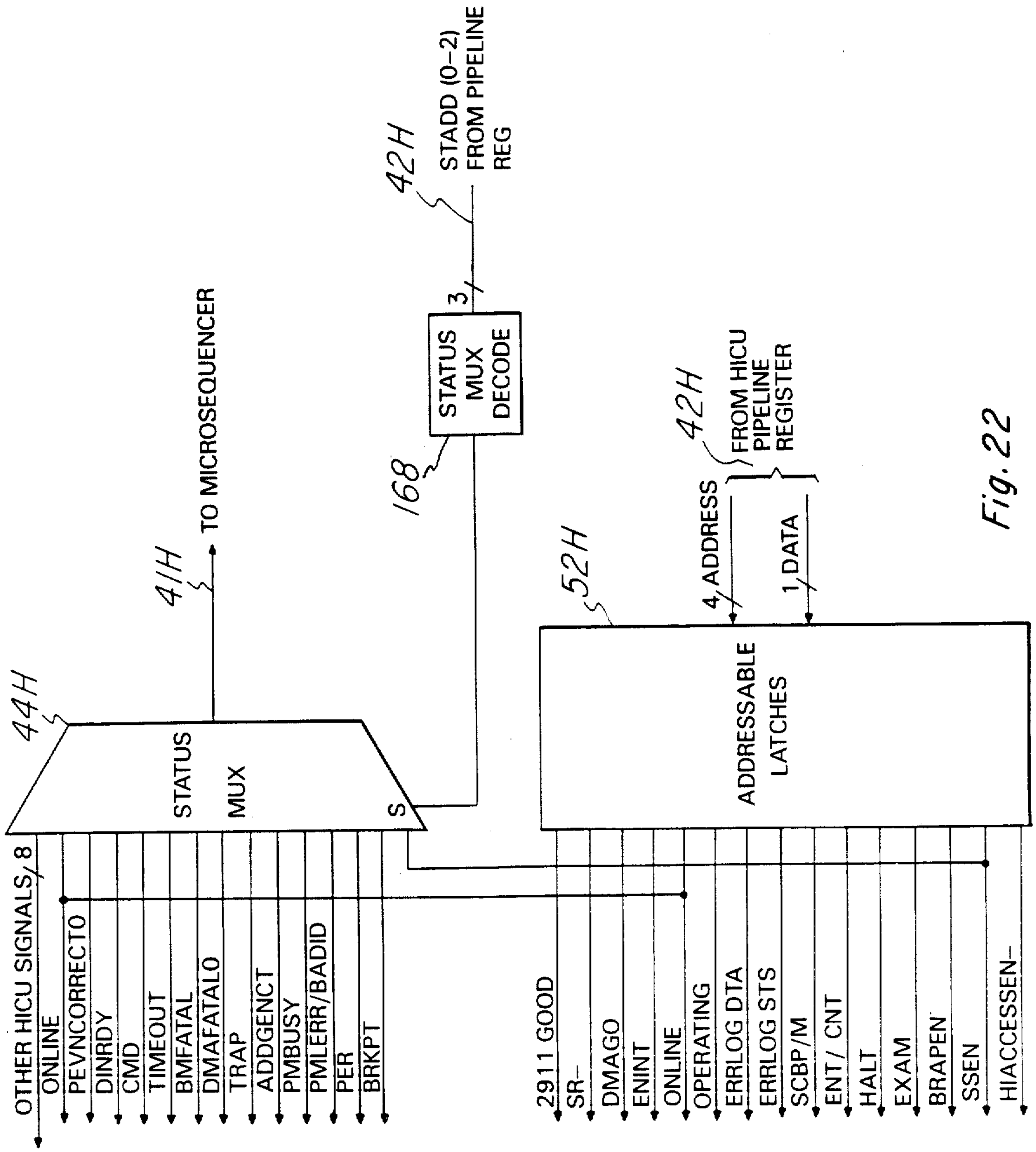
Figure 23:
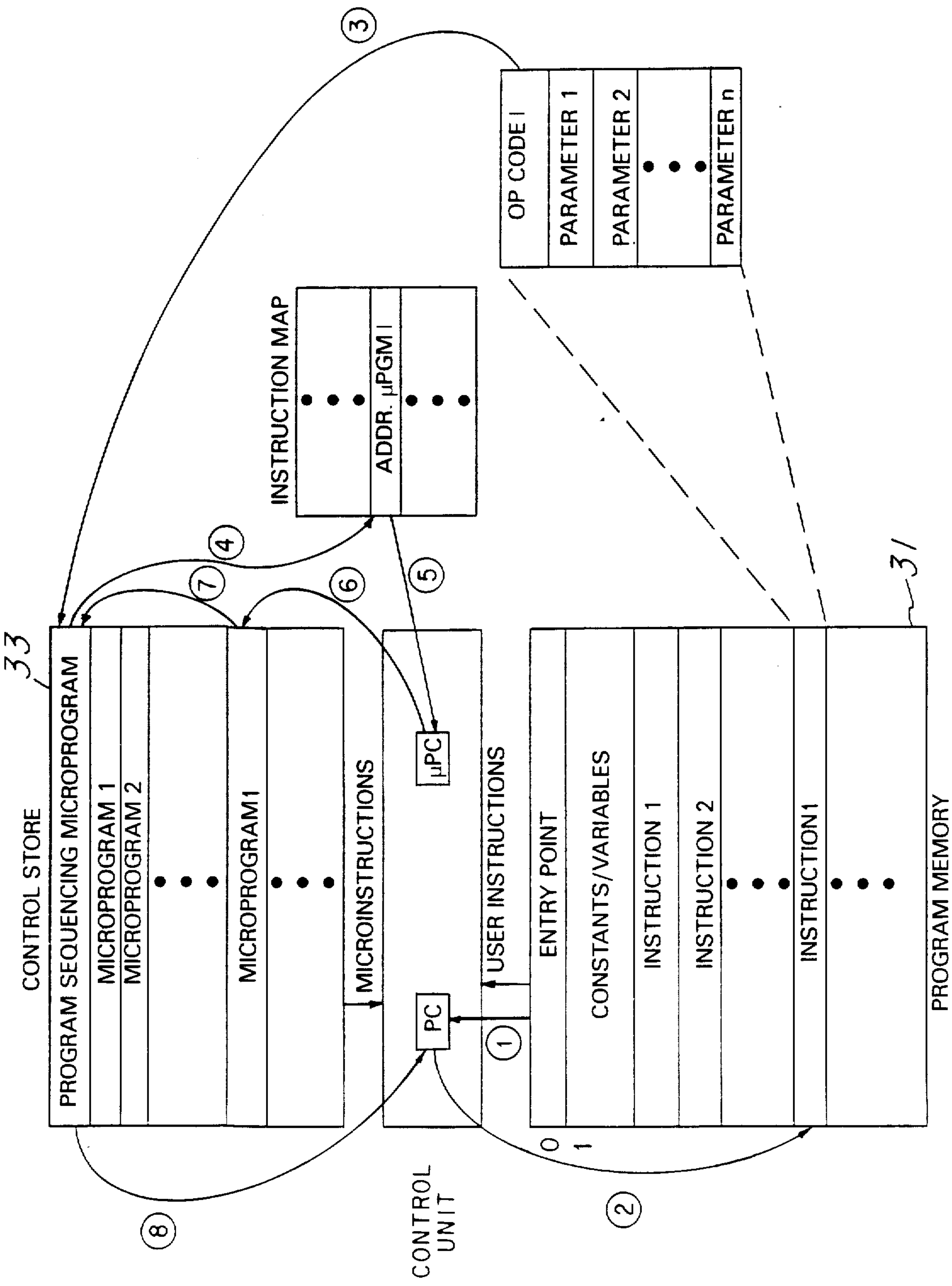

FIG. 24 is a block diagram of DMA transfer controller 163. DMATC 163 is started by HICU 32H which provides signal DMAGO for starting DMATC 163. To generate addresses rapidly enough (one address per clock), DMATC 163 has a separate address generator for each of its three interfacing buses. SCB address generator 167, BM address generator 168 and host address generator 169. each of these three address generators also has a counter associated with it for the number of elements to transfer. When data is available, each generator will generate its next address and decrement its number of elements counter. The counters are not shown but are part of the control units 171, 172 and interface 173. When a particular counter reaches 0, the associated address generator stops. BM address generator 168 has the capability of generating a new 32 bit address every clock cycle. This address is compared with a limit compare 175 which provides signal BMLER, terminating the operation if the limit has been exceeded.

Host address generator 169 has the capability of generating a new 24 bit absolute host memory address on every clock. Each address is compared in the limit compare 176. If outside the limits, the transfer currently in progress is terminated and the host computer is notified with signal HOSTLER.

SCB address generator 167 generates a new address in at least every two clocks.

Bulk memory interface logic 162 includes buffering necessary to form 64 bit bulk memory data words from the 16 bit data values obtained from the direct memory access (DMA) bus or from SCB bus 27 prior to writing in the bulk memory 14. On read operations, bulk memory interface logic 162 holds the 64 bit values from the bulk memory 14 and allows the accessing of 16 bits at a time to the host 12 or SCB logic 71. For 32 bit writes, bulk memory interface logic 162 places the same 32 bit data word on both the upper and lower halves of the 64 bit data bus to the bulk memory 14. A transfer rate of 48M bytes per second to or from bulk memory is supported in short bursts due to buffering limitations in slower transfer speeds on the host and SCB buses.

Host interface (HI) 20 is divided into two sections, one resident in the host computer 12 (HIPE) and one resident in the ATP V 10 (HIAP). The HIPE interfaces with both the host computer 10 and the memory via the multiplexer bus (Mux bus) 165A for control and status reporting and a direct memory access bus (DMA) 164A for data transfers to/from ATP V 10 devices. The HIAP interfaces with all ATP V devices via the system control bus (SCB) 27 for reading from or writing to ATP V device program memory 31 and microcode control stores 33, and to bulk memory 14 via the transfer controller (TC) 23 APM bus for transferring unprocessed and processed data arrays between host computer 12 and ATP V 10.

FIG. 20 illustrates, in block form, the Mux Bus Interface and Control (MBICU) in block form. The MBICU provides a communications port between host computer 12 and ATP V 10. The MBICU is comprised of two registers 1304 and 1305 into which data can be written, and two registers 1306 and 1307 from which data can be read. These registers can be accessed at any time to either command the ATP V 10 or ascertain status. Once a command is received by the HIPE, the HIAP is signaled via the host interface control unit (HICU) 32H with the appropriate control line. HICU 32H responds by reading the command and taking the necessary action.

HICU 32H is the focal point of the host interface 20. It accepts, executes and returns status of command over the PE Mux Bus 165A. It sets up and activates the TMA transfer controller 163 (shown in FIG. 24) to transfer data between host computer 12 and ATP V 10, host computer 12 and bulk memory 14, and ATP V 10 and bulk memory 14. In addition, the HICU 32H, by means of executing assembly language instructions resident in host interface program memory 31H, performs scheduling and control functions of control word blocks which are passed to the ATP V 10 by way of the DMA transfer controller 163. HICU 32H initializes and monitors all ATP V 10 device operations and returns status upon completion of the assignment of each device.

DMA transfer controller (DMATC) 163 provides for the control of transfers between host computer 12 and bulk memory 14, host computer 12 and SCB 27, and bulk memory 14 and SCB 27. DMATC 163 communicates with the microcode to provide for loading of transfer parameters and control over starting and ending of transfer cycles.

DMA bus interface logic (DMAIL) 164 provides for interface to PE DMA bus 164A. DMAIL 164 allows ATP V 10 to access host computer 12 memroy at high speed burst transfers. DMAIL 164, through DMATC 163 can access bulk memory 14 providing a high speed port between mass memory 14 and host computer 12.

Bulk memory interface logic (BMIL) 162 provides the necessary protocol between bulk memory 14 and HI 20. Transfers are made in either a 32 or 64-bit format.

The MBIL 162 allows HI 20, IC 24, and TC 23 to vie for use of the bulk memory 14. Each I/O requires a request/grant with priority management being handled by TC 23. HI 20 has priority 3, TC 23 has priority 6 and IC 24 has priority 0, with 0 being the highest.

Figure 24:
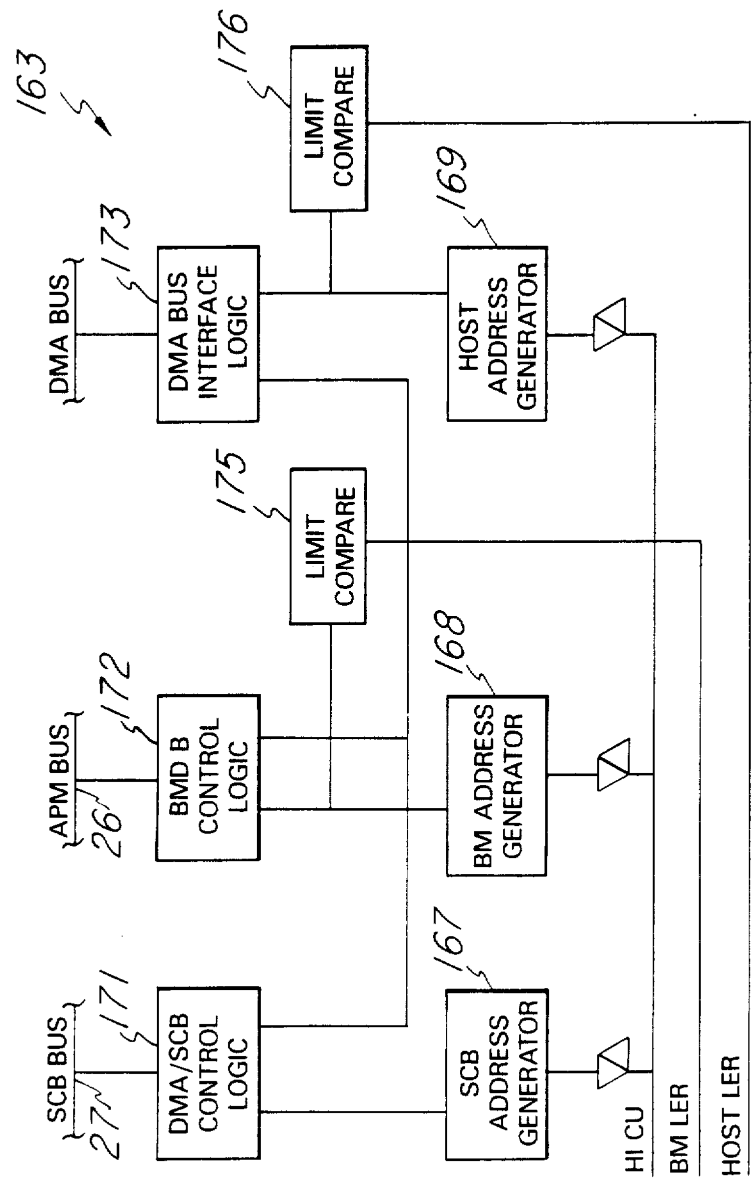
Figure 24A:
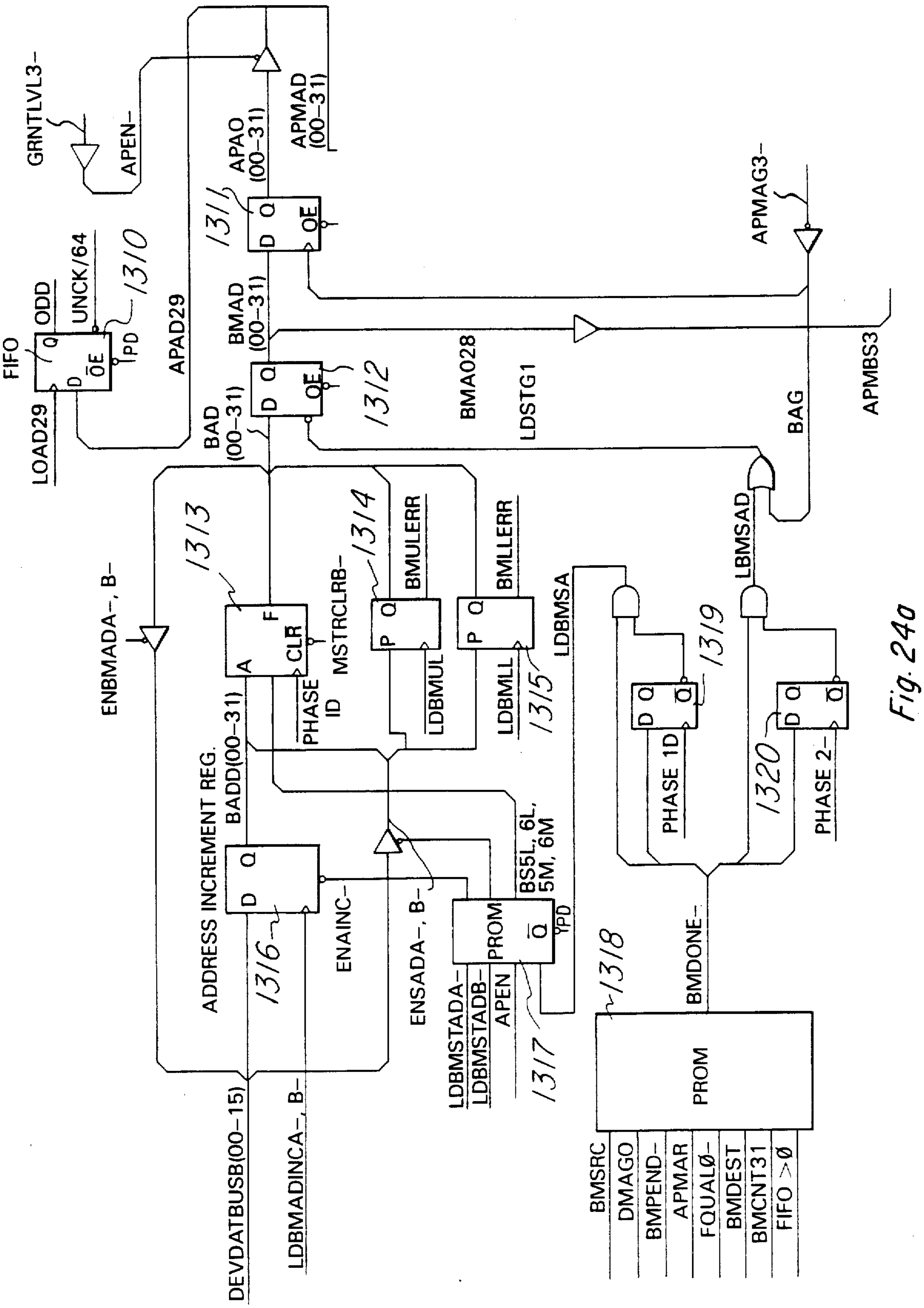
FIG. 24*a* is a block diagram of the bulk memory address generator.

The bulk memory address generator, as shown in FIG. 24a, provides the addresses for access of locations within bulk memory 14. To begin with, a start address is provided from microcode through pipeline register 42H to DEVDATBUSB(00-15) where it is loaded into the bulk memory address generator. Host interface 20 can access bulk memory 14 only on either 32 or 64-bit address boundaries. Each address generated is compared to an upper and lower limit value to allow segmentation of bulk memory 14 for multi-tasking.

DMA/SCB control unit (DMASCBCU) 161 provides the interface with device program memories 31 and control stores 33. This interface allows for direct transfers between host computer 12 or bulk memory 14 and SCB 27 devices. DMASCBCU provides address for addressing remote program memories 31 and control stores 33.

Input Controller

The primary function of the input controller 24 is to accept timing signals and select channel data from a line interface unit 17 (FIG. 1), then to format, demultiplex, and store the selected channel data in bulk memory 14. As indicated above, data also may be supplied from the host computer 12. The inclusion of input controller 24 enables the very rapid handling, in this preferred embodiment, of a large amount of seismic data. Input controller 24 is capable of receiving data from 4,096 channels sampled at 2 ms. During the buffering of a complete seismic record, input controller 24 signals other devices in the system (e.g., transfer controller 23) that sub-buffers filled with channel data are available for processing. The sub-buffers then are available for processing by the other array processor devicss. After the sub-buffer has been emptied, it is available for re-use during the input process, thus minimizing overall bulk memory 14 capacity requirements. The data input from LIU 17 is sent alternately to two buffers located in bulk memory. While input controller 24 is sending data to one buffer, the other devices are processing data from the previously filled buffer. Input controller 24 interfaces with the LIU 17, APM bus 26 and system control bus (SCB) 27.

Twenty five signal pairs connect LIU 17 and input controller 24: First start of scan (ATPV1STSOS), start of scan (ATPVSOS), data strobe (ATPVSTRB), LIU data (ATPDATA(00-19)) (ATPDAT), LIU clock (ATPV2048CK), end of record (ATPVENRCD) and GROUND.

The LIU 17 interface is completely asynchronous to the system clock 121. It has its own clock (not shown) that runs continuously whether data is being transferred or not. This clock (LICK) has a frequency of 2.048 Mhz.

IC 24 converts data from LIU 17, in the LIU format (to either a 16-bit, quaternary exponent, floating point format, or a 32-bit, hexadecimal exponent, floating point format. For test purposes, the format conversion circuitry can be bypassed and the data written directly into the scan buffer memories.

The 16-bit, quaternary exponent, floating point data format, consists of a sign bit, a 3-bit, base four exponent, and a 12-bit, one's complelment mantissy. If the sign bit is a logic 0, the data word is positive, and if it is a logic 1, the data is negative. The exponent can have a range of values from $4^0$ to $4^7$. The radix point is on the left side of the mantissa.

The 32-bit, hexadecimal exponent, floating point data format (sometimes referred to as the IBM format) consists of a sign bit, a 7-bit, base 16 exponent and a 24-bit mantissa. If the sign bit is a logic 0, the data word is positive, and if it is a logic 1, the data is negative. The exponent is biased by 64 which allows for a range of values from $16^{-64}$ to $16^{63}$. The radix point is on the left side of the mantissa.

Figure 25A:
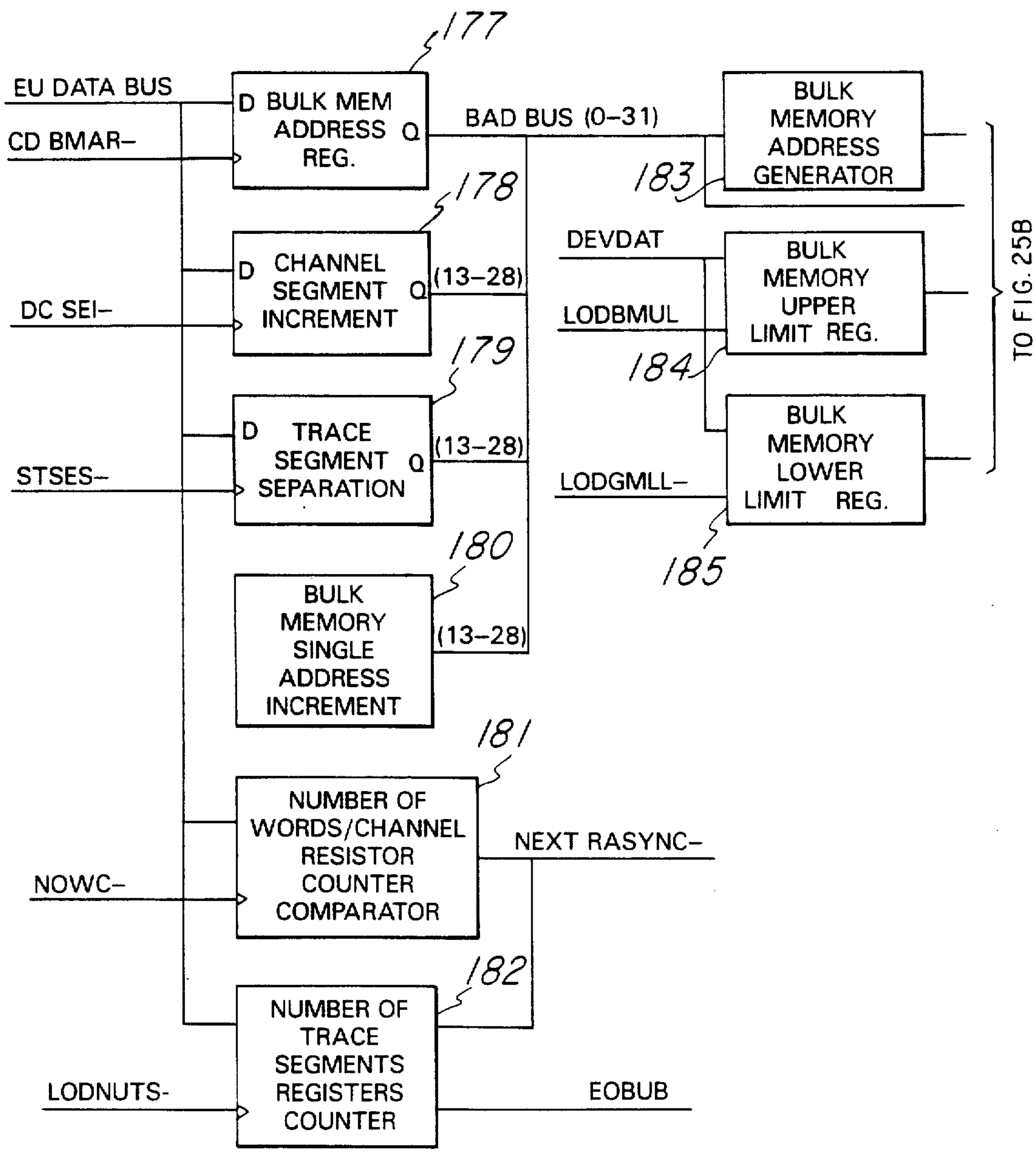
Figure 25B:
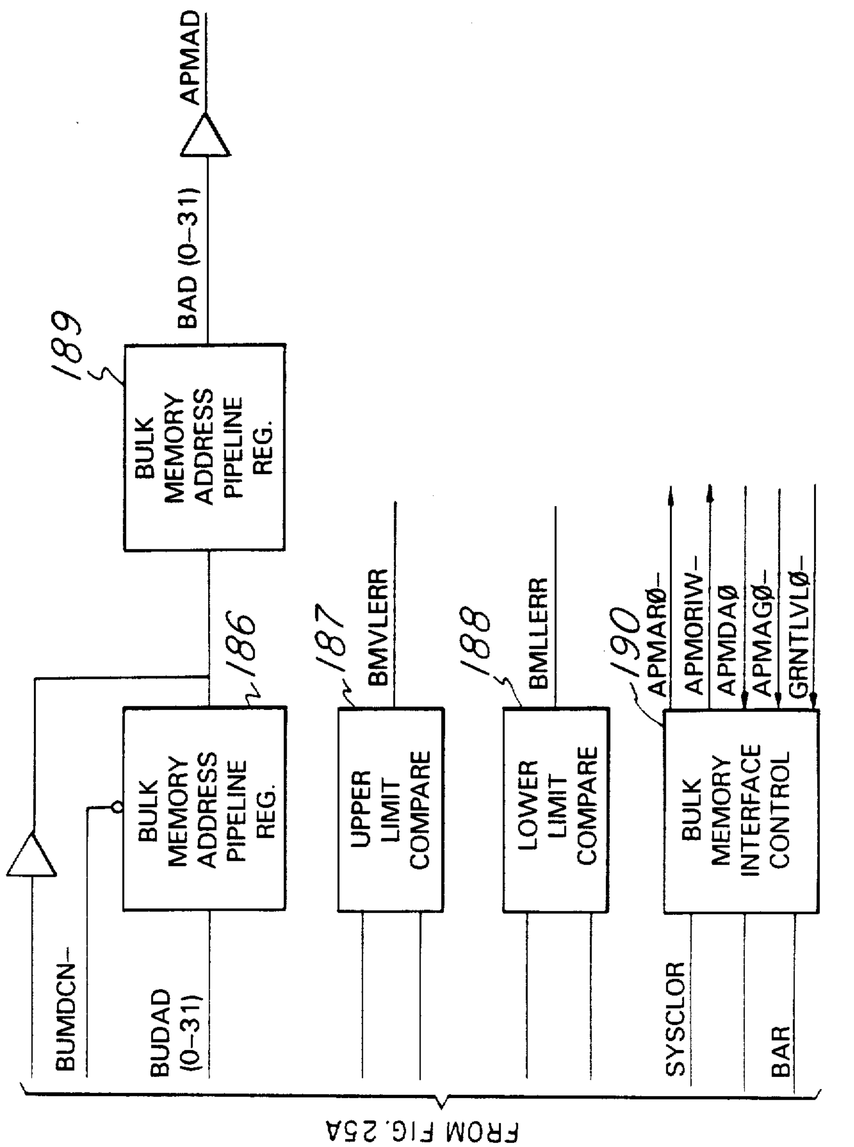

Referring now, to FIGS. 25*a* and 25*b*, the address generation for bulk 14 is shown. Data is applied over DEVDAT bus to bulk memory address register 177, channel segment increment 178, trace segment separation 179, number of words per channel 181 and number of trace segments 182, respectively. Signals LODBMARL- and LODBMARU- (load bulk memory address register) are applied to register 177; signal LODCSEI- (load channel segment increment) is applied to incrementer 178; signal LODTSES- (load trace segment separation) is applied to device 179; signal LODNOWC- (number of words per channel) is applied to device 181; signal LODNUTS (number of trace segments) is applied to device 182. The outputs from each of units 177-180 is applied to bulk memory address generator 183.

Bulk memory address register 177 is a 32-bit register that is loaded, 16-bits at a time, from the device data bus. It is loaded with the starting address of the bulk memory record.

The number of words per channel 181 is a 16-bit register that is loaded with the number of 64-bit words per channel in each trace segment. A simpler way to describe the unit 181 is to say that it is loaded with the number of scan buffers per trace segment. The output of a register within unit 181 is compared to the output of a counter that is incremented by one of the end of scan buffer signals to generate a running count of a number of scan buffers that have been transferred into the trace segment in bulk memory. When the counter value equals the register value (indicating that a trace segment has been filled), the counter is reinitialized.

Channel segment increment 178 is a register that is loaded with the increment between the channel segments within a trace segment.

Trace segment separation 179 is a register that is loaded with the increment from the final address of one trace segment to the first address of the next segment.

Number of trace segments 182 has a register that is loaded with the number of trace segments in the record being transferred. The contents of this register are loaded into a counter, the counter being decremented for each trace segment. When the final trace segment has been written, the counter decrements to 0 indicating that the transfer is complete.

Bulk memory address generator 183 comprises a bit-slice control element. It is made up of 8 SN74S482 4-bit slice slice expandable control elements. Each bit slice is comprised of a full adder, a push-pop stack, and an output register. A functional block diagram of this device, along with function tables for the six control inputs, may be studied in "The Bipolar Microcomputer Components Data Book for Design Engineers" (Third Edition) from Texas Instruments Incorporated. Four of the function select inputs to the bit-slice control element come from the address generator control PROM. The output of bulk memory address generator 183 comprise an input to bulk memory address pipeline register 186 which in turns provides an input to bulk memory address pipeline register 189, providing a dual pipeline register. Register 189, as shown, also may be directly loaded from bulk memory address generator 183. The output of register 189 is applied to APM bus 26.

To illustrate the operation of the bulk memory address generation circuitry, a simple example is given. In this example, 15 scan buffers full of data will be transferred to bulk memory. Each scan buffer contains data from four channels. The bulk memory address register 177 is loaded with hexidecimal 00000000 number of words per channel 181 register is loaded with hexidecimal 0003 channel segment increment 178 is loaded with hexidecimal 0020 trace segment separation register 179 is loaded with hexidecimal 0200 and the number of trace segments 182 register is loaded with hexidecimal 0005.

Figure 26:
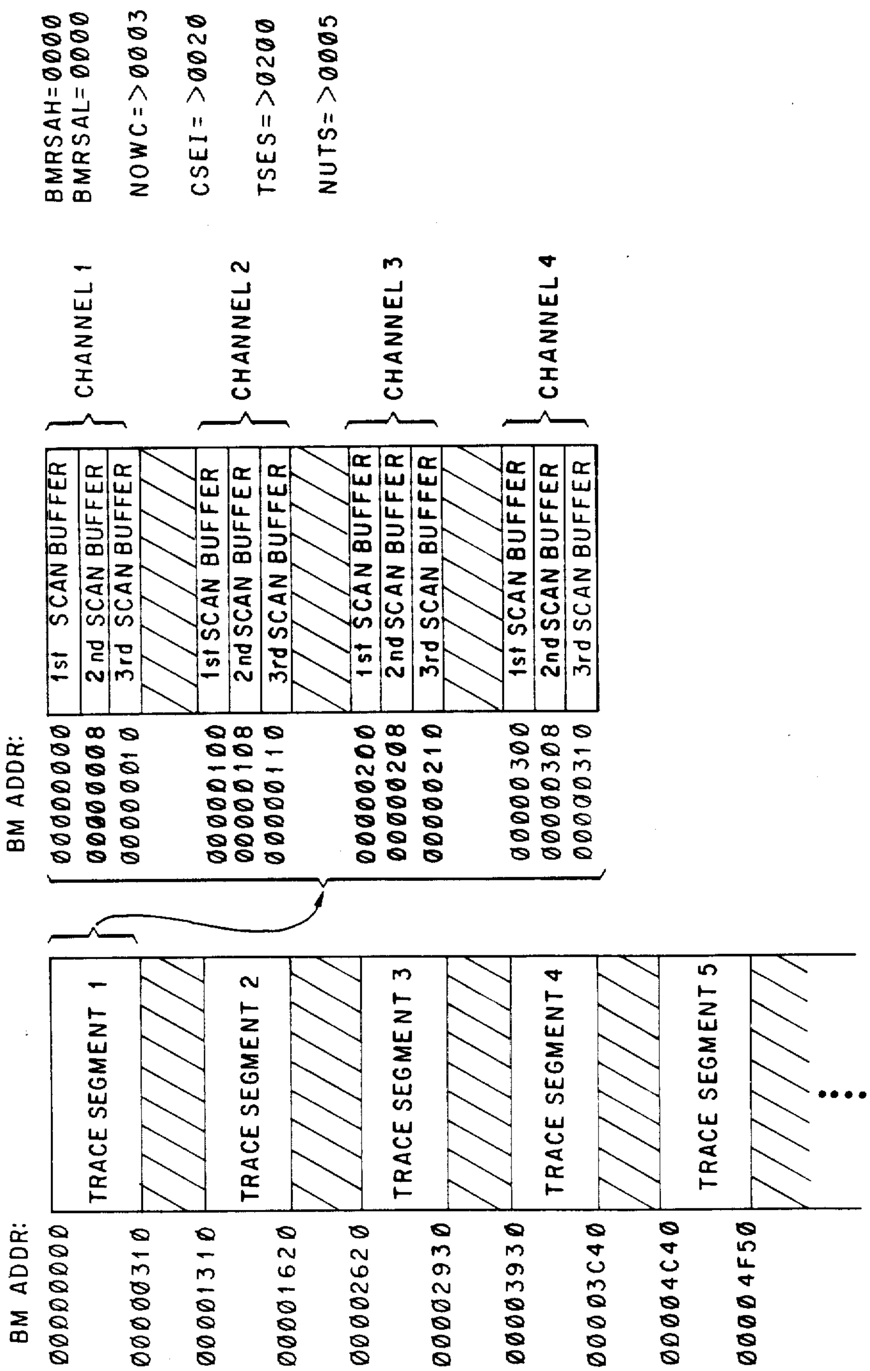
FIG. 26 illustrates an example of bulk memory address generation for the input controllers.
Figure 27A:
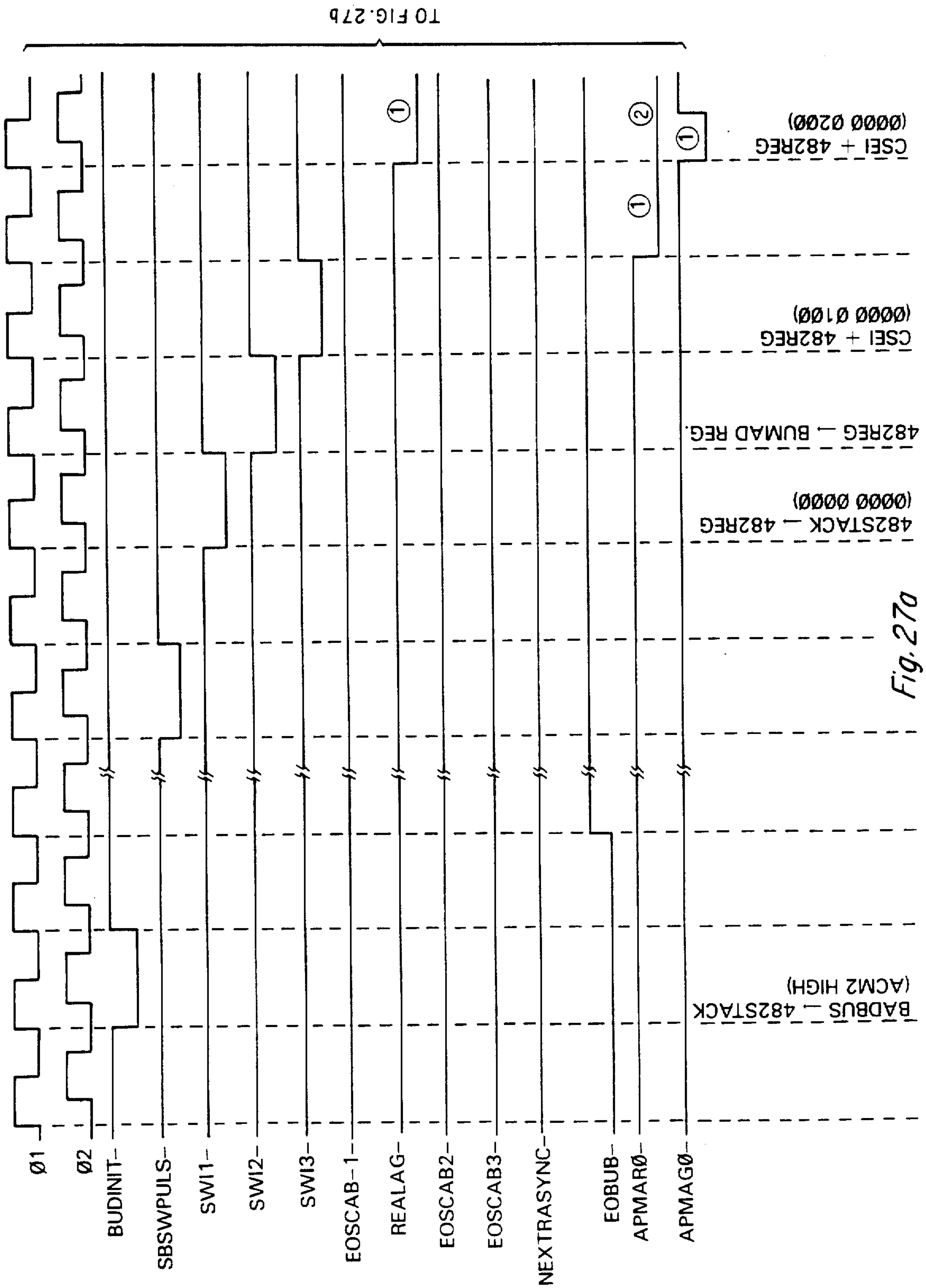
FIGS. 27*a*–27*f* form a timing diagram of the input controller bulk memory generation.
Figure 27B:
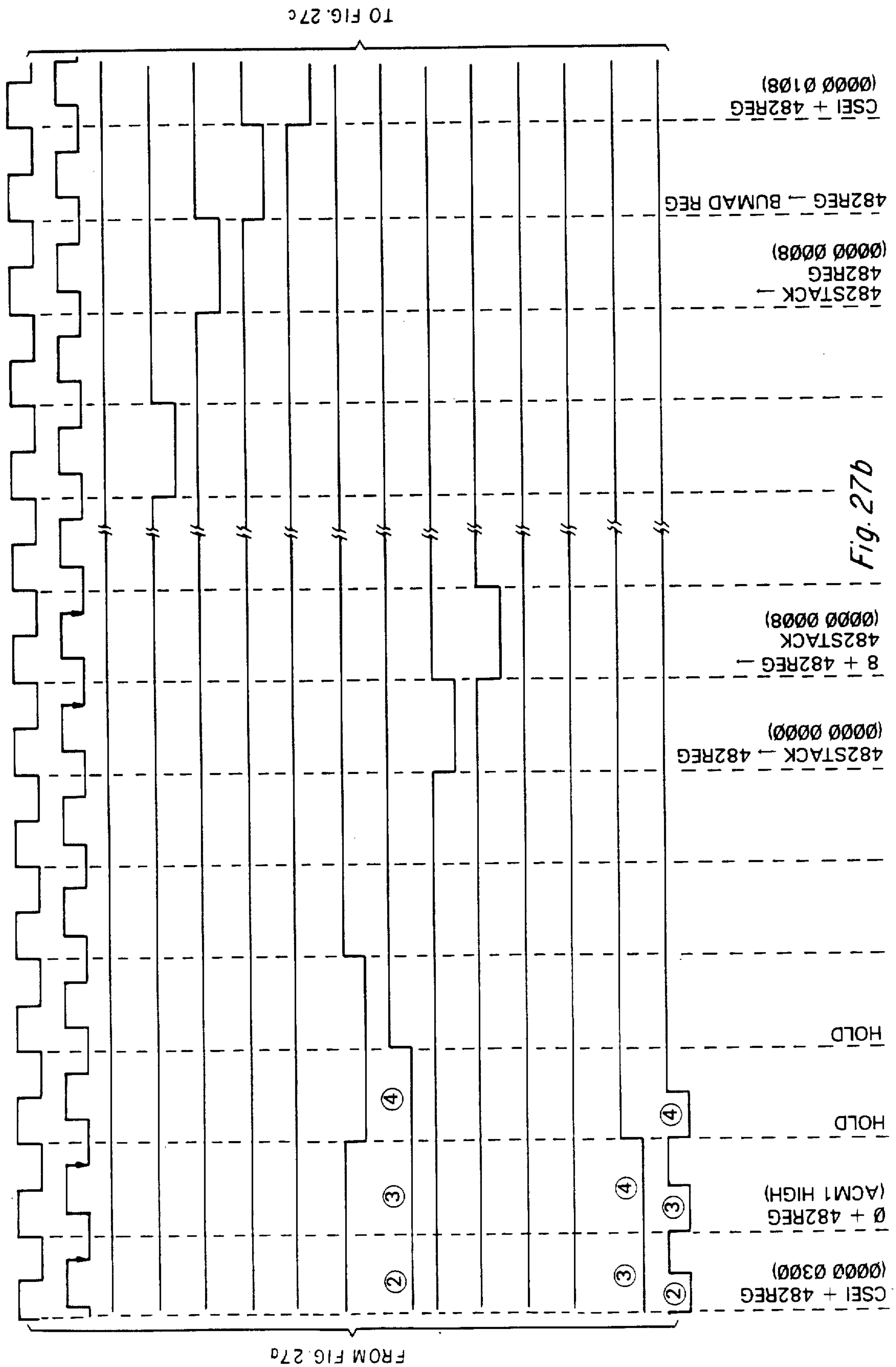
Figure 27C:
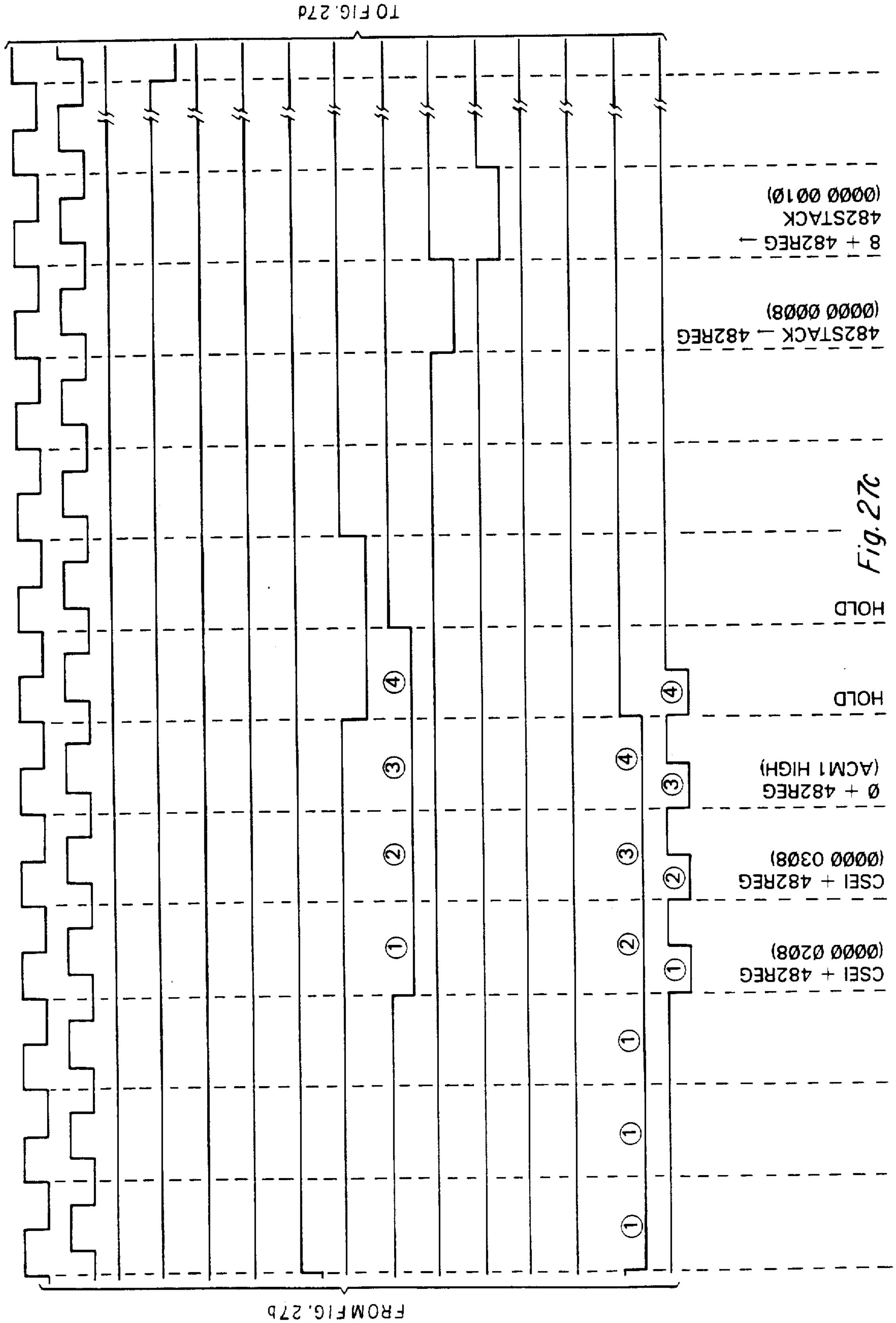
Figure 27D:
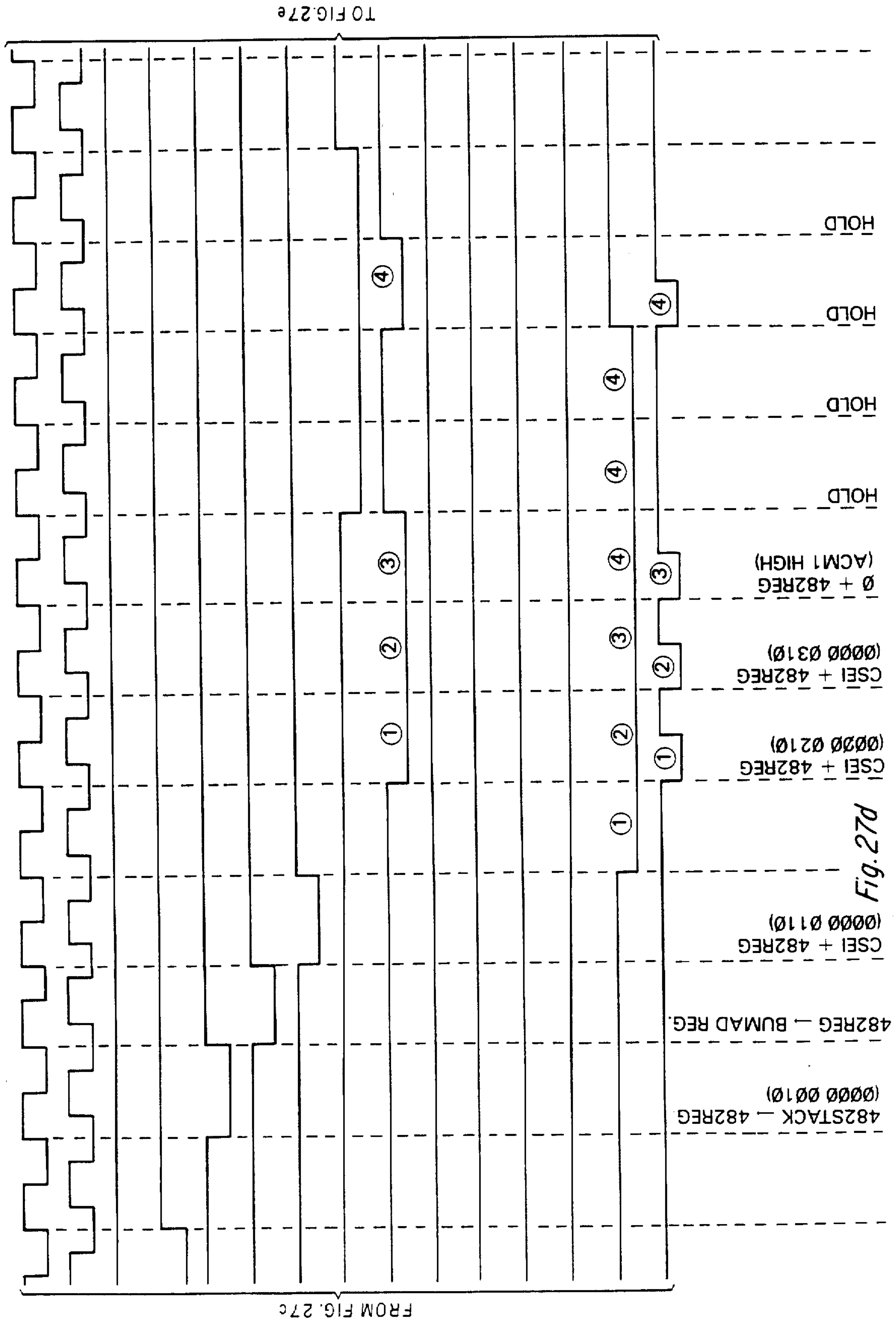
Figure 27E:
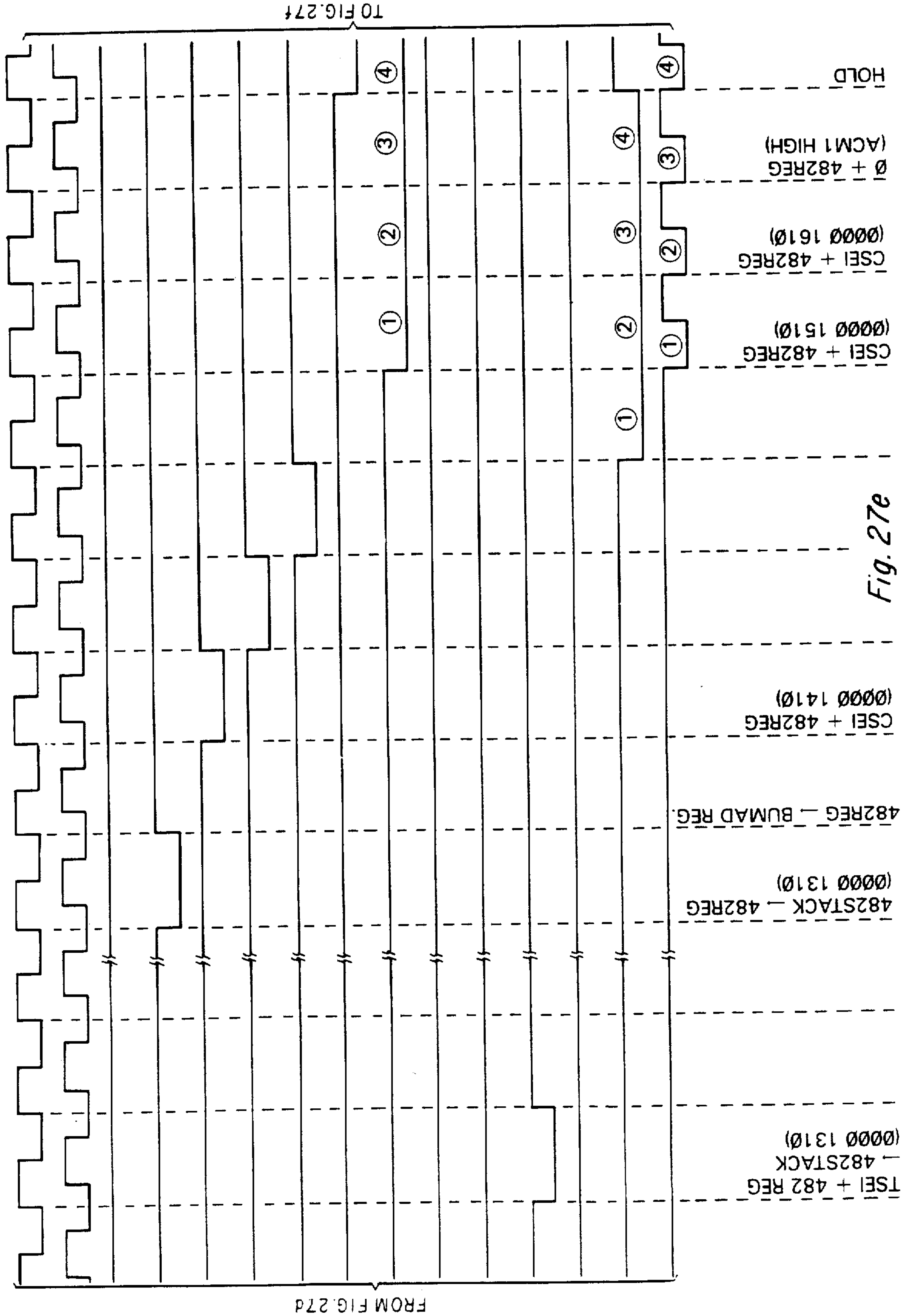
Figure 27F:
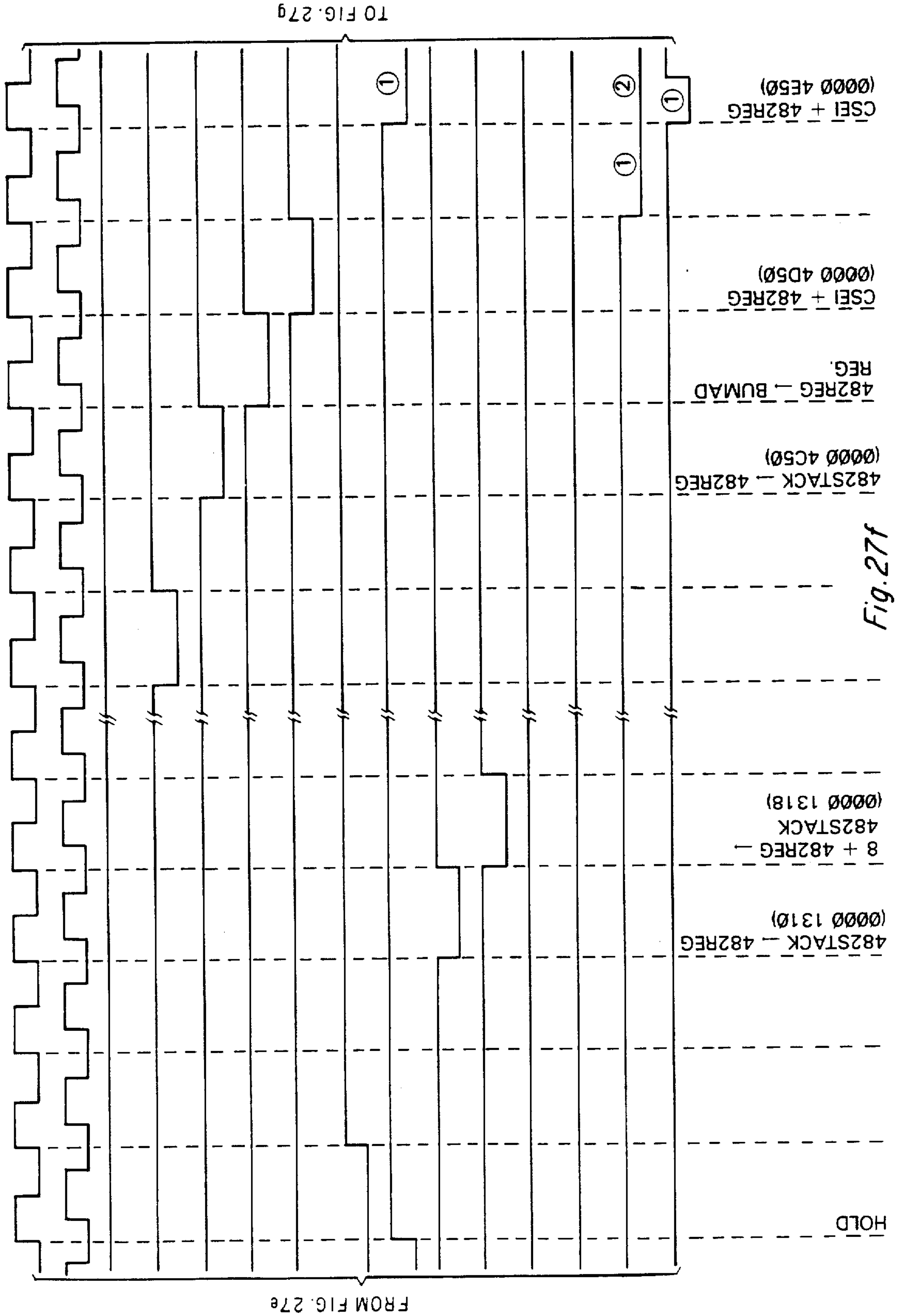
Figure 27G:
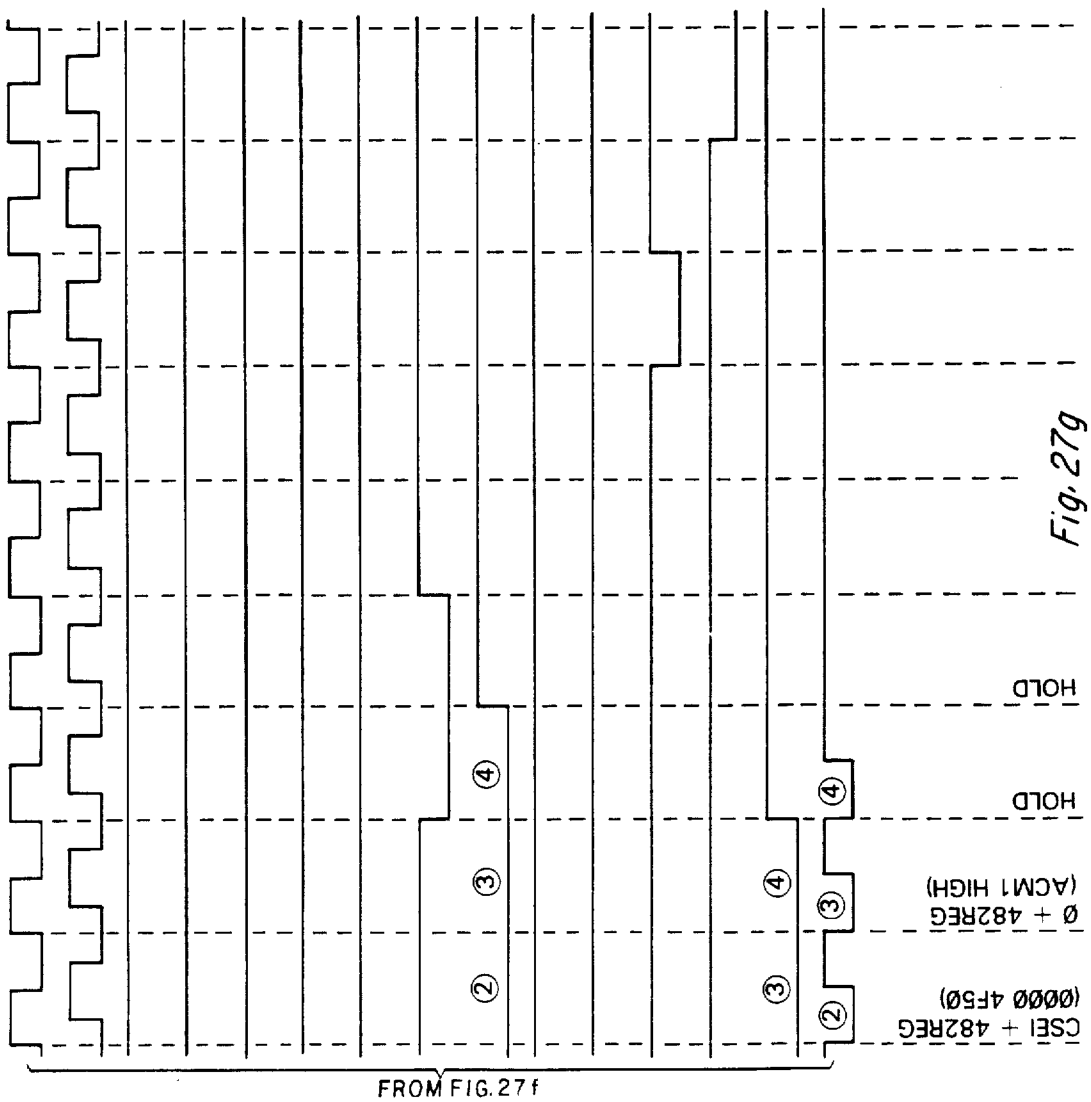

The timing diagram in FIG. 26 shows the key signals in the bulk memory address generation. The function being performed by the address generator during each clock cycle is shown. Also shown are the bulk memory access request and access granted signals. After the loading indicated above has been completed, signal BUDINIT is generated, which clears the number of words per channel 181 counter, loads the contents of the number of trace segments 182 register into its counter, and inputs the contents of bulk memory address register 177 into bulk memory address generator 183.

Figure 28A:
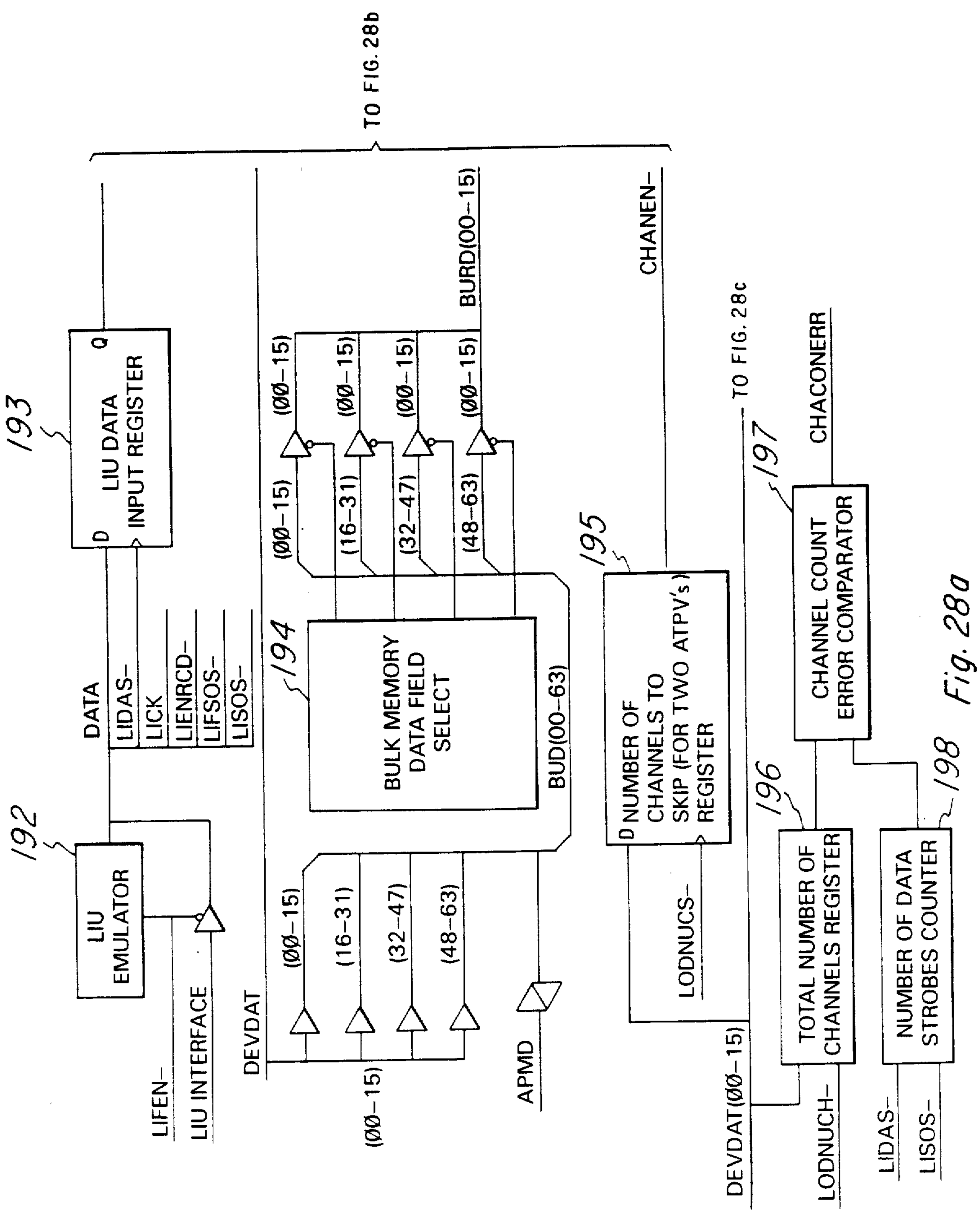
FIGS. 28*a*–28*c* form a block diagram of the input controller bulk memory interface.
Figure 28B:
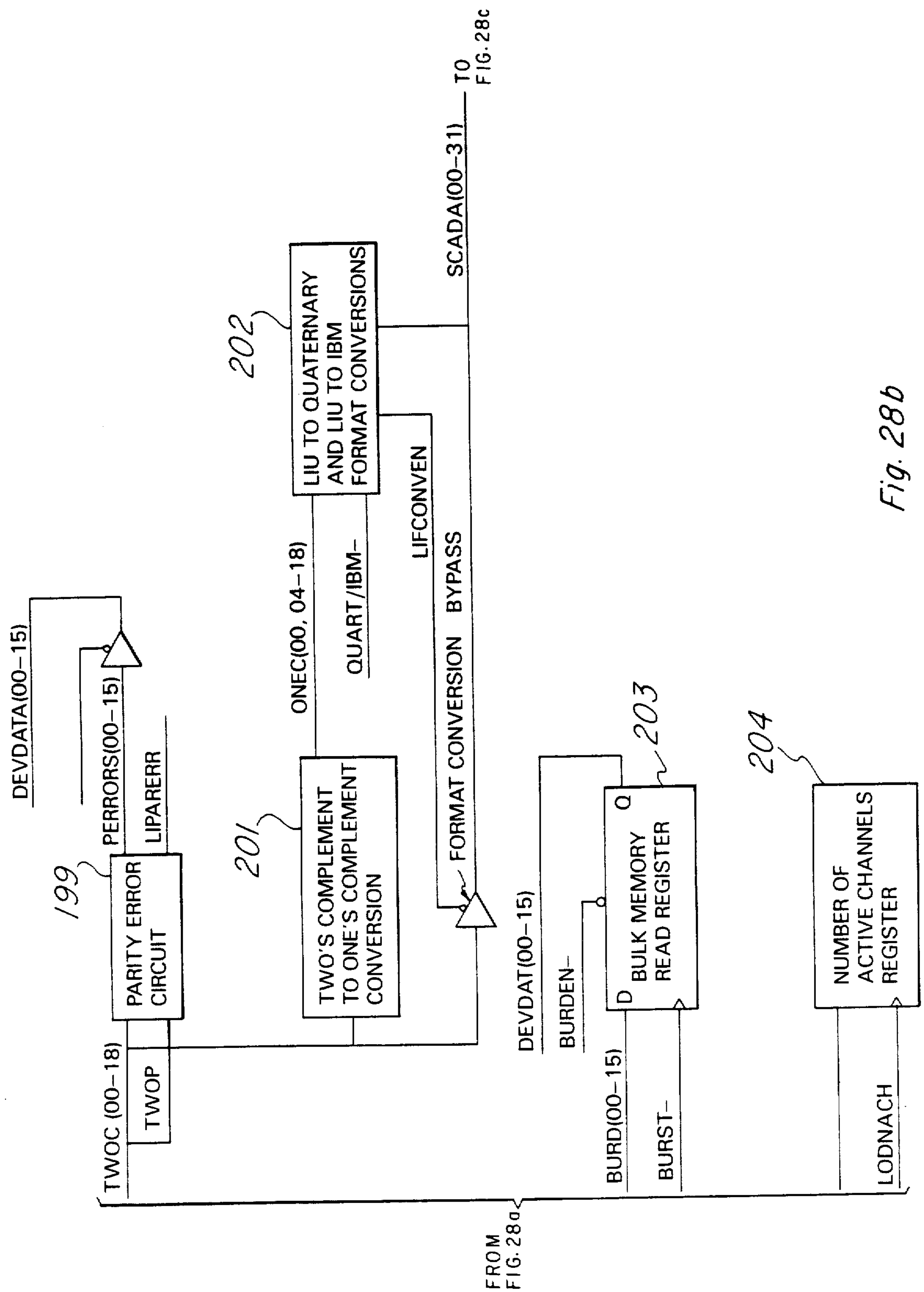
Figure 28C:
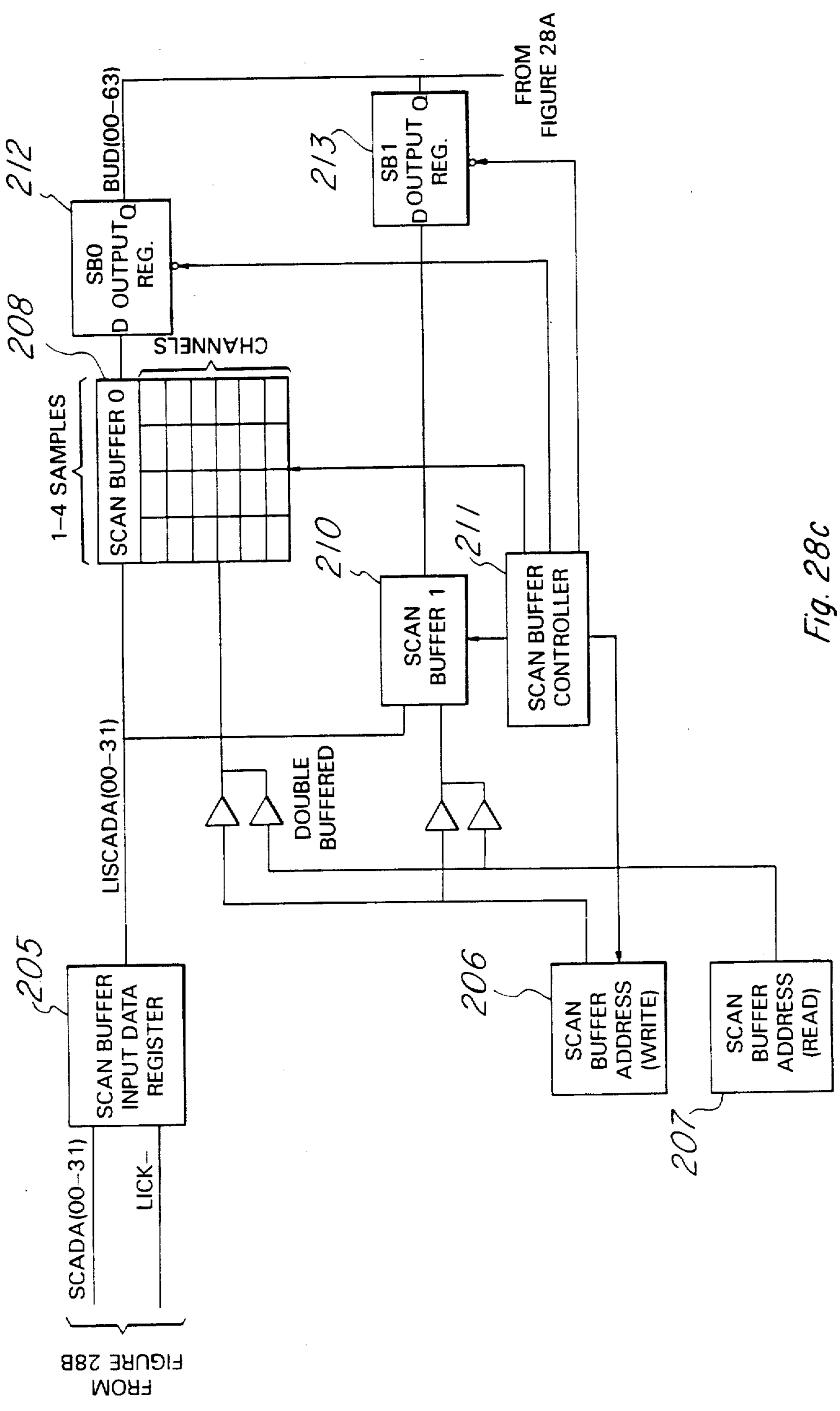

Following this action, data from line interface unit 17 is loaded into scan buffer (0) 208 of FIG. 28*c*. When scan buffer 208 has been filled, the control circuitry switches over to loading scan buffer (1) 210 and activates the signal Scan Buffer Switch Pulse (SBSWPULS-). This signal clears the scan buffer read address generator 207 (FIG. 28*c*) and loads a shift register in bulk memory interface control 190. This shift register produces three pulses, SWI1, SWI2, and SWI3 and are used in the bulk memory interface. The inverted version of these signals are shown in FIGS. 27*a*-27*f*. SWI1- loads the data on the top of the push-pop S482 stack of the bulk memory address generator 183. SWI2- hold the contents of the output register of bulk memory address generator 183 so that it can be loaded into the first stage of the dual pipeline register 186, on the leading edge of SWI3. SWI3- enables the contents of channel segment increment 178 to BADBUS and adds it to the contents of the bulk memory address generator 183 output register. SW13- also causes bulk memory access request signal (AREQ-) to become active.

At this point, the address generator has hexidecimal 00000000 in the first pipeline register 186, hexidecimal 00000100 in the output register of bulk memory address generator 183, and access request (APMARO-) is active. When input controller 24 is granted access to bulk memory 14 (APMAGO- and GRNTLVL- active), the contents of the first stage pipeline register 186 are loaded into the second stage 189 and enabled onto the array processor memory address bus 26. The contents of bulk memory address generator 183 output register are loaded into the first stage pipeline register 186. Finally, the contents of the channel segment increment 178 register are added to the contents of the bulk memory address generator 183 output register and the sum hexidecimal (0000200) is loaded back into the bulk memory address generator 183 output register.

This repeats until the second to last access grant signal occurs, which causes the scan buffer read address 207 to match the number of active channels register 204 (FIG. 28*b*). The end of scan buffer (EOSCAB) sequence begins, causing 0 to be added to the bulk memory address generator 183 output register. EDSCAB-1- goes low and holds the contents of the bulk memory address generator 183 output register until the final access granted occurrs. The final access granted signal turns off the access request (AREQOFF- goes low) and increments the scan buffer read address 207 which causes EOSCAB-1- to go high and the EOSCAB sequence to complete.

EOSCABO increments the number of words per channel 181 counter. EOSCAB2- loads the data on the top of the 's 482 stack in the bulk memory address generator 183 (which is still hexidecimal 00000000) into its output register. EOSCAB3- enables the hard-wired single address increment onto BADBUS where it is added to the contents of bulk memory address generator 183 output register and loaded into the top of the stack. The stack now contains hexidecimal 00000008 and address generator 183 is ready for the next scan buffer switch.

The above sequence of events continues until the third scan buffer has been written into bulk memory 14. When the third EOSCABO occurs the words per channel register and carrier will be equal and NEXTRAS- and NEXTRASYNC- will go active. NEXTRASYNC- inhibits EOSCAB2- and EOSCAB3-, and enables the contents of trace segement separation 179 register hexidecimal 0200 BADBUS where it is added to the value in the bulk memory address generator 183 output register and loaded onto the top of the stack. The top of the stack now contains the address hexidecimal 00001310 the first trace segment has been written and the bulk memory address generator 183 is ready for the next scan buffer switch.

After the fifth scan buffer has been loaded into bulk memory 14, the number of trace segments counter 182 decrements to 0, which generates the end of Bulk Memory Buffer (EOBUB) signal. EOBUB indicates that the transfer is complete.

Referring now to FIG. 28*a*, LIU emulator 192 is shown. This device is used for testing and will not be described. Signal LIFEN- enables the emulator. LIU interface is the input from line interface unit 17, providing the signals mentioned earlier. The LIU clock (LICK) runs continuously whether the data is being transferred to IC24 or not. Its frequency is 2.048 Mhz and it is not synchronized to the system clock 121. A clock cycle is defined as the period between rising edges of the LIU clock. Both the inverted (LICK1- and LICK2-) and non-inverted (LICK) versions of the LIU clock are used in the circuitry that moves data from LIU 17 into the scan buffers 208 and 210.

LIU End of Record (LIENRCD-) goes active (logic 0) after the last data from a record is transmitted and does not go inactive again until a record begins. A record is defined as some number of data samples taken at timed intervals from each active channel. End of Record is available as both an active high signal (LIENRCD) and an active low signal (LIENRCD-).

LIU First Start of Scan (LIFSOS-) is a pulse of one clock cycle duration that occurs once per record. It goes active (logic 0) on the same clock edge that LIENRCD- goes inactive. First start of scan is available as both an active high signal (LIFSOS) and an active low signal (LIFSOS-). LIU Start of Scan (LISOS-) is a one clock cycle wide pulse that occurs each time the data from a sample (Scan) of each channel is sent from the LIU 17 to the system. The number of LIU Start of Scans that occur during a record will be a function of a sample rate (the frequency at which the channels are sampled) and the listening time (the time intervals in which samples are taken). An active high signal (LISOS) and two active low signals (LISOS- and LISOSB-) are used.

The LIU data strobe (LIDAS-) occurs when there is valid data on the LIU data bus. There is one LIDAS- (active low, one half cycle pulse width) per clock cycle starting with the clock cycle where LISOS- is active and continuing until a data word for each active channel has been sent. The data strobe occurs during the last half of the clock cycle. An active high data strobe (LIDAS) and two active low data strobes (LIDAS- and LIDASA-) are used.

The 20 bit data field consist of a 19-bit data word (LIDAT) (00–18)) and a parity bit (LIP). The 19-bit data word consists of a 3-bit gain and a 16-bit, two's complement mantissa. The sign is determined by the most significant bit of the mantissa, with a logic 1 representing a negative number and a logic 0 representing a positive number. The radix point is located to the left of the mantissa.

The LIU data input register 193 is loaded with the LIU data word and the parity bit on the rising edge of LIDAS-. The output of this register is input to the format conversion circuitry 201, 202 and to parity error circuit 199. The LIU data field has odd parity which means it should contain an odd number of logic 1's. Parity error counter circuit output signal PERRORS to the DEVDAT bus. As indicated earlier, IC 24 can convert data from the LIU format to either the 16-bit quaternary exponent, floating point format or the 32-bit hexadecimal exponent, floating point format. If desired, the format conversion circuit can be bypassed as shown in FIG. 28*b* for testing purposes.

The first stage of the format conversion circuitry 201 is that which converts the mantissa from two's complement to one's complement. A 16-bit adder is used to perform this function. One input to the adder is the mantissa from the LIU data word, the other input is the hexidecimal number #FFFF. If the data word is positive, the carry into the adder will be a logic 1 and #FFFF plus 1 (0000) will be added to the mantissa. If the data word is negative, the carry into the adder will be a logic 0 and #FFFF (minus 1) will be added to the mantissa.

The one's complement mantissa is 12 bits wide but the quaternary mantissa is only 16 bits wide, so rounding may be necessary. The mantissa is rounded up if the most significant bit of the excess data in the LIU mantissa is a logic 1 for positive data, or a logic 0 for negative data.

If a data word is positive, the IC 24 checks ONEC00 and ONEC04 to determine if they are both a logic 0. If they are, PPOSSHFT goes to its active state (high), indicating that the mantissa may be shifted if one other condition is met. The other condition that must be met is that mantissa bits ONEC05 through ONC15 must contain at least one logic 0. If all of these remaining mantissa bits were a logic 1, the mantissa would be rounded and in a left shift by 2-bits would result in the loss of significant data.

Negative data words are checked in a similar way. If ONEC00 and ONEC04 are both a logic 1, PNEGSHFT goes active (high) and bits ONEC05 through ONEC15 are checked for at least one logic 1. If normalization is necessary for either a positive number or a negative number, the signal SHFTMANT will go active (high).

The rounding circuitry consists of a PROM and an adder. A positive mantissa is rounded up by adding 1 and a negative mantissa is rounded up by subtracting 1. The PROM determines what will be added to the one's complement mantissa. _WOC03 (sign bit) determines whether a positive 1 or a negative 1 will be presented to the input of the adder. If the mantissa is not going to be shifted, ONEC15 will determine whether or not the mantissa will be rounded up. If the mantissa is going to be shifted, then ONEC17 will determine whether or not the mantissa will be rounded up. Refer to the rounding control PROM map, shown in FIG. 29 to see how the PROM generates the adder input for the rounding function.

The quaternary mantissa comes from a 4 to 1 multiplexer which is controlled by the mantissa selector PROM shown in FIG. 30. Only three of the multiplexer inputs are used. One input is the unshifted output of the rounding adder, another input is the output of the rounding adder shifted left by two bits, (this is where the mantissa normalization is implemented), and the final input is all zeros. The zero input to the mantissa multiplexer is used when a dirty zero is detected, a dirty zero being essentially a negative zero occurring when the sign bit is a logic 1 and all of the mantissa bits are logic 1's.

For any gain value other than the maximum (7) SHFTMANT determines whether the shifted or unshifted mantissa is selected. If the gain is 7 (which means the exponent will be 0), the unshifted mantissa must be selected because an exponent of 0 cannot be decremented.

The mantissa selector PROM also generates a signal called SHFTEXP which determines when the exponent needs to be decremented. See the mantissa selector PROM map in FIG. 3.

The exponent and sign PROM generates the quaternary exponent and sign bit. When SHFTEXP is inactive (logic 0), the exponent is simply the inverse of the gain. When SHFTEXP is active (logic 1), the exponent is generated by inverting the gain and decrementing it. The sign bit is passed through the PROM as is, unless DIRTZERO is active. DIRTZERO forces both the exponent and the sign to zero. The exponent and sign PROM map is shown in FIG. 31.

The output of the LIU to quaternary format conversion appears on the most significant 16 bits of the input to the scan buffer input register 205 (FIG. 28*c*).

The mantissa for the 32-bit hexadecimal format is a signed magnitude number, so the one's complement mantissa must be converted. This is done with exclusive-OR gates that invert the mantissa when the sign bit is a logic 1 (negative) and pass it through when the sign bit is a logic 0 (positive). The converted mantissa is then checked for 4-bit fields that are all zero. If the most significant 4-bits are all logic 0's, ZEROD0 goes active (high). ZEROD1, ZEROD2 and ZEROD3 are used for the remaining three mantissa fields. ZEROD4 detects when the two most significant mantissa bits are both logic zeros.

Three PROMs are used to generate the hexadecimal exponent and to select the input to the mantissa multiplexer. The inputs for these PROMs are the zero field bits (ZEROD (0–4)) and the inverted gain from the LIU data word. Their PROM maps are shown in FIGS. 32*a*–32*h*. If the gain is odd and any value other than the maximum (7), the selected multiplexer input will be the unshifted mantissa and the exponent will be hexidecimal 40 plus one half of the inverted gain.

If the gain is even, the mantissa selection will be based on the state of ZEROD4. If both if a two most significant mantissa bits are logic 0's, ZEROD4 will be active (high) and the selected multiplexer input will be the one that is shifted to the left by 2 bits. The exponent will be hexidecimal 40 plus one half of the decremented inverted gain. If one or both of the two most significant mantissa bits are logic 1's, ZEROD4 will be inactive (low) and the selected multiplexer input will be the one that is shifted to the right by 2 bits. The exponent will be greater than 40 plus one half of the incremented inverted gain.

If the gain is the maximum value (7), and the exponent mantissa are determined by ZEROD0 through ZEROD3. If the first four mantissa bits contain at least one logic 1 (ZEROD0 is low), the multiplexer input will be the unshifted mantissa and the exponent will be hexidecimal 40. If the first 4 mantissa bits are all logic 0's and at least one of the next four is a logic 1 (ZEROD0 is high and ZEROD1 is low), the multiplexer input will be the one that is shifted left by 4 bits and the exponent will be hexidecimal 3F. If the first eight mantissa bits are all logic 0's and at least one of the next four is a logic 1 (ZEROD0 and ZEROD1 are high and ZEROD2 is low), the multiplexer input will be the one that is shifted left by 8 bits and the exponent will be hexidecimal 3E. If the first 12 mantissa bits are all logic 0's and at least one of the next four is a logic 1 (ZEROD0, ZEROD1 and ZEROD2 are high and ZEROD3 is low), the multiplexer input will be the one that is shifted left by 12 bits and the exponent will be hexidecimal 3D. If all 16 of the mantissa bits are logic 0's (ZEROD0, ZEROD1, ZEROD2 and ZEROD3 are all high), the mantissa and exponent will both be 0. The output of the LIU to 32-bit hexadecimal format conversion appears at the input of the scan buffer input register 205.

Figure 33:
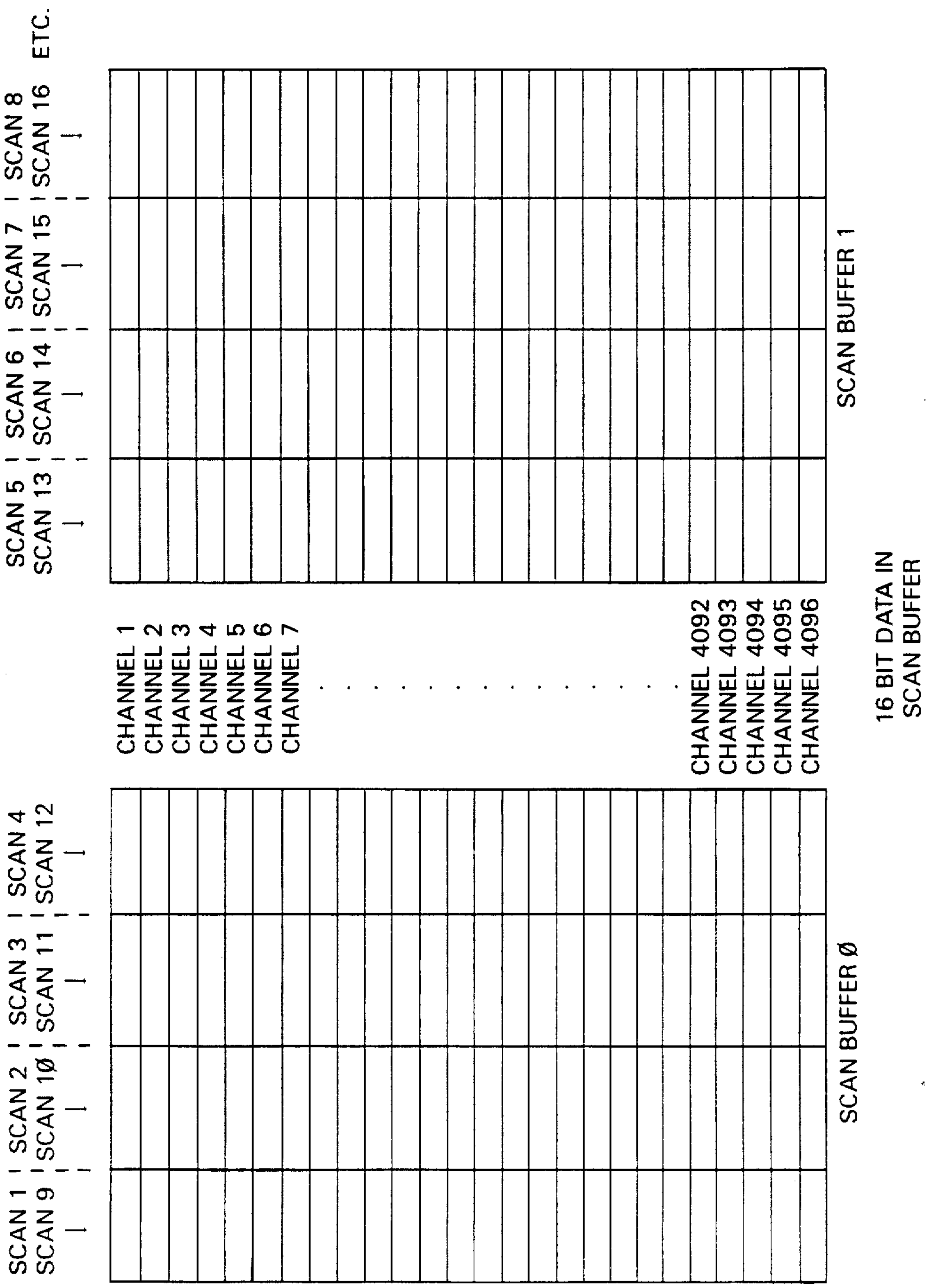
FIG. 33 illustrates the 16-bit data organization in the bulk memory scan buffer of the input controllers.

IC24 contains two memory buffers, scan buffer 208 and scan buffer 209, for temporary storage of the input data from LIU17. Each scan buffer is 64 bits wide and 4096 words deep and is partitioned into four 16-bit wide data fields. If the LIU data is being converted to the 16-bit, floating-point format, four scans are required to fill a scan buffer. The data from the first scan of a record is always loaded into the most significant 16-bit field of scan buffer 208 (0). The next three scans fill up scan buffer 208. The fifth scan is loaded into the most significant 16-bit field of scan buffer 210, followed by the sixth through eighth scans as shown in FIG. 33.

As soon as the scan buffer loading circuitry switches over from loading scan buffer 208 to loading scan buffer 210, the data in scan buffer 208 is available to be written into bulk memory 14. When it switches back to loading scan buffer 208, the data in scan buffer 210 is available to be written into bulk memory 14. This switching between buffers continues until all of the data from a record has been loaded into the scan buffers 208 and 210 and written to bulk memory 14.

Figure 34:
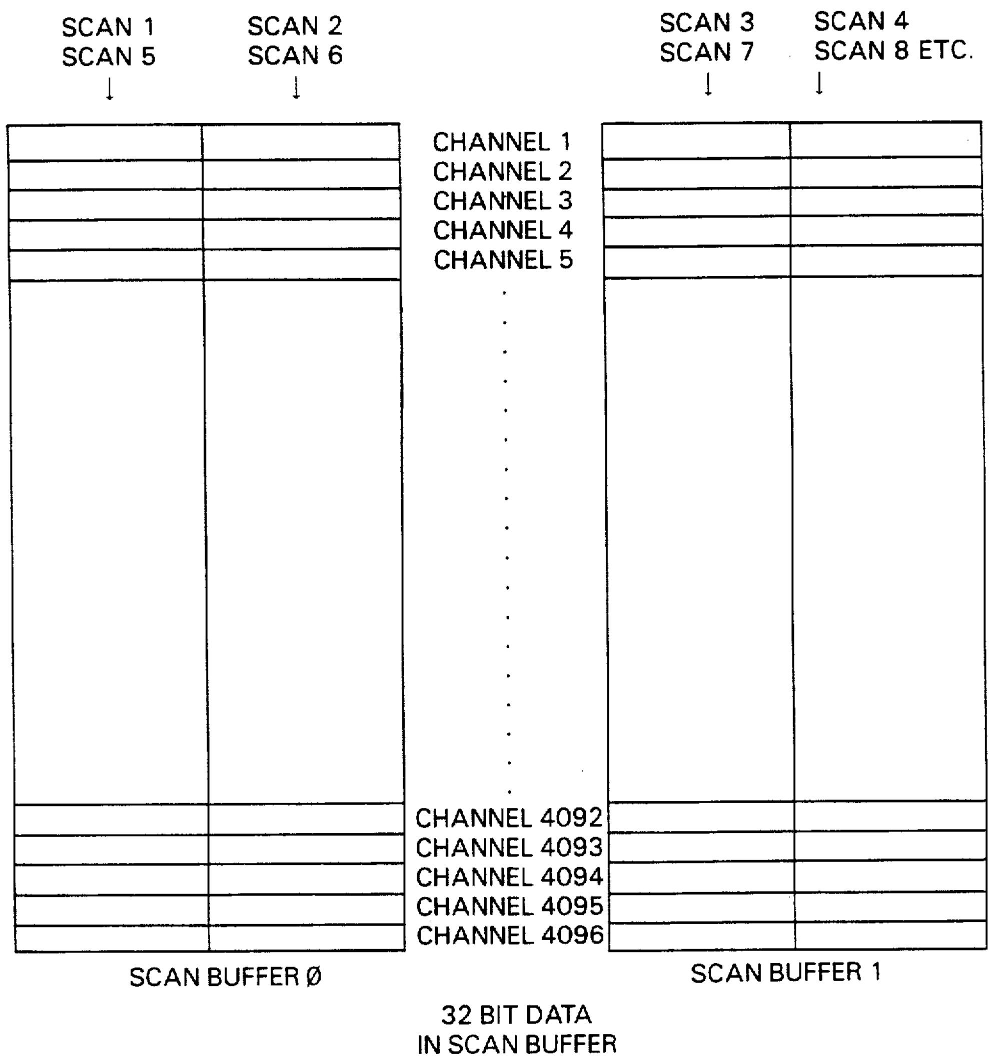
FIG. 34 illustrates the 32-bit data organization in the scan buffer of the input controller.

If the LIU data is being converted to the 32-bit, floating-point format, two scans are required to fill a scan buffer. The data from the first scan of a record is loaded into the two most significant 16-bit data fields of scan buffer 208 (0) and the second scan is loaded into the remaining two 16-bit fields. The third and fourth scans are loaded in the scan buffer 210 (1), as shown in FIG. 34.

Scan buffers 208 and 210 are loaded under the control of scan buffer controller 211 whose primary components are a counter and three PROMs. The counter is cleared at the beginning of a record by LIU First Start of Scan (LIFSOS-), and increments with each start of scan (LISOS). The signal SCANADEN, which is cleared by LIFSOS- and set on the trailing edge of the first LISOSB-, is used to hold the counter at 0 when the first LISOS occurs. The result is that the counter outputs (SCANAD (0–2)) are 0 when data for the first scan is being received, one when data for the second scan is being received, two for the third scan, etc. It counts up to 7, goes back to 0 and continues counting in this manner until all of the scan data has been received.

A scan buffer right enable PROM generates the enables for the scan buffer write pulses. Its inputs are the 3-bit counter output and the signal that selects the format conversion (IBM/QUART-). The scan buffer write enable PROM map is shown in FIG. 35 (as indicated, when data in the 16-bit format is being loaded into the scan buffers 208, 210, the right enables are turned on at a time to load the individual 16-bit scan buffer segments. The particular enable that is turned on depends on the counter value. The PROM outputs are clocked into flip-flops to create stable logic levels. The flip-flop outputs are gated with WIDEN, which is active when there is valid data on the line. When data in the 32-bit format is being loaded into the scan buffers, the write enables are turned on two at a time to load either the most significant half or the least significant half of the scan buffers.

The data that is to be written into the scan buffers 208, 210 come from the scan buffer input register 205 on lines LISCADA ((00–31). The first 16-bit data field in a scan buffer will always be loaded with LISCADA (00–15). If data is in the 32-bit format, the second 16-bit field will be loaded with the data on LISCADA (16–31) at the same time the first field is loaded. If data is in the 16-bit format, the second 16bit field will be loaded with the data on LISCADA (00–15) after the next Start of Scan. The same rule applies to the third and fourth 16-bit data fields in a scan buffer. This function is controlled by the Scan Buffer Input Data Enable PROM. Its inputs are the counter output (SCANAD (0–2)) and the format conversion select signal (IBM/QUART-). Its outputs are clocked into flip-flops and gated with WIDEN as were the outputs of the scan buffer write enable PROM. The Scan Buffer Input Data Enable PROM map is shown in FIG. 36.

There are two address sources for each scan buffer. The write address (LISBAD (00–11)) is generated by the circuitry that loads data from the LIU17 into the scan buffers 208, 210 and the read address (BUMSBAD (00–11)) is generated by the circuitry that loads data from the scan buffers 208, 210 into bulk memory 14. The scan buffer address selector and switch PROM (see FIG. 37) controls which address source is selected for each scan buffer. If data is being converted to the 16-bit format, the write address 206 will be selected for scan buffer 208 (0) (SBUFO active) for the first four scans in the record. During the second four scans, the write address 206 will be selected for scan buffer 210 (1) (SBUF1 active) and the read address 207 will be selected for scan buffer 208. This continues until the last scan in the record is loaded into one of the scan buffers. LIU End of Record (LIENRCD-) causes the address selector to change once more so that the contents of the last scan buffer that was written can be loaded into bulk memory 14. The other important output of the scan buffer address selector and switch PROM (SBUSWI-) is used to generate the active high and low Scan Buffer Switch Pulse signals (SBSWPULS and SBSWPULS-). These signals are generated each time the scan buffer loading circuitry switches over from loading one scan buffer to loading the other and at the end of a record. They are synchronized to the system clock 121 and are primarily used in the circuitry that loads scan buffer data into bulk memory 14.

Total Number of Channels Register 196 is loaded with one less than the number of LIU data strobes expected from each scan. The contents of this register is compared to a counter that is cleared by LIU Start of Scan (LISOS-) and incremented by each LIU data strobe (LIDAS-). The reason that the register is loaded with one less than the total number of strobes is because the first strobe occurs during the same cycle as Start of Scan, clearing the counter. If the number of data strobes recorded by the counter does not match the value in the register, CHEQ- will be inactive (logic 1). The next Start of Scan will cause Channel Count Error (CHACONERR) to go active indicating that either too many or too few data strobes occurred during the previous scan. SCANADEN is gated into the error bit so that the first LIU Start of Scan (when the counter value is unknown) will not generate an error.

Figure 38A:
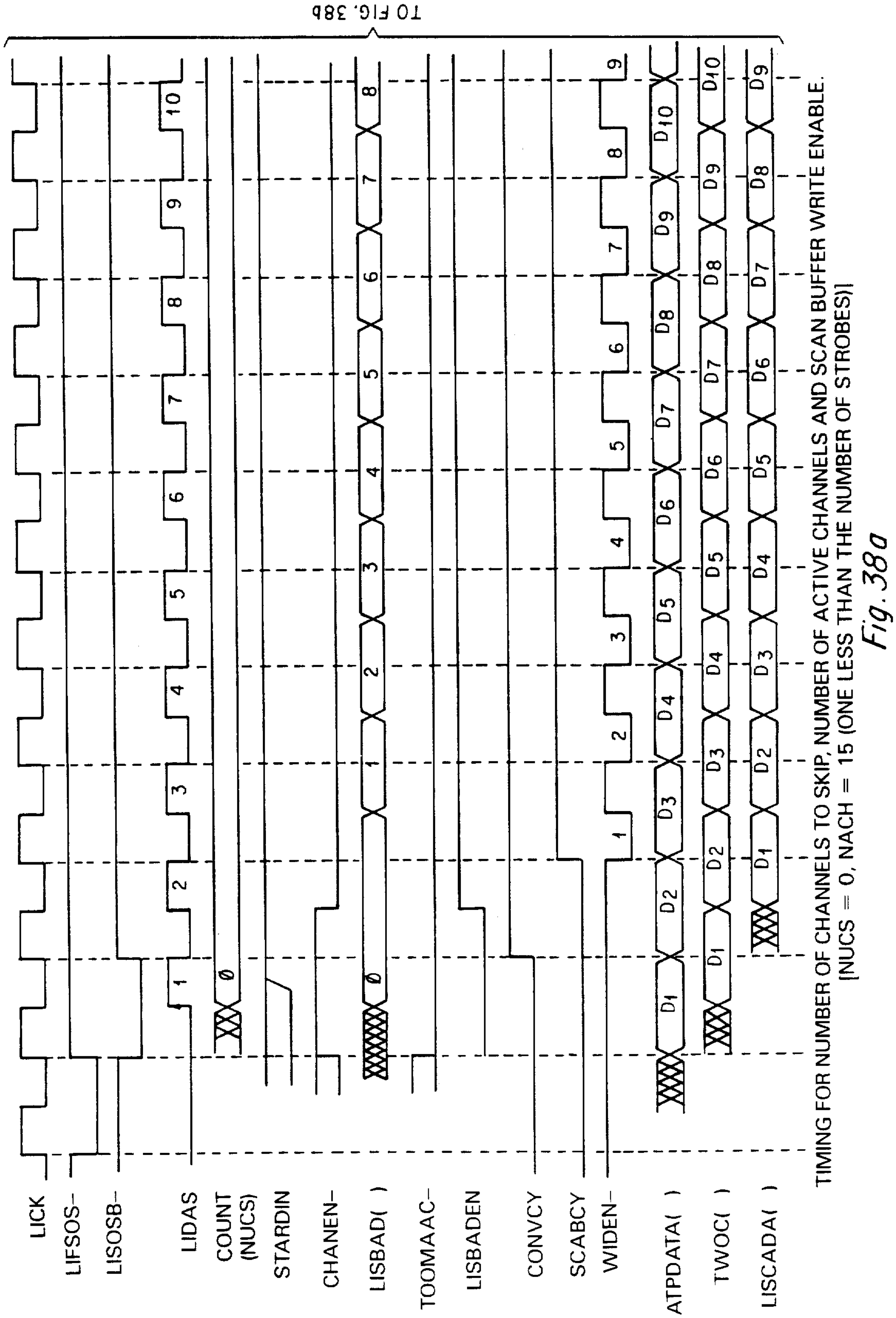
FIG. 38 illustrates scan buffer timing for the input controller format conversion when a skip channel function is inactive.
Figure 38B:
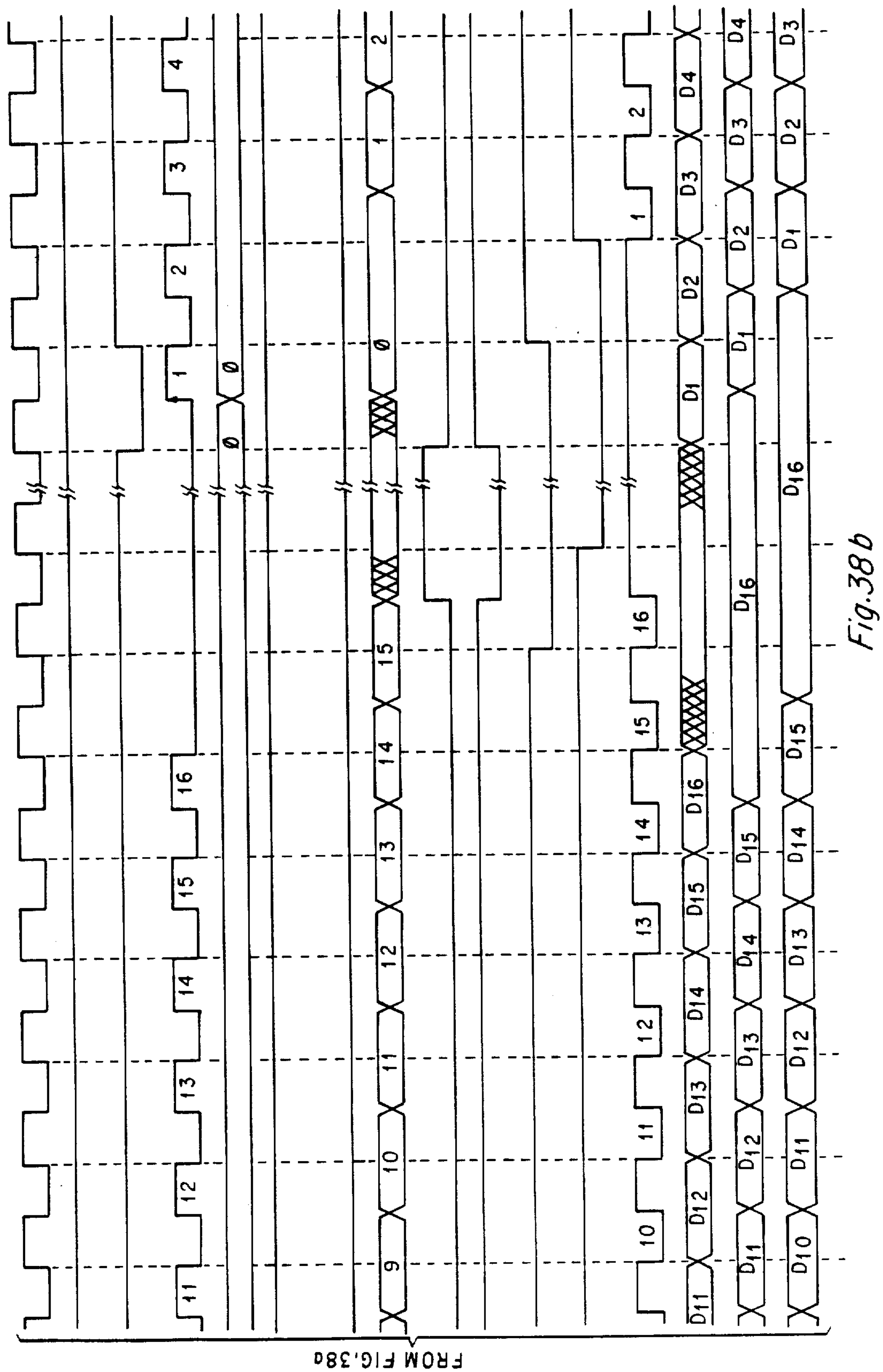
Figure 39A:
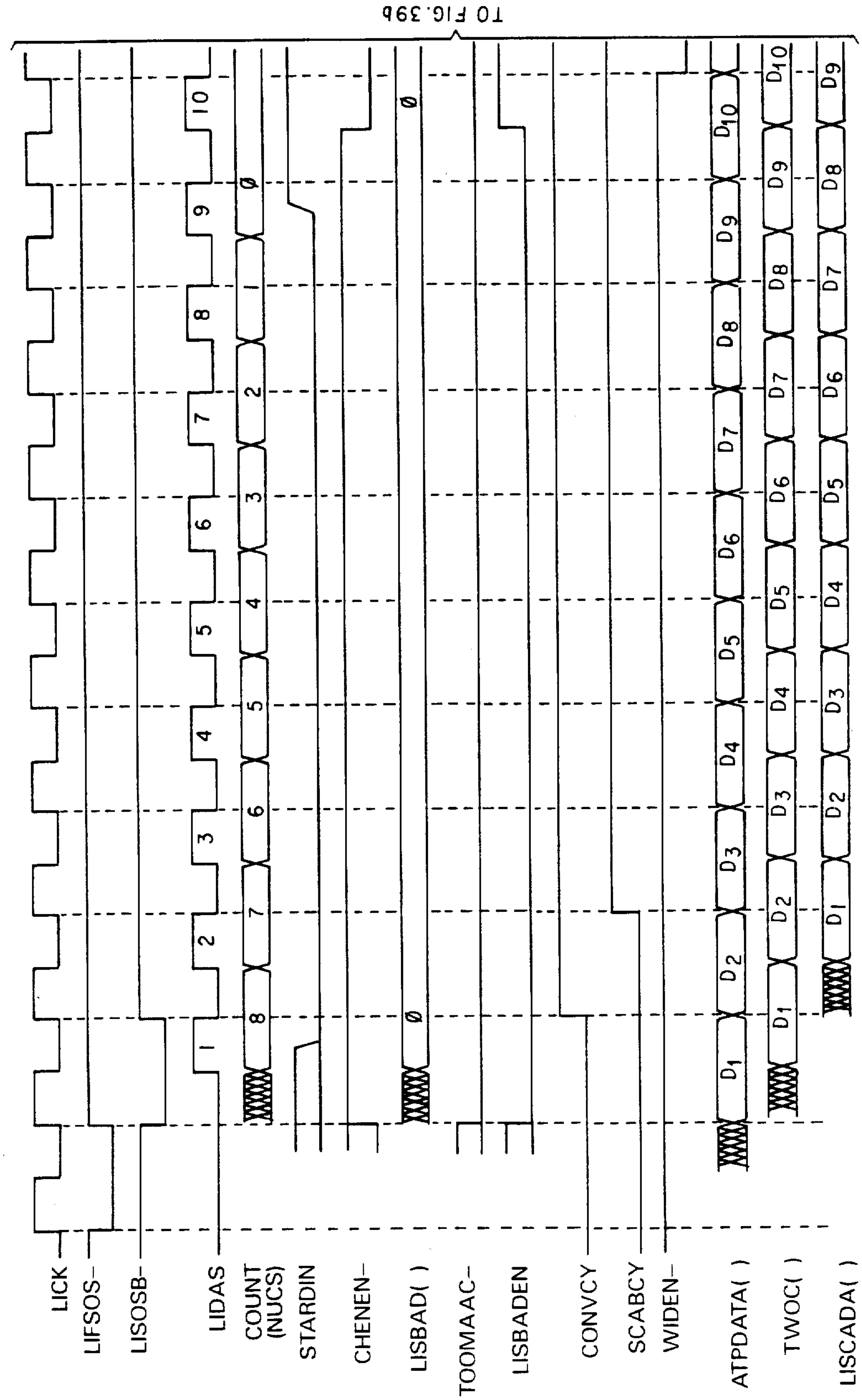
FIG. 39 illustrates the scan buffer timing for the input controller format conversion when the skip controller is active.
Figure 39B:
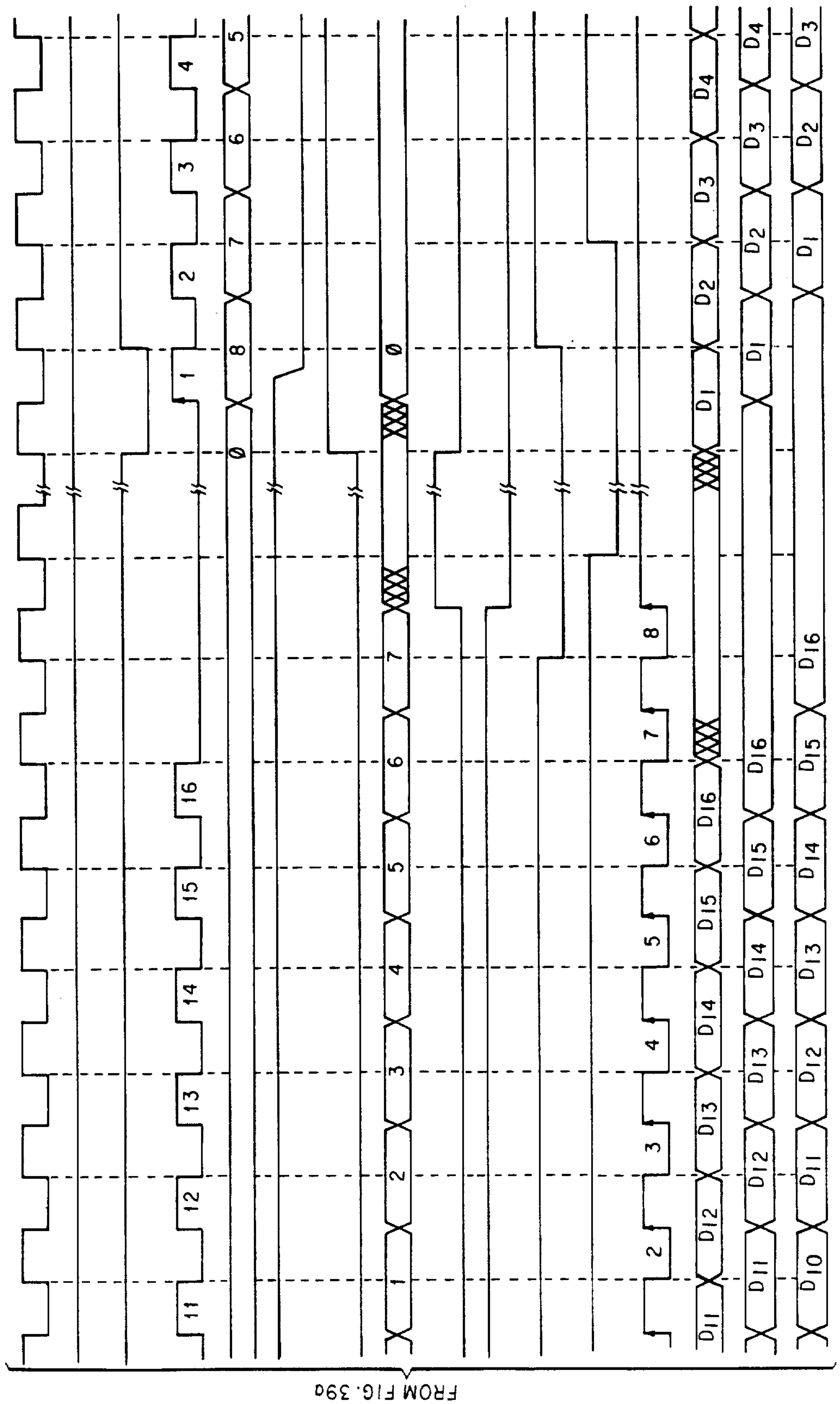

Number of Channels to Skip Register 195 is loaded with a number of LIU data words to skip before Scan Buffer loading begins. This is used in the system configuration where two array processors are employed and the data is divided between the two for processing. The counter is loaded with the contents of the number of channels to skip register 195 each time LIU Start of Scan occurs. This counter is decremented on each LIU data strobe and when it reaches 0, CHANEN- goes active (logic 0) to enable the scan buffer write pulse (WIDEN-). Number of Active Channels Register 204 is loaded with one less than the number of data words to be loaded into a scan buffer for each scan. When the contents of this register matches the scan buffer address (LISBAD (00–11)), TOOMAAC- goes inactive (logic 1) inhibiting the scan buffer write pulse (WIDEN-). FIG. 38 shows the timing for the Scan Buffer control register circuitry when the Number of Channels to Skip 195 (NUCS) function is unused and FIG. 39 shows the timing when it is used.

Figure 40:
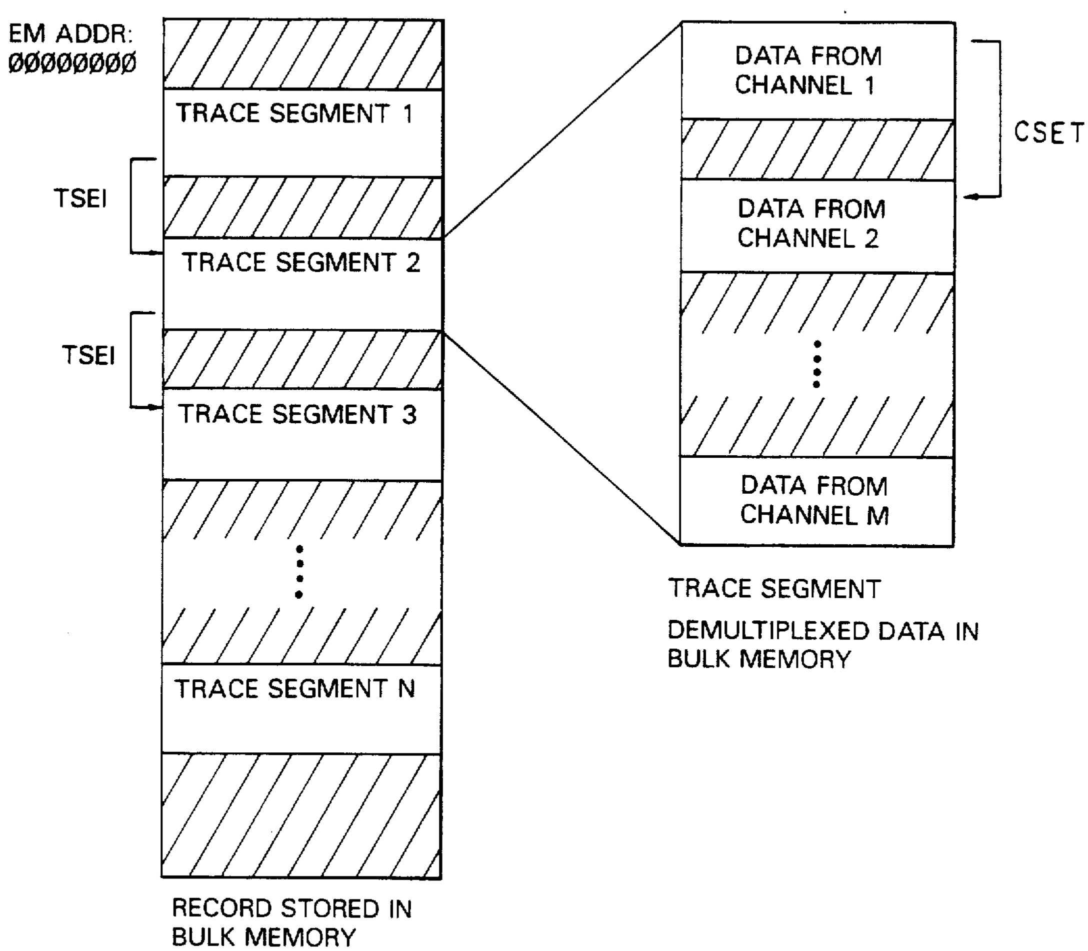
FIG. 40 illustrates the format of demultiplexed data in bulk memory.

Bulk memory interface 190 controls the transfer of data from the scan buffers 208, 210 into bulk memory 14. When a scan buffer has been loaded with either two scans of 32-bit data or four scans of 16-bit data, the scan buffer control circuitry switches over and begins loading the other buffer. When this occurs, the bulk memory interface 190 begins transferring data from the buffer that was just loaded into bulk memory 14. Data may be stored in bulk memory 14 in one of two ways. FIG. 40 shows how demultiplexed data is stored. The record consists of some number of blocks of data called trace segments. The trade segments may be separated, as shown, or they may be contiguous. Each trace segment consists of some number of channel segments. A channel segment contains a block of data from a single channel. Within each trace segment there will be one channel segment for each active channel. The channel segments may be separated, as shown, or they may be contiguous.

Figure 41:
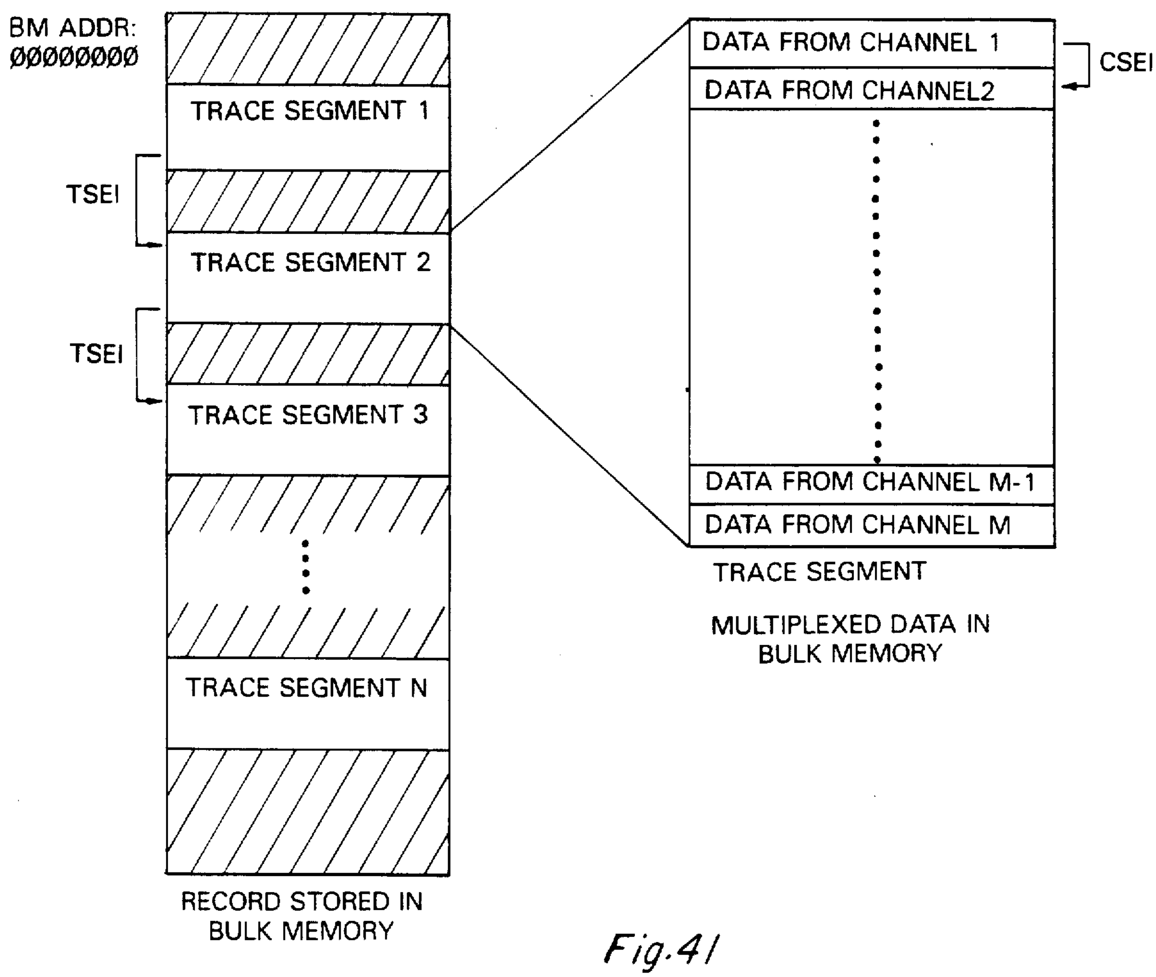
FIG. 41 illustrates the format of multiplexed data in bulk memory.

Multiplexed data storage is similar to demultiplexed storage. The difference is in the trace segments, as shown in FIG. 41. A single 64-bit data word (consisting of four 16bit or two 32-bit data words) for each channel is loaded into consecutive Bulk Memory 14 addresses. This is equivalent to transferring a single scan buffer into a trace segment.

Figure 42A:
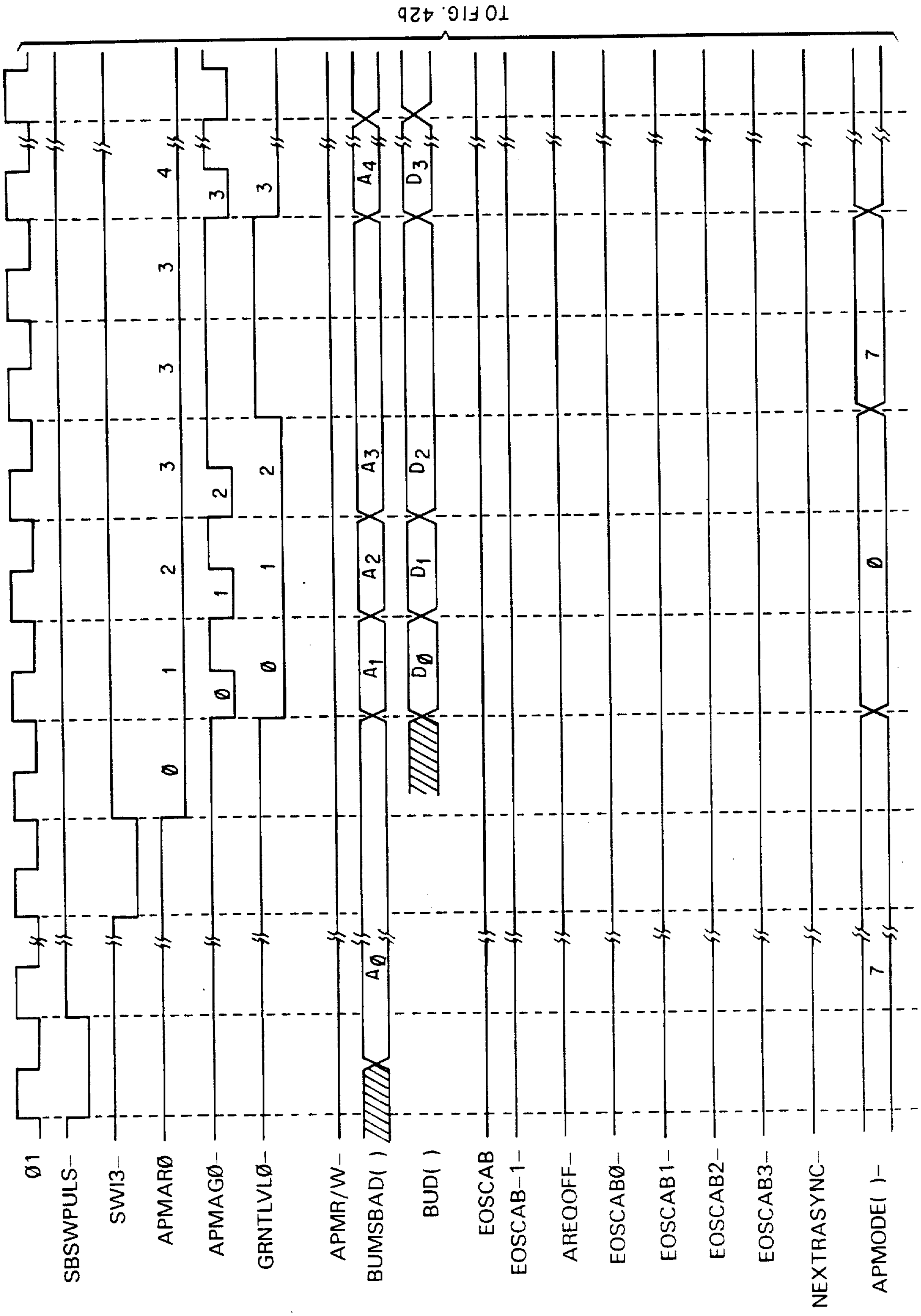
FIG. 42 illustrates bulk memory interface timing for the input controller format conversion.
Figure 42B:
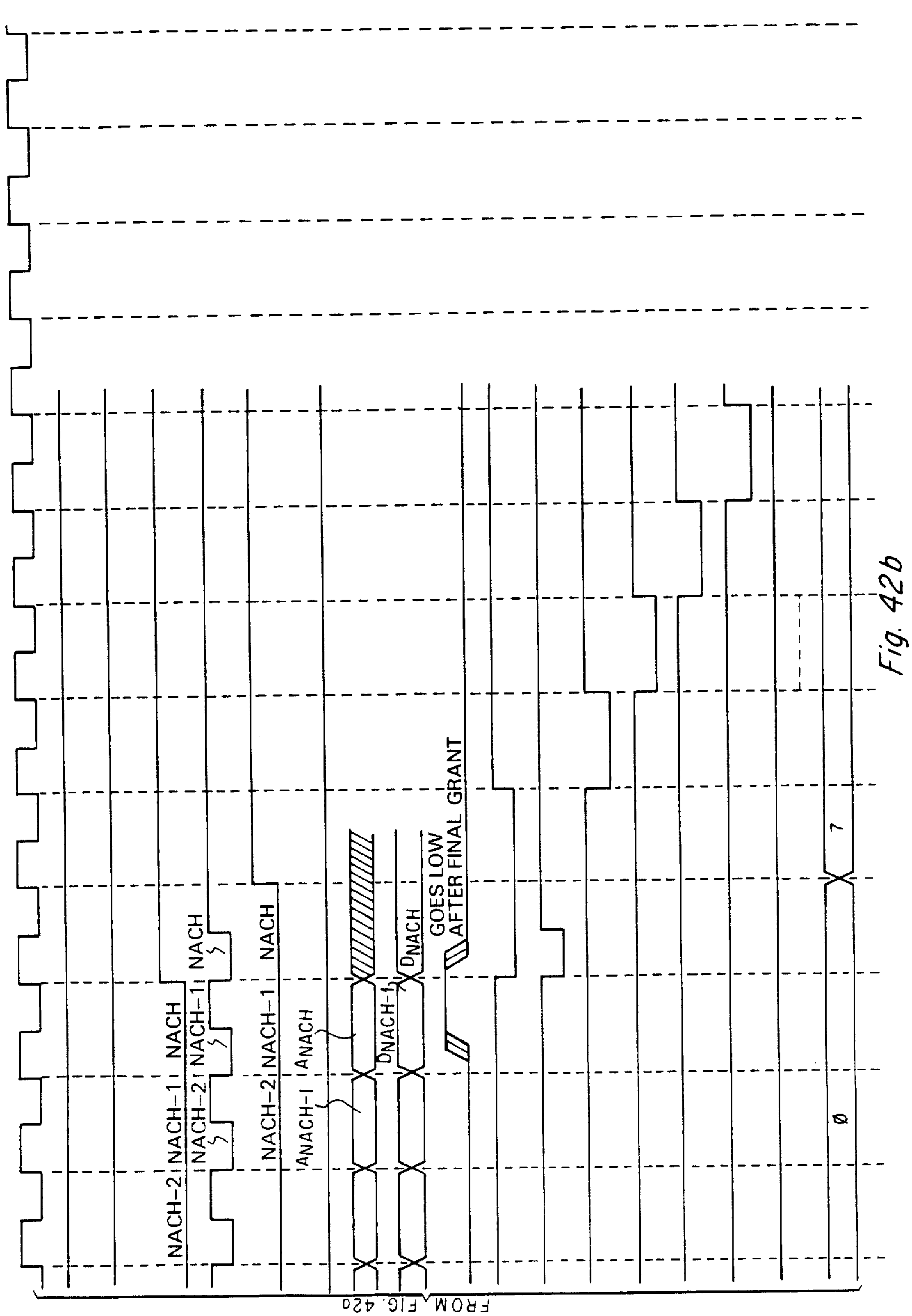

The scan buffer read address 207 comprises a counter that is cleared each time the scan buffer control circuit switches from loading one buffer to loading the other (SBSWPULS-). The address is incremented each time the Bulk Memory 14 access request is granted (BAG-active). The scan buffer address is compared to the value in the Number of Active Channel Register 204 to determine when the last valid data word has been taken out of the Scan Buffer. The signal End of Scan Buffer (EOSCAB) becomes active when this occurs and triggers a sequence of signals (EOSCAB-1- and EOSCAB0- through EOSCAB3-) that are used throughout the bulk memory interface 190. The timing for these signals is shown in FIG. 42.

ARITHMETIC UNIT

Figure 43:
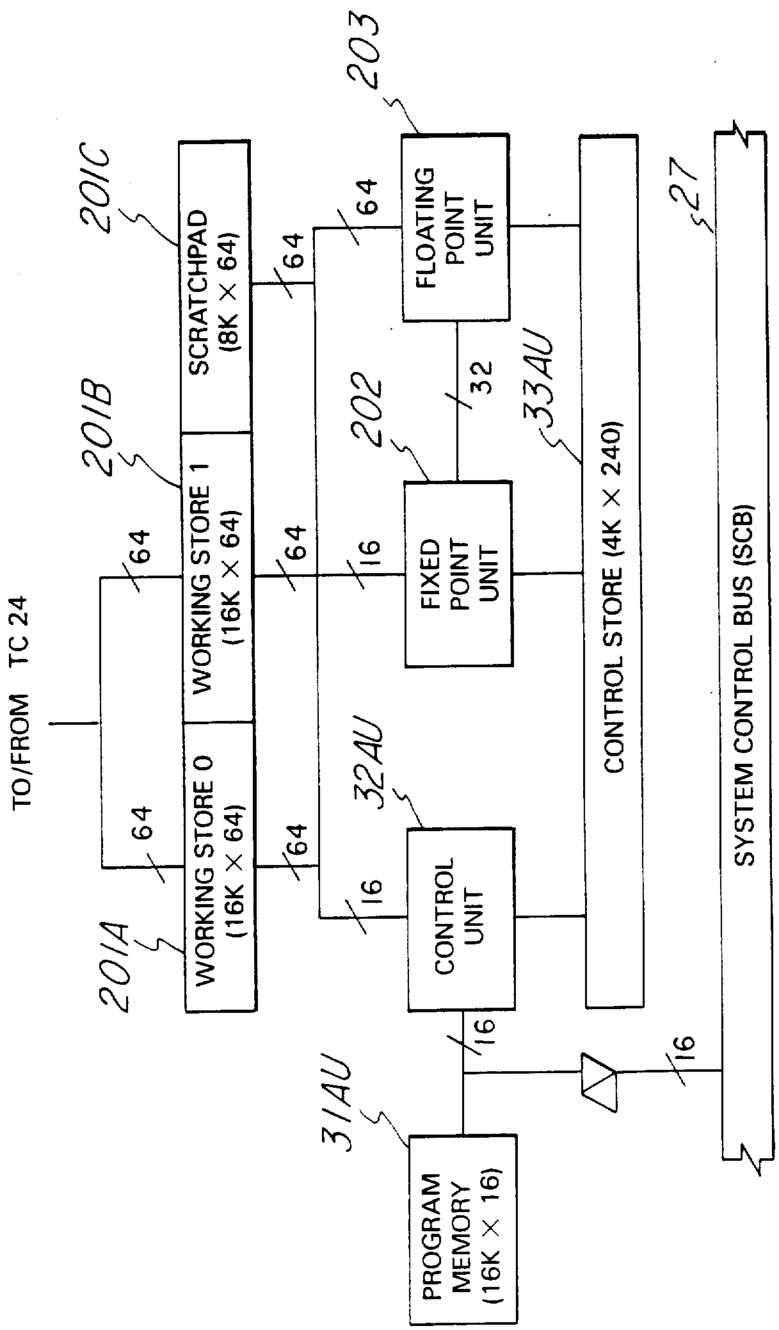
FIG. 43 is a block diagram of the arithmetic unit.

Arithmetic Units 21, 22 (FIG. 2) provide the array processor system with high speed fixed and floating point computational capability on arrays. The hardware is optimized toward the computation of Fast Fourier transforms T. Arithmetic unit elements operate at a clock rate of 6 MHz (167n sec). The array processor has the option of using one or two arithmetic units 21, 22. Each arithmetic unit is identical to the other. WSxB bus provides the interface through which floating point data is loaded into arithmetic units 21 and 22 from bulk memory 14 for processing. All data flow over this bus is under control of transfer controller 23. The arithmetic units 21, never invokes any data transfers of any type of this bus. Arithmetic units 21, is dependent on TC/24 for fetching the bulk memory data and placing data in their working stores 201A, 201B (see FIG. 43). The arithmetic unit 21 performs 32-bit floating point arithmetic operations on data arrays resident in the working stores 201A and 201B, and scratch pad 201C of Floating Point Unit 203 as two floating point multipliers and two three-input floating point adders to support these operations. The two working stores 201A and 201B are accessible by the arithmetic unit 21 and the transfer controller 24. The scratch pad memory 201C is used to hold intermediate results and is accessible by the arithmetic unit 21 only.

Control store 33AU provides the storage for the microcode instruction sequence. It is accessed at a 6 MHz rate, whereby the microcode defines the data paths and the arithmetic unit sub-system control functions during each clock cycle. Program memory 31AU provides the storage for the assembly language control program which directs the operation of the arithmetic unit 21.

Fixed point unit 202 provides the controlled functions which coordinate the activities of the constituent sub-systems of the arithmetic units (AU21, 22). The control signals specify not only the data paths within the AU21, 22 for the realization of a specific process, but also the functional operation of the processing elements. The fixed point unit 202 also provides the mechanism by which fixed point arithmetic operations (16-bit) are carried out. AU21, 22 is optimized for the implementation of FFT type operations. In support of these, fixed point unit 202 contains a generator 213 (FIG. 44) of the coefficients used in this process. These coefficients are provided to the floating point unit 203 of AU21, 22.

In further support of the efficiency of AU21, 22 in the performance of processing algorithms, the fixed point unit 202 contains a generator 214 (FIG. 44) a numeric constants used in calculations performed by floating point unit 203. This is done as a pre-defined set of floating point values which are accessed and provided to floating point unit 203 in this same manner as are the FFT coefficients.

Figure 44:
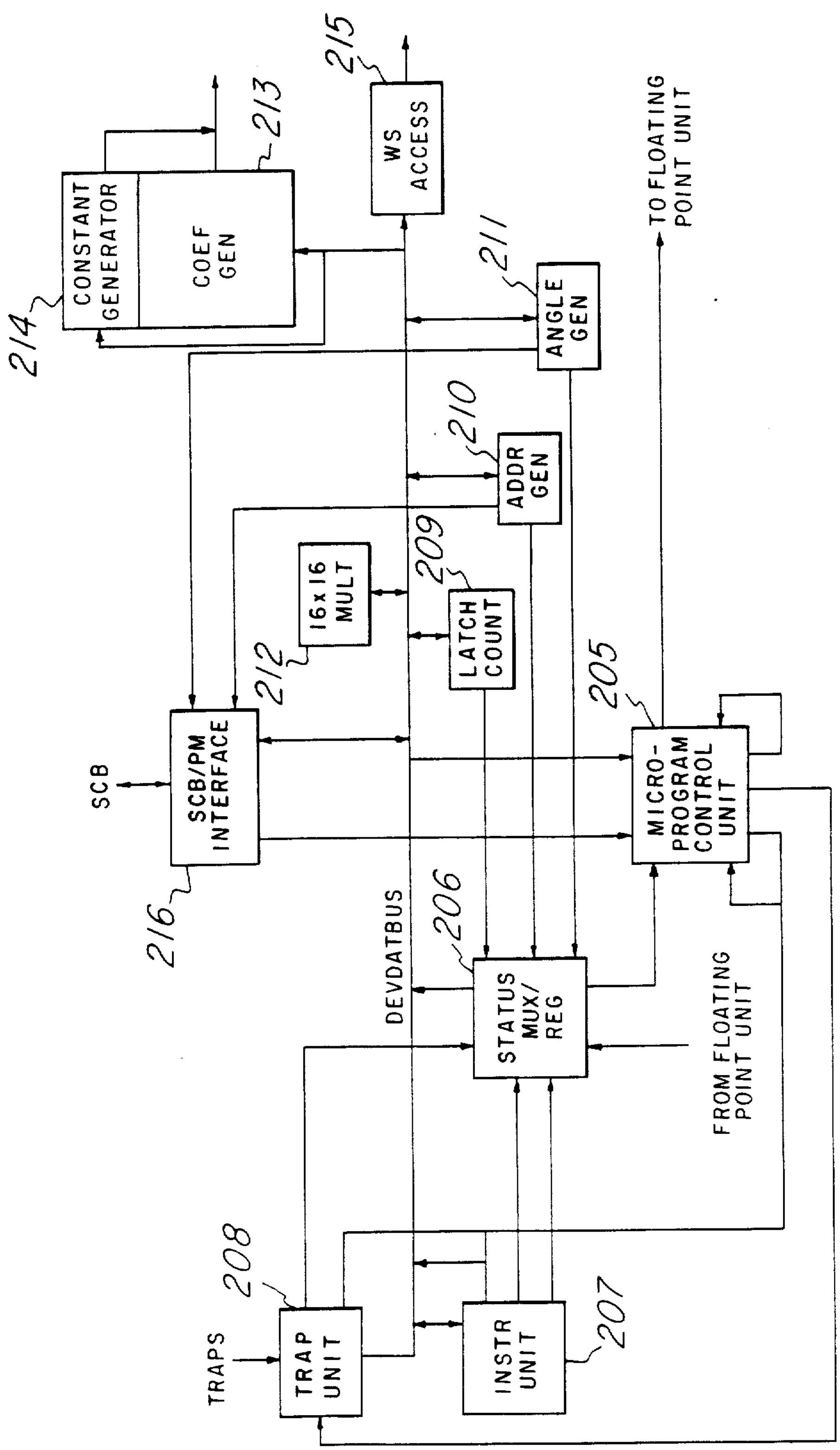
FIG. 44 is a block diagram of the fixed point unit of the arithmetic unit.
Figure 45:
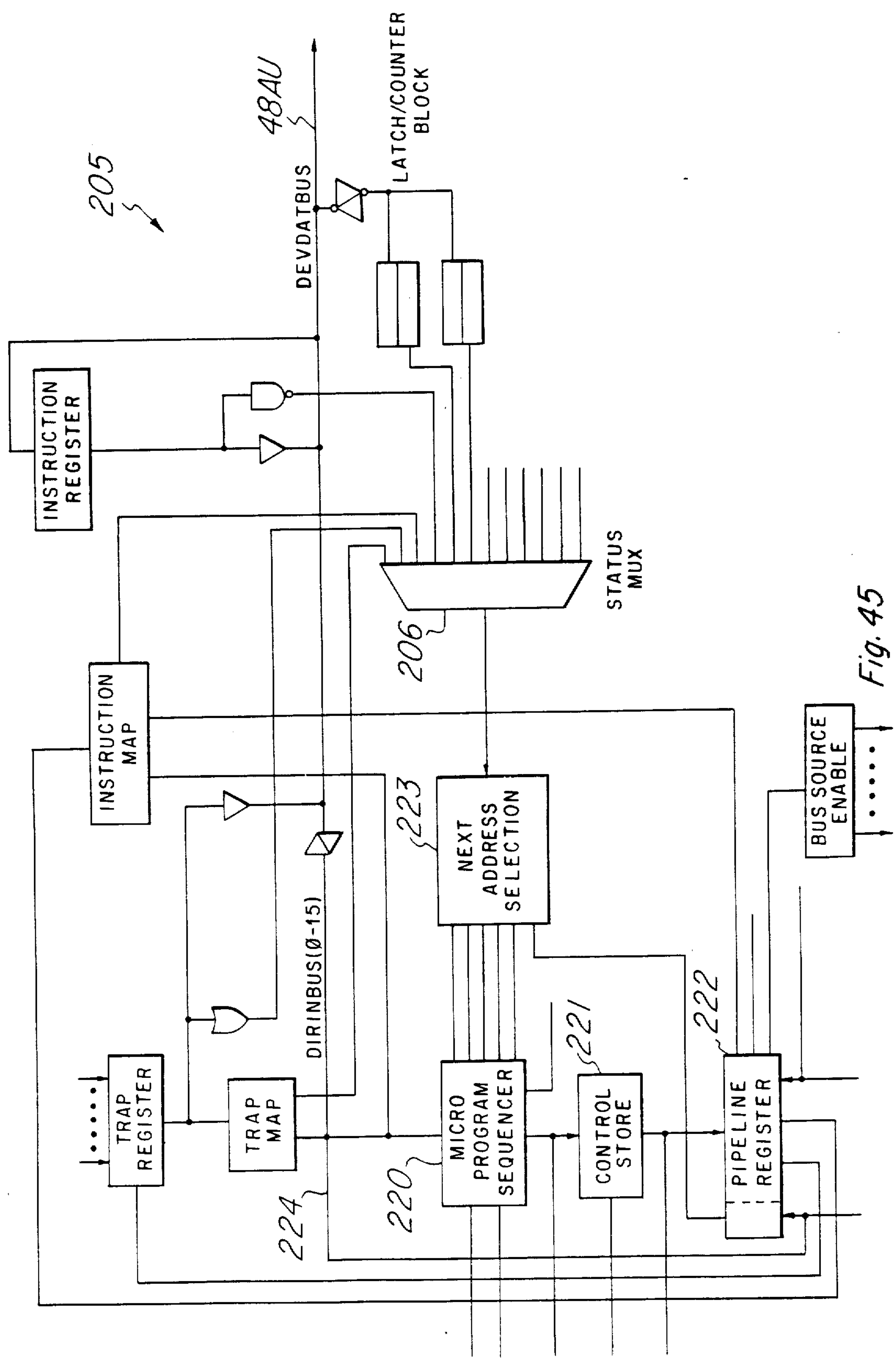
FIG. 45 is a block diagram of the microprogram control unit of the fixed point unit.

Fixed point unit 202 is shown in FIG. 44. FIG. 44 illustrates the following major elements connected as shown. These are:

Microprogram Control Unit 205 generates the control signals which specifiy the functions of the AU systems. The details of microprogram control unit 205 are illustrated in FIG. 45. The control signals are produced as a result of access to the microcode instruction words, each of which explicitly defines the state of the control signals for one full system clock cycle.

As shown in FIG. 45, microprogram control unit 205 is comprised of a number of sub-elements, connected as shown. Included is a microprogram sequencer 220, a control store 221 and a pipeline register 222. Microprogram sequencer 220 produces the control store 221 address for the next microinstruction to be executed. Control store 221 provides the storage for the array of microcode instruction words. The pipeline register 222 holds the current microinstruction for a full system clock while the next microcode instruction is being retrieved.

The operation of the microprogram sequencer 220 is enhanced by the inclusion of next address select logic 223 and a microprogram sequencer direct input bus 224. Next address select 223 logic provides the means by which selection of the address to be used in the next control store 221 access is made contingent upon the state of an external test signal. In this way, conditional branches may be implemented. Microcode sequencer direct input bus 224 provides the means by which alternative data paths may be selected as direct inputs to the microprogram sequencer 220.

Status multiplexer/register 206—This unit provides the mechanism by which information pertaining to the status of the AU21, 22 subsystems is routed. The multiplexer selects one of the hardware status lines so that it may act as an input to the control logic. The register preserves information from many of the status lines for access by the user.

The status multiplexer register 206 provides the data path by which this status information provided by the AU device is routed to the NAS223 logic. This logic may then establish the MPS220 control functions such that conditional branches are performed contingent upon the state of the selected status line. This functional unit is in the critical timing path of the microprogram sequencer 220 execution cycle.

The status register multiplexer 206 also provides the data path by which transient status information provided by the AU device is preserved for subsequent access by the user. These status bits may be placed on the DEVDATBUS in parallel for hardware testing or uploading under user control. AU21, 22 supports two 16-bit block of user status information.

Instruction unit 207—This unit provides the means by which the AU assembly language level instructions initially resident in program memory, are made available for decoding and execution. This unit provides the mechanism by which each register is loaded from the DEVDATBUS into the instruction register portion of unit 207. The instruction map provides the mechanism by which the instruction may be partially decoded for entry into appropriate microcode routines. A subset of the instruction register bit fields are available as test signals.

Trap unit 208—This unit provides means by which traps may be detected and to which responses are made quickly and efficiently. Furthermore, the response to the trap condition is made in a conditional manner. The unit provides the mechanism by which each trap flag is latched into the appropriate location in the trap register. The trap map provides the mechanism by which the trap flags are decoded for service by the appropriate microcode routine.

Latches/counters unit 209—A pair of latches is provided which are loaded from DEVDATBUS. The width of each latch is 16-bits, as is the width of a counter associated with each latch. The counters are loaded from their associated latches. The counters are able to count independently of each other. Each counter generates a test signal which indicates when the counter in not 0. These signals are selected by the status MUX/REG206 as a test signal input to the next address select logic.

Address generator 210/Angle Generator 211—This unit provides the facility for performing fixed point arithmetic and logical operations on 16-bit data. Each generator consists of a 16-bit arithmetic/logic unit (ALU), a condition code/status register, and a register file with at least 16 words.

Coefficient genertor 213 is made up of twelve PROMs (24K×32 bit) and generates the sine and cosine values used for computing the FFT algorithm.

Constant generator 214 is made up of four PROMs (32×32 bits) and provides constents used in calculators by the floating point unit 203.

SCB/PM Interface Unit 216—This unit provides the mechanism by which the AU21, 22 communicates to external devices via system control bus 27. It is by this mechanism that inter-device communication is supported. Program memory 31AU accesses are also made under the control of the unit. Program memory 31AU must be available to local and remote devices. The local device AU21, 22, must minimally be able to execute the assembly language instructions resident in the unit. Remote devices must be able to read and/or modify the contents of local program memory 31AU. SCB26 provides not only the data paths to support these modes of operation, but also the needs by which resolution of conflicts arising over program memory access is provided.

Figure 46:
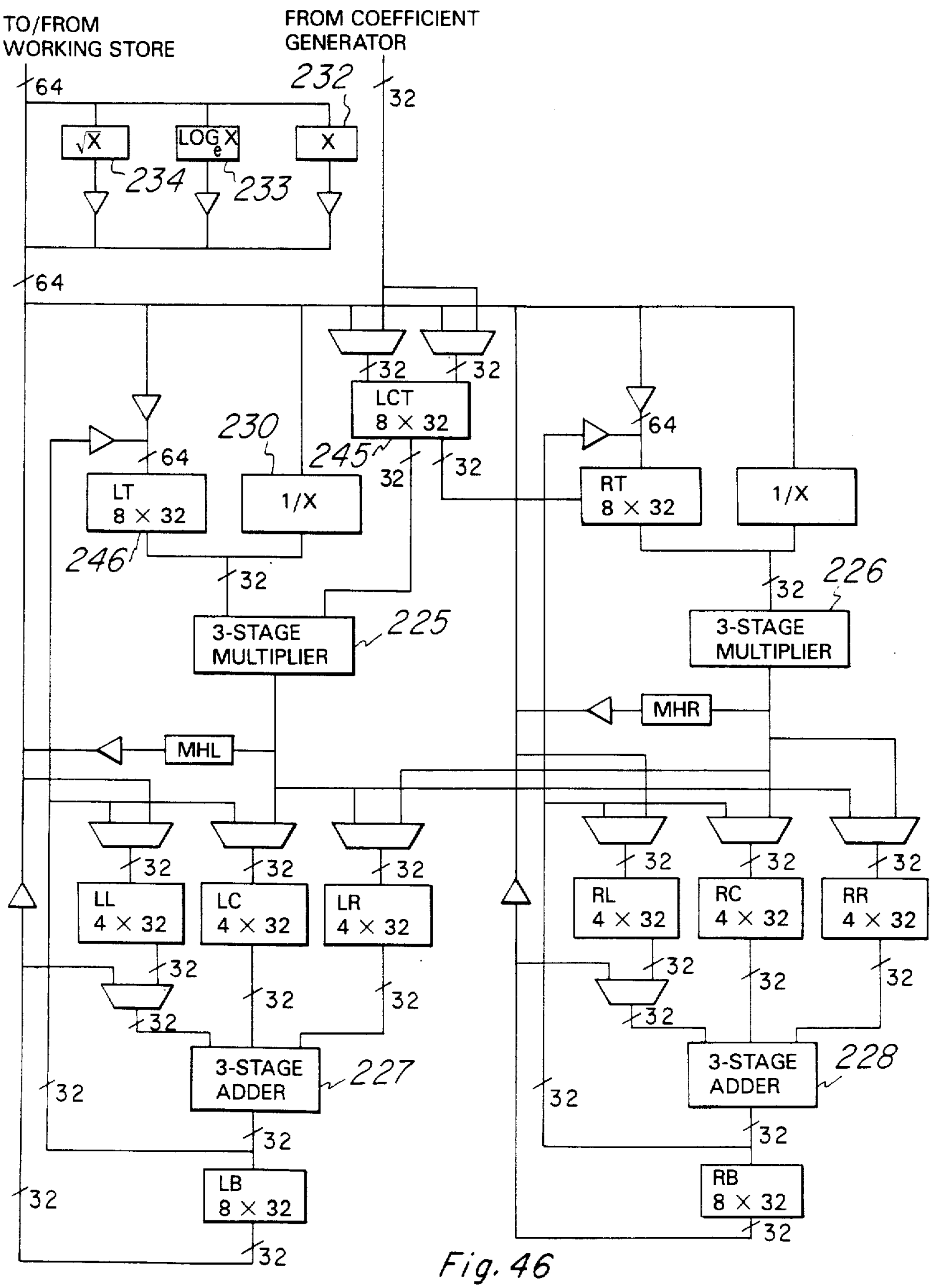
FIG. 46 is a block diagram of the floating point unit of the arithmetic unit.

Floating point unit 203 provides the mechanism by which floating point arithmetic operations are carried out by AU21, 22. Refer to FIG. 46 where it is shown that floating point unit 203 has two floating point multipliers 225, 226 and two 3 input floating point adders 227, 228. Registers are provided for scratch pad memory for the intermediate results. For addition, hardware support is provided to reduce the computation required to generate the results of the following operations:

1. Finding the reciprocal of a value.
2. Finding the square root of the value.
3. Finding the base 10 logarithm of a value.
4. Finding the anti-logarithm to the base 10 of a value.

The floating point multipliers 225 and 226 have 232-bit inputs, A and B which must be normalized. The normalized 32-bit result, C, is the result of one of four operations:

1. $C=A\times B$
2. $C=1\times B$
3. $C=A\times B\times 0.5$

Multipliers 225 and 226 each provide a signal which indicates when a result is invalid. A single product is available three system clock cycles after the inputs have been defined. However, once a sequence of multiply operations have been initiated, successive results are produced every single clock cycle.

The floating point adders 227 and 228 each have 1, 2 or 3 32-bit inputs, A, B, and C. All of the inputs are normalized. The adder produces a 30-2-bit normalized results.

Reciprocal estimator 230 provides a first approximation of the reciprocal of a floating point number. Four iterations are required for full accuracy.

Square root estimator 234 provides a first approximation to the square root of a floating point number.

Logarithm estimator 233 provides the basis for an approximation of the logarithm of a floating point number. The estimate of the logarithm is derived as the sum of two terms. The first term is a 32-bit floating point number which is the original input shifted to guarantee that it has a value in the range of one to two. The second number represents the original exponent and the shift necessary to bit normalize the mantissa.

Exponential estimator 232 provides the basis for an approximation of the anti-logarithm on the base e of an input. This includes a floating point number to be used in subsequent iterative calculations. The terms to be provided is generated on a table look-up basis. There are two parallel exponential estimators connected to the floating point data bus.

Figure 46A:
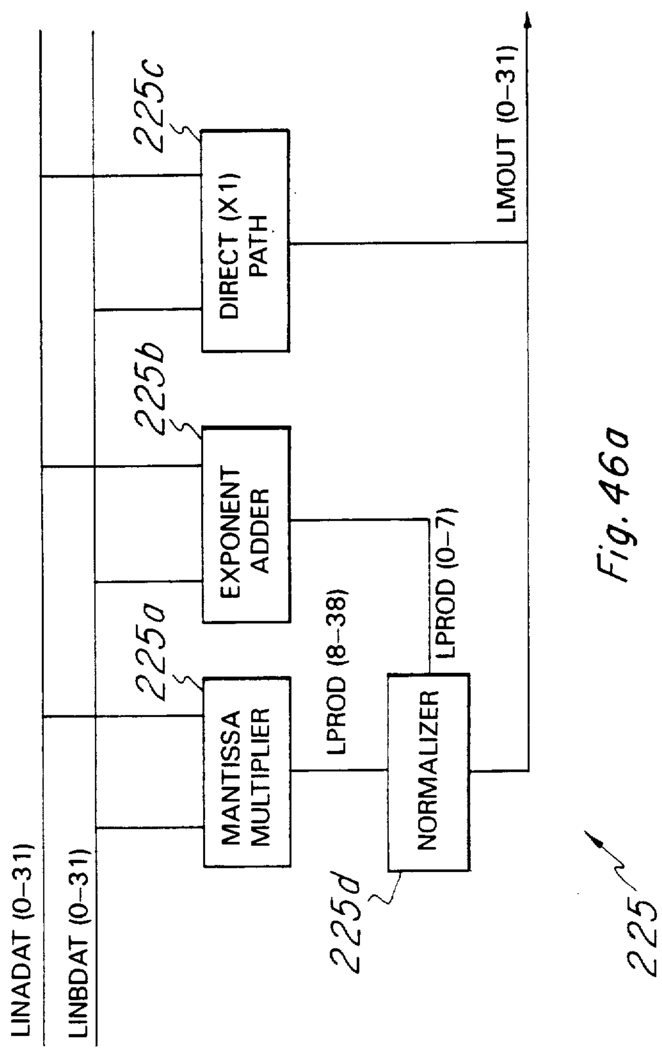
FIG. 46a is a floating point multiplier block diagram.

The multipliers 225 and 226 are floating point multipliers and are identical. The block diagram of the multipliers is shown in FIG. 46*a*. There it can be seen that mantissa multiplier 225*a*, exponent adder 225*b* and direct path 225*c* are all connected to receive the input signals (LINADAT(0–31) and LINBDAT(0–31). Normalizer 225 receives the outputs from mantissa multiplier 225*a* and exponent adder 225*b*, with its output also jointed with that of direct path unit 225*c* to provide the output signal. When multiplying floating point numbers, it is necessary to operate differently on the exponent and the mantissa portions of the number. The mantissas are multiplied, the exponents are added and the resulting product must be normalized, as indicated in the block diagram of FIG. 46a. In this particular application, there is a requirement to multiply either operand by 1 and therefore the direct path unit is included.

Figure 46B:
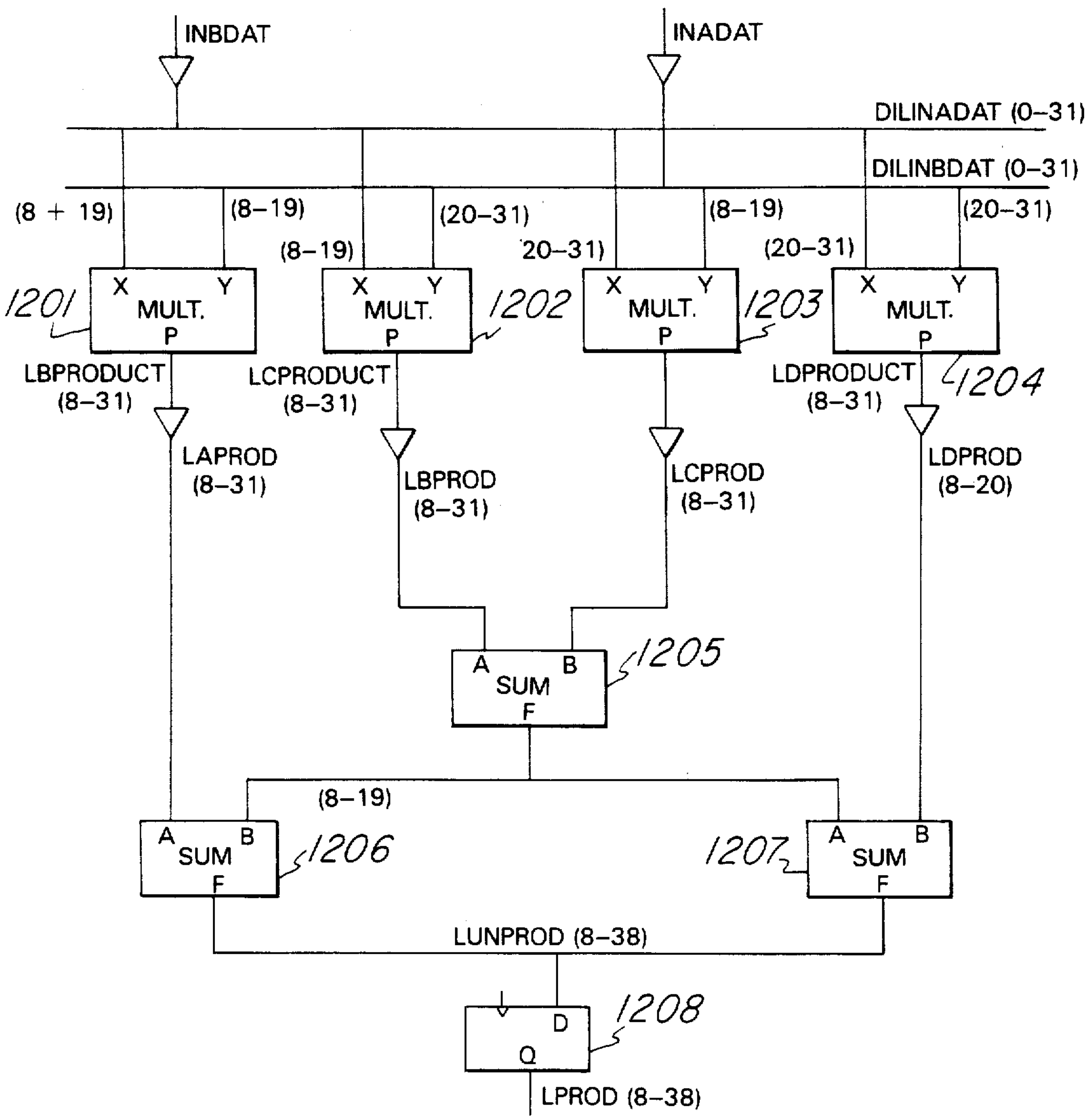
FIG. 46b is a mantissa multiplier of floating point multiplier block diagram.

The mantissa multiplier 225a is shown in detail in FIG. 46b.

The mantissa of the floating point number is made up of bits 8 through 31, a 24-bit number. The multiplier is implemented using multipliers which are capable of multiplying a 12-bit×12-bit number. In this preferred embodiment, the number sizes do not match and the product is formed by taking a series of partial products and then summing the results, as shown. Multipliers 1201–1204 receive the inputs as shown with the products being summed in summers 1205–1207 as shown. Finally, the total product, LUNPROD(8–38) is set into flip flop 1208.

Figure 46C:
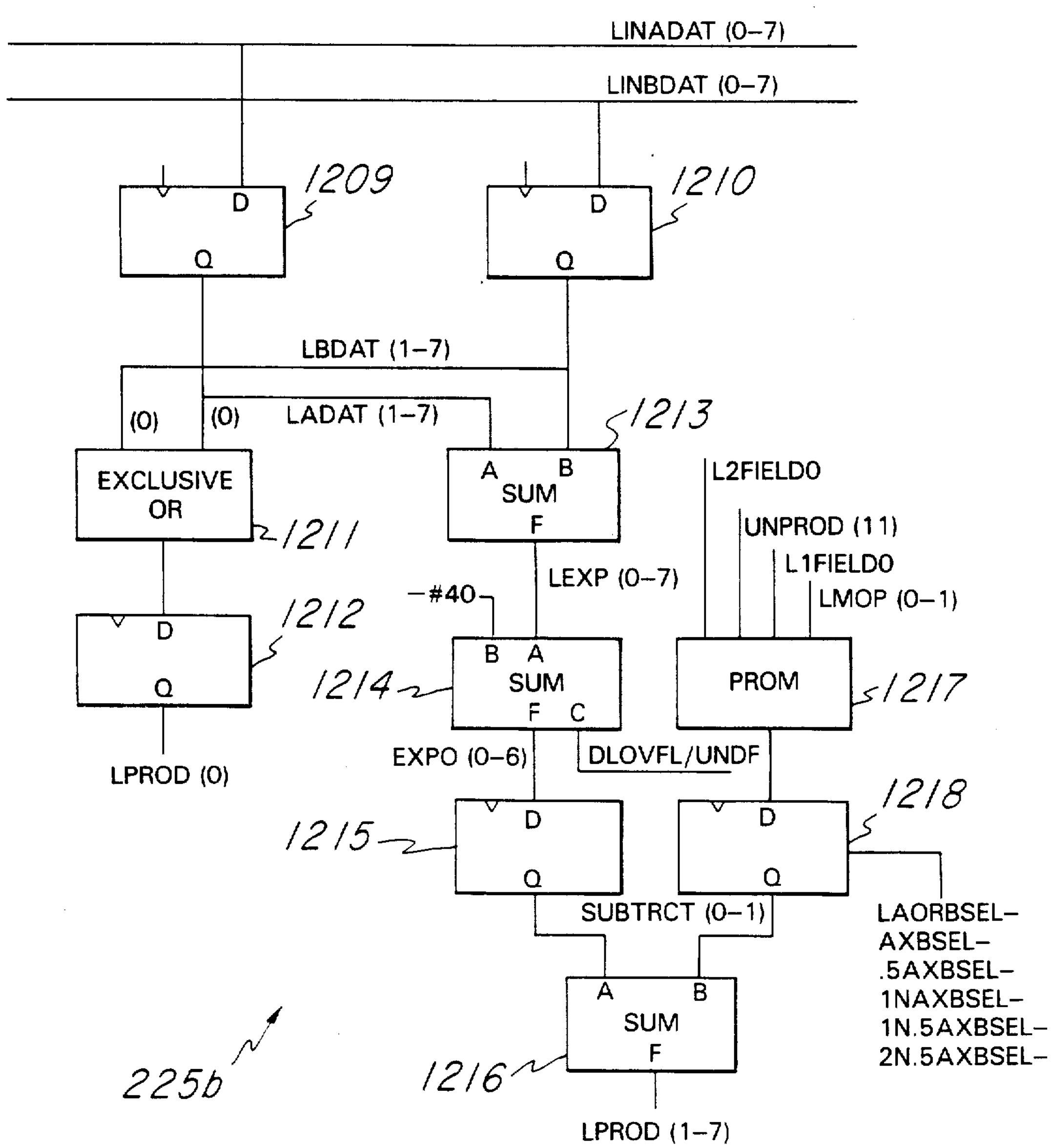
FIG. 46c is an exponent adder of floating point multiplier block diagram.

Exponent adder 225b is shown in FIG. 46c. This block diagram illustrates the basic circuit making up this adder. The adder performs two functions: 1. It adds the exponents for the multiply operations; 2. It provides signals to normalize the results of the mantissa multiplication based on the mantissa product in the multiply operation being performed.

In the block diagram, exclusive OR circuit 1211 determines the sign of the resulting exponent which is signal LPROD(0).

The final exponent of the product LPROD(1–7) is the difference between EXPO(0–6) from summer 1214 and latched in flip flop 1215, and signal SUBTRCT(0–1) from flip flop 1218.

Figure 46D:
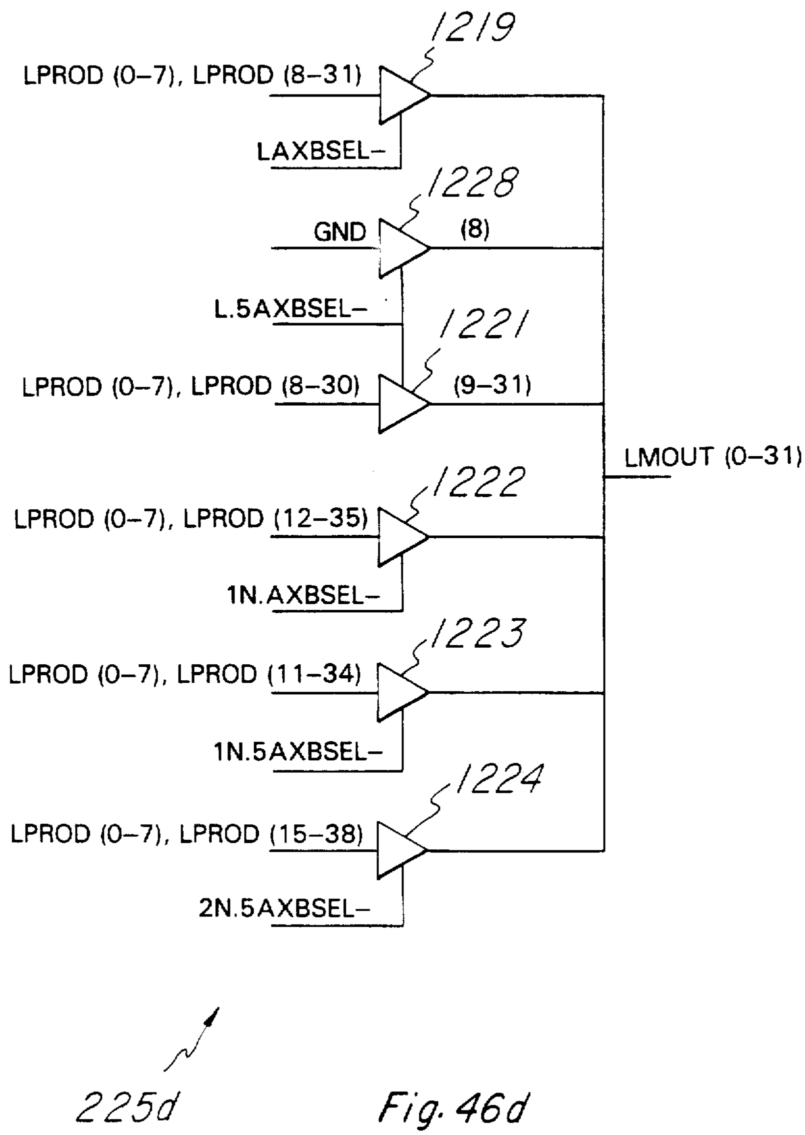
FIG. 46d is a normalizer of floating point multiplier block diagram.

Normalizer 225d is shown in FIG. 46d. As shown in the figure, the normalizer simply selects the proper field of the mantissa and the derived exponent for the multiplier output bus LMOUT(0–31).

Figure 46E:
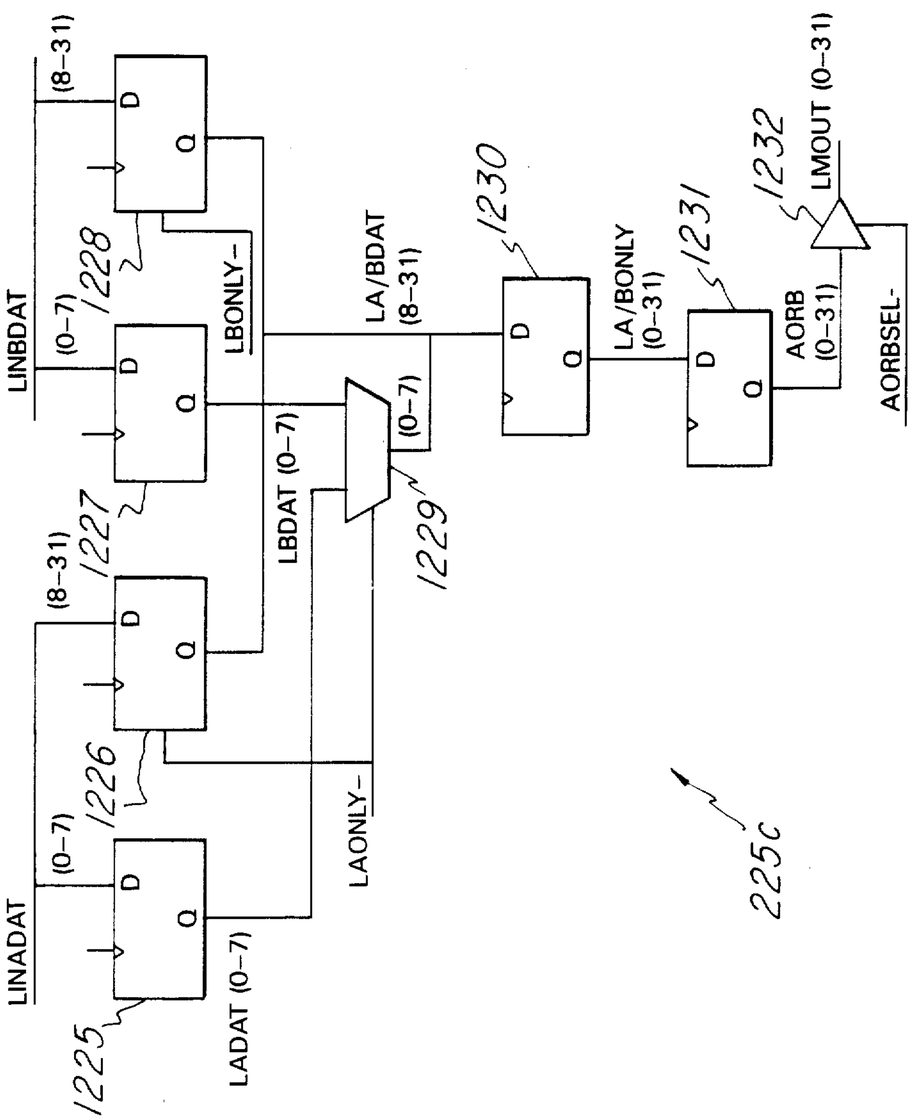
FIG. 46e is a multiplier direct path of point multiplier block diagram.

Multiplier direct path is shown in block form in FIG. 46e. As indicated, the input signals LINADAT and LINBAT are input directly to unit 225c. Note that the exponent portion of the input numbers is latched in flip flops 1225 and 1227, while the mantissa portion is latched in tri state flip flops 1226 and 1228. Multiplexer 1228 has an output which is combined with that from flip flops 1226 and 1228. The output from multiplexer 1229 is input to flip flop 1230 as are the outputs from flip flops 1226 and 1228. The output from flip flop 1231 ultimately provides signal LMOUT(0–31), as shown.

Figure 46F:
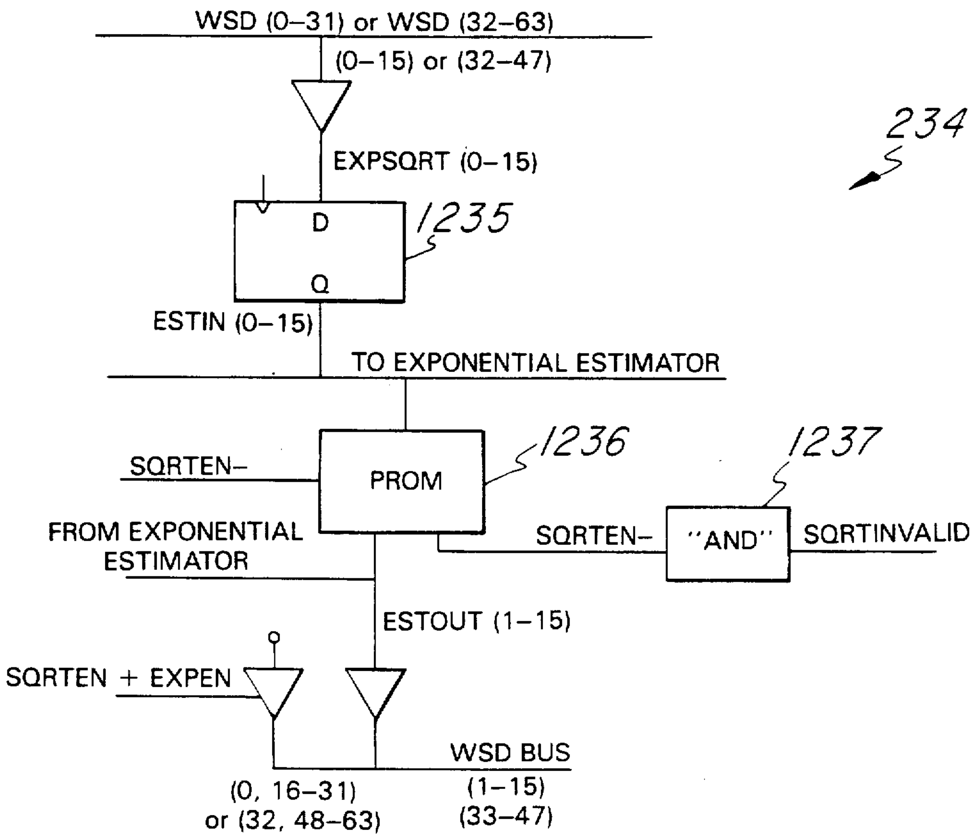
FIG. 46f is a square root estimate block diagram.

Turning now to FIG. 46f, the square root estimator 234 is shown. The square root is computed using the following iterative formula:

$$X(n+1)=0.5*X(n)-0.5*(X)(n)**3)/a+X(n)$$

A=number for which the square root is desired
X(n)=n estimate of the square root
X(n+1)=n+1 estimate of the square root The number "A" is used to address a PROM which provides the first estimate, X(1). Microcode uses the equation given above to compute the square root. The value of "A" is monitored to generate an error status bit if an attempt is made to determine the square root of a negative number.

Microcode makes a number available on the WSD bus which is clocked into flip flops 1235 providing signals ESTIN(0–15) which is the sign, exponent and first 8 bits of the number's mantissa. Signal is distributed to the Exponential Estimator and to PROM 1236. The PROM generates an estimate, signal ESTOUT(1–15) based on the number input. It also generates an error signal based on the sign of the input number. The microcode program asserts the signal SQRTEN on the clock following inputting the number to enable the PROM 1236, the estimate output signal being impressed on the WSD bus. It also is directed to the AND circuit 1237 to sample the PROM 1236 output, resulting in the signal SQRTINVALID if "A" is negative. Note that the sign bit, WSD(0) is forced to 0 regardless of the sign of the input number when the estimate is output. Bits 9–31 of the estimate are always returned as 0. Signal EXPEN is a microcode program bit used to enable the ESTOUT to the bus.

Figure 46G:
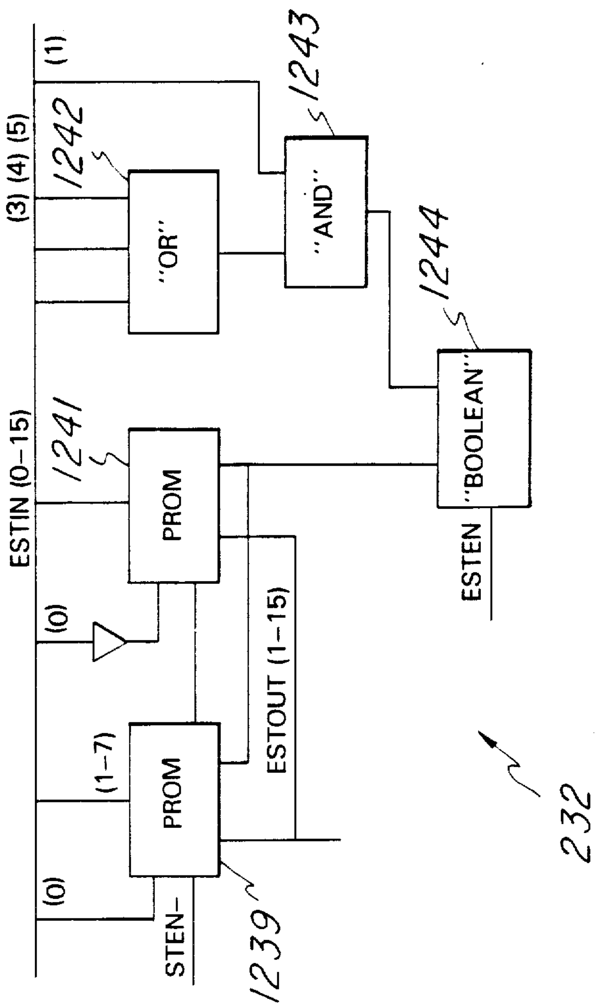
FIG. 46g is an exponential estimate block diagram.

Exponential Estimator 232 is shown in block form in FIG. 46g. Input signal ESTIN(0–15) comes from flip flops 1235 of FIG. 46f. Bits 1–7 are used to address PROMs 1239 and 1241, one for estimates of positive loss and one for estimates of negative loss. Which PROM is selected is determined by bit 0, the sign of the number. Output signal ESTOUT(1–15) FROM from PROMs 1239 and 1241 are enabled by the microcode program bit signal ESTEN-. A second output from PROMs 1239 and 1241 is input to the "BOOLEAN" unit which is enabled by signal ESTEN. The second output is an error signal indicating that an attempt has been made to take an exponential of a number outside the allowable range. Gating is supplied which monitors the exponent bits 1 an 3 or 4 or 5 and the PROM error output. As indicated, unit 1244 which provides this logic is enabled by ESTEN which outputs the Exponential Estimator status signal EXPINVALID.

Figure 46H:
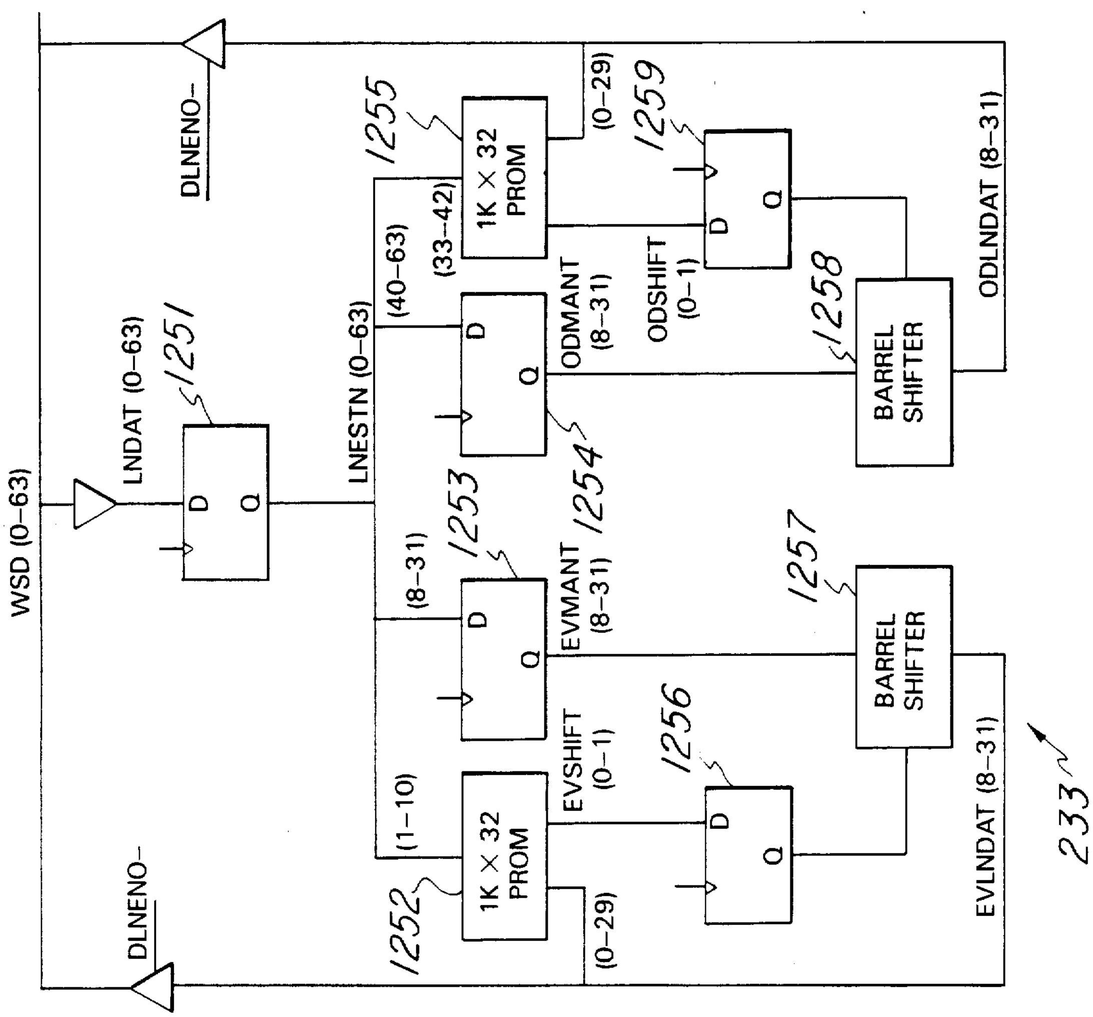
FIG. 46h is a log estimater block diagram.

Log estimator 233 is illustrated in block form in FIG. 46h. Note that two estimators are implemented, one connected to bits 0–31 of the WSD bus and the other connected to bits 32–63. The estimators have common control lines so two estimates are always generated whether used or not.

Data input to the LOG estimators is in the biased floating point number format. Two floating point numbers can be include on the WSD bus in one clock, one in bits 0–31 and a second in bits 32–63. Programming through microcode makes the input available on the WSD bus. After being input, these signals become signal LNESTEN(0–63) or as output from flip flops 1251. The exponent portions of this signal, bits 1–7 and bits 33–39, and the most significant bits of the first characters of the two mantissas, bits 8–10 and bits 40–42, are used to address the 1K PROMs 1252 and 1255. These PROMs perform two functions, first they examine the mantissa to determine where the first 1 exists in the mantissa and, used as a look-up table, they compute the log of the exponent portion of N shown in the immediately preceding equation. PROMs 1252 and 1255 form outputs comprising bits 0–29 which are returned to WSD bus through the line drivers as shown. The PROMs 1252 and 1255 also output bits 0 and 1 which are latched in flip flops 1256 and 1259, respectively, and are used to control barrel shifters 1257 and 1258 as shown. Log estimator status signals are generated by monitoring the signal LNESTN(0–63). Gates are provided to monitor bits 8–11 and 40–43. Since the floating point word is normalized, a 1 must exist in these bits if the number is non-zero. If no 1 exists, the number is declared to be 0. Bits 0 and 32 of the signal are monitored to determine if the number is negative. The two status conditions are ORed together to form the signals OBDERR- and EVENERR-. These signals are enabled for the common control circuitry by the log estimator control signal DLNEN1-.

Figure 46J:
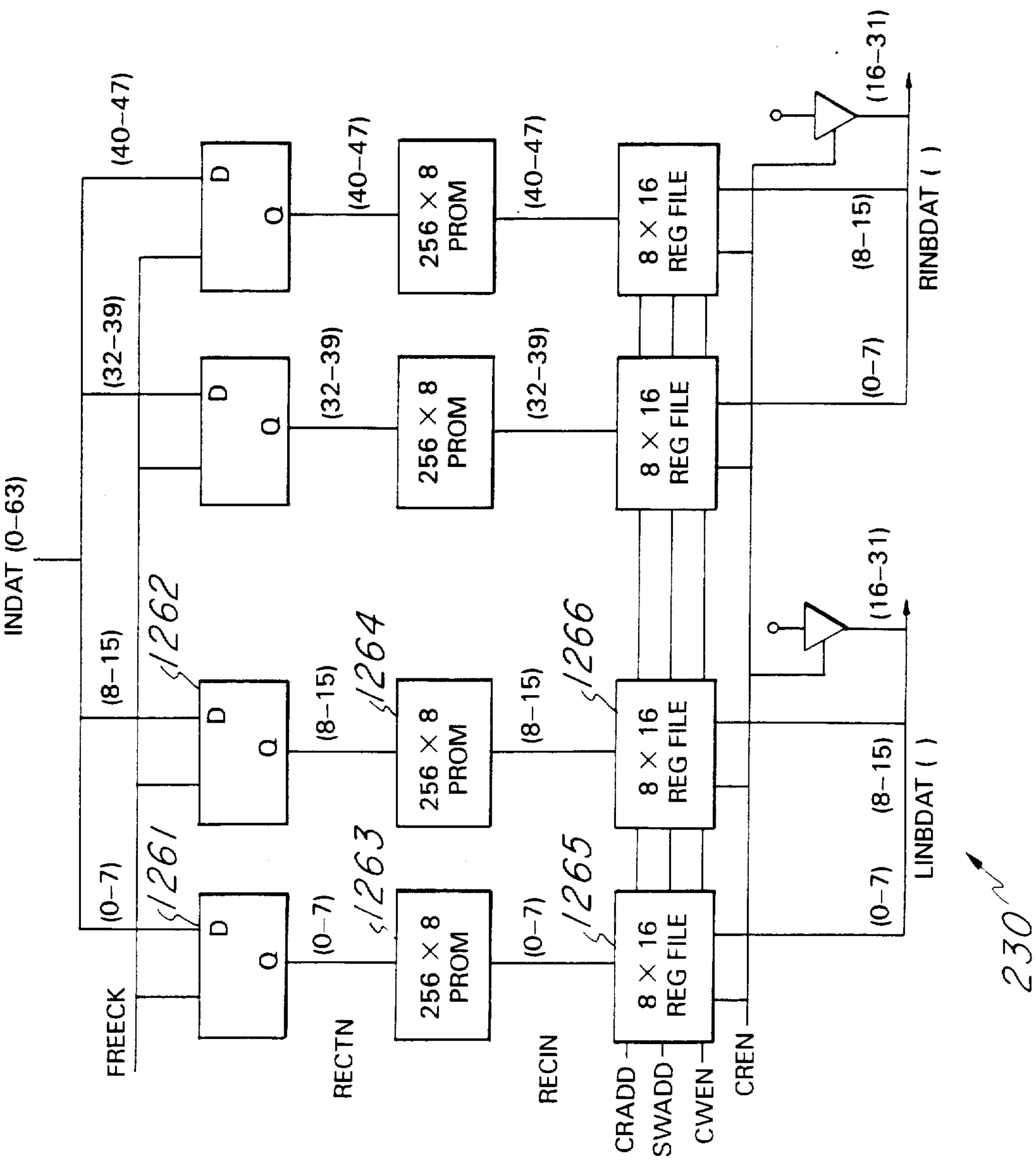
FIG. 46i is a reciprocal estimater block diagram.
Figure 47A:
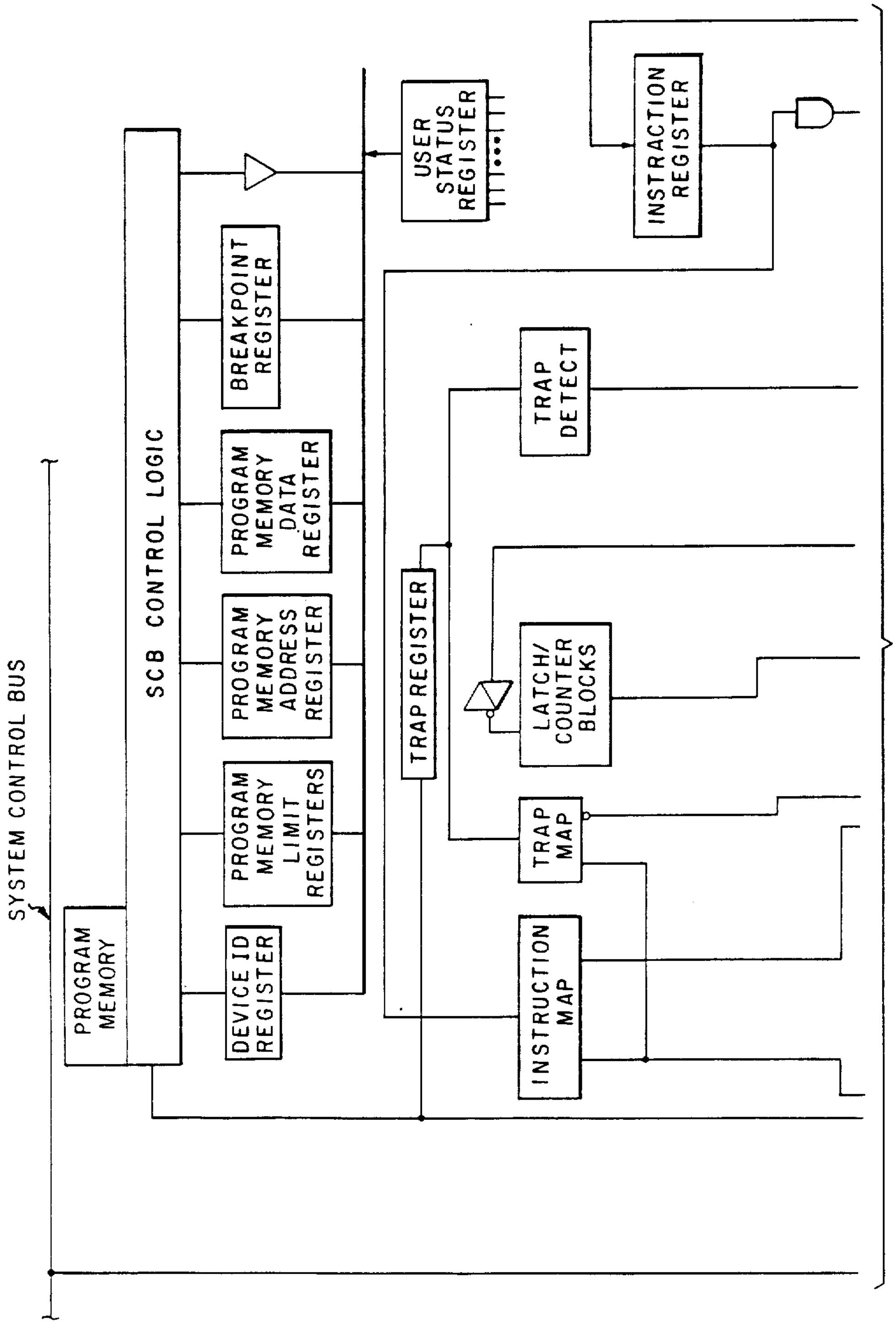
FIG. 47 is a block diagram of the transfer controller control and device dependent unit.
Figure 47B:
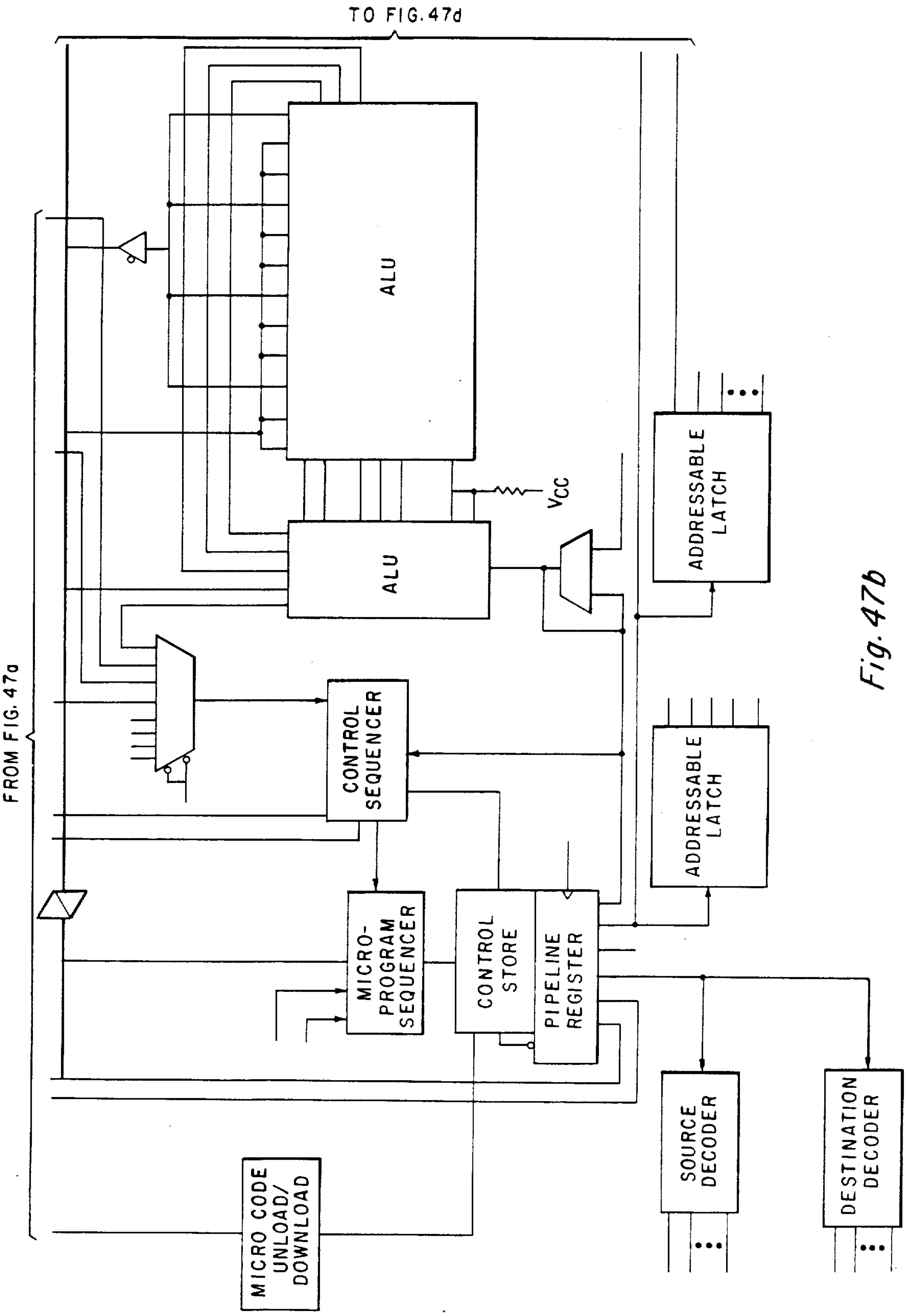
Figure 47C:
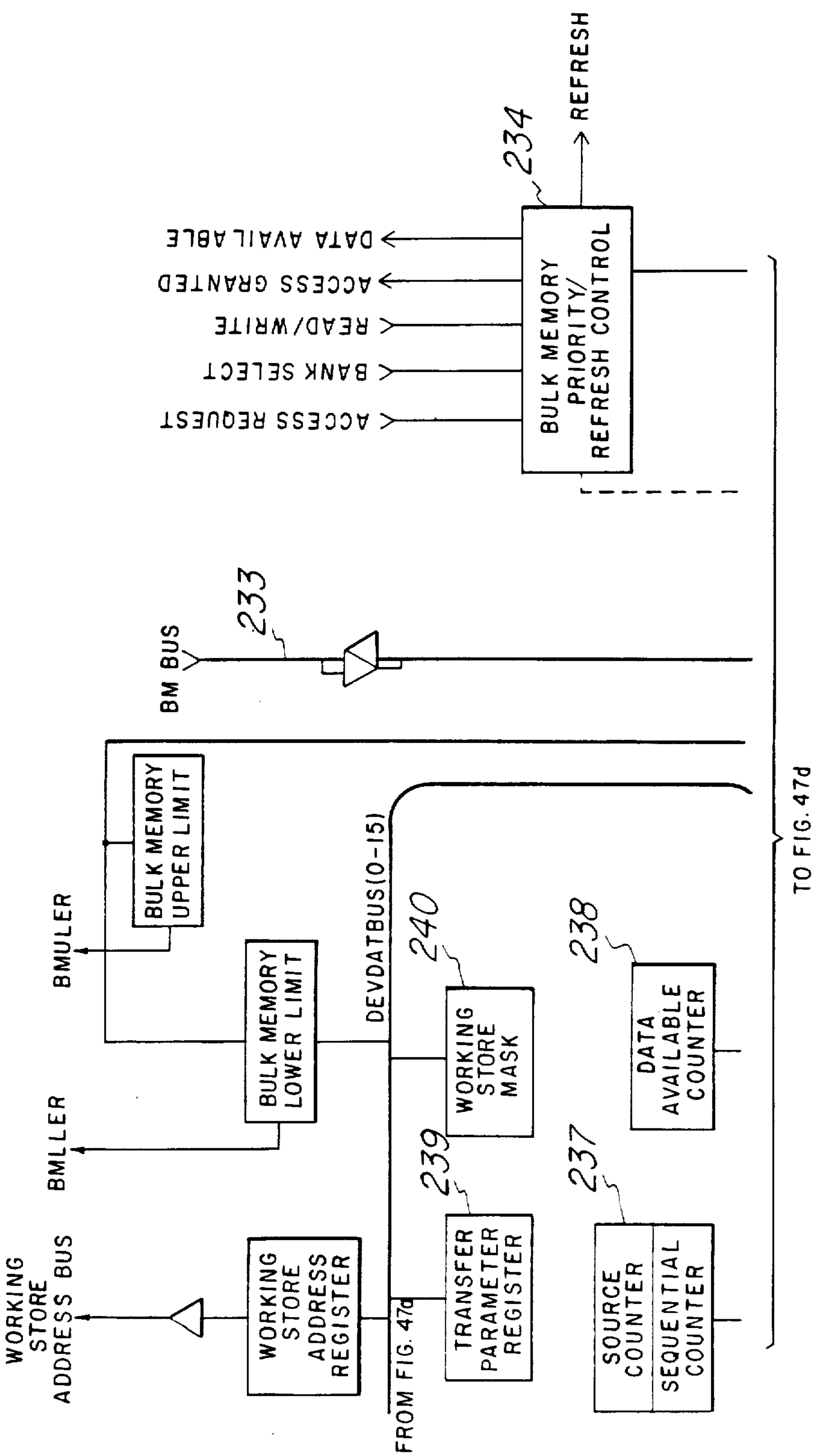
Figure 47D:
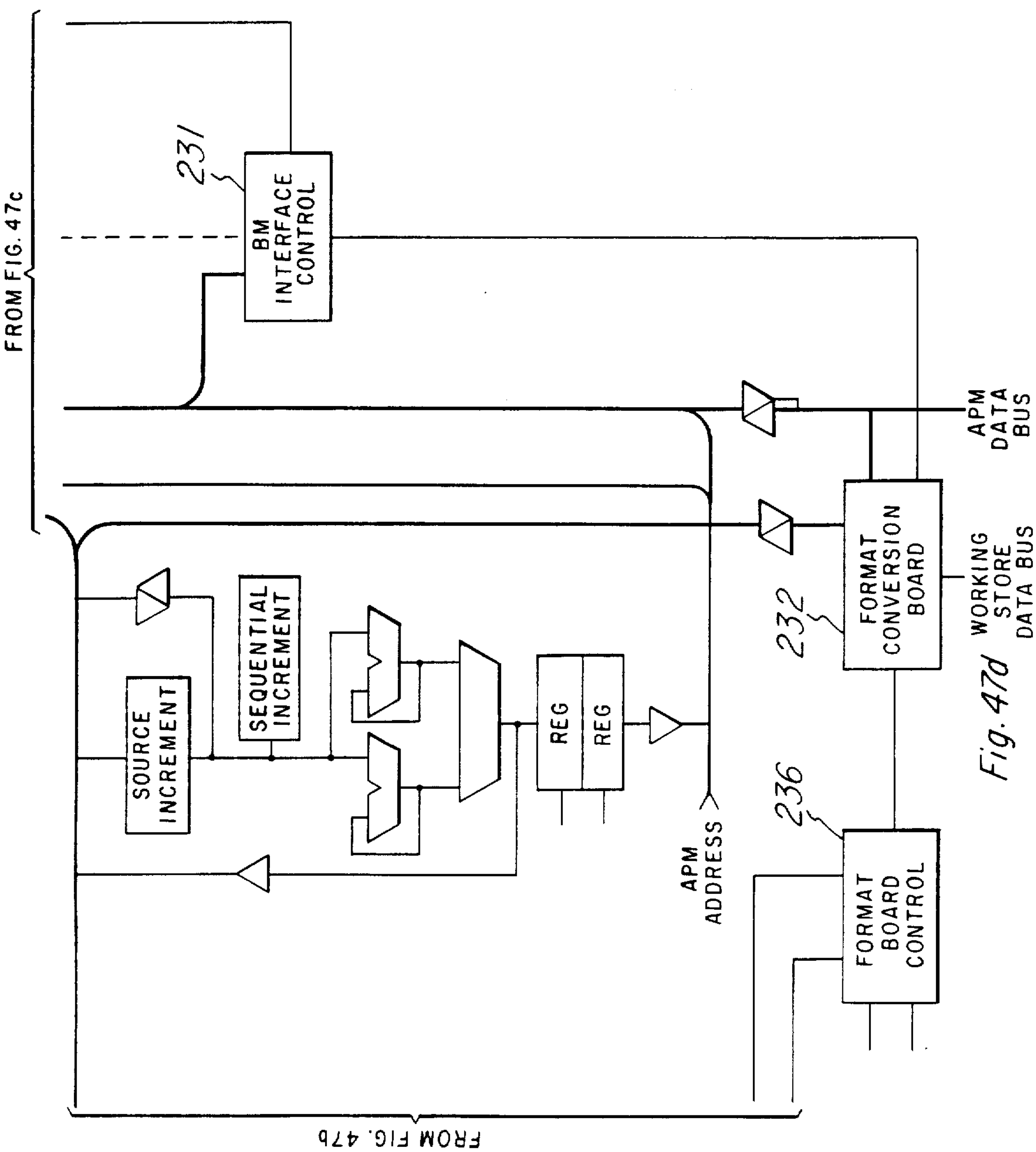

Reciprocal estimator 230 is shown in FIG. 46j where two identical estimators may be seen with the output from one being signal LINBDAT and from the other signal RINBDAT. One estimator is connected to bits 0–15 of the input and the other is connected to bits 32–47. The two estimators have common control lines, therefore two estimates are always generated whether used or not. The discussion relatively to the estimators will be restricted to the estimator shown at the left of the drawing, keeping in mind that the estimator to the right of the drawing is identical. Register 1261, when loaded with data contains the sign and exponent of N. Register 1262 contains the first 8 bits of the mantissa. These registers are clocked with the system's free running clock so the output, RECTN is valid only during the period after valid data has been placed on the input. PROMs 1263 and 1264 have been programmed to contain the reciprocal estimate of the register's contents. PROM 1263 provides the estimate for the inverse of the exponent and PROM 1264 is the inverse of the mantissa. The PROM outputs, signals RECIN are valid and must be written into a specified address in register files 1265 and 1266 during the period when RECTN is valid. The estimate is stored in these register files 1265 and 1266 and are made available for use at some future time.

The estimators provide a 16-bit estimate of the 32-bit desired results. When the register files 1265 and 1266 are read, they provide 16 bits of data for input to the floating point multiplier.

Floating point adders 227 and 228 provide AU 21 with hardware floating point adder operations which provide a sum and/or a difference three clocks after the inputs are made available. Once piped, they can provide the results every clock cycle.

In summary, it is shown that the arithmetic unit 21, 22 performs the high speed computations that are necessary in the array processor 10. Having fixed and floating point capability enables this unit to perform not only vector computations but simple addition and multiplication as well.

TRANSFER CONTROLLER

Transfer controller 23 has two major functions: Prioritizing access to bulk memory 14; controlling data flow between bulk memory 14 and the working stores 201A and 201B of arithmetic unit 21. As many as eight ATPV5 devices may be attached to the AP bus 26. TC23 grants access to the highest priority device in case of simultaneous requests. Each device attached to the bus 26 is given a unique, fixed priority.

TC23 performs block transfers of data between bulk memory 14 and the arithmetic unit working stores 201A and 201B. In addition to generating the required bulk memory 14 and working store 201A and 201B addresses, TC23 formats data during the data transfer operation. This formatting includes fixed-to-floating point conversion as well as conversion between various floating point formats. FIG. 47 is a block diagram of the control unit 32Ta and device dependent unit 32Tb. The control unit is the same as the control units in the other devices and no further explanation is necessary. However, units 231–244 provide the functions noted above and will be discussed below.

The fixed/floating point conversion technique performs the following data format conversions:

1. 16-bit fixed point to 32-bit hexadecimal exponent floating point.
2. 32-bit fixed point to 32-bit hexadecimal exponent floating point.
3. 32-bit hexadecimal exponent floating point to 16-bit fixed point.
4. 32-bit hexadecimal exponent floating point to 32-bit fixed point.

The bit format representation of the 16/32 bit fixed point and the 32-bit hexadecimal floating point data format is shown below:

| | | |
|---|---|---|
| 16 bit fixed point: | | |
| 00 01 | | 15 |
| S 16-bit fixed point | | |
| 32 bit fixed point: | | |
| 00 01 | | 31 |
| S 32-bit fixed point | | |
| 32 bit hex floating point: | | |
| 00 01 | 07 08 | 31 |
| S 7-bit exponent | 24-bit mantissa (magnitude) | |

*S represents a sign bit

The 7-bit exponent in 32-bit hex floating point format is an IBM standard excess 64 hexadecimal exponent. It has been biased by hex 40 (decimal 64) such that it represents 16**(exponent -40) where exponent can assume values from 0 to 127. The 24-bit hex mantissa is a normalized hex number such that the implied radix point is to the left of the most significant bit and MSB hex digit is non-zero.

Figure 48A:
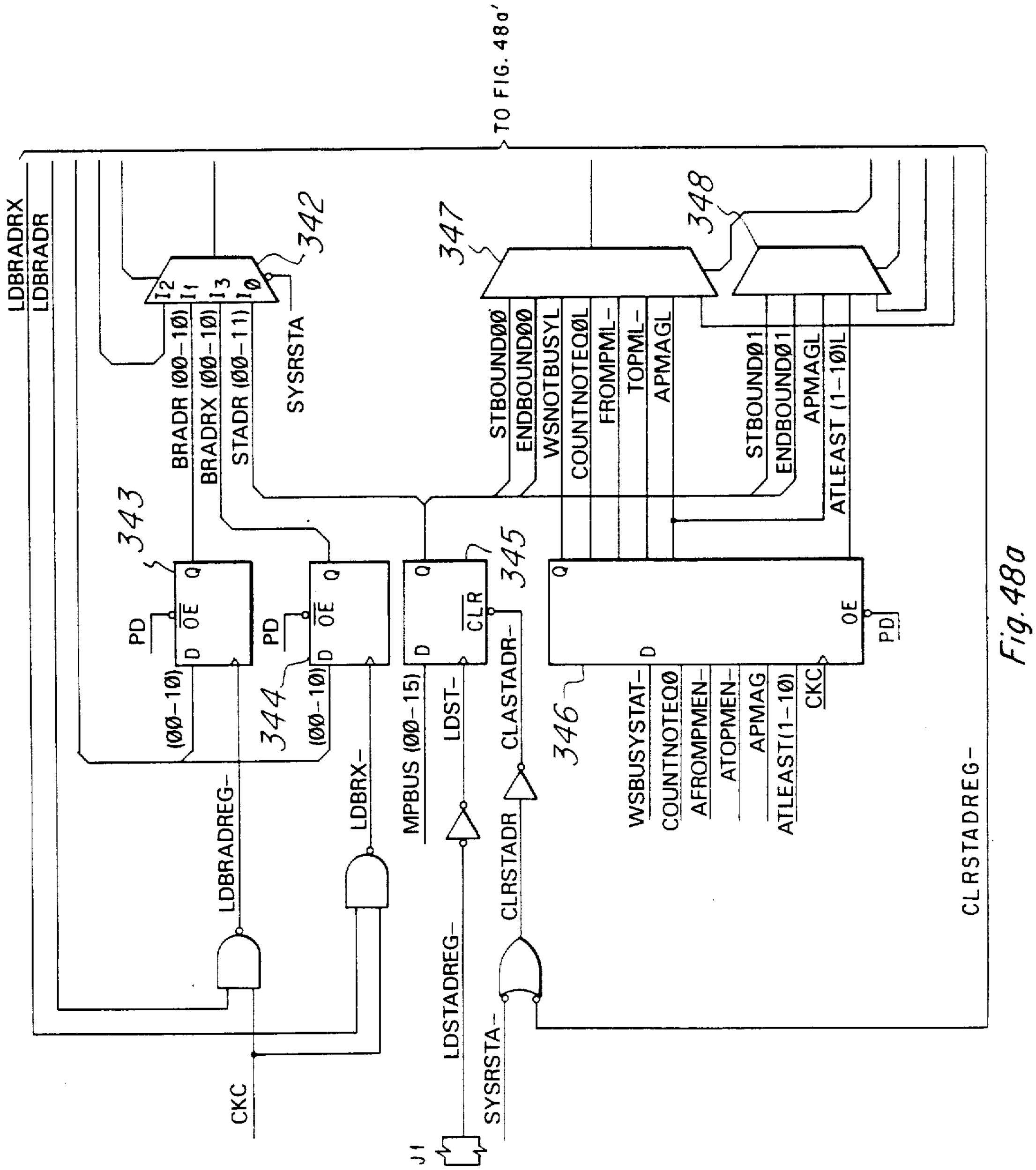
FIGS. 48a–48f form a block diagram of the transfer controller to form conversion circuitry.
Figure 48A:
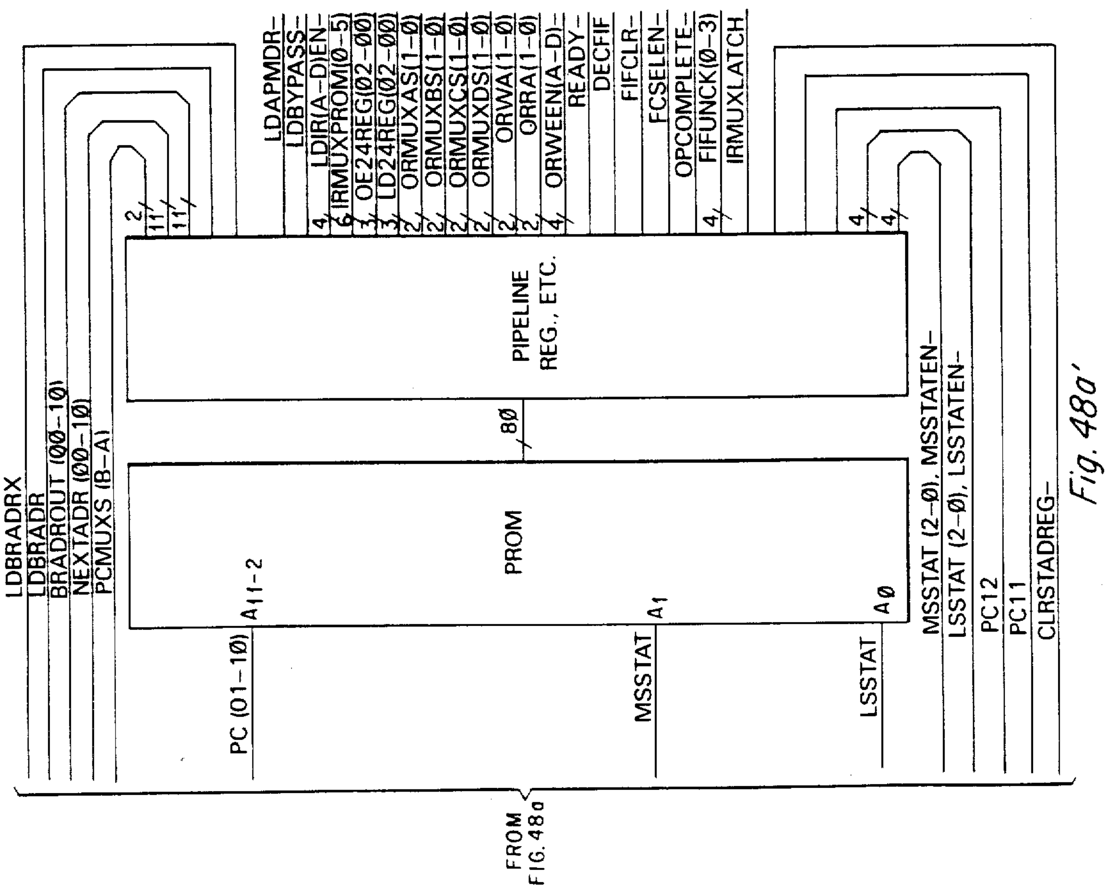
Figure 48B:
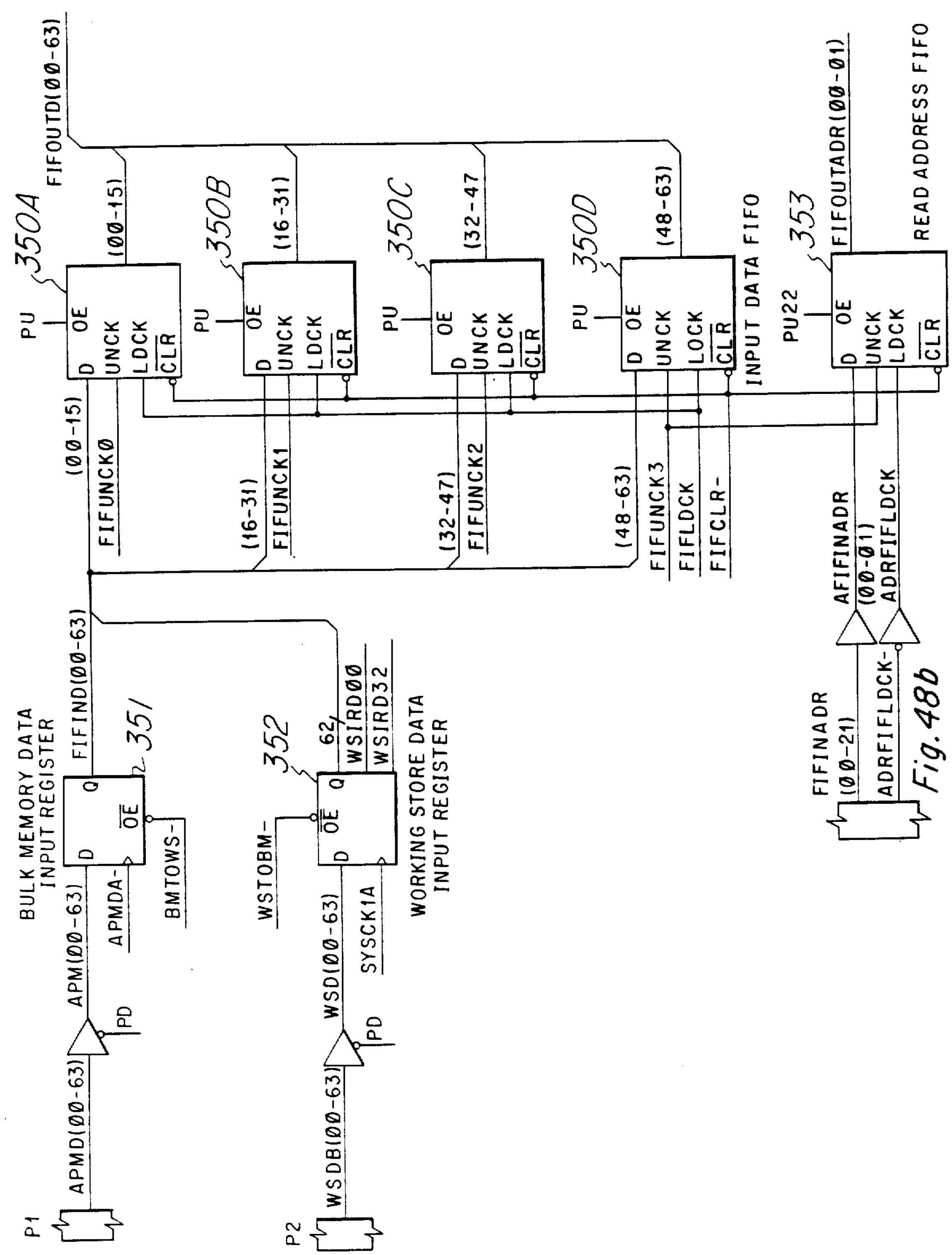

FIGS. 48a–48f show, in block form, the format conversion board 232 of FIG. 47. As shown in FIG. 48a, microprogrammable PROM controller is made up of 10 4K×8 PROMs to create a control field that is 80 bits wide and 4,096 words deep. The outputs of the PROMs are clocked into a single stage pipeline register 341 so that all signals are synchronized to the system clock.

The output of program counter multiplexer 342 is the source for the most significant 10 bits of the PROM address. Multiplexer 342 input is selected by signals PCMUXSB and PCMUXSA which are pipeline register outputs. Three of the four multiplexer 342 inputs are generated by the PROM controller 340 itself. NEXTADR (00–10) is an output of pipeline register 341 and is the input that is normally used when the controller is sequencing through a program. Signals BRADR (00–10) and BRADRX (00–10) are used to return to the main microprogram from a subroutine. Registers 343 and 344, the source of these signals, are loaded by signals LDBRADR and LDBRADRX.

The only multiplexer 342 input that is not generated by PROM 340 is the output of starting address register 345 which provides signal STADR (00–11). Register 345 is loaded by the common control unit 32Ta. Register 345 is cleared by either an output from pipeline register 341 (CLRSTADREG-) or by the system reset.

The least significant two bits of the address for PROM 340 are signals MSSTAT and LSSTAT which are the outputs, respectively, of the most-significant status multiplexer 347 and the least significant status multiplexer 348. Most of the inputs to the status multiplexers 347 and 348 are synchronized to the rising edge of CKC (which occurs in the middle of each clock cycle). This allows the status lines to be tested during the clock cycle in which they occur, while still meeting the timing requirements of PROM 340. The most significant status multiplexer 347 input is selected by MSSTAT (2-0) and MSSTATEN-. The least-significant status multiplexer 348 input is selected by LSSTAT (2-0) and LSSTATEN-. Following is a list of the inputs to the status multiplexers 347 and 348:

1. STBOUND (00-01): Starting boundary for data in bulk memory.

2. ENDBOUND (00-01): Ending boundary for data in bulk memory.

3. WSNOTBUSYL: Signal is 1 unless transfer controller 23 and arithmetic unit (RAU22) are trying to access the same working store memory at the same time.

4. COUNTNOTEQOL: During a read from either bulk memory 14 or an arithmetic unit working store 201A or 201B, until the last word of data has been read and loaded into the data FIFO in the data input circuitry. It is derived from DCNT=0- which goes low when the data available counter decrements to 0.

5. FROMPML-: During a transfer of data from program memory 31 to either bulk memory 14 or working stores 201A or 201B, this signal goes low when the program memory data word is entered into the device data bus (DEVDATB).

6. TOPML-: During a transfer of data from bulk memory 14 or working store 201A, 201B to program memory 31, this signal goes low when the data is enabled onto the bus DEVDATB.

7. Signal APMAGL: This signal is high when the transfer controller 23 is granted access to bulk memory 14.

8. ATLEAST1L-10L (1) L is high when there is at least one word in the data FIFO. (10L) is high when there are at least 10 words in the data FIFO.

9. PC11—Pipeline register 341 bit can be used to set MSSTAT to either a logic 1 or a logic 0 under microprogram control.

10. PC12—Pipeline register that can be used to set LSSTAT to either a logic 1 or a logic 0 under microprogram control.

The PROM controller 340 is initialized by the ATP10 system reset. The system reset clears the starting address register 345 and forces the output of the program counter multiplexer 342 to 0. PROM controller 340 is programmed so that when the 10 most-significant address bits are 0, the starting address register 345 is the source for the signals PC (01-10). Since starting address register 345 contains 0, PROM controller 340 will remain in state 0 until the contents of the register are changed. When the starting address register 345 is loaded, PROM controller 340 begins executing microinstructions. Sometime before the end of the microprogram, PROM controller 340 will clear starting address register 345 (using signal CLRSTADREG-). A final microinstruction of the program will send the controller back to state 0 where it will remain until the starting address register 345 is loaded again.

In the bulk memory to working store mode, data that is being read from bulk memory 14 enters transfer controller 23 on the array processor memory data bus (APMD). The data is loaded into the bulk memory data input register 351 of FIG. 48*b*, on the rising edge of array processor memory data available signal (APMDA-). The output of the bulk memory data input register 351 (FIFIND (00-63)) is the input to the data FIFO 350 and is enabled only when data is being transferred from bulk memory 14 to working store 201A, 201B (BMTOWS- is a logic 0).

In the working store to bulk memory mode, data that is being read from working store 201A, 201B enters on the working store data bus WSDB (00-63). Working store data input register 352 is loaded by the rising-edge of the system clock, so it is loaded on each clock cycle. It is up to the control circuitry to generate the data FIFO load clock when there is a valid working store data word in register 352. Data FIFO 350A-350D is cleared by FIFCLR- which is generated by the PROM controller. The first data word loaded into the data FIFO 350A-350D after FIFCLR- occurs will appear on the output FIFOUTD (00-63). To set the next data word onto the output, the unload clocks are used. The PROM controller generates four unload clock for the data FIFO 350A-350D. Clocks FIFUNCK--FIFUNCK3 are the unload clocks for the first through the fourth data fields, respectively.

Figure 48C:
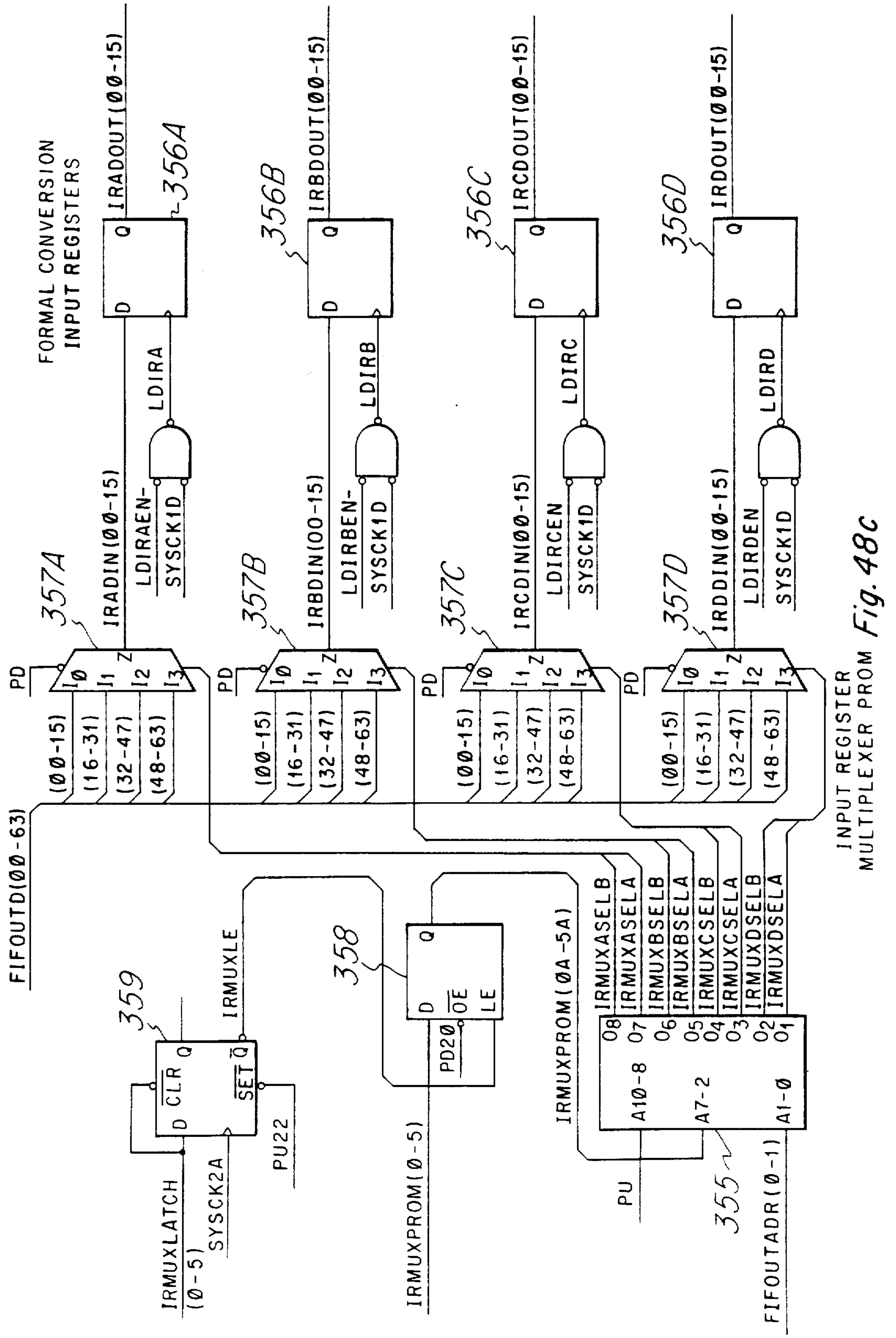
Figure 48D:
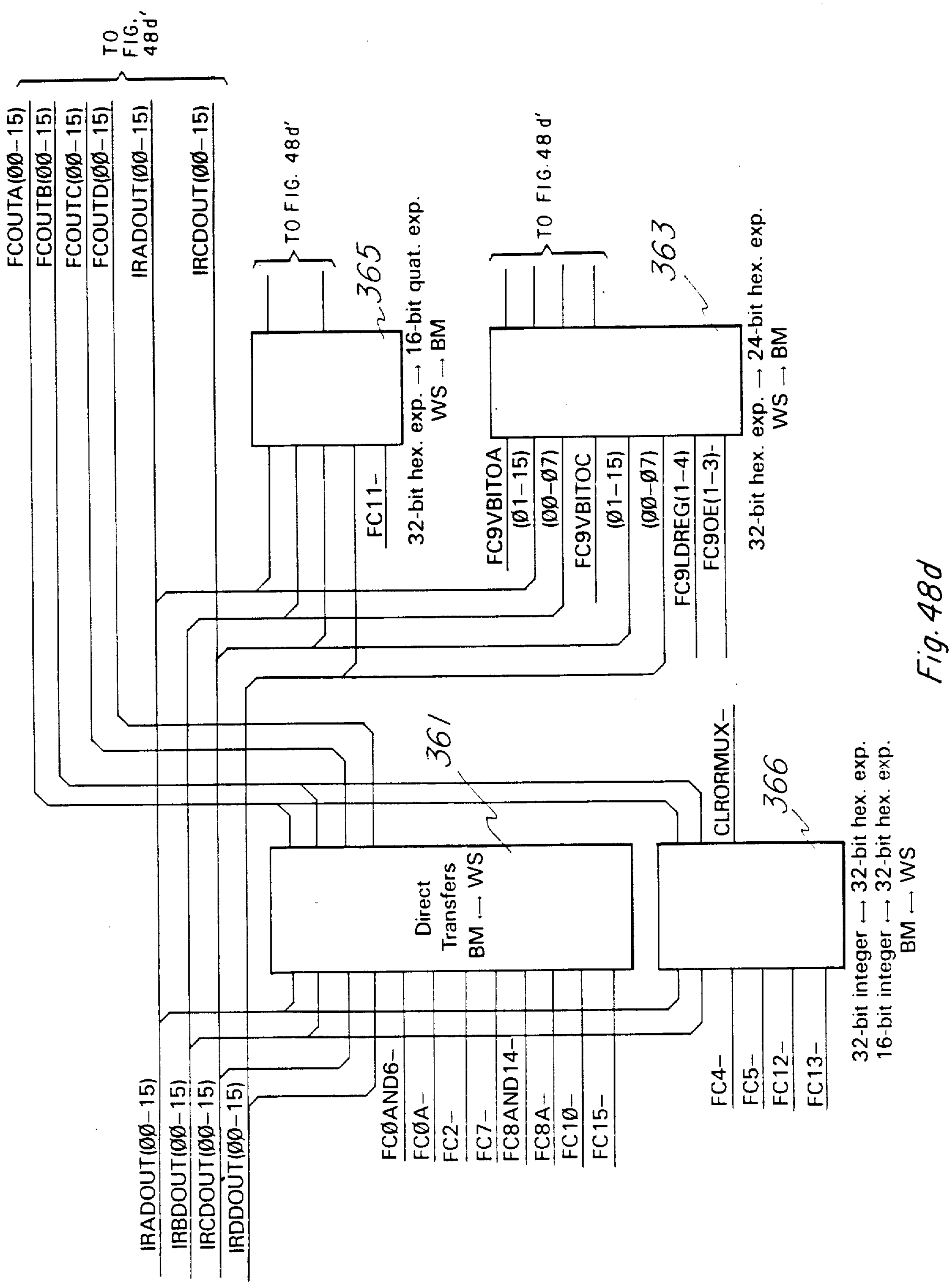
Figure 48D:
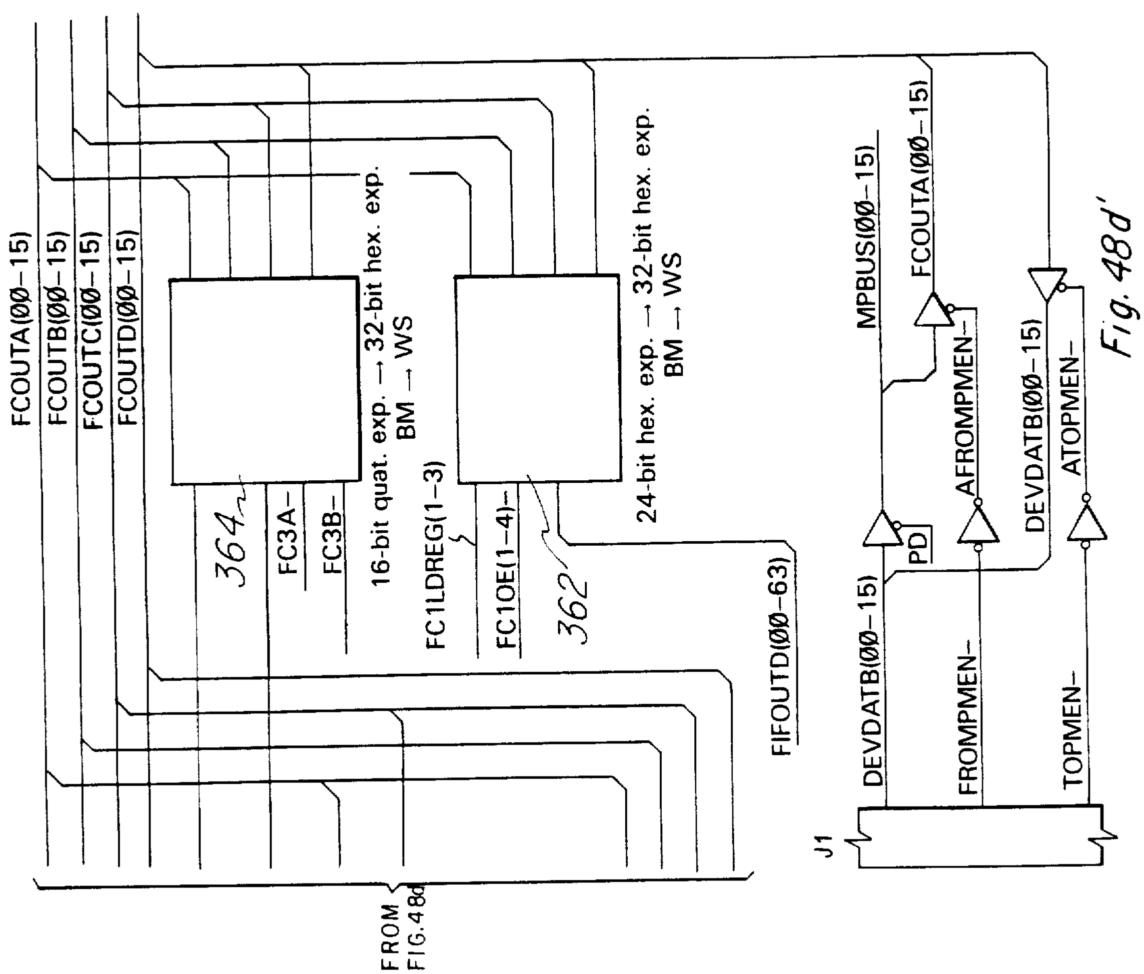

Read address FIFO 353 provides output signal FIFOUTADR (00-01) providing an input to input register multiplexer PROM 355 shown in FIG. 48*c*. Incoming data may be non-sequential and in one of the 16-bit data formats (which means that there is a valid 16-bit word in one of the 16-bit data fields in the data FIFO) or in one of the 32-bit formats (which means that there is a valid 32-bit word in one half of the 64-bit data field). When data in the FIFO 350A-350D is non-sequential, the contents of address FIFO 353 point to the valid data in the data FIFO 350A-350D. The address FIFO 353 is loaded by bulk memory 14 address bits 29 and 30 when data is being read out of bulk memory 14. The load clock is generated from bulk memory access granted. When reading from working store 201A, 201B, bits 14 and 15 of the working store address are loaded into the address FIFO 353. In this case, the load clock is a microcode bit from common control unit 32A of the transfer controller.

Four 16-bit data registers 356A-357C are provided for inputting data into the format conversion circuitry. These registers are loaded by four PROM controller outputs, signals LDIRAEN-, LDIRBEN-, LDIRCEN-, LDIRDEN-. Data out of the data FIFO 350A-350D enters the format conversion input registers 356A-356D through input register multiplexers 357A-357D, respectively. Input register multiplexers 357A-357D allow any of the four 16-bit data fields out of the data FIFO 350A-350D to be input to any of the four input registers 356A-356D.

The selection of the data source for each input data register 356A-356D is controller by signals IRMUXPROM (0-5) which is a PROM controller output. These signals go into a transparent latch 358 which is controlled by signal IRMUXLATCH input to latch 359. Transparent latch 358 is for microprogramming convenience and is used whenever the value of IRMUXPROM (0-5) is going to remain constant for most of the transfer.

The output of the transparent latch IRMUXPROM (0A-5A) and the two bit code out of the address FIFO 353 are the inputs to the input register multiplexer PROM 355. PROM 355 generates the select lines for the four input register multiplexers 357A-357D. If the incoming data is non-sequential and in one of the 16-bit data formats, the multiplexer input selection will be based on IRMUXPROM (0-5) and both address FIFO outputs. If the incoming data is non-sequential and in one of the 32-bit data formats, the multiplexer input selection will be based on IRMUXPROM (0-5) and the most-significant address FIFO bit. If the incoming data is sequential, the multiplexer input will be selected by IRMUXPROM (0-5) only.

Figure 49:
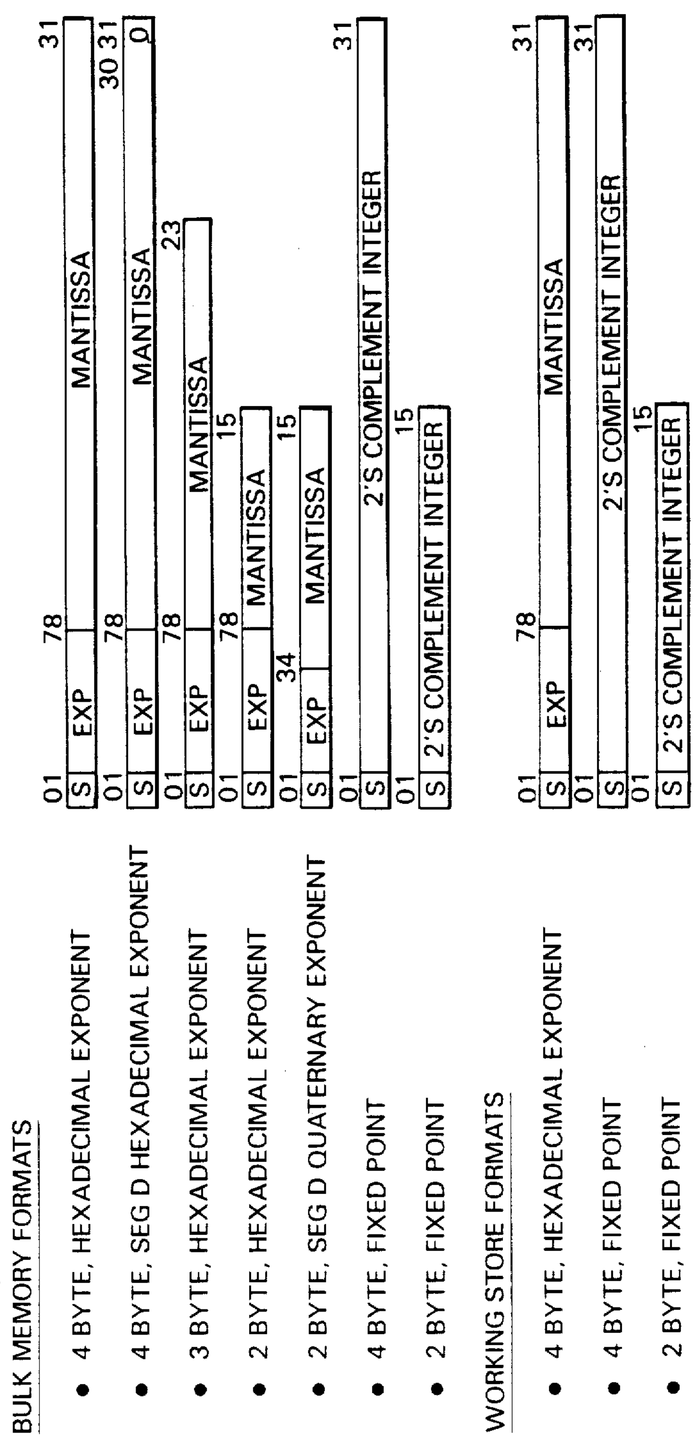
FIG. 49 illustrates the bulk memory formats and the working store formats.

There are seven bulk memory data formats and three working store data formats used in the system. These data formats are shown in FIG. 49. The primary working store format is the 32-bit, hexadecimal exponent, floating-point format. The system provides conversions from any of the bulk memory data formats to the 32-bit, hexadecimal format and vice-versa. If either of the fixed-point formats are used in working store 201A, 201B, the data in bulk memory 14 must be in the same data format. There is no format conversion circuitry to convert from any of the bulk memory formats to either of the working store fixed point formats.

The 32-bit, hexadecimal exponent, floating-point data format consists of a sign bit, a 7-bit exponent, and a 24-bit mantissa. The sign bit is the most-significant bit of the data word and is a logic 0 for a positive number and a logic 1 for a negative number. The 7-bit exponent is a binary exponent of 16 which is biased by 64 so that it represents 16 to the power of the exponent minus 64. This gives a range of values from $16^{-64}$ to $16^{63}$. The mantissa is a 24-bit positive binary fraction, meaning than the number system is sign and magnitude. The radix point is to the left of the most-significant bit and the number is always written as a left-justified number. If the number is 0, all 32 bits will be 0.

The 32-bit hexadecimal exponent, floating-point (SEG D) data format is the same as that described above except that the least-significant mantissa bit is always a logic 0. The 24-bit and 16-bit, hexadecimal exponent floating-point data formats are also the same as described above except that the mantissas are 16-bits and 8-bits, respectively.

The 16-bit quaternary exponent, floating-point data format consists of a sign bit, a 3-bit exponent and a 12-bit, one's complement mantissa. The sign bit is the most-significant bit of the data word and is a logic 0 for a positive number and a logic 1 for a negative number. The 3-bit exponent is a base four positive exponent that gives a range of values from $4^0$ to $4^7$. The mantissa is a one's complement binary fraction with the radix point to the left of the most-significant bit. Negative 0 is an invalid data word.

The 32-bit and 16-bit fixed-point data formats are two's complement integers with the radix point to the right of the least-significant bit. The sign bit is the most-significant bit of the data word and is a logic 0 for a positive number and a logic 1 for a negative number.

The direct transfer circuitry 361 which is shown in FIG. **48*d* handles five format conversions in each direction between bulk memory 14 and working stores 201A, 201B**. The following is a description of the bulk memory to working store direct transfers.

The 16-bit integer to 16-bit integer transfer is enabled by the signal FC7-. The outputs of the four format conversion input registers are enabled directly onto the four 16-bit format conversion output buses without any manipulation of the data.

The 16-bit hexadecimal exponent, floating point (SEG D) 32-bit hexadecimal exponent, floating point format conversion is enabled by signal FC2-. The outputs of format conversion input registers 356A and 356C are enabled onto FCOUTA (00-15) and FCOUTC (00-15). FCOUTB (00-15) and FCOUTD (00-15) are driven to logic 0's. This results in two 32-bit hexadecimal data words with the least-significant 16-bits being logic 0's.

The 32-bit hexadecimal exponent, floating point (SEG D) to 32-bit, hexadecimal exponent, floating-point format conversion is enabled by FCOA-. The outputs of the four format conversion input registers 356A-356D are enabled directed onto the four 16-bit format conversion output buses without any manipulation of the data.

The 32-bit, hexadecimal exponent, floating point to 32-bit, hexadecimal exponent, floating point transfer and the 32-bit integer to 32-bit integer transfer are enabled by FCOAND6-. The outputs of the four format conversion input registers are enabled directly onto the four 16-bit format conversion output buses without any manipulation of the data. For direct transfers of data from working store 201A, 201B to bulk memory, the following transfers are available.

The 16-bit integer to 16-bit integer transfer is enabled by the signal FC15-. The outputs of the four format conversion input registers 356A-356D are enabled directly onto the four 16-bit format conversion output buses without any manipulation of the data.

The 32-bit hexadecimal exponent, floating point to 16-bit, hexadecimal exponent, floating point format conversion is enabled by FC10-. In this case, the outputs of the four format conversion input registers 356A-356D are enabled directly onto the four 16-bit conversion output buses without any manipulation of the data. It is left the PROM controller to move the data into the output stage. The result of this conversion is a simple truncation of the least-significant 16-bits of the data word.

The 32-bit hexadecimal exponent, floating point 32-bit, hexadecimal exponent, floating point (SEG D) format conversion is enabled by FC8A-. The outputs of the registers 356A-356D are enabled directly onto the four 16-bit format conversion output buses with the least-significant bit of each 32-bit data word being forced to a logic 0.

The 32-bit, hexadecimal exponent, floating point to 32-bit, hexadecimal exponent, floating point transfer and the 32-bit integer to 32-bit integer transfer are enabled by FC8AND14-. The outputs of the registers 356A-356D are enabled directly onto the four 16-bit format conversion output buses without any manipulation of the data.

Data in the 24-bit hexadecimal exponent, floating-point format is stored in bulk memory 14 with eight 24-bit data words packed into three bulk memory locations. Data in this format will start on an even 64-bit word boundary and end on an even 64-bit word boundary. Therefore, the number of data words will always be a multiple of eight.

Conversion units 362-365 are made up of known circuitry. Without describing the circuitry in detail, the functions are described below.

A conversion in unit 362 is a 24-bit hexadecimal exponent, floating point to 32-bit hexadecimal exponent, floating point, performed by taking three 64-bit bulk memory data words out of the data FIFO 350A-350D and loading them into a register block. When this is done, the register block contains eight 24-bit data words. The 24-bit data words may then be enabled onto the format conversion output buses, two at a time, and padded with zeros to create 32-bit data words for working store. The signal FC1- is used to enable logic 0's onto the least-significant 8 bits of the data word. The PROM controller generates the three signals that load the register block with FIFO data, FC1LDREG (1-3)

and the four signals that enable the data in the register block onto the format conversion output buses FC10E (1-4)-.

Unit 363 provides a 32-bit hexadecimal exponent, floating point to 24-bit hexadecimal exponent, floating point conversion performed by taking two 32-bit data words from registers 356A-356D and truncating the last-significant eight bits of each to create two 24-bit words. The two 24-bit words are loaded into a register block. This process is repeated three more times until a total of eight 24-bit words have been loaded into the register block. The PROM controller generates the four signals that load the register block FC9LDREG (1-4). THE PROM controller also generates the three signals that enable data into the register block onto the format conversion output bus FC90E (1-3)-.

Unit 364 provides a 16-bit, quaternary exponent, floating-point to 32-bit, hexadecimal exponent, floating-point format conversion, enabled by FC3-. The inputs to the conversion circuits are from registers 356A and 356C. The 16-bit quaternary data word on IRADOUT (00-15) will be converted to 32-bit hexadecimal and will be output on FCOUTA (00-15) AND FCOUTA (00-15). Likewise, the data on IRCDOUT (00-15) will be output on FCOUTC (00-15) AND FCOUTD (00-15).

Unit 365 provides a 32-bit, hexadecimal exponent, floating-point to 16-bit quaternary exponent, floating point format conversion, enabled by signal FC11-. A 32-bit hexadecimal data word on IRADOUT (00-15) and IRBDOUT (00-15) will be converted to 16-bit quaternary and output on FCOUTA (00-15). Likewise, the data on IRCDOUT (00-15) and IRDDOUT (00-15) will be converted and output on FCOUTC (00-15).

Unit 366 performs various conversions. Conversions between both the 16-bit and 32-bit, fixed-point formats and the 32-bit floaing point format are performed by a single circuit. Rather than having a separate circuit for each of the four conversions, a single circuit was designed with common functions shared between the different conversions. This will be described in detail later.

Figure 48E:
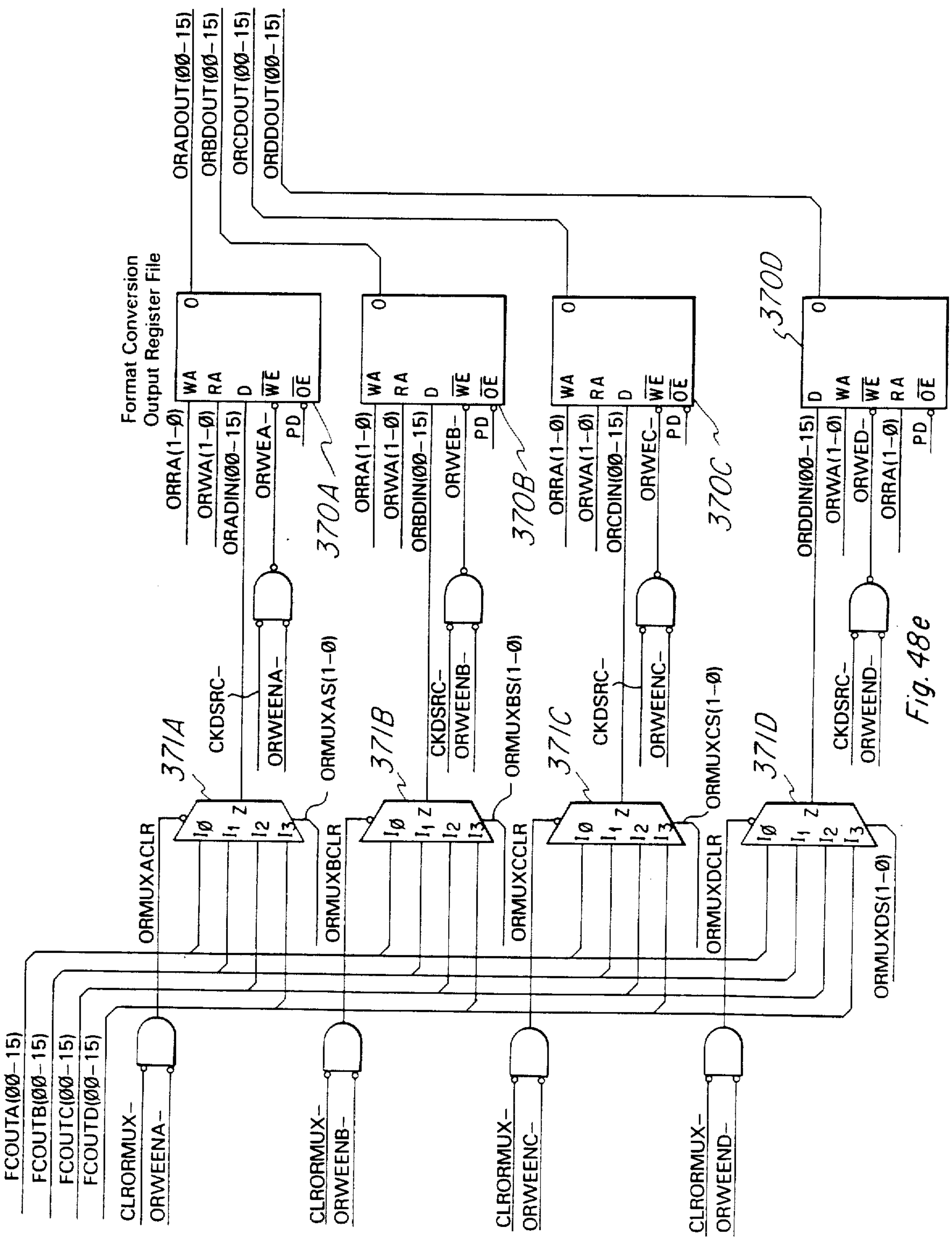
Figure 48F:
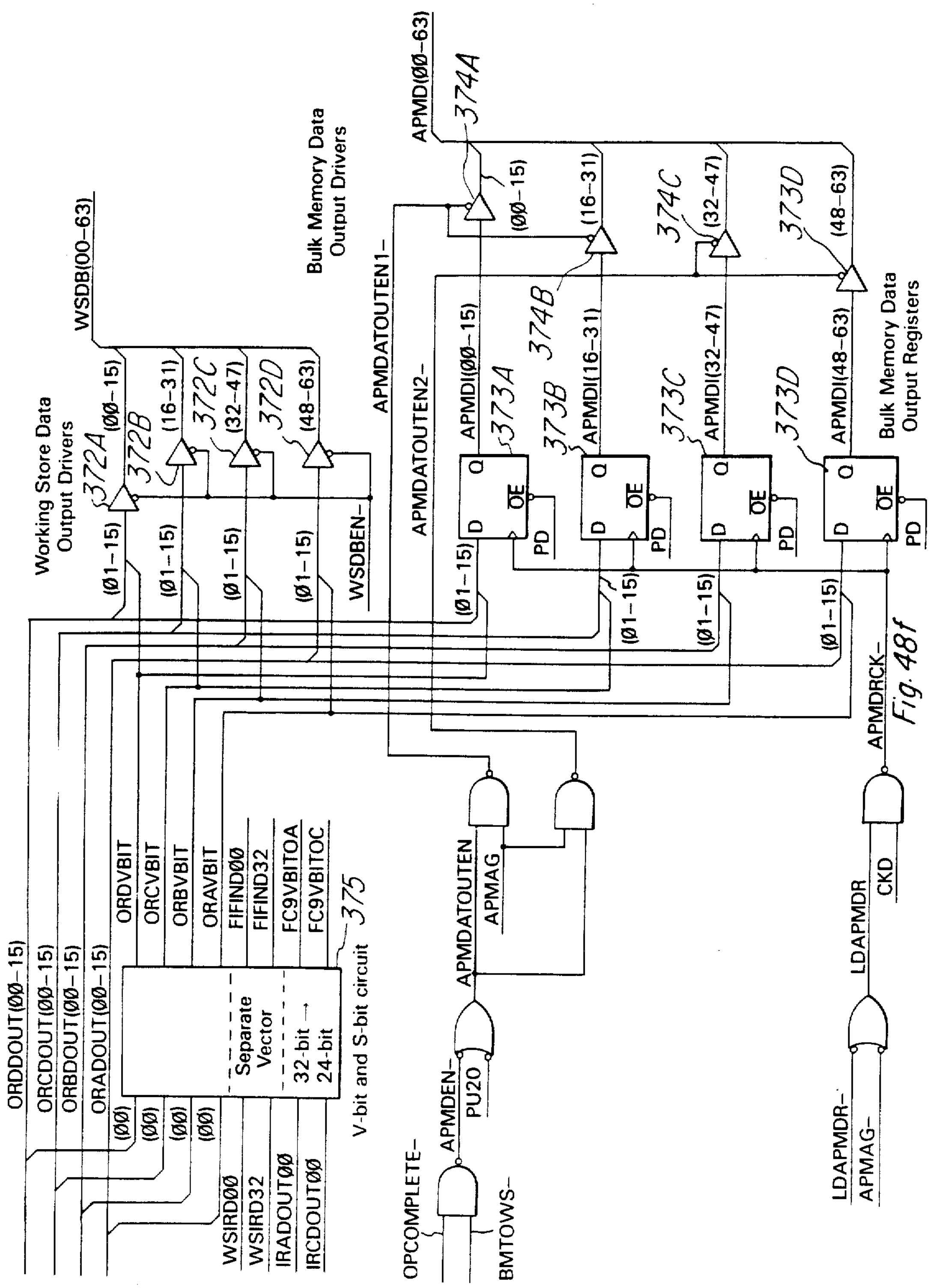

Data out of the format conversion circuitry goes into the output stages 370A-370D as shown in FIG. 48e before being written into the destination. The output of the format conversion circuit is broken up into four 16-bit data field FCOUTA-FCOUTD.

The output registers 370A-370D have individual read and write controls. The individual registers have common read and write addresses but have individual write strobes. The PROM controller provides the write pulses and the read and write addresses.

The inputs to the registers 370A-370D come from four-to-one multiplexers 371A-371D. The inputs to the multiplexers are the four format conversion output fields. The PROM controller generates the data select inputs to the four multiplexers. The output of the register file 370A-370D goes to either the working store data output driver 372A-372D or the bulk memory output data register 373A-373D. Data is driven onto the working store data bus by the working store data output driver when signal WSDBEN- is a logic 0.

The bulk memory data output register register 373A-373D is loaded from either the PROM controller signal LDAPMDR- or bulk memory access granted, APMAG-. The output of register 373A-373D is driven onto the array processor memory data bus APMD by the bulk memory data output drivers 374A-374D. These drivers are enabled when TC 23 is transferring data to bulk memory 14 and a bulk memory access granted occurs.

The V-bit and S-bit circuit 375 performs various functions on the sign bits of data as it passes through TC 23. In most cases, the V-bit and S-bit function is performed on the data as it comes out of the format conversion output register file 360A-370D. There are two exceptions:

The first exception occurs when data is being transferred into two vectors in bulk memory. By the time the data reaches the output register field, it has been separated into a 64-bit word consisting of only real data followed by a 64-bit word consisting of only imaginary data. Therefore, when a separate vector transfer is being executed, the V-bit and S-bit function is applied to the data as it comes out of the working store data input register.

The other exception is when data is being converted from the 32-bit floating-point to the 24-bit, floating-point data format. The data being written into bulk memory 14 consists of eight 24-bit data words packed into three 64-bit data fields. In this case, the sign bits are not in the proper location in the 64-bit data field to have the V-bit and S-bit function applied at the output register file 370A-370D. They are applied to the data on the output of the format conversion input registers 356A-356D where the data is still in the 32-bit format.

Figure 54:
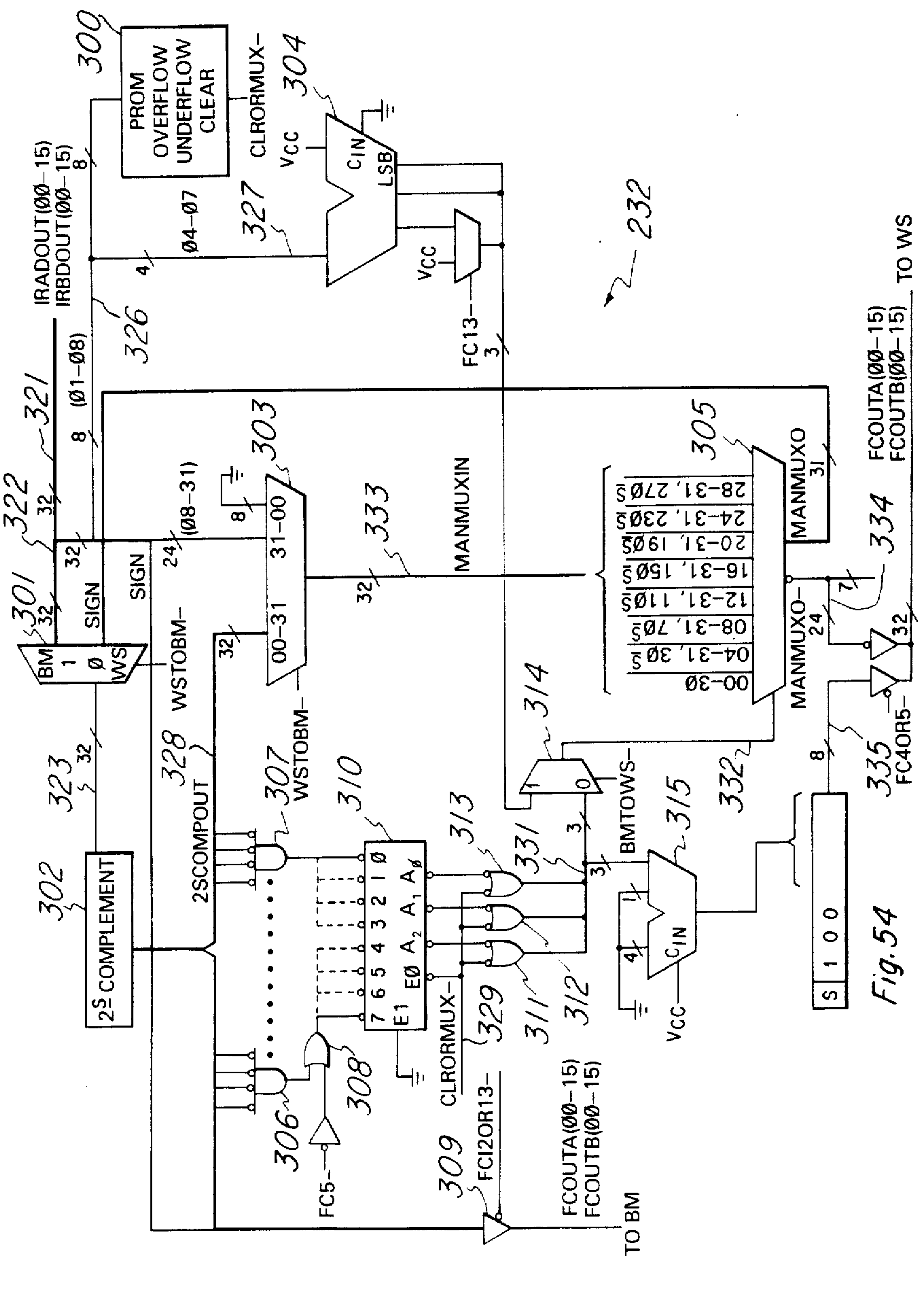
FIG. 54 is a block diagram of the transfer controller single circuit multiple format conversion block diagram.

Unit 366, as indicated above, provides circuitry for fixed-point/floating point format conversion. The single circuit for performing these conversions is shown in FIG. 54. However, before studying FIG. 54, please refer to the flowcharts listed below.

Figure 50A:
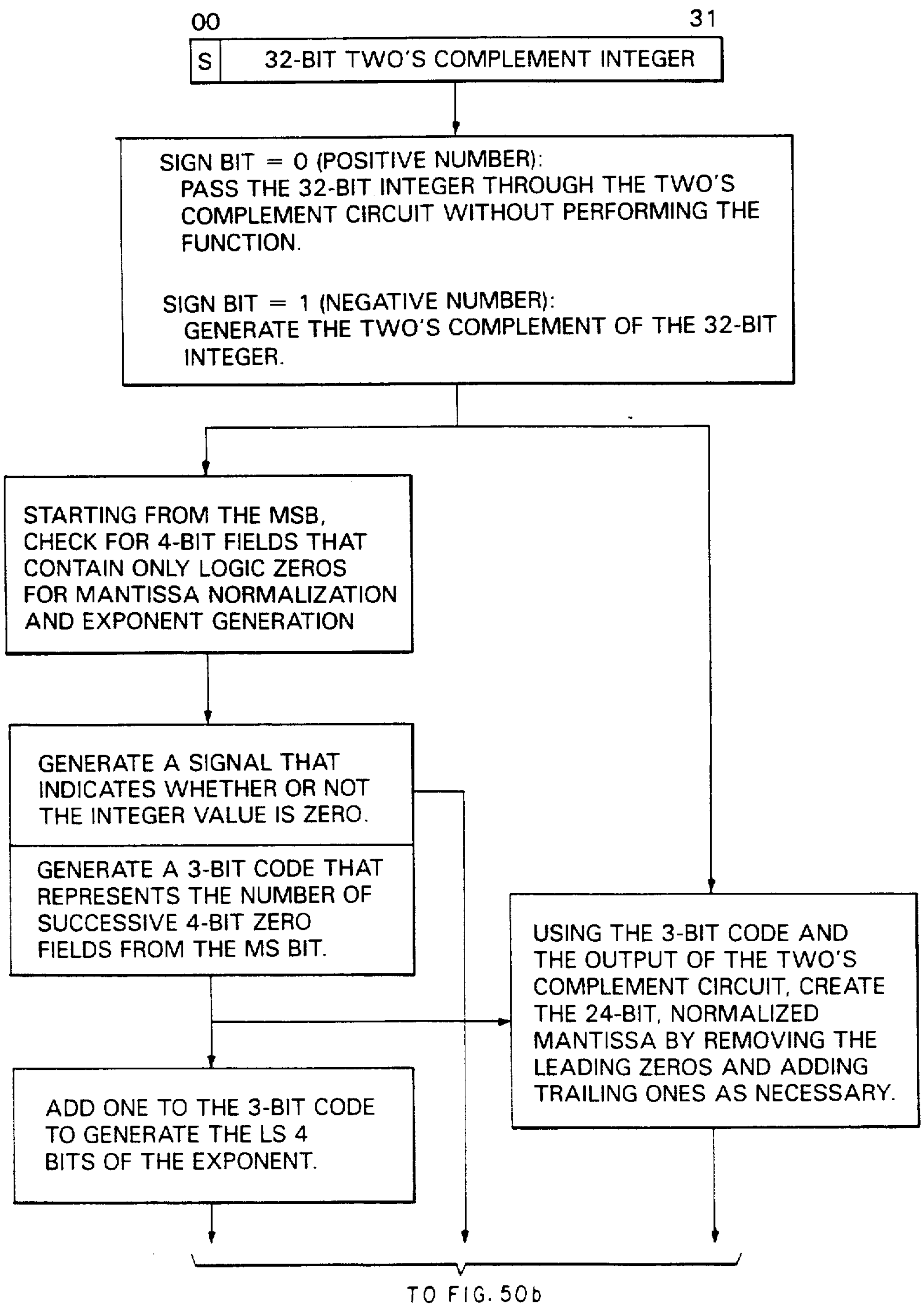
FIGS. 50a–50b form a flowchart illustrating the 32-bit fixed point to 32-bit hex floating point conversion.
Figure 50B:
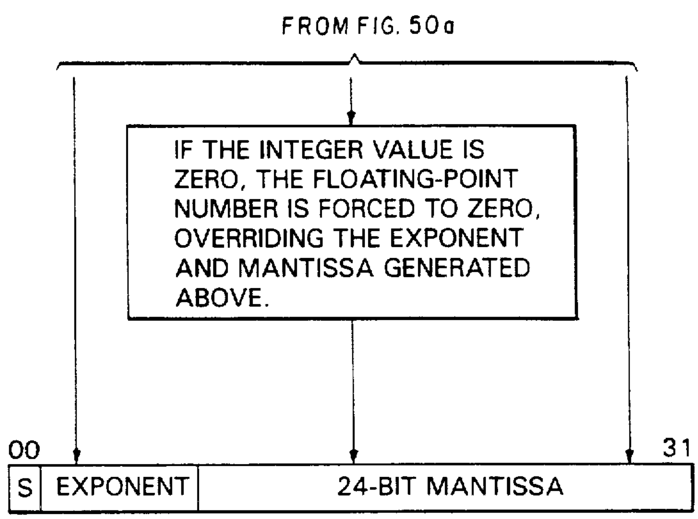

FIGS. 50a and 50b form a flowchart describing the conversion of 32-bit fixed point to 32-bit hexidecimal exponent floating point. The steps shown in this flowchart are self-explanatory.

Figure 51A:
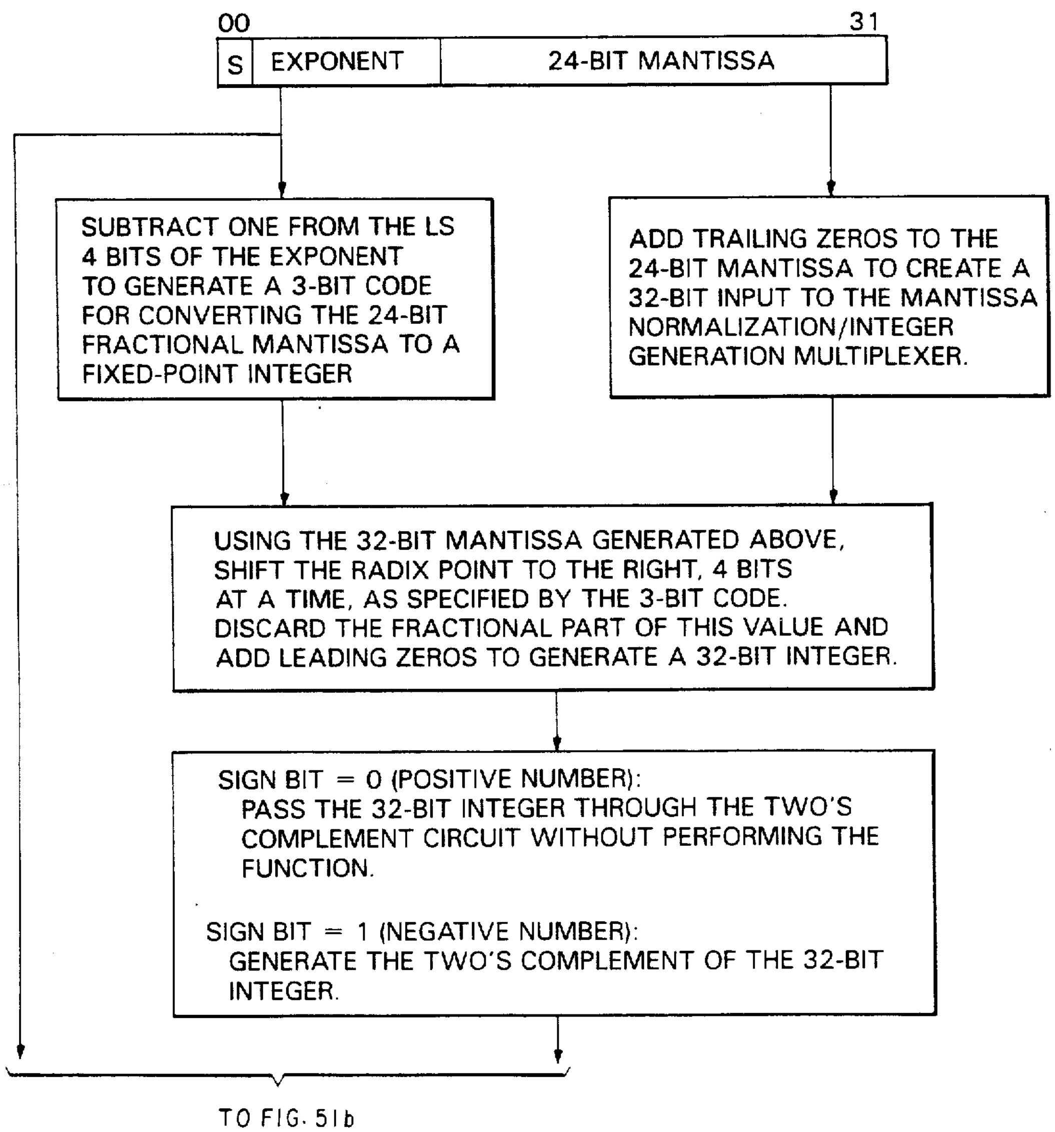
FIGS. 51a–51b form a 32-bit hex floating (normalized) to 32-bit fixed point conversion flowchart for the TC.
Figure 51B:
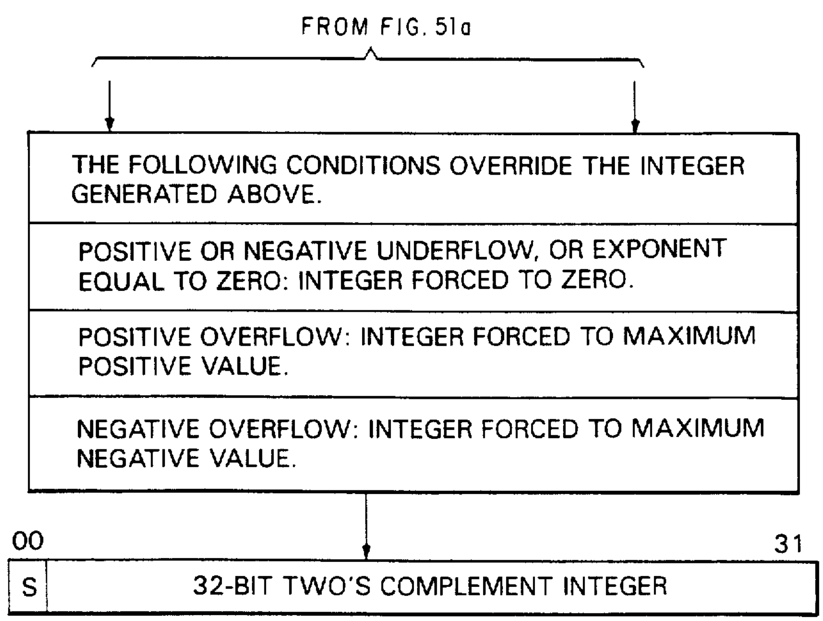

FIGS. 51a and 51b form a flowchart describing the conversion of 32-bit hexidecimal exponent floating point to 32-bit fixed point. The steps described therein are self-explanatory.

Figure 52A:
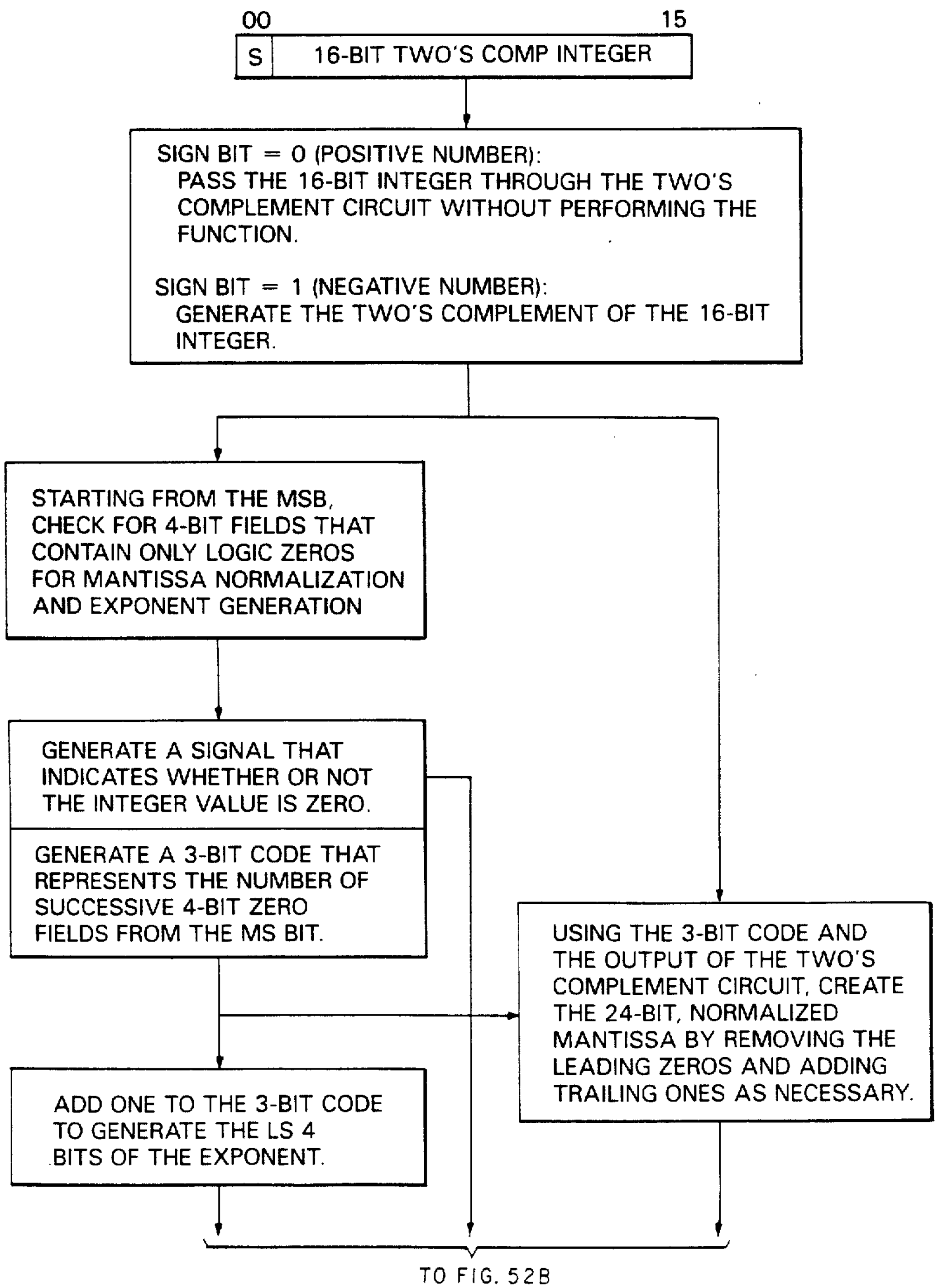
FIGS. 52a–52b form a 16-bit fixed point to 32-bit hex floating point conversion flowchart for the TC.
Figure 52B:
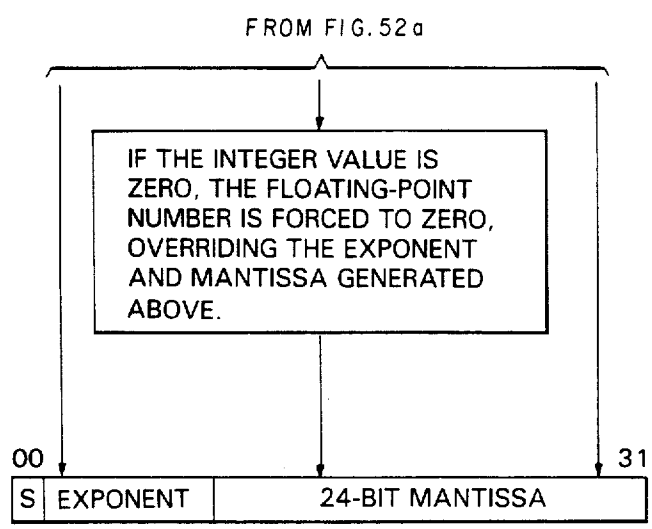

FIGS. 52a and 52b describe a conversion of 16-bit fixed point to 32-bit hexidecimal exponent floating point. The steps shown in this flowchart are self-explantory.

Figure 53A:
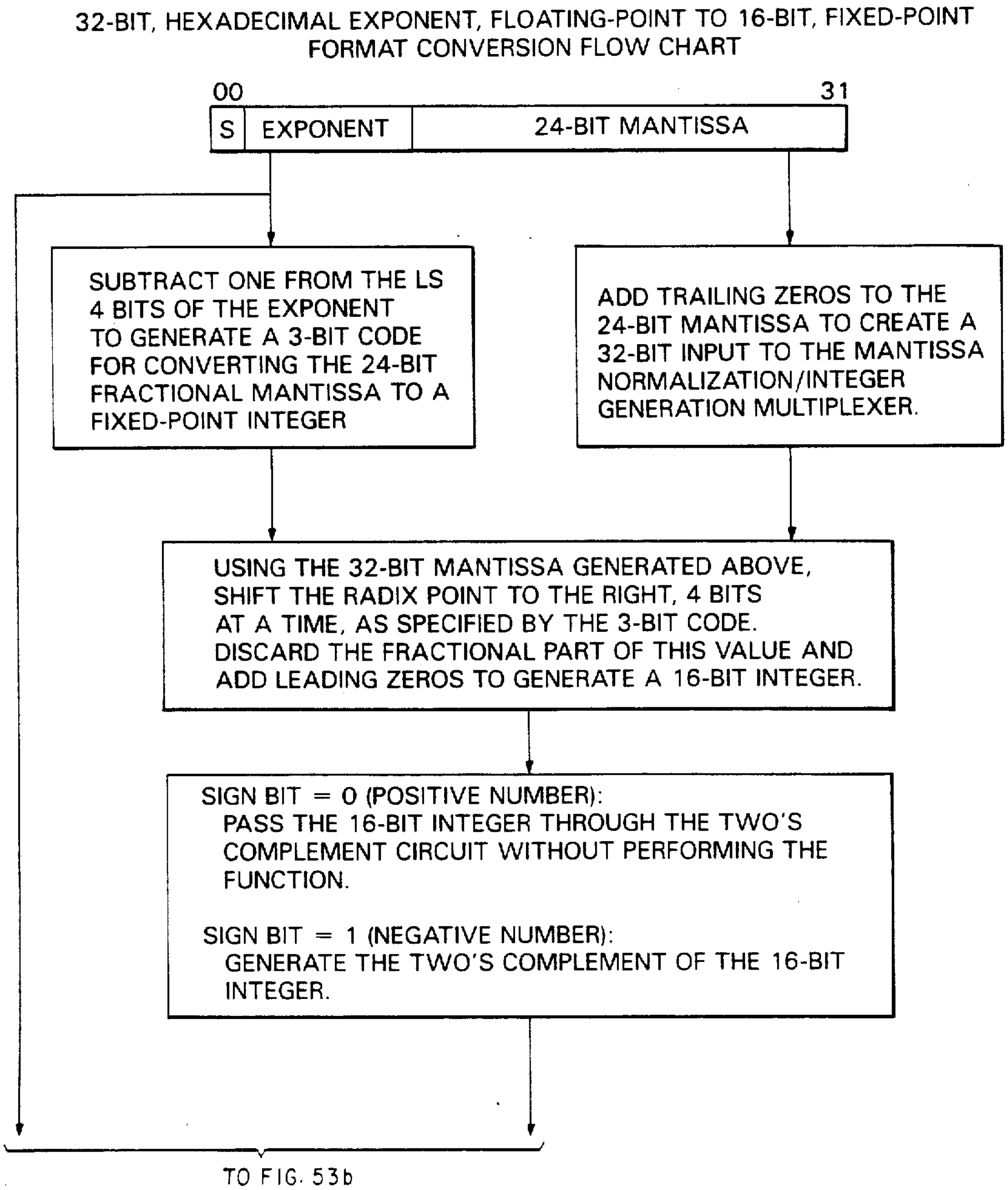
FIGS. 53a–53b form a 32-bit hex floating point (normalized) to 16-bit fixed point conversion flowchart for the TC.
Figure 53B:
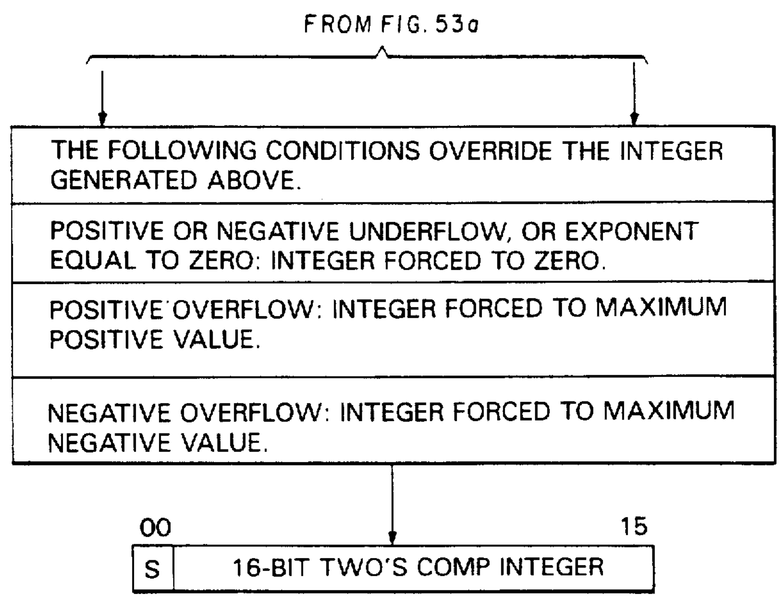

FIGS. 53a and 53b describe the conversion of 32-bit hexidecimal exponent floating point to 16-bit fixed point. Again, the steps shown in this flowchart are self-explantory.

The steps shown in these flowcharts may be applied to the circuit of FIG. 54 as follows:

32-bit fixed point to 32-bit hex floating—

Data from registers 350A and 350B are input through multiplexer 301 into two's complement circuit 302 where the sign bit is detected as a 1 or 0. If it is a 1, the two's complement is performed, and if not, it is passed through. Next, successive 0's in groups of four are found via circuits 306 and 307 which illustrate the first and eighth of eight identical circuits to provide the eight inputs to encoder 310. Encoder 310 generates a 3-bit code for the number of successive 0's from the most-significant bit. The 3-bit code is inverted through circuits 311-313, and in adder 315, one is added to provide the exponent.

Mantissa normalization integer generation selector 305 performs the task of normalizing the 32-bit fixed point number from multiplier 303 by removing leading MSB 0's and adding trailing 0's is required to generate 24-bit normalized hex numbers. 16-bit fixed to 32-bit hex—

Uses the same components as used in the conversion of 32-bit fixed to 32-bit hex. An examination of the flowchart of FIGS. 52a and 52b illustrates that the procedure is very similar except that the circuit operates on data from register 350B.

32-bit hex to 32-bit and 16-bit fixed—

The 32-bit, floating-point input data comes from registers 350A and 350B. The order of the 24 mantissa bits is reversed on the input to multiplexer 303. This is done so that the shifting of the radix point will be effectively in the right direction. The order is reversed again on the input to multiplexer 301.

The select line signals for mantissa normalization-/integer generation 305 are generated by subtracting one in adder 304 from the least-significant four bits of the hexadecimal exponent to form a code. This code is applied to mantissa normalization/integer generation selector 205 to select the corresponding input. If the data is being converted to a 16-bit integer, the most significant mantissa select bit is forced to a logic 1 in adder 304, reducing the number of multiplexer inputs from eight to four. The radix point will be shifted four bits to the right for each value of the biased hexadecimal exponent over 40.

The two's complement circuit 302 is made up of eight 4-bit slice arithmetic logic units with look-ahead carry. This circuit performs one of three functions. If an negative overflow occurs (i.e., the floating point number is negative and too large to be converted to the specified fixed-point format) the output of the two's complement circuit will be the maximum negative number. If the input data is negative and there is not an overflow, then the shifted mantissa will be subtracted from 0 to get the two's complement. If the input data is positive, the circuit will pass the input through by adding it to 0.

The output of two's complement circuit 302 is driven onto FCOUTA (00–15) and FCOUTB (00–15) to be stored temporarily in the output stage prior to being written into bulk memory 14.

Referring now to the flowchart of FIGS. 51a and 51b, a 32-bit hex floating (normalized) word is shown with bits 1–8 being sent to PROM 300 and bits 4–7 being sent to adder 304. 3-bit code is generated out of adder 304 to convert a hexadecimal fraction to a fixed point integer. At the same time, the first eight bits are sent to PROM 300 where it is determined whether the exponent is less than or equal to hex 40, in which case an underflow signal is given which results in signal CLRORMUX- from PROM 300 being applied to the input gates of FIG. 48e to set inputs to the registers 370A–370D to 0. If the exponent is greater than or equal to hex 49, an overflow is indicated and either a maximum negative number or a maximum positive number is output. The two's complement circuit is simply a concatenation of bit slices to form an arithmetic logic unit. The contents of PROM 300 is shown in a map set out in FIG. 55.

The mantissa section of the hex floating point word is sent through selector 303 and in reverse order is applied to mantissa normalization/integer generation mantissa normalization/integer generation selector 305. Mantissa normalization/integer generation selector 305 is a series of selectors wired to effectively shift to the left, in this preferred embodiment. In the case of the fixed point to floating point, a left shift is appropriate. However, in the case of the floating point to fixed point, a right shift is necessary. In this embodiment, the right shift is accomplished by reversing the order of the bits and adding eight 0's to form a 32 bit number, then effectively shifting the radix point to the left. By effectively right shifting the radix point, a fractional portion is mapped off the end and 0's are added at the other end of the word to generate a 32-bit fixed point integer that is reversed. The order of bits is reversed again in multiplexer 301. The word with bits in proper sequence is then sent to the two's complement circuit 302 where the sign bit is tested and if it is negative, there is no inversion and there is no addition. If the sign bit is positive, all 32-bits are inverted and one is added. The result is a 32-bit fixed point number.

FIGS. 53a and 53b, which form a flowchart of the 32-bit hex to 16-bit fixed are the same as just described with respect to FIGS. 51a and 51b. The difference is in block 282 of FIG. 53a which indicates that an exponent greater than or equal to hex 45 will cause an overflow.

In summary, the data conversion circuitry is conventional for direct transfers, for hex to quaternary, and for quaternary to hex. However, for fixed point to floating point and for floating point to fixed point, unique circuitry is used that is common for all of the conversions.

Transfer controller 23 can honor bulk memory 14 requests from a maximum of eight devices, each having a unique priority level between 0 and 7 with 0 being the highest and 7 the lowest. Currently, the input controller 24 is assigned priority level 0. Host interface 20 is assigned priority level 3. Transfer controller 23 is assigned priority level 6.

Bulk memory 14 (BM) architecture prevents consecutive accesses from being made to the same bulk memory controller. This bulk memory requirement is built into the priority controller. The devices send three sets of information to the priority controller. These are bulk memory access request APMAR (0–7)-, bulk memory bank select apmb5(0–7) (which is bulk memory address bit 28), and read or write APMR/W- (0–7). The address bit 28 indicates bulk memory the priority logic which BM 14 controller the next access is requesting. The priority controller hardware is designed to flip-flop between the BM 14 controllers to prevent consecutive accesses, and uses address bit 28 as well as the device priority level to determine if the device should be granted access. Each device has dedicated lines provided to send each of these signals to TC 23. The read or write signal APMR/W- (0–7) information is required by TC 23 because the priority scheme issues the next grant based on whether the previous grant was a read or write. This is to circumvent possible data conflict on the bidirectional bulk memory data bus APMD (00–63). If the previous grant issued was for a bulk memory 14 read, then only read requests are accepted until a higher priority write request is received. When that happens, further requests are not honored until all read data previously requested is received from bulk memory 14. When the read data register is empty, meaning that all read data is received, then the priority controller can honor the write request and any other requests that may be received.

Figure 56:
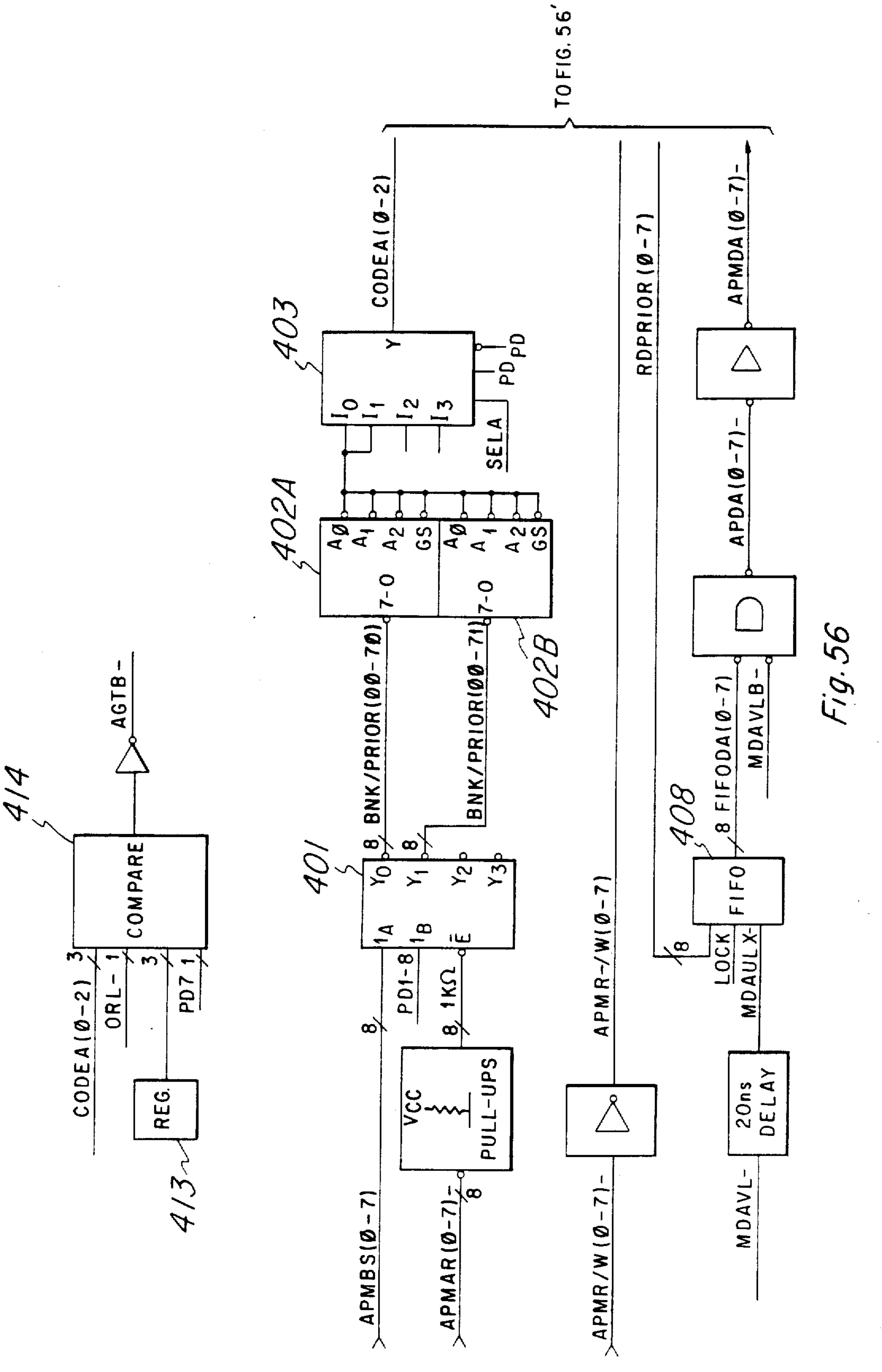
FIG. 56 is the bulk memory priority controller for the transfer controller.
Figure 56:
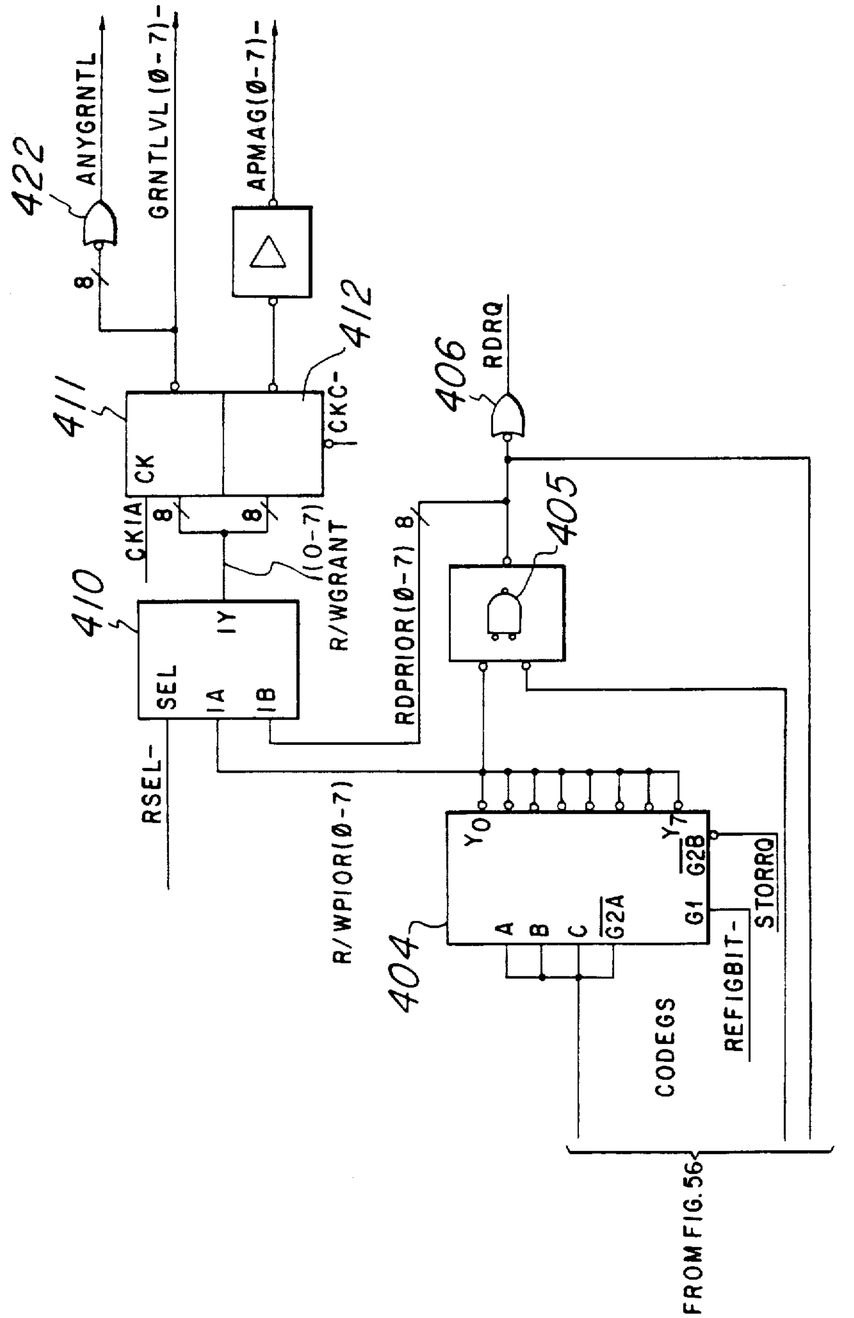

Refer now to FIG. 56 where incoming bulk memory access request lines APMAR (0–7)- and bulk memory bank select lines APMB5(0–7) are shown inputting decoder 401, which determines the highest priority devices accessing each of the two memory banks. The output of decoder 401 goes to two priority encoders 402A and 402B, one for BANK 0 and one for BANK 1.

Encoded outputs of each of the priority encoders 402A and 402B go to a 2:1 multiplexer 403 which selects between BANK 0 and 1 encoded outputs. The select line to multiplexer 403 is a clock signal running at half the system clock frequency which alternately selects the BANK 0 or BANK 1 input.

The encoded bank 0 or bank 1, output of multiplexer 403 goes to 3 to 8 line decoder 404. At any point in time, the active output (low) of decoder 404 indicates the highest priority device accessing bulk memory. The three enable inputs are gated to disable servicing the priority when conditions such as refresh, BM not ready, system reset, etc. are active.

The output of decoder 404 is the device priority for either a read or a write request. Since the read request priority is treated differently than the write request priority, the read/write priority output of decooder 404 is gated with the device read/write line using the OR gate 405 to detect the read priority. The read priorities, signals RDPRIOR(0–7), are ORed in a NAND gate 406 to generate RDRQ which indicates that one of the devices is making a read request. If the output RDRQ is true, then the read priority is loaded into 16 bit FIFO 408 by signal LCDK. In this manner, FIFO 408 keeps track of the read requests and the associated devices which made those requests. When the requested read data is sent by BM14. FIFO 408 is unclocked with the data available pulse MDAVLX-. This assures that read data is returned to the devices in the same sequence as it was requested. A low bit on the output FIFODA(-0–7)- represents the device number to which the read data belongs. FIFO 408 output is gated with the data available from bulk memory 14 to generate the device data available signals APMDA(0–7)-, which are specific for each device. To generate device grants, the read priority lines RDPRIOR(0–7) and the read/write priority lines R/WPRIOR(0–7), go to 2:1 multiplexer 410 for selections between the two priorities. As discussed earlier, once the read request is granted to a device, only read requests are possible. Write requests are locked out until a higher priority write request is input. The write requests are locked out by select input RSEL- applied to multiplexer 410. Multiplexer 410 output goes to register 411 to generate a device grant level signal GRNTLVL(0–7)-, which exists for one clock cycle. It also goes to flip flop 412 to generate a half clock device grant pulse, signal APMAG(0–7)-.

When the write requests are locked out and only the read requests are taken, the select input RSEL-, is true (low). During this time the 3-bit device code CODE(A-0–A2) is clocked into the 4-bit register 413 on every clock cycle. This device code in the 4-bit register 413 is the code from the previous read grant and is compared with the current read/write code to see if the current code is of higher priority level. If the current code is from a higher priority device than the previous code, then B>A output of comparator 414 is true. Comparator 414 output is gated with signal RDRQ which selects the B>A case only during the write requests.

Figure 57:
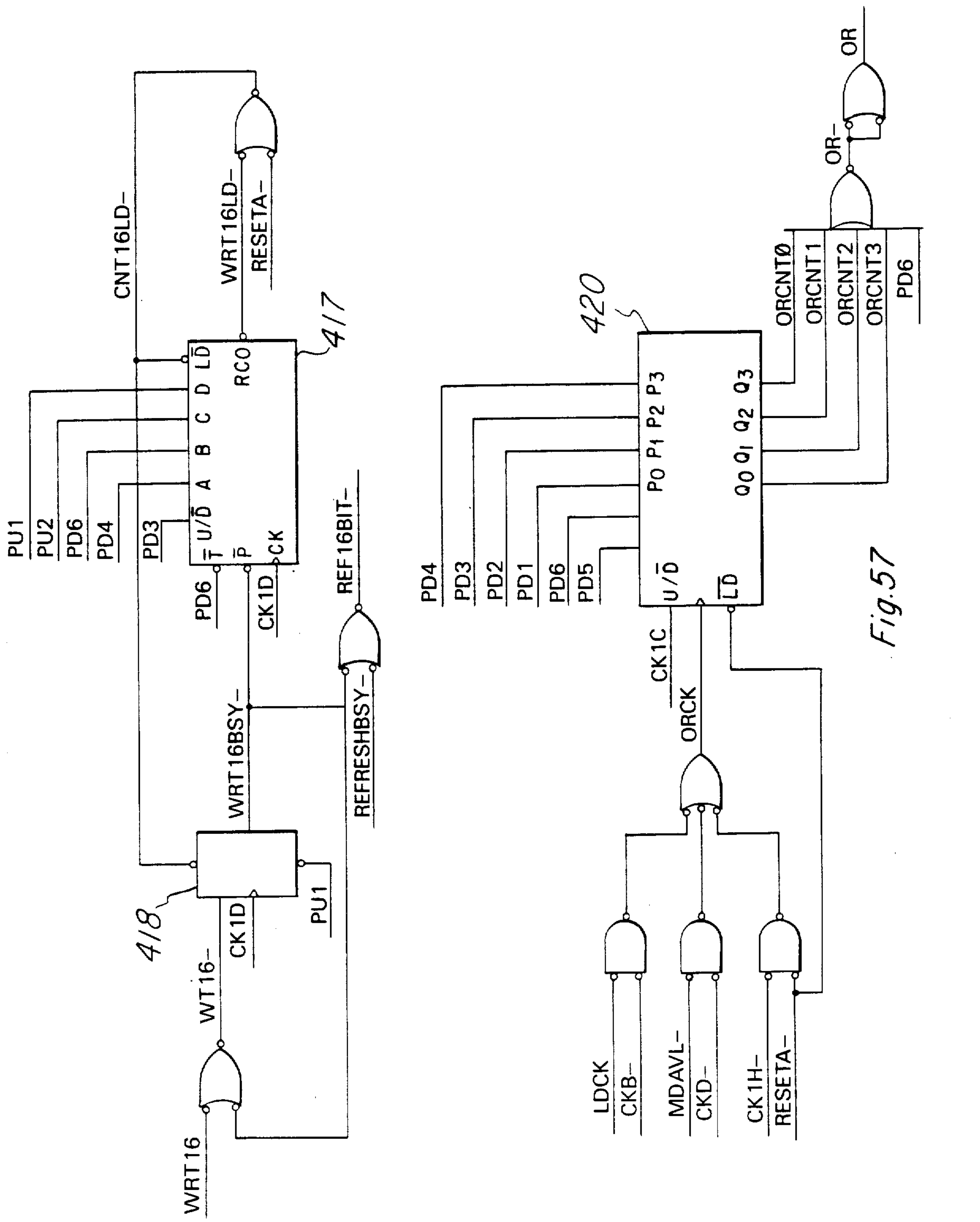
FIG. 57 is a priority logic controls schematic of the TC.

FIG. 57 shows the 16-bit write mode disable (WRT16BSY-) and the output ready counter. Whenever the device requesting bulk memory gets a grant for a 16-bit write, the signal WRT16 goes low and disables the priority controller. The signal WRT16 is ORed with the feedback hold signal WRT16BSY- to generate signal WRT16- which is synchronized to the clock. Signal WRT16BSY-, when low, enables 4-bit counter 417 to count down. Counter 417 is initialized to a count of 12 by system reset SR-. When signal WRT16BSY- goes low, counter 417 counts down to 0 during which time the priority controller is disabled. The carryout of the counter presets flip flop 418 enabling the priority controller. The carryout also leads the counter to 12 and disables it until WRT16 goes low again.

Figure 58:
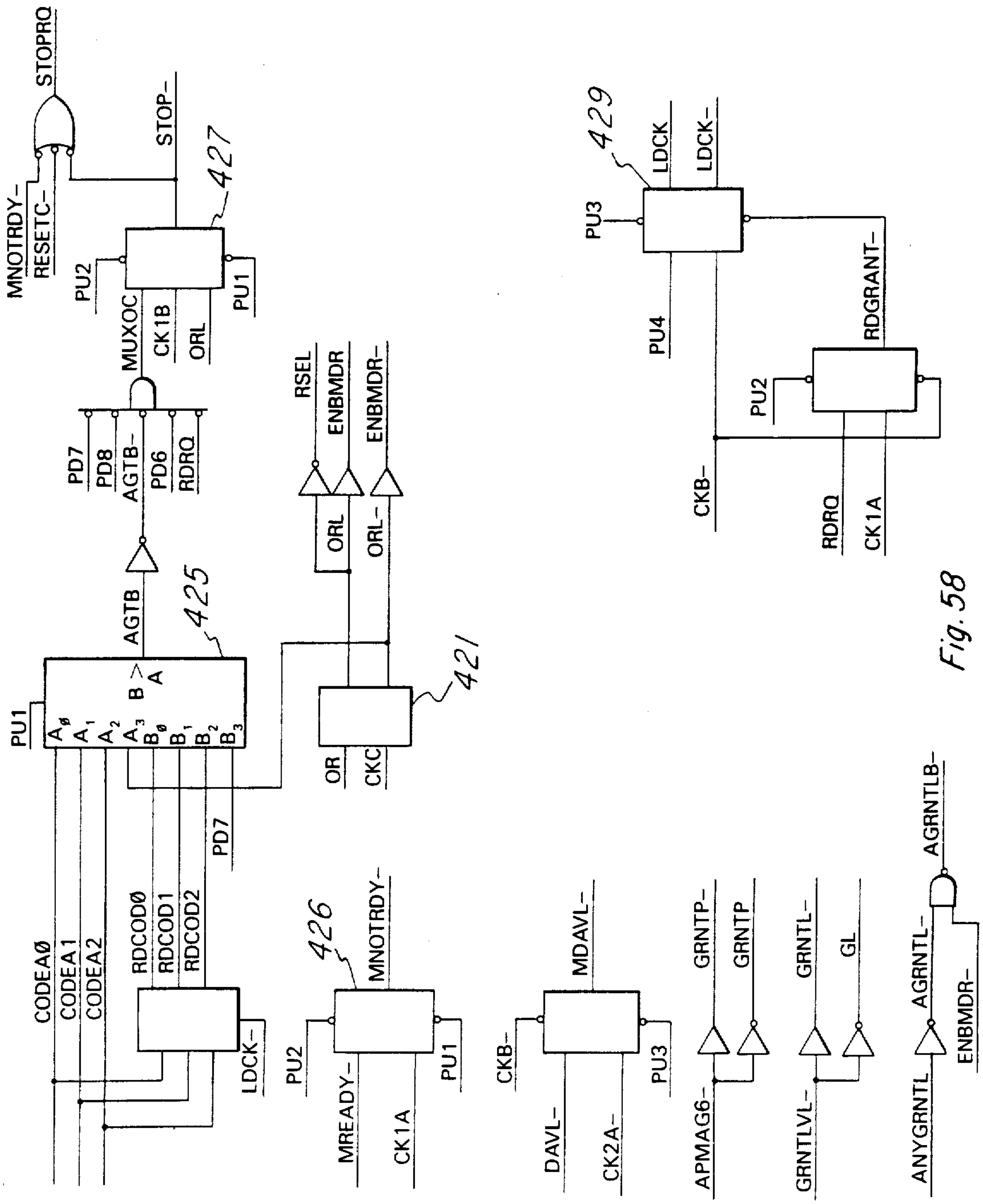
FIG. 58 is also a priority logic controls schematic of the TC.

To generate data available FIFO "output ready" external to the FIFO, an up/down counter 420, FIG. 57, is used. Whenever a read grant is issued to any device, the signal LDCK upcounts counter 420. Anytime the data available is received from BM 14, the signal MDAVL- down counts counter 420. Signal LDCK is output from flip-flop 429 as shown in FIG. 58. Latch 421 output, ENBMDR- steers the direction of the bidirectional BM data bus, BMDATA(00–63) by activating a transceiver (not shown) for conduction in one direction or the other, depending upon whether the operation is a read or write. The latch output RSEL- is used as the multiplexer select input to select only the read priority requests, signals RDPRIOR(0–7), also discussed earlier. The output ready signal from counter 420 goes true when the read grant is issued in the device and stays true until all requesting read data is received from BM 14.

The signal ANYGRANT- represents the ORing of all of the grant level signals, GRNTLVL(0–7), in gate 422. Similarly, the signal RDRQ represents the ORing of all the read priority signals RDPRIOR(00–07), and gate 423.

The signal LDCK is the load clock for the FIFO 408 in FIG. 56. To meet the timing requirements, the signal LDCK is normally held high and goes low when RDRQ occurs. FIFO 408 input is clocked on the high to low transition of signal LDCK. The timing requirements between the active edges of the load clock and the unclock of FIO 408 are very critical. MREADY-signal is the BMREADY from BM 14. As shown in FIG. 58, flip flop 426 synchronizes the signal to the clock edge before it is ORed with signal STOP- to disable a priority controller when BM 14 is not ready. Comparator 425 in FIG. 28 compares the current priority device code with the previous device. The output of B>A of the comparator is dated with signal RDRQ to allow the comparison only when the write request has a higher priority than a read request. The signal output MUXOC represents this case. The signals MUXOC and ORL are used as J-K inputs of flip flop 427 to generate the signal STOP-. Flip flop 427 generates STOP(low) when MUXOC goes true regardless of the state of signal ORL although from the previous stage signal ORL had to be high to turn on MUXOC. Once the STOP-goes true, it will maintain that state until ORL goes low.

Signal STOP- can go true and disable the priority controller any time that the FIFO 425 is not empty and higher priority write requests occur. This condition will persist until FIFO 425 is empty, meaning that all the requests of read data has been received from the bulk memory 14.

Figure 59A:
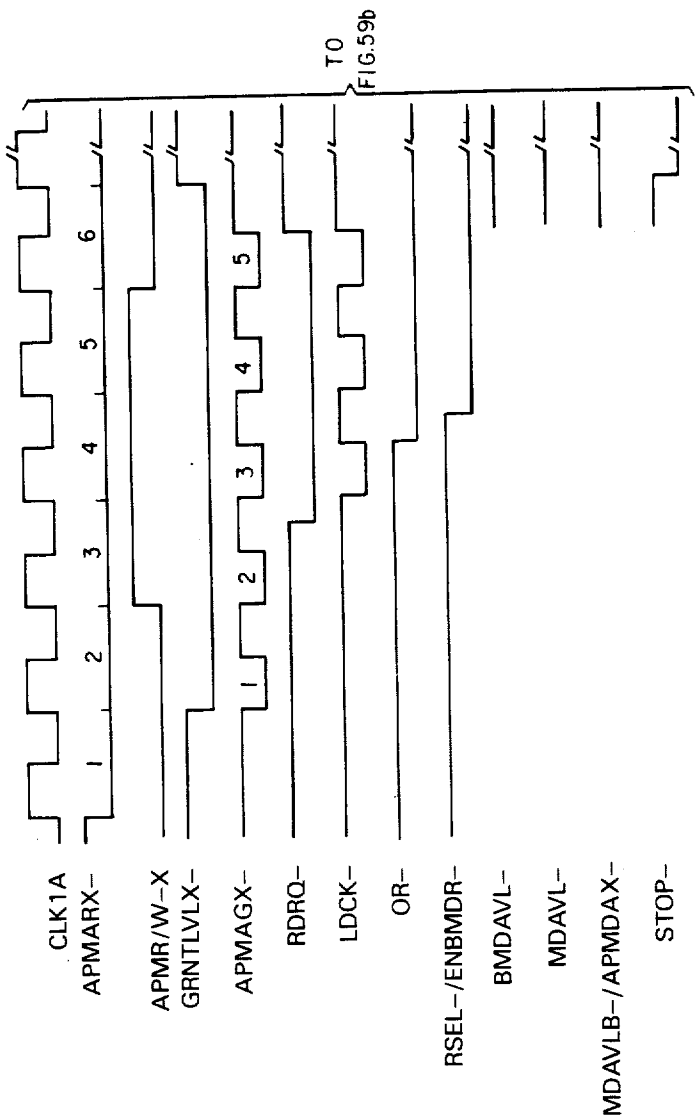
FIG. 59 is a timing diagram of the control signals used in the priority controller.
Figure 59B:
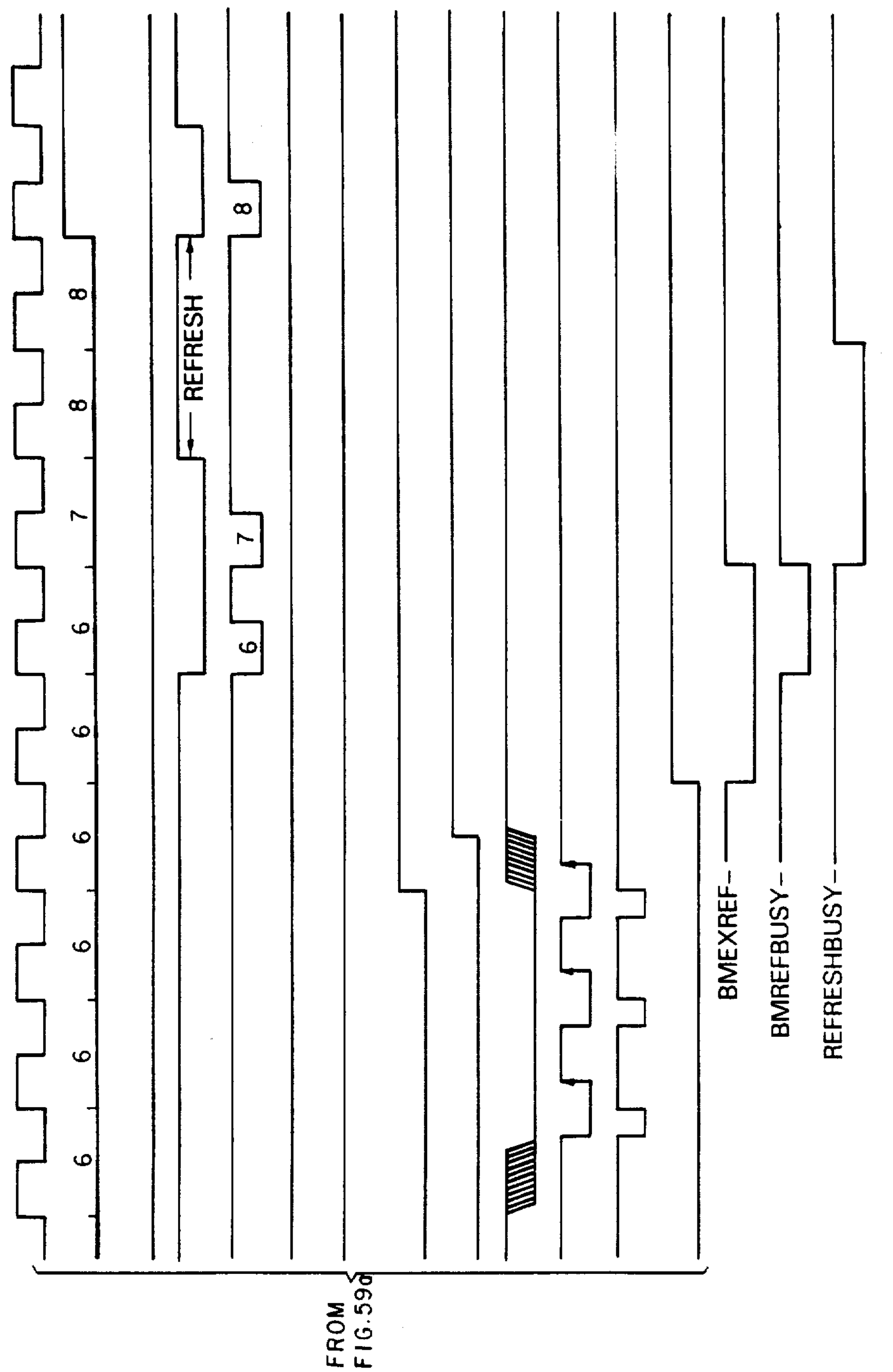

FIG. 59 illustrates the timing of two bulk memory write requets followed by three read requests, two write requests, an external bulk memory refresh and one write request. At any time, the highst priority device receives the grant. The grant is issued one clock after the request is made. The first two writes are honored immediately. The next read following the writes puts the priority controller in a read only state where it will continue accepting only reads until a higher priority write occurs. After the third read, a higher priority write occurs. The controller then initiates the STOP-signal which locks out the controller from issuing any more grants. The controller waits for three data availables for the previous three read requests. After the three data availables, the controller resumes its operation and issues two write grants. The third write grant is delayed for two clocks for the bulk memory 14 to be refreshed. After the third write, no more requests are made.

MODE OF OPERATION

As indicated earlier, the microcode for all of the devices is present in the appendix under the appropriate heading. This, of course, sets the specific operation of the devices to perform their particular tasks.

In the detailed description above, the specific details of the operation of each of the units have already been presented. The following is a generalized description of the operation of the system.

All of the devices operate autonomously and synchronize themselves by relatively infrequent device-to-device signaling. Before the host computer 12 of FIG. 1 initiates a system operation, only the host interface 20 is receptive to instructions from the host computer 12.

When the initial instructions are sent to the system, none of the devices have executable code stored in either their control stores 33 or their program memories 31. To inhibit execution of bad code, PIT 25 (FIG. 2) turns off the system clock. On command it accesses its ROM storage and down-loads its code to the host interface 20 for its control store memory. This is essentially a boot strap program which sets sufficient intelligence into the host interface 20 so that it may communicate with the host computer 12 to load code both to itself and to the other devices. After being down-loaded, the host interface 20 can control execution of the other devices and PIT 25 then turns on the system clock. The contents of the control stores and the ROM of PIT 25 are checked, as set out earlier with respect to FIGS. 9 and 10.

At that point, the host interface 20 microcode permits the loading of its control store 33 enables communication with host computer 12 and controls its data paths from host computer 12 from the system control bus 27 and to the bulk memory data bus 26. The host interface 20 also performs an initialization cycle from which it reports certain status to the host computer 12. Two items reported are the size of bulk memory 14 and the configuration of the system. Then the host computer is enabled to down-load both assembly language and microcode to all of the devices. At the completion of loading code, host interface 20 releases a system clear line which allows all devices to start operation. Host interface 20 at this point is executing assembly language code and performing its full executive task. When the clear line is released, the other devices all execute a built in test, and if the built in test is successfully completed, they enter their executive microcode.

The microcode and assembly language code are passed from the host computer 12 to the program memories via a system control bus 27. Working stores 201A and 201B, FIG. 43 of arithmetic unit 21 (or 22) are also loaded via SCB 27.

In this preferred embodiment, seismic data is now to be selected and processed. That seismic data comes from line interface unit 17 as received by input controller 24. The primary purpose then, of input controller 24, is to provide the data path for the seismic data to be received and transferred to bulk memory 14. As the data passes through the input controller 24, it is modified under program control. The received data is in a two's-complement, inverse gain, multiplex format. Input controller 24 removes the gain and converts the data to either a 32-bit IBM or 16-bit quadinery format. The data is stored internally in scan buffers at 208, 210 of FIG. 28c in multiplexed order. The scan buffers are accessed and the data is transferred to bulk memory 14 in a demultiplexed format. The format demultiplexing control is provided by bulk memory address control within IC24, as described in detail earlier.

Transfer controller 23 represents a single point interface for driving bulk memory from the bulk memory data bus 26. It provides priority arbitration between the various devices requesting bulk memory 14. It provides the data path between bulk memory 14 and arithmetic unit 21. In communications with the bulk memory, it supports 16, 32 and 64-data writes and 64-bit data reads. Although only a maximum 64 megabites of memory is provided. TC 23 provides 32-bit addressibility for bulk memory 14. When transferring data in the 64-bit mode, it can sustain sequential transfers of 64 bits on every clock for a maximum transfer rate of 48 megabites per second.

With the data from LIU 17 now residing in bulk memory 14, it is transferred to the working storers 201A, 201B of arithmetic unit 21. A data path is special. Since AU 21 is a 32-bit floating point processor, its data path provides a number of format conversions of data transfer in both directions. The selected conversion for use is under program control. The conversions are performed as shown in great detail above.

With the data converted to the desired format, arithmetic unit 21 is now supplied and ready to perform the necessary operations. Working stores 201A, 201B and the scratch pad memory 201c are temporary memories for use by AU 21. Data is stored in working stores 201A and 201B and then is operated on in accordance with the programs stored in the program memory 31AU. During the calculations, scratch pad memory 201c is used for storing intermediate results. This scratch pad memory is accessible only by AU 21. Upon completion of the calculation, the results are sent back to bulk memory 14.

Each unit then operates under the instructions contained in a program memory 31 in a special manner dictated by its microcode contained in its controlled storer 33AU. Information from bulk memory 14 is sent to the host computer 12 through the control of transfer controller 23. New programs can be sent into the system by host computer 12 as desired.

This complex system is susceptible of extensive changes in hardware and software by those skilled in the art. However, such changes are contemplated and the invention is limited only by the appended claims.

What is claimed is:

1. An array processor system having bulk memory means, for storing data,, controlled by digital host computer means, comprising:

(a) interface means, connected to receive signals, including user instructions, microcode instructions, and data signals from the digital host computer means to autonomously and selectively distribute said user instructions, microcdoe instructions and data signals within the system, and to transmit signals, including status, control and data signals to the digital host computer means;

(b) transfer controller means connected to the bulk memory means and to the interface means for receiving said user instructions from the interface means and for autonomously and selectively transferring and formatting data signals from the bulk memory means; and (c) arithmetic means, connected to the transfer controller means and to the interface means, for receiving said user instructions from the interface means and for subsequently autonomously and selectively performing arithmetic functions on the data transferred by the transfer controller means.

2. The system of claim 1 wherein the interface means comprises:

(a) (i) host interface means connected to transmit and receive the signals to and from the host computer means; and (ii) processor initialization and test means for verifying the microcode instructions sent to said host interface means, the transfer controller means and the arithmetic means.

3. The system of claim 2 further comprising system control bus memory means for interconnecting said host interface means, the transfer controller means and the arithmetic means.

4. The system of claim 3 wherein the processor initialization and test means comprises means for prioritizing access to the system control bus means by said host interface means, the transfer controller means, the processor initialization means and the arithmetic means.

5. The system of claim 3 wherein said host interface means, said processor initialization and test means, said arithmetic means and said transfer controller means each comprises:

control means for performing program sequencing and address generation functions;

device dependent means for performing said specific functions of a designated one of said interface means, said processor initialization and test means, said arithmetic means or said transfer controller means;

control store means connected for storing microcode instructions for said control means and said device dependent means; and program memory means for storing user instructions for use by said control means.

6. The system of claim 5 wherein said program memory means is connected to said system control bus means to permit interchange of said user instructions of said program memory means between said host interface means, said processor initialization and test means, said arithmetic means, and said transfer controller means.

7. The system of claim 6 wherein said host interface means, the processor initialization and test means, the arithmetic means and the transfer controller means each further comprises means for signaling completion of a predetermined series of instructions to a selected one or more of said host interface means, the processor initialization and test means, the arithmetic means, and the transfer controller means.

8. The system of claim 2 further comprising bulk memory bus means for interconnecting the bulk memory means with the transfer controller means and said host interface means.

9. The system of claim 5 wherein the transfer controller means comprises bulk memory priority means for prioritizing access to the bulk memory bus means by said host interface means and the transfer controller means.

10. The system of claim 1 wherein the arithmetic means comprises fixed point arithmetic means.

11. The system of claim 1 wherein the arithmetic means comprises floating point arithmetic means.

12. The system of claim 1 wherein the arithmetic means comprises floating point arithmetic means.

13. An array processor system having bulk memory means for storing data, controlled by digital host computer means, comprising:

(a) interface means, connected to receive signals, including microcode instructions, user instructions, and data signals from the digital host computer means to autonomously and selectively distribute the microcode instructions, user instructions and data signals within the system, and to transmit signals, including status, control and data signals to the digital host computer means;

(b) input controller means, for receiving the user instructions from the interface means, for receiving data from a data source, and connected to the bulk memory means, for reformatting said received data and transmitting to the bulk memory means;

(c) transfer controller means connected to the bulk memory means, the input controller means, and to the interface means for receiving the user instructions from the interface means and for autonomously and selectively transferring and formatting data from the bulk memory means; and (d) arithmetic means, connected to the transfer controller means, the input controller means, and to the interface means, for receiving the user instructions from the interface means and for subsequently autonomously and selectively performing arithmetic functions on the data transferred by the transfer controller means.

14. The system of claim 13 wherein the interface means comprises:

(a) (i) host interface means connected to transmit and receive the signals to and from the host computer means; and (ii) processor initialization and test means for verifying said instructions sent to the host interface means, the transfer controller means, the input controller means, and the arithmetic means.

15. The system of claim 14 further comprising system control bus memory means for interconnecting the host interface means, the transfer controller means, the input controller means, and the arithmetic means.

16. The system of claim 15 wherein the processor initialization and test means comprises means for prioritizing access to the system control bus means by the host interface means, the transfer controller means, the processor initialization means, the input controller means, and the arithmetic means.

17. The system of claim 15 wherein the host interface means, the processor initialization and test means, and the arithmetic means, the input controller means, and the transfer controller means each comprises:

control means for performing program sequencing and address generation functions;

device dependent means, for performing said specific functions of a designated one of the host interface means, the processor initialization means, arithmetic means, the input controller means, or the transfer controller means;

control store means connected for storing microcode instructions for the control means and the device dependent means; and program memory means for storing user instructions for use by the control means.

18. The system of claim 17 wherein the program memory means is connected to the system control bus means to permit interchange of said contents of the program memory means between the host interface means, the processor initialization and test means, the input controller means, the arithmetic means, and the transfer controller means.

19. The system of claim 18 wherein the host interface means, said processor and test initialization means, the arithmetic means, the input controller means, and the transfer controller means each further comprises means for signaling completion of execution of a predetermined number of instructions to a selected one or more of the host interface means, the processor initialization and test means, the arithmetic means, the input controller means, and the transfer controller means.

20. The system of claim 14 further comprising bulk memory bus means for interconnecting the bulk memory means with the transfer controller means, the input controller means, and the host interface means.

21. The system of claim 17 wherein the transfer controller means comprises bulk memory priority means for prioritizing access to the bulk memory bus means by the host interface means, the input controller means, and the transfer controller means.

22. The system of claim 13 wherein the arithmetic means comprises fixed point arithmetic means.

23. The system of claim 13 wherein the arithmetic means comprises floating point arithmetic means.

24. The system of claim 13 wherein the arithmetic means comprises floating point arithmetic means.

* * * * *